US006912152B2

(12) United States Patent
Iwata et al.

(10) Patent No.: US 6,912,152 B2
(45) Date of Patent: Jun. 28, 2005

(54) MAGNETIC RANDOM ACCESS MEMORY

(75) Inventors: Yoshihisa Iwata, Yokohama (JP); Tomoki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/369,886

(22) Filed: Feb. 21, 2003

(65) Prior Publication Data

US 2003/0161197 A1 Aug. 28, 2003

(30) Foreign Application Priority Data

Feb. 22, 2002 (JP) ........................................ 2002-046964

(51) Int. Cl.$^7$ ............................................... G11C 11/00
(52) U.S. Cl. ...................................... 365/158; 365/173
(58) Field of Search .................................. 365/173, 158

(56) References Cited

U.S. PATENT DOCUMENTS

| 6,215,707 B1 | 10/2001 | Moyer |
| 6,335,890 B1 * | 1/2002 | Reohr et al. ............. 365/225.5 |
| 2001/0023992 A1 | 9/2001 | Doll |
| 2002/0008988 A1 | 1/2002 | Lenssen et al. |
| 2002/0021543 A1 | 2/2002 | Gogl et al. |

FOREIGN PATENT DOCUMENTS

| EP | 1 225 592 A2 | 7/2002 |
| EP | 1 225 592 A3 | 1/2003 |
| WO | WO 99/18578 | 4/1999 |
| WO | WO 00/19441 | 4/2000 |

OTHER PUBLICATIONS

Roy Scheuerlein, et al. "A 10NS Read and Write Non–Volatile Memory Array Using A Magnetic Tunnel Junction and Fet Switch in Each Cell," ISSCC 2000 Digest of Technological Papers, Feb. 8, 2000, pp. 128–129.
M. Durlam, et al. "Nonvolatile Ram Based on Magnetic Tunnel Junction Elements," ISSCC 2000 Digest of Technical Papers, Feb. 8, 2000, pp. 130–131.
U.S. Appl. No. 10/369,886, filed Feb. 21, 2003, Iwata et al.
U.S. Appl. No. 10/431,369, filed May 8, 2003, Iwata.
U.S. Appl. No. 10/369,886, filed Feb. 21, 2003, Iwata et al.
U.S. Appl. No. 10/465,616, filed Jun. 20, 2003, Iwata et al.
U.S. Appl. No. 10/369,886, filed Feb. 21, 2003, Iwata et al.
U.S. Appl. No. 10/438,015, filed May 15, 2003, Iwata et al.
U.S. Appl. No. 09/961,326, filed Sep. 25, 2001, Pending.
U.S. Appl. No. 10/107,310, filed Mar. 28, 2002, Pending.
U.S. Appl. No. 10/160,058, filed Jun. 4, 2002, Pending.
U.S. Appl. No. 10/162,605, filed Jun. 6, 2002, Pending.
U.S. Appl. No. 10/199,176, filed Jul. 22, 2002, Pending.
U.S. Appl. No. 10/214,568, filed Aug. 9, 2002, Pending.
Scheuerlein, R. E., "Magneto–Resistive IC Memory Limitations and Architecture Implications", 1998 Int'l Non Volatile Memory Technology Conference, ISBN: 0–7803–4518–5, pp. 47–50, Jun. 22, 1998.

* cited by examiner

Primary Examiner—M. Tran
(74) Attorney, Agent, or Firm—Oblon, Spivak, McClelland, Maier & Neustadt, P.C.

(57) ABSTRACT

A magnetic random access memory includes a memory cell array having memory cells using a magnetoresistive effect, a first functional line which runs in a first direction in the memory cell array and is commonly connected without an intervening select switch to one terminal of each of the memory cells, second functional lines which are arranged in correspondence with the memory cells and run in a second direction perpendicular to the first direction in the memory cell array, each second functional line being connected without an intervening select switch to a corresponding memory cell, and a third functional line which is electrically insulated from the memory cells and generates a magnetic field to write data in the memory cells such that the magnetic field is shared by the memory cells.

48 Claims, 91 Drawing Sheets

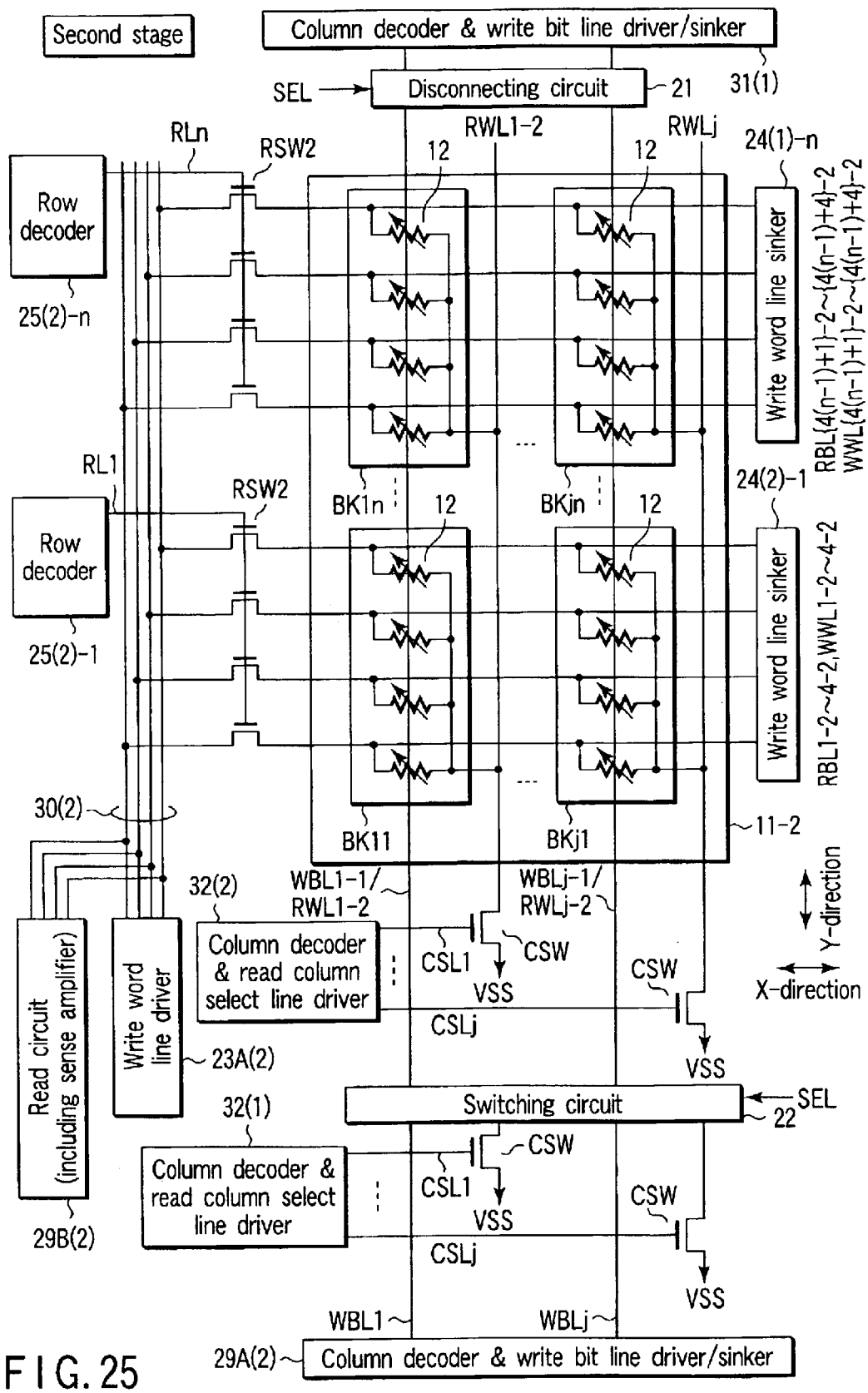
F I G. 25

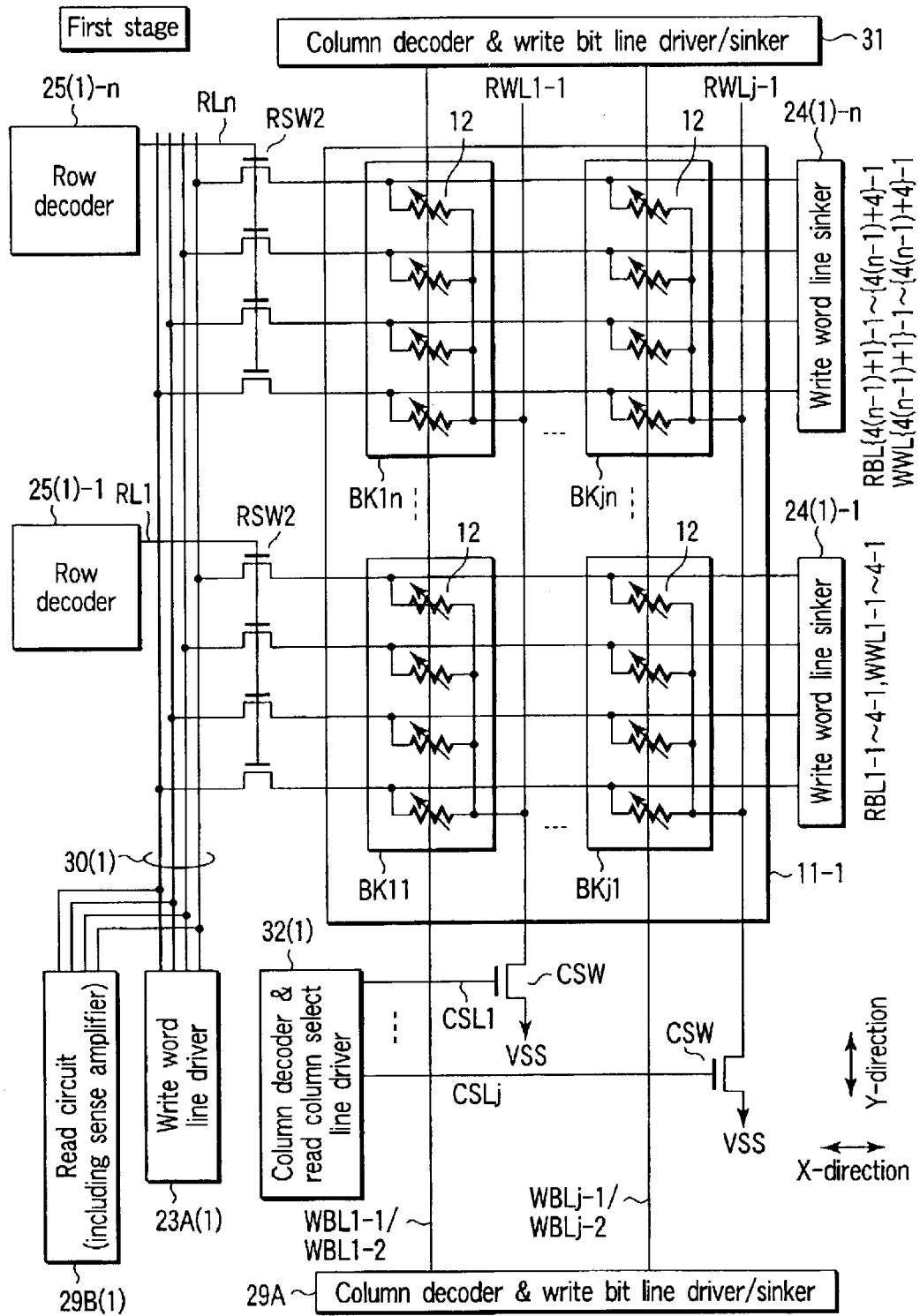
F I G. 34

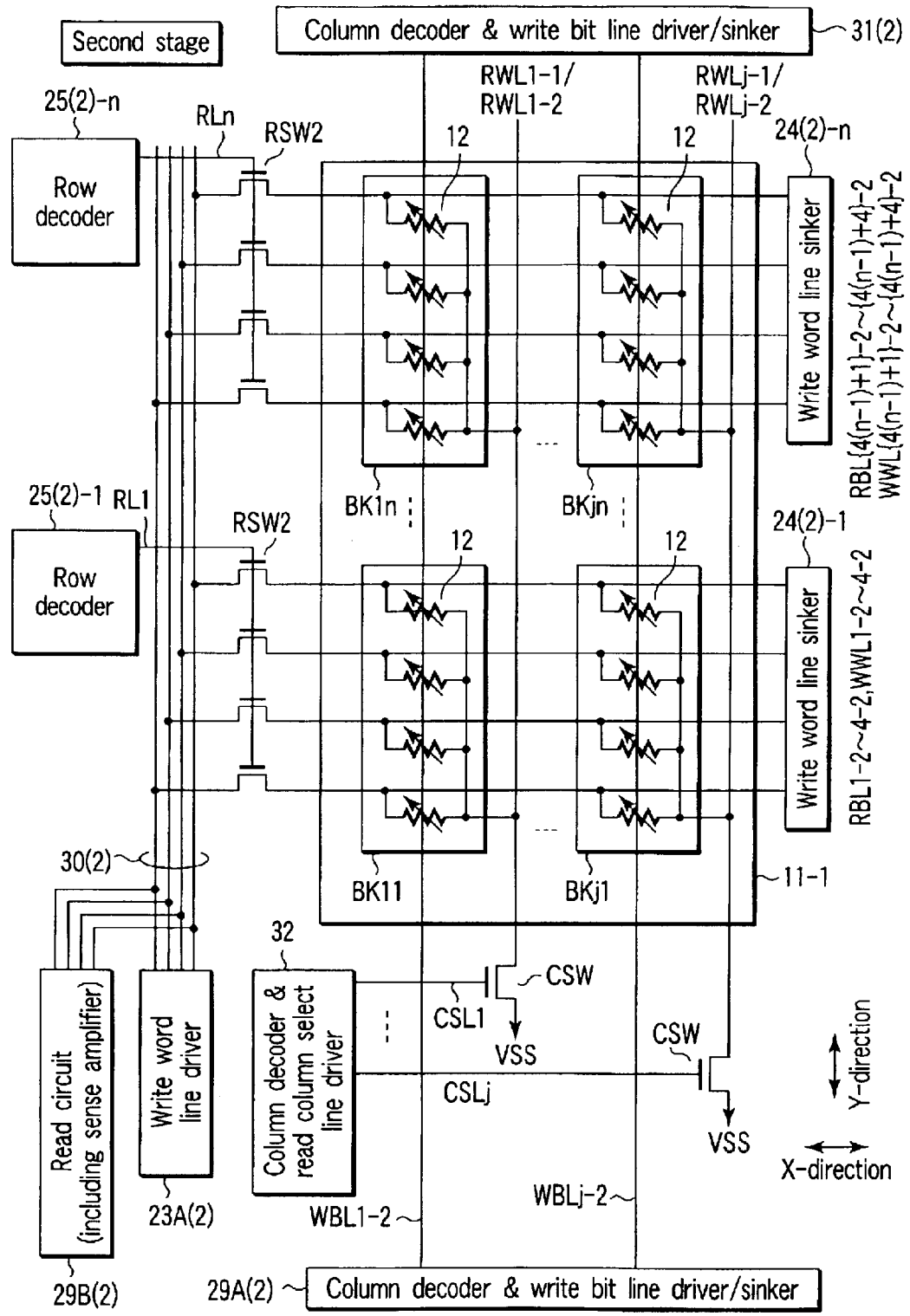
F I G. 45

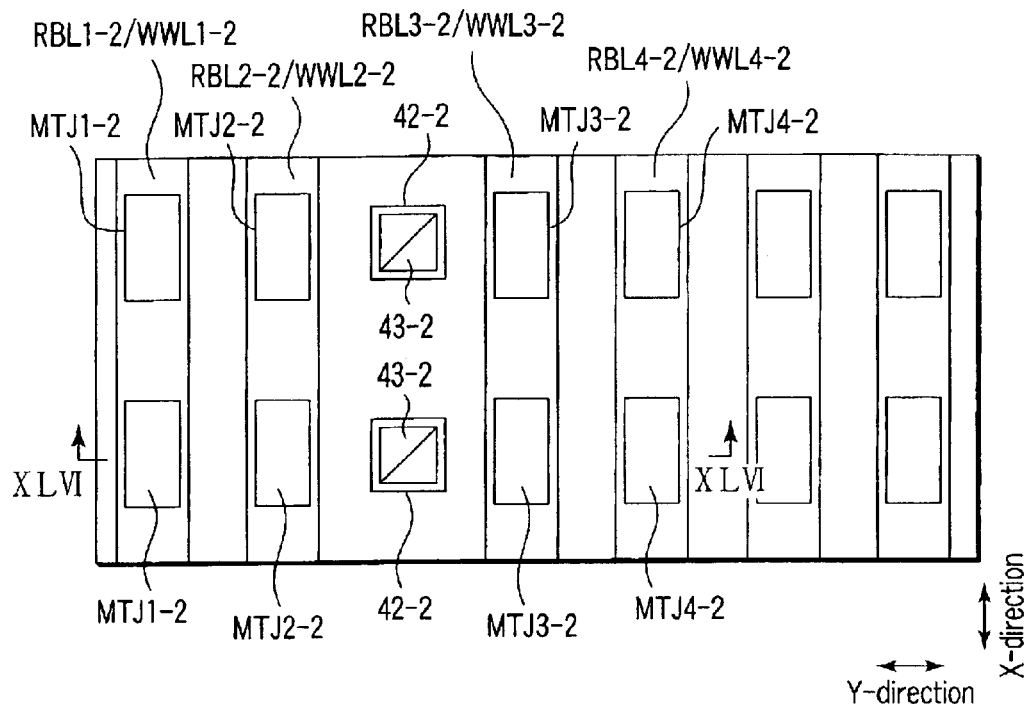
F I G. 51
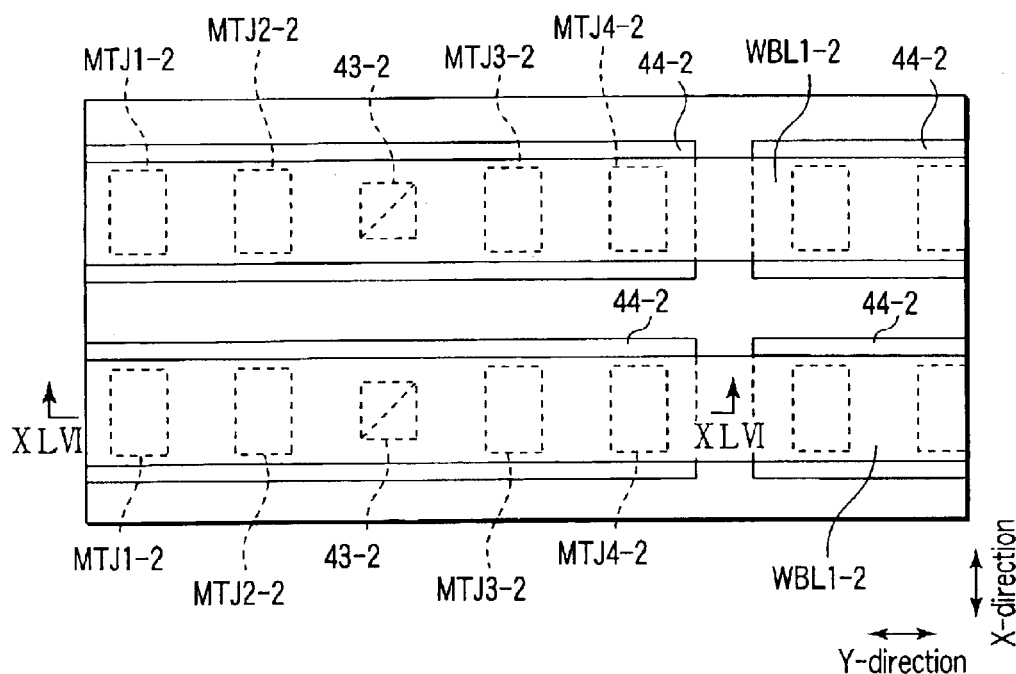
F I G. 52

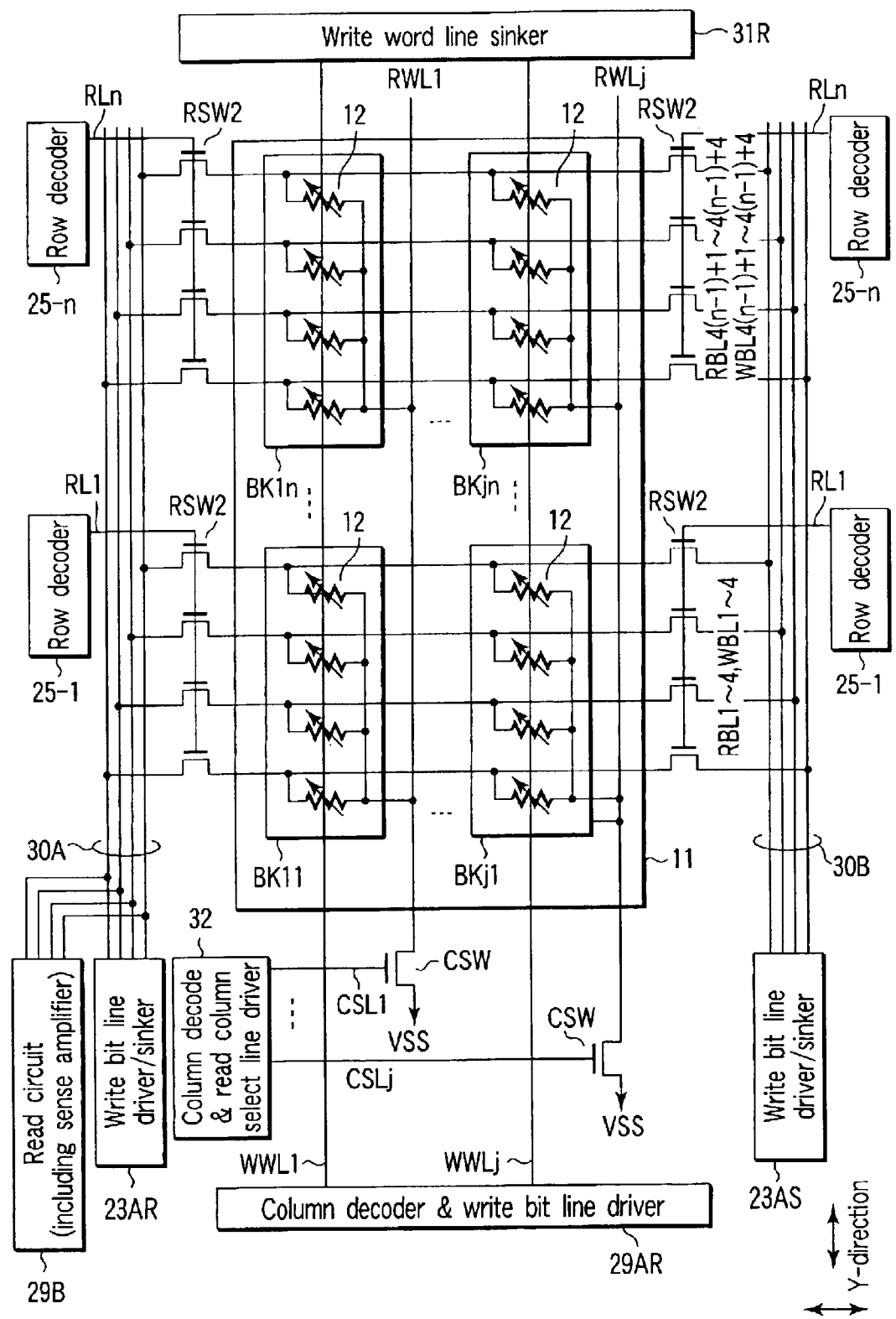
F I G. 53

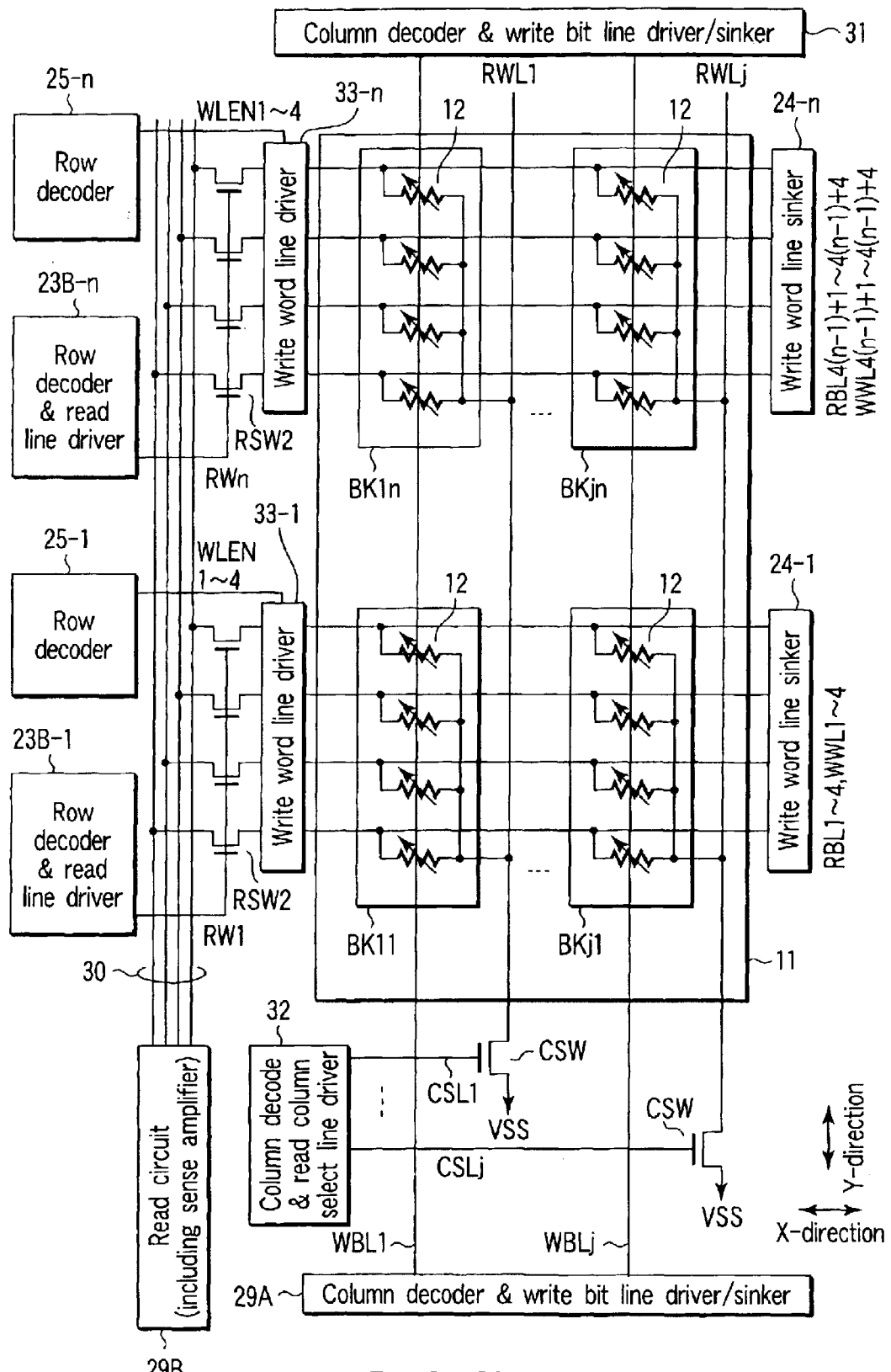
F I G. 59

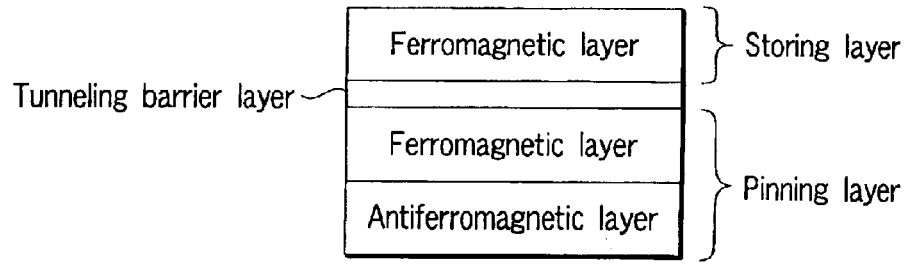
F I G. 61
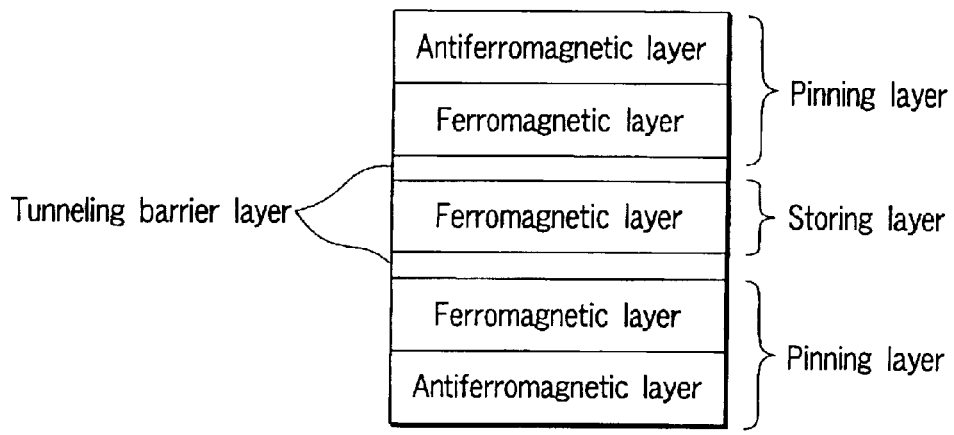
F I G. 62
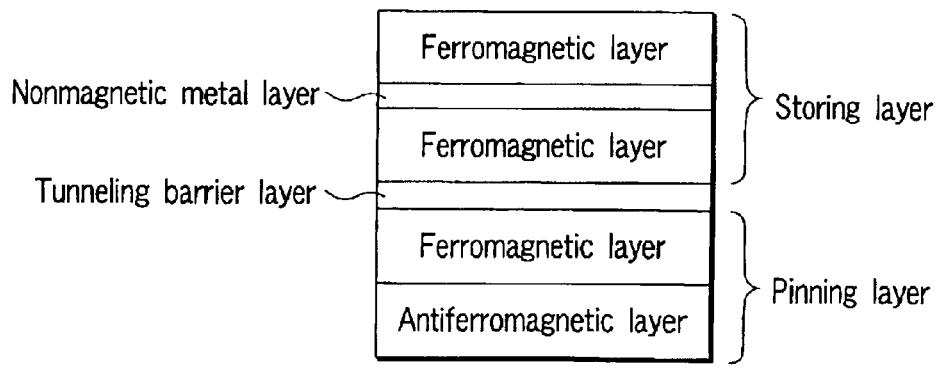
F I G. 63

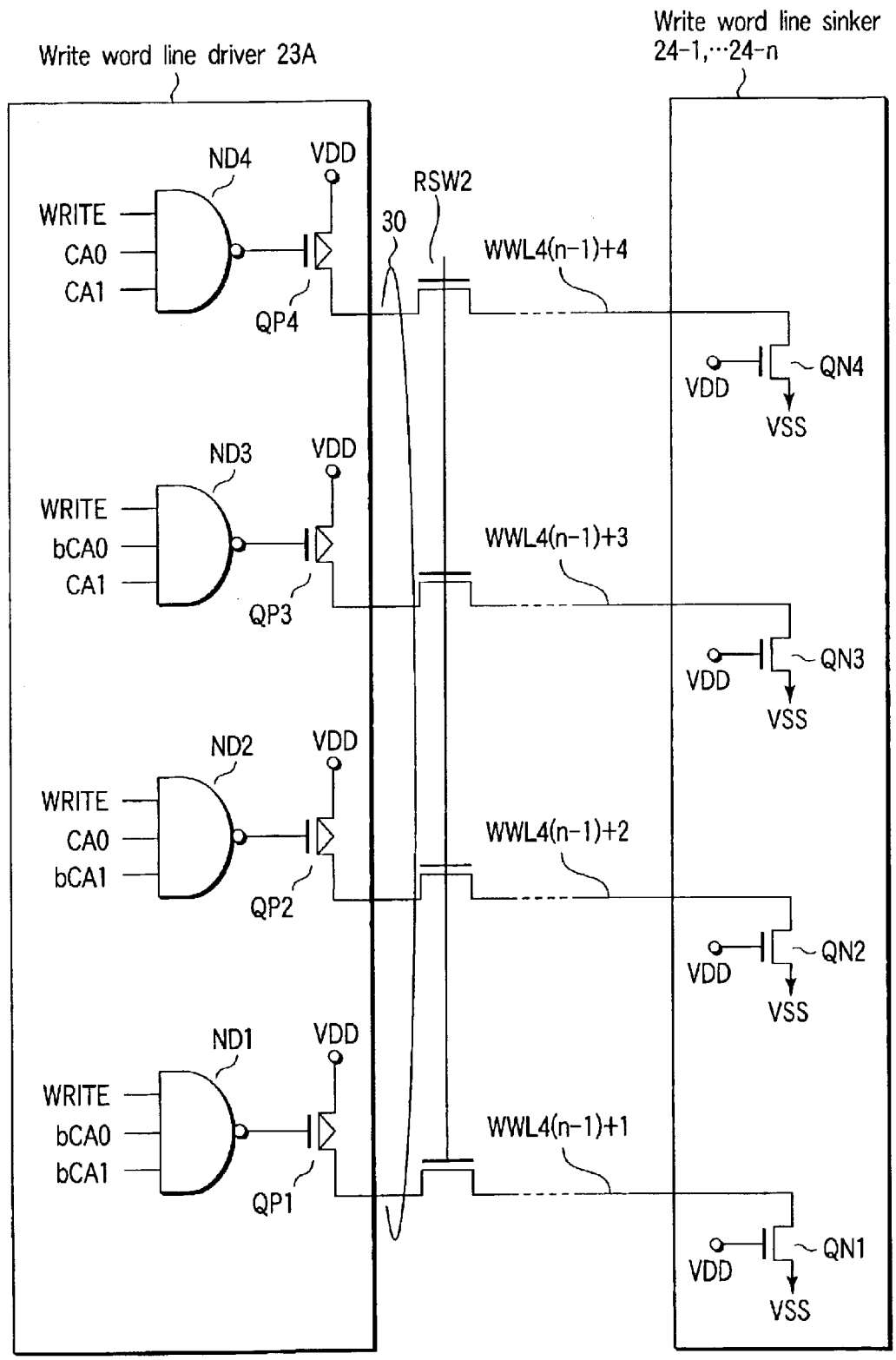
F I G. 64

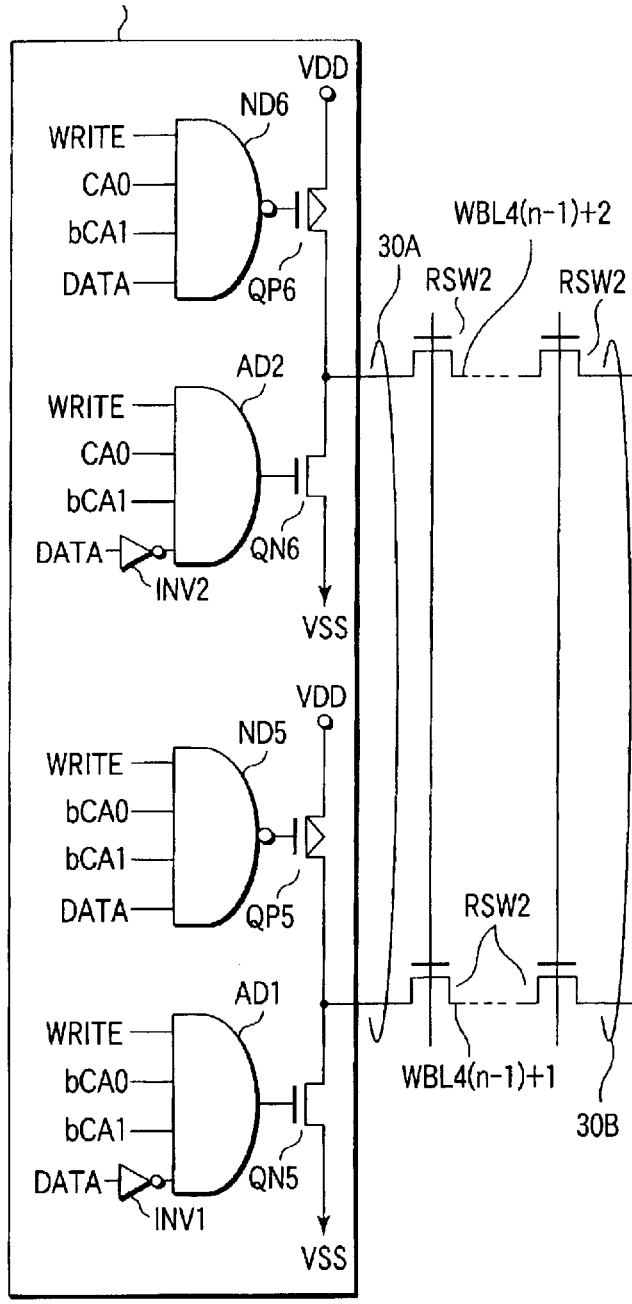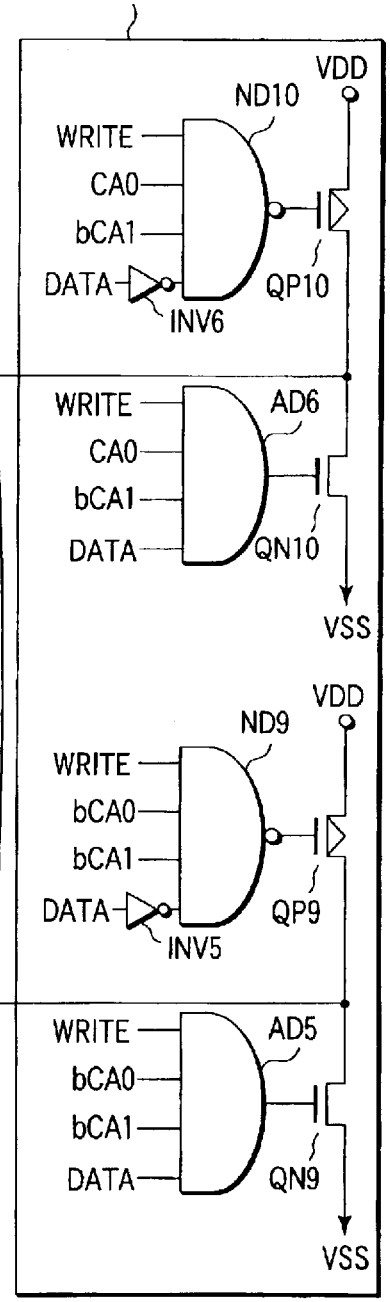
F I G. 68

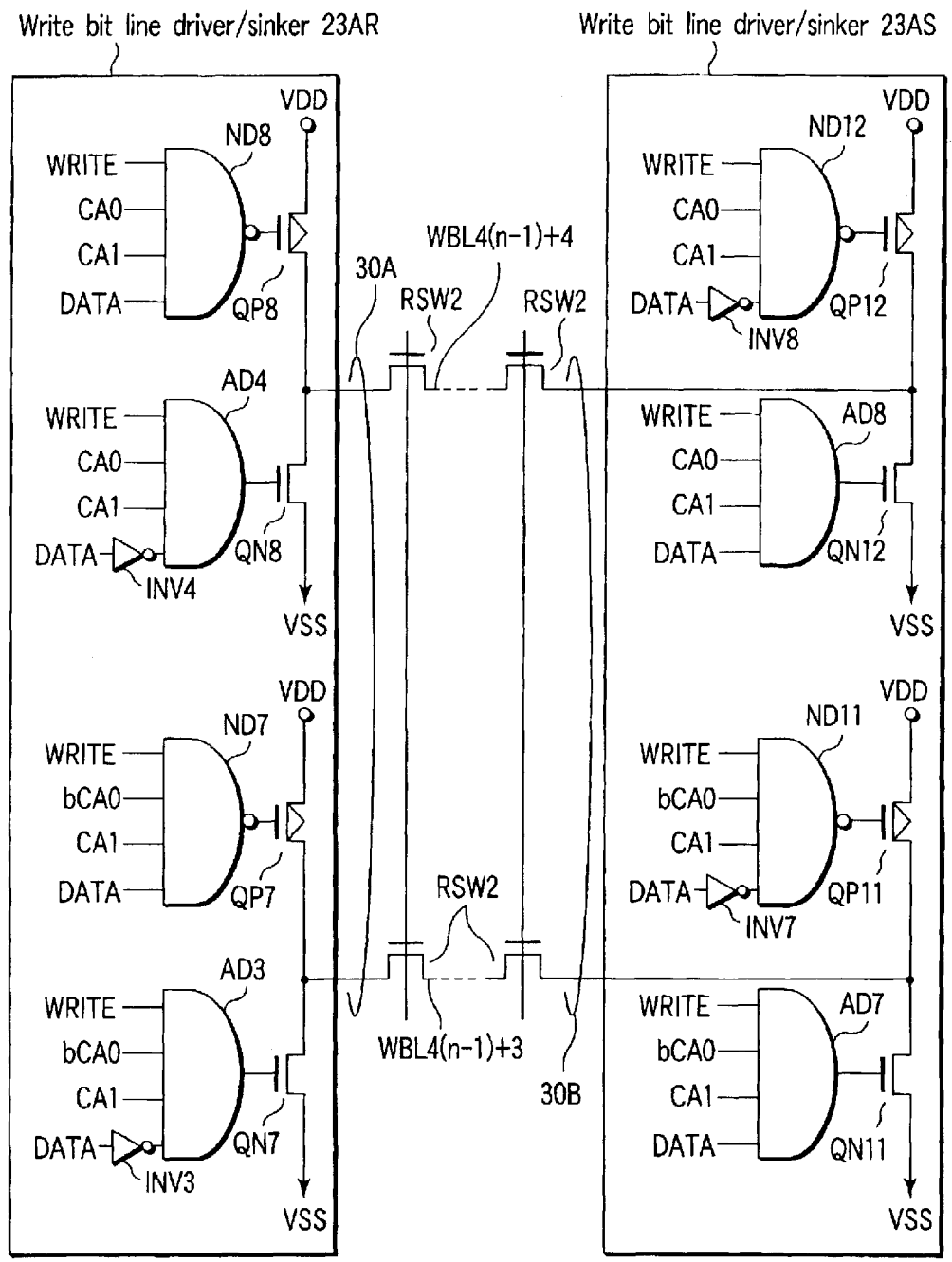
F I G. 69

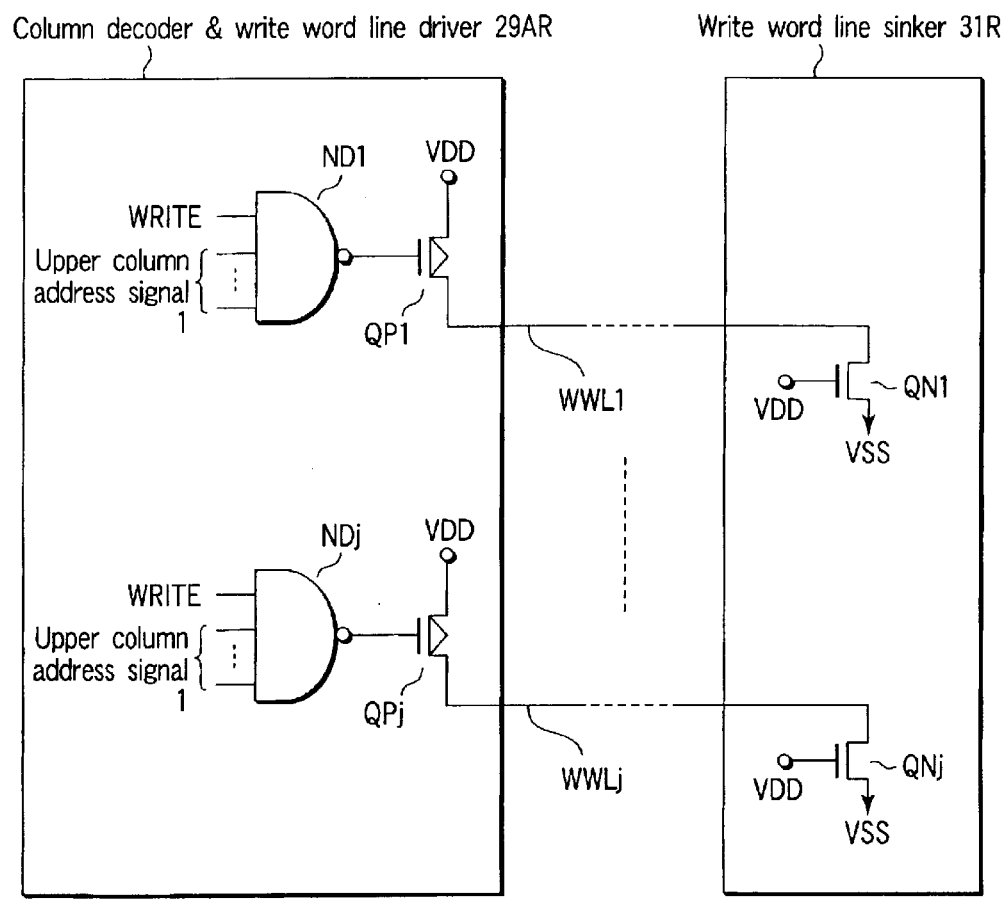
F I G. 70

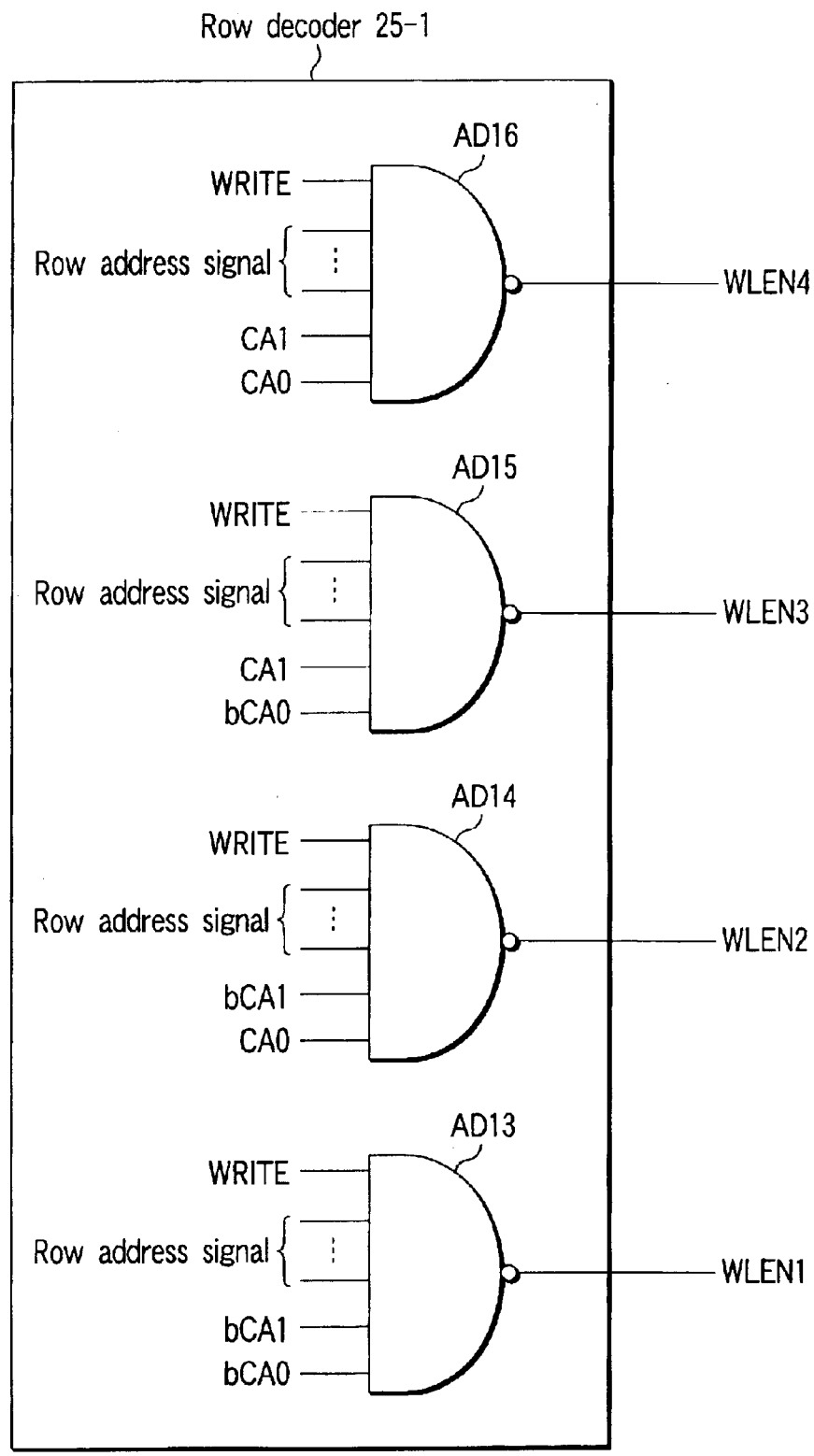
F I G. 71

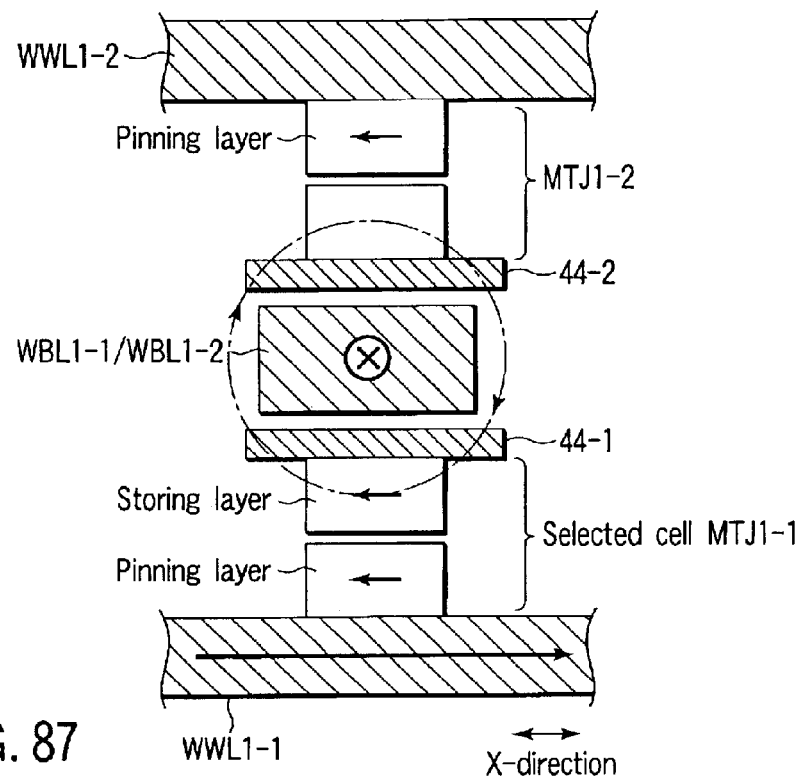
F I G. 87
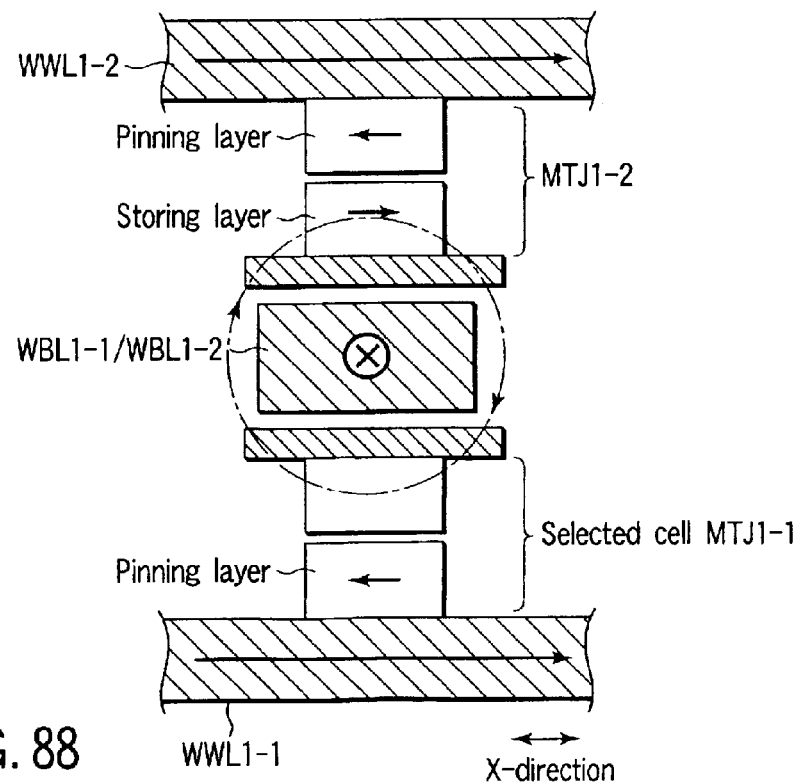
F I G. 88

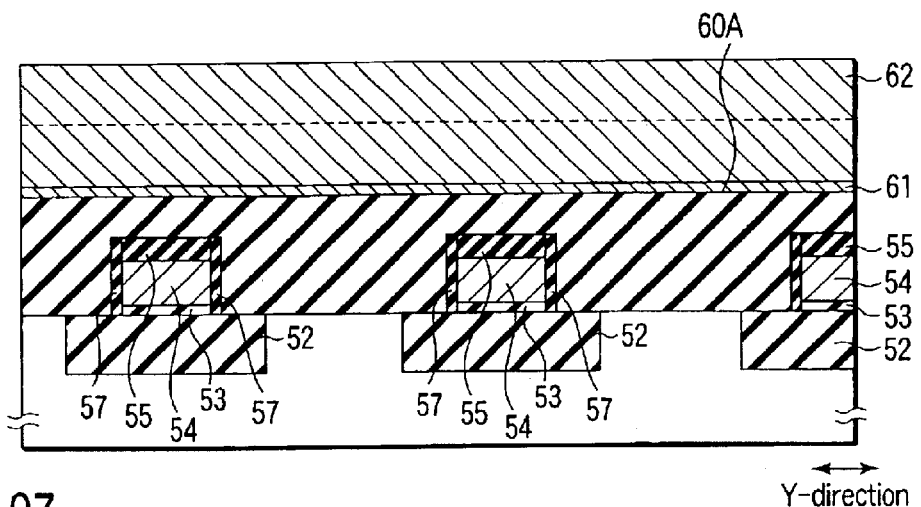
F I G. 97
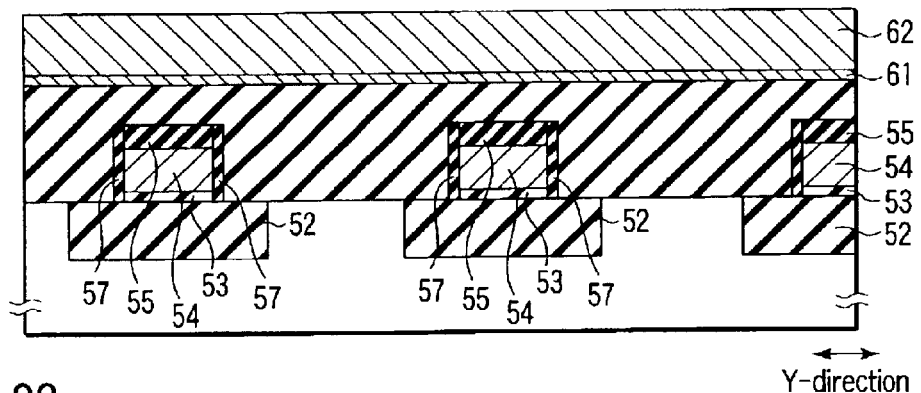
F I G. 98
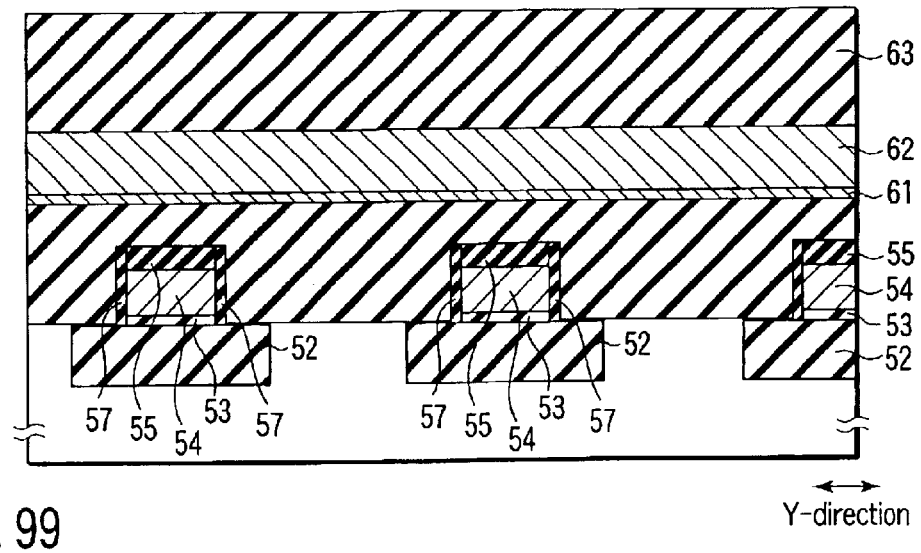
F I G. 99

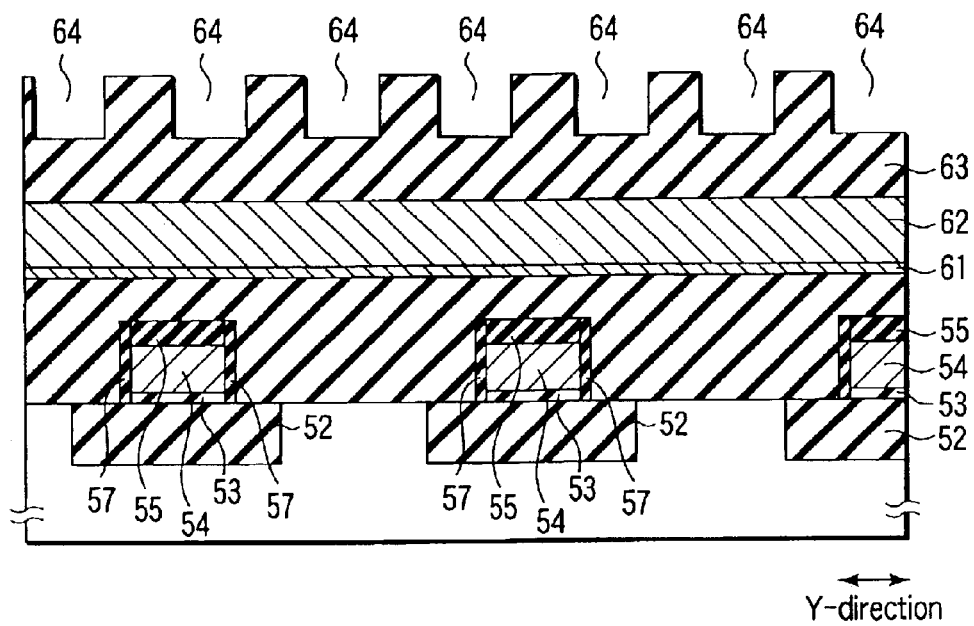
F I G. 100
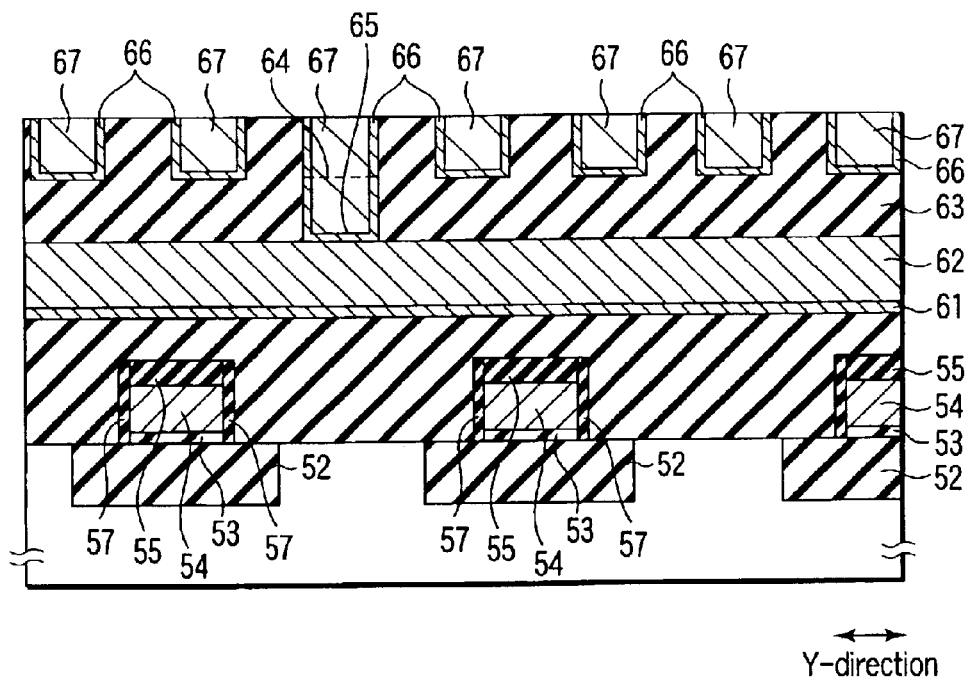
F I G. 101

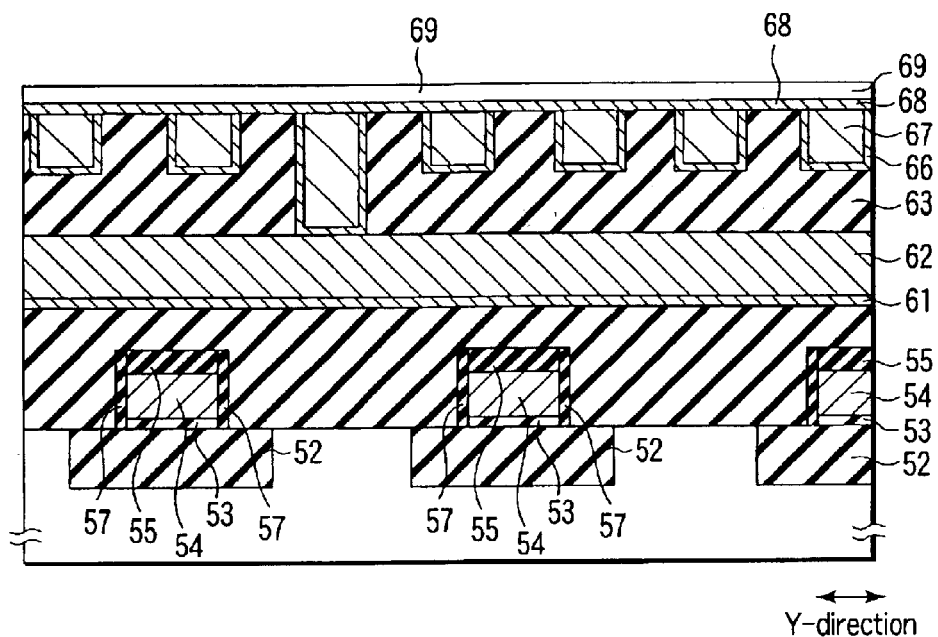
F I G. 102
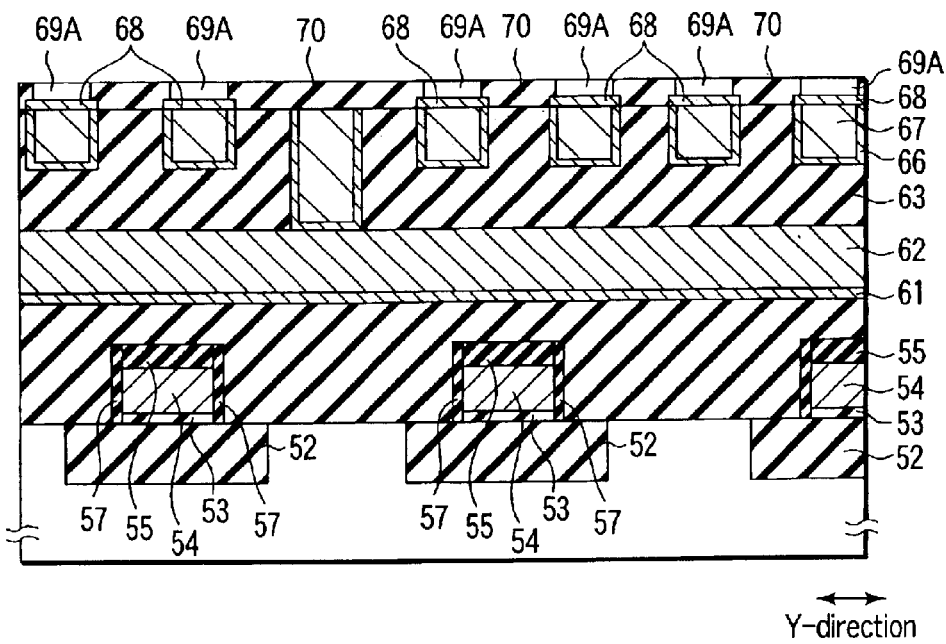
F I G. 103

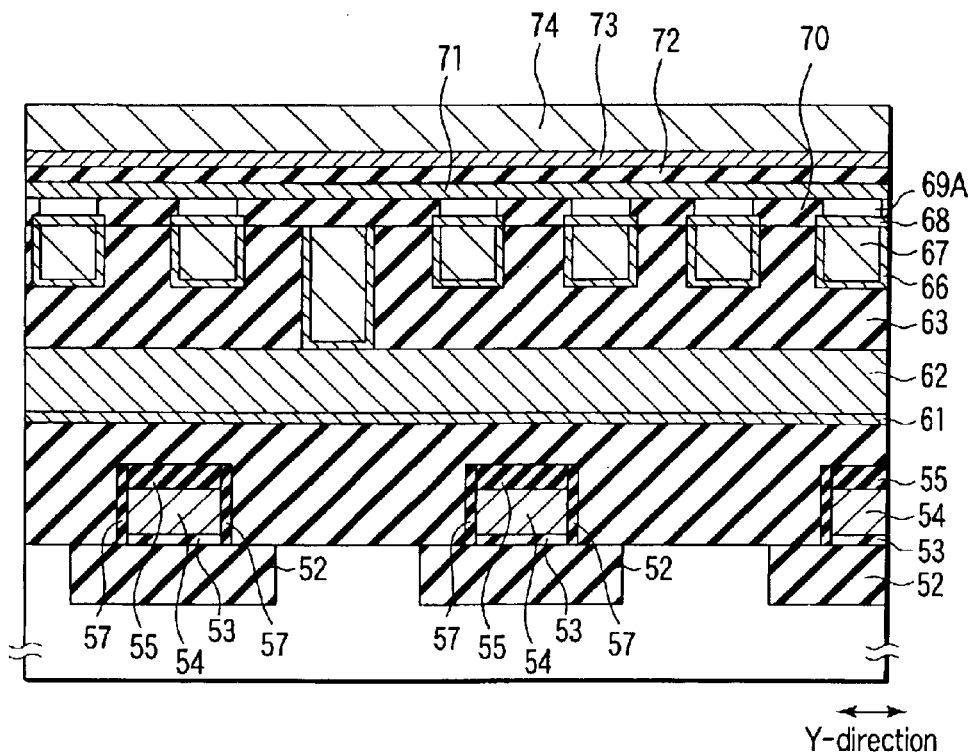
F I G. 106
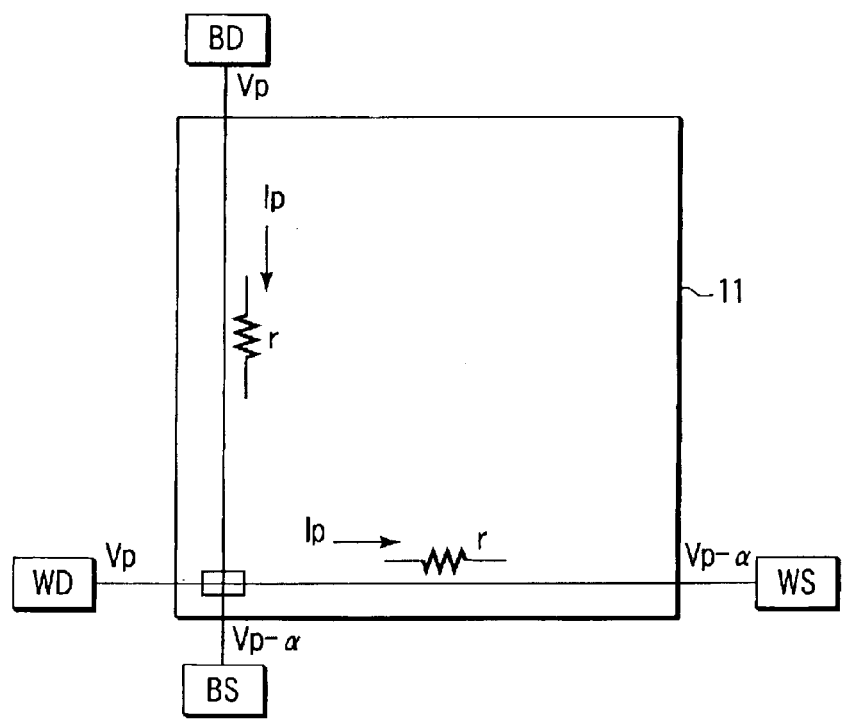
F I G. 107

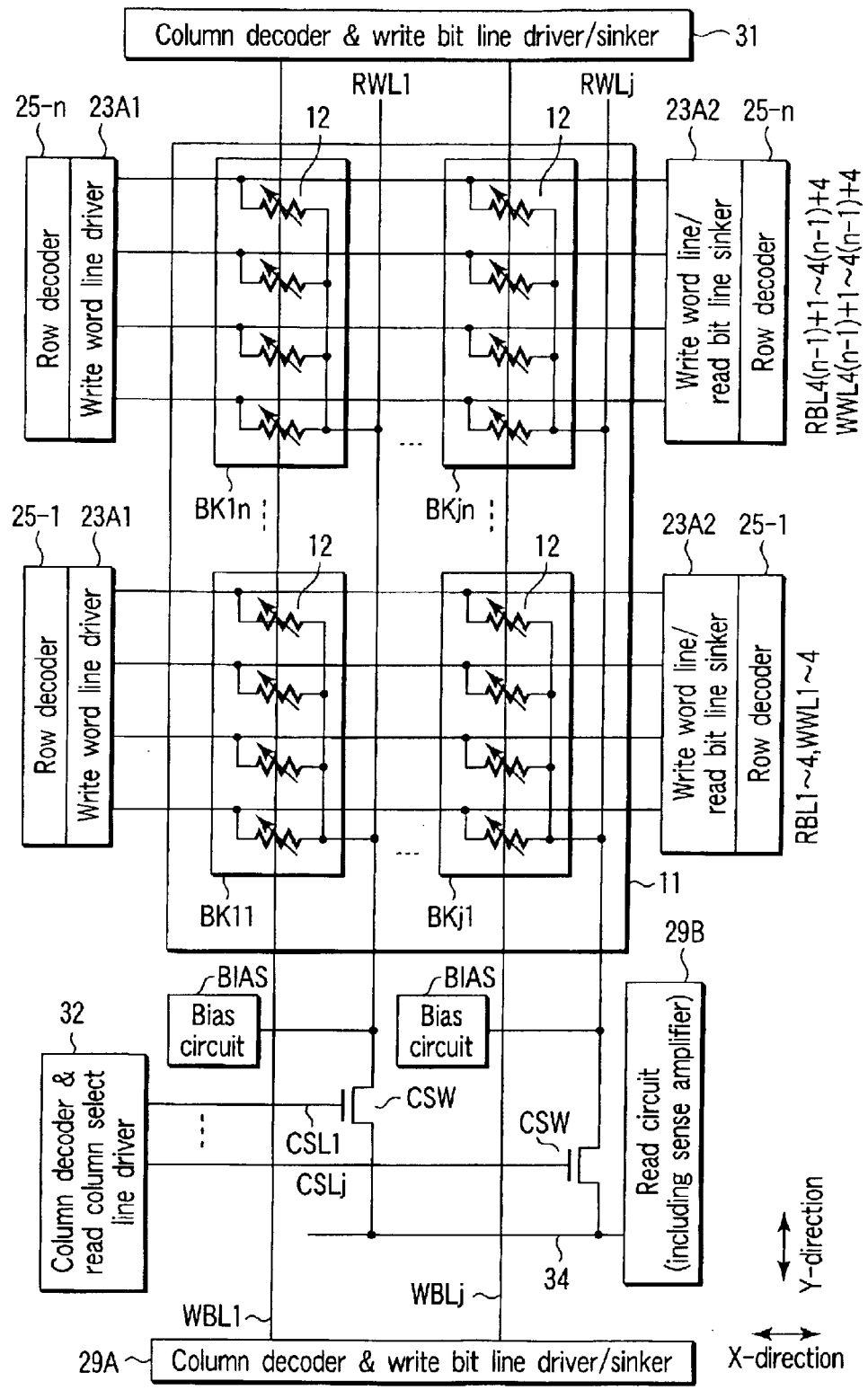
F I G. 108

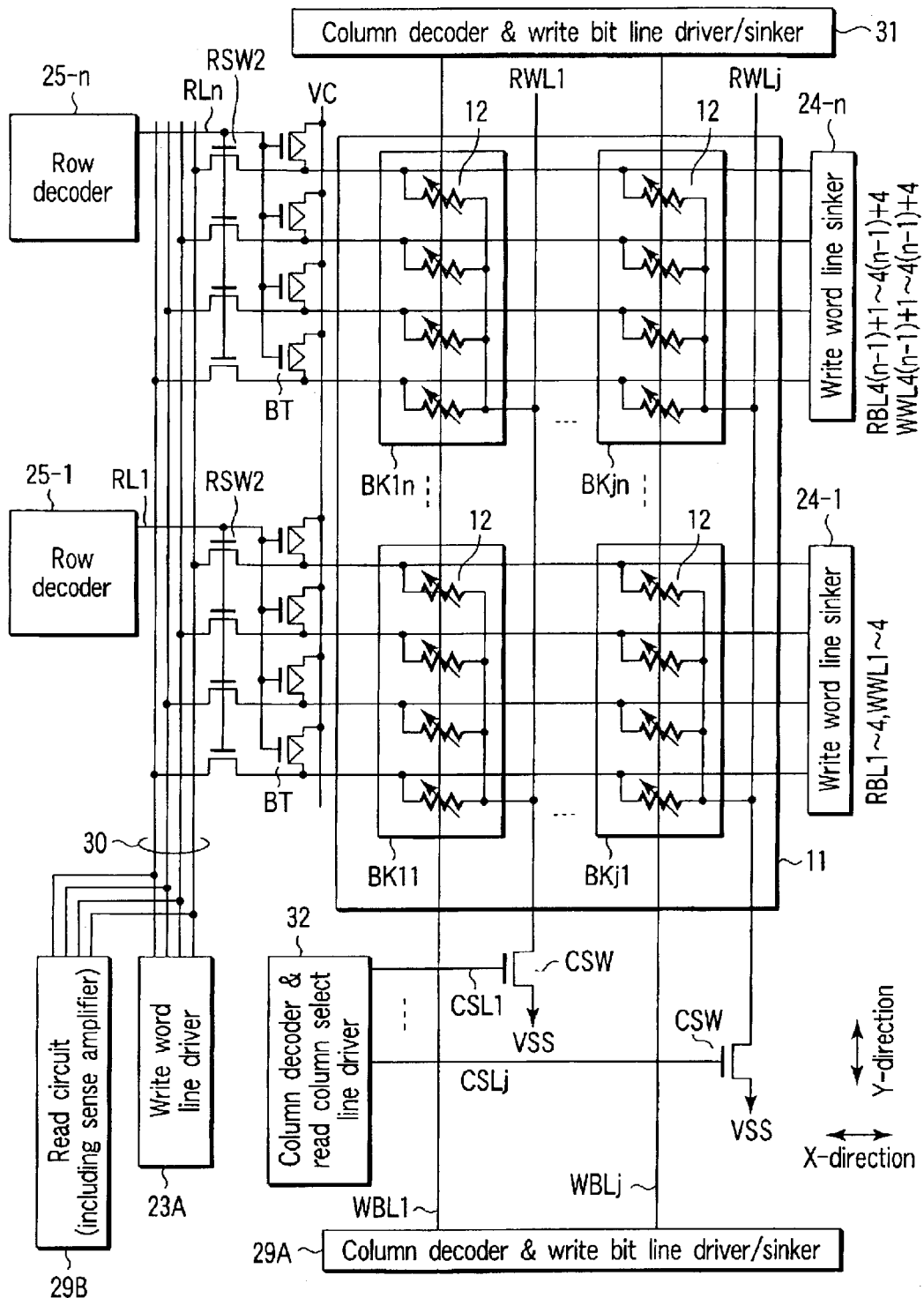
F I G. 111

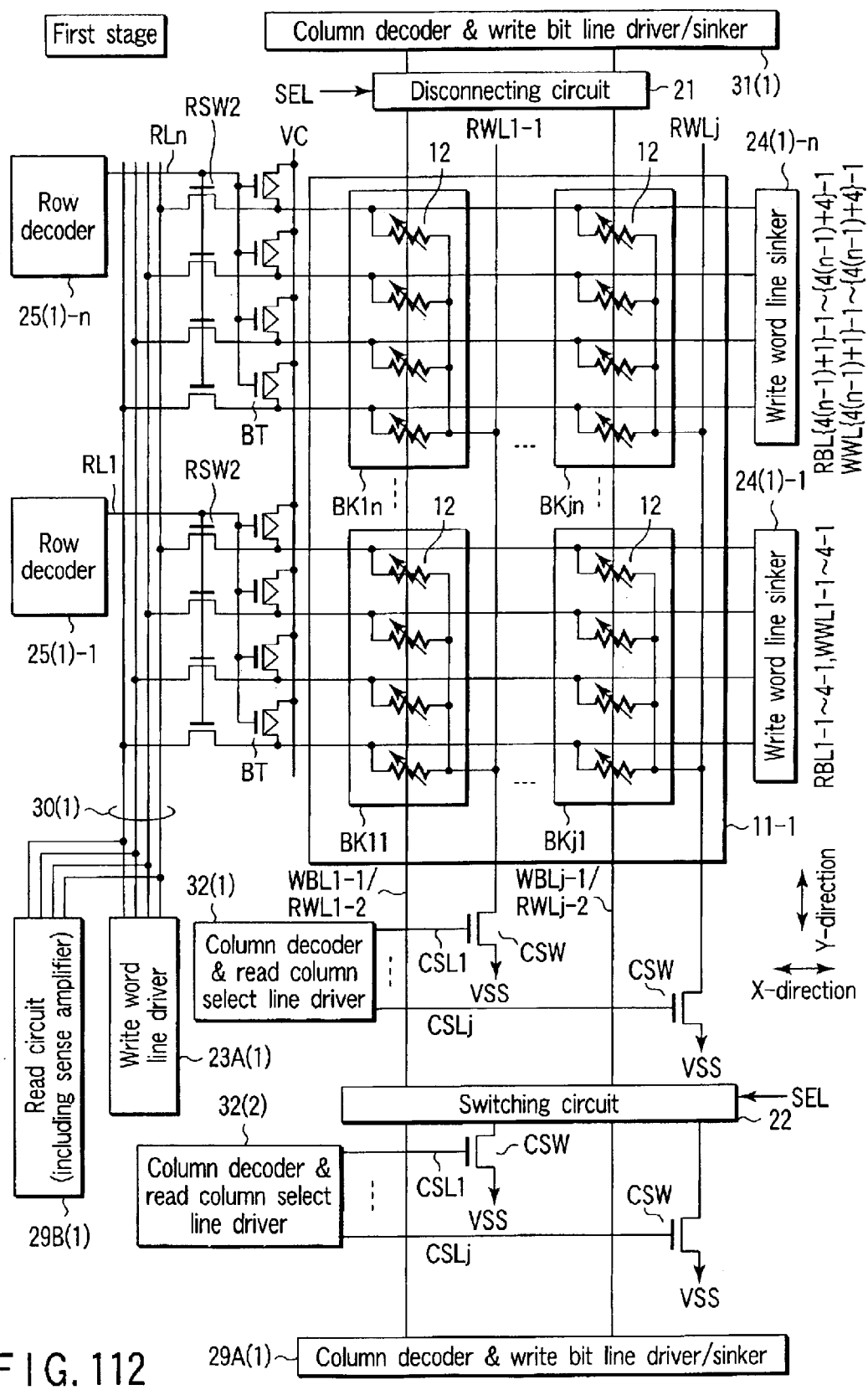
F I G. 112

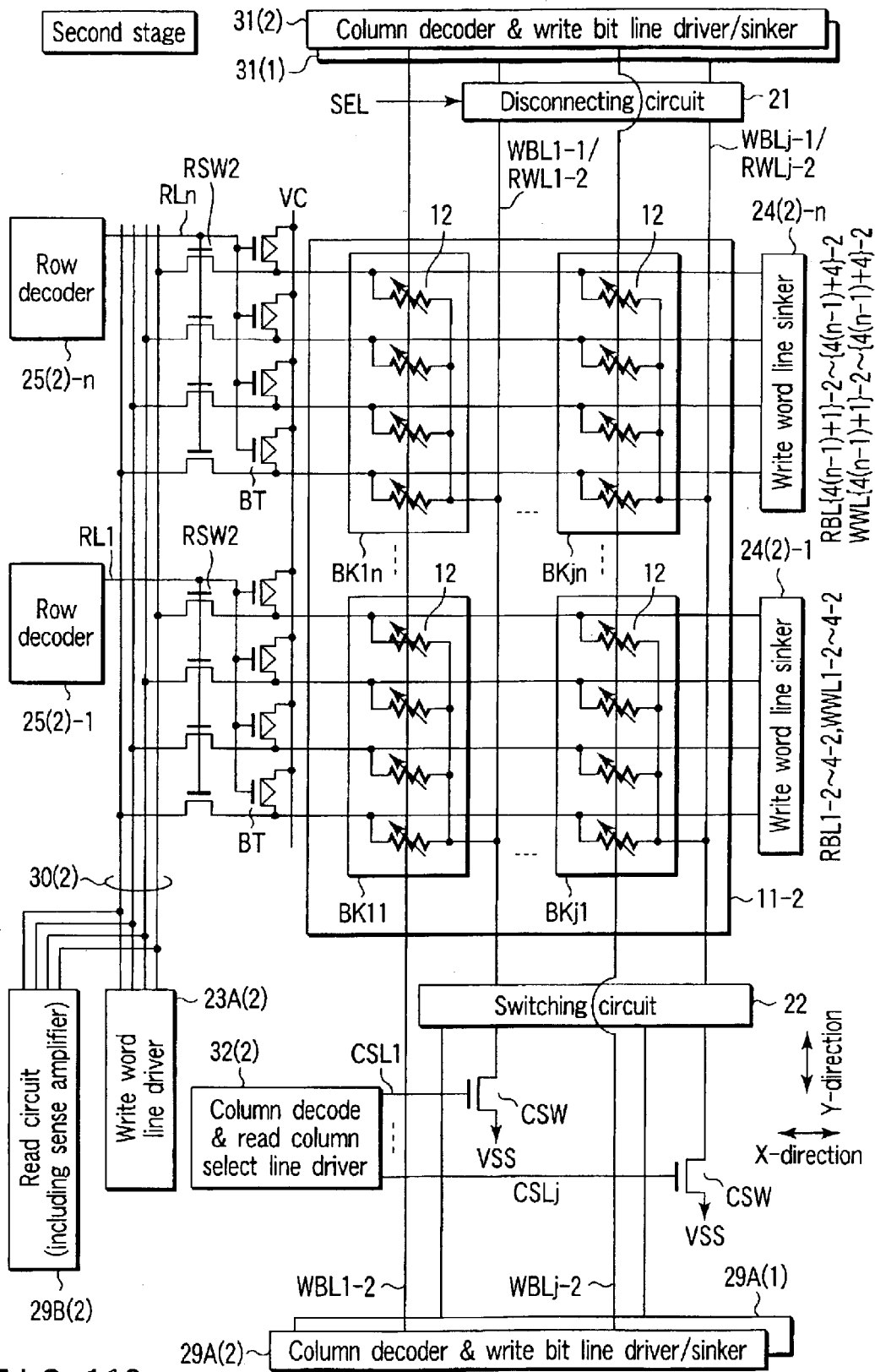
F I G. 113

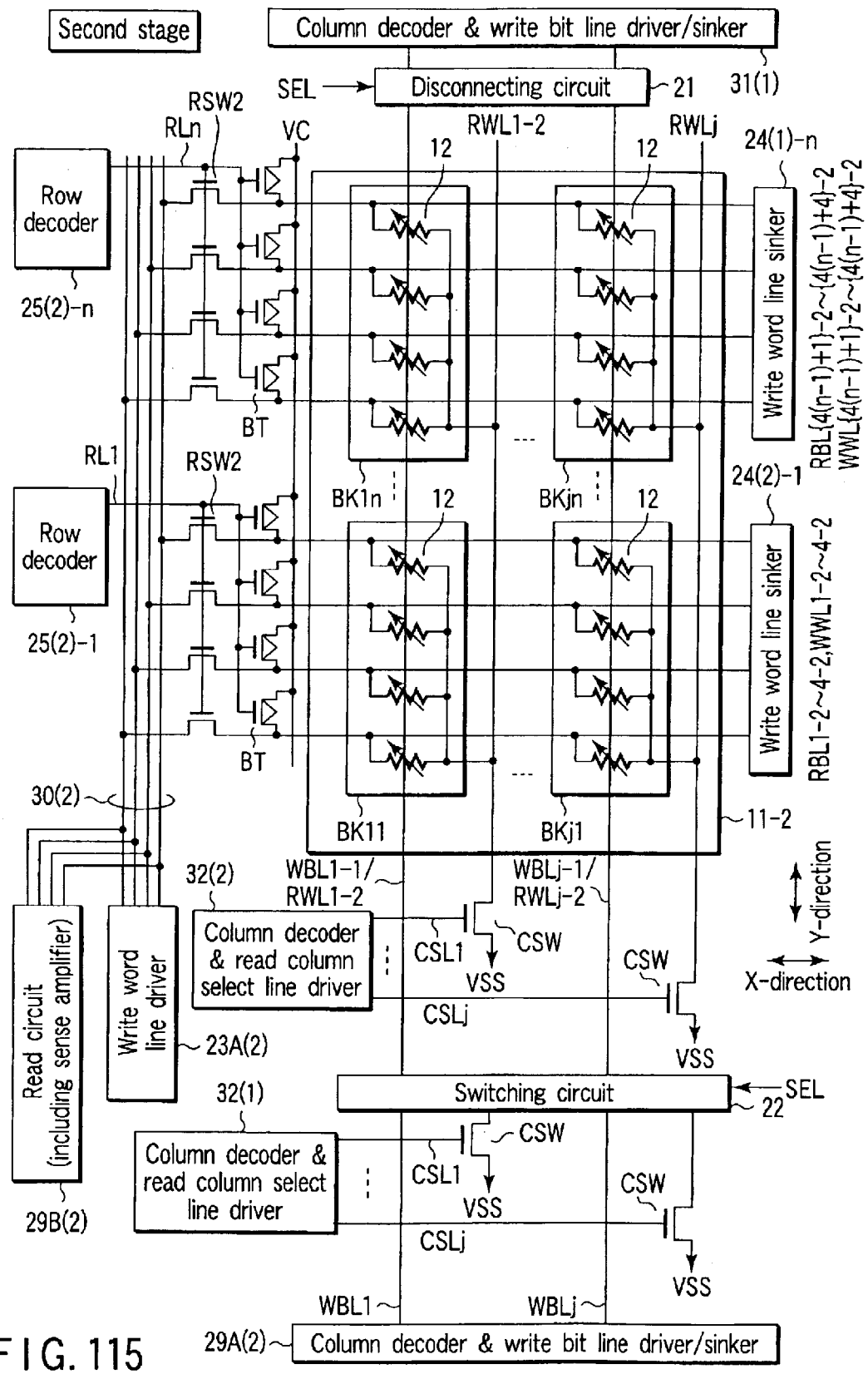
F I G. 115

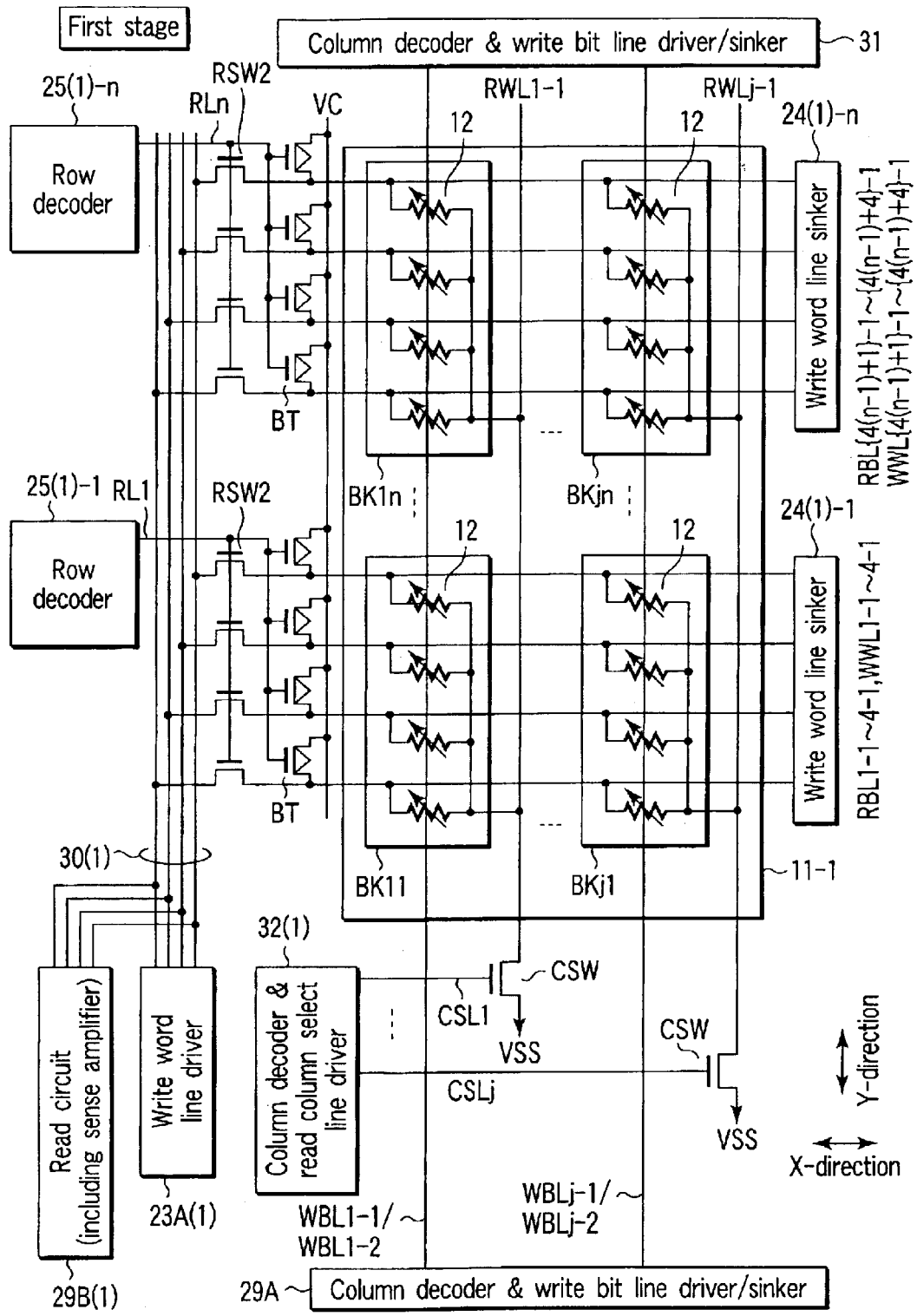
F I G. 116

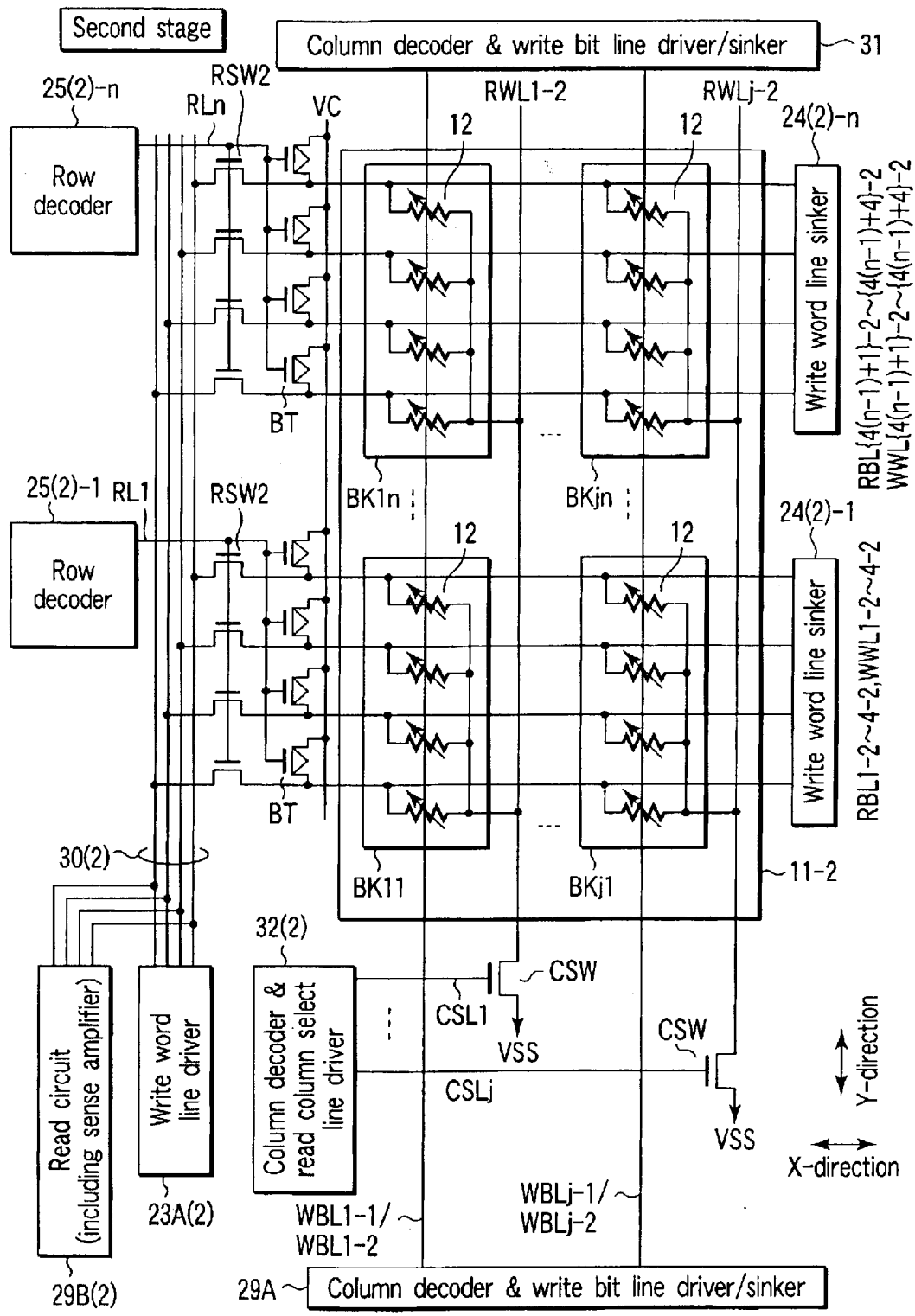
F I G. 117

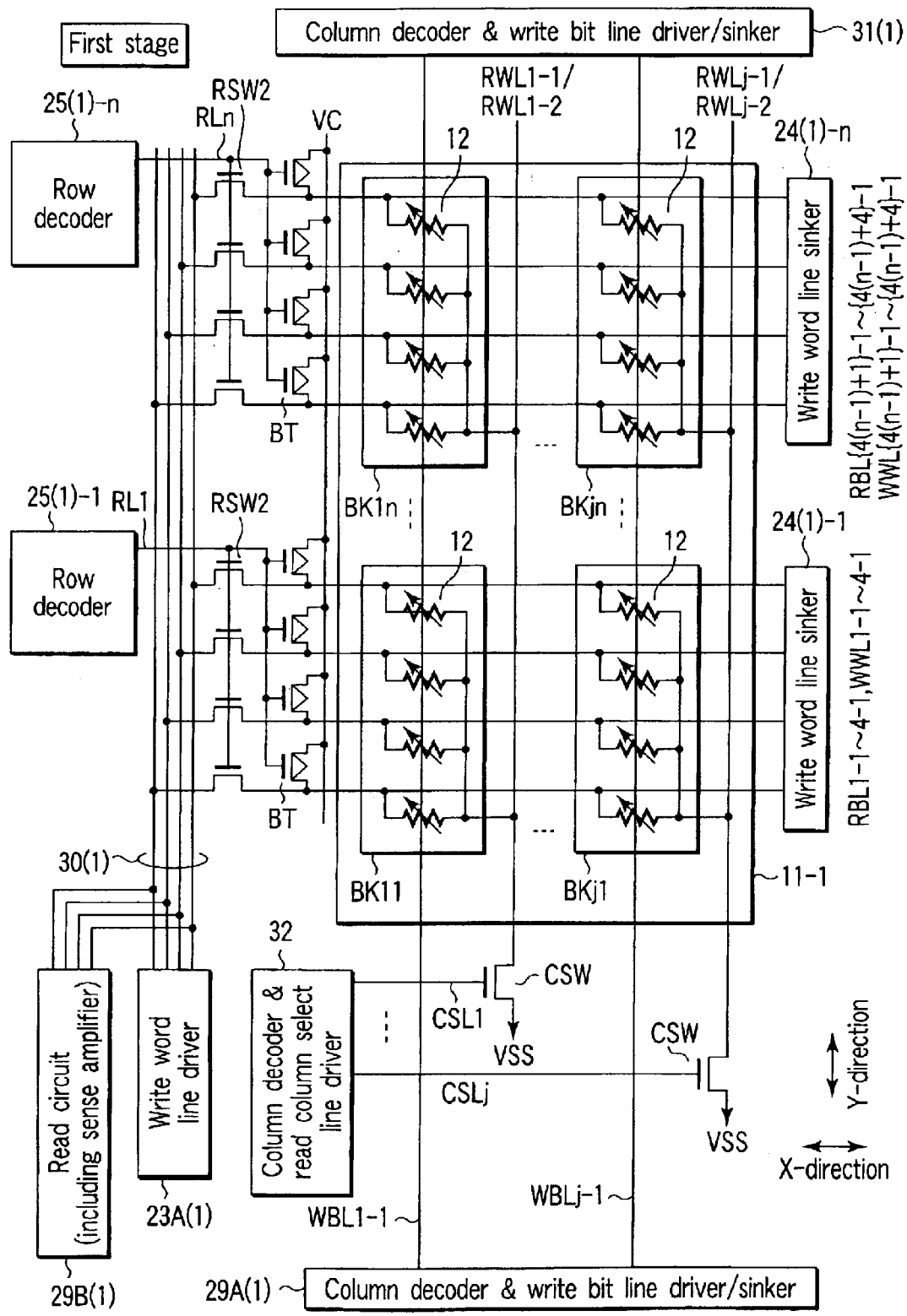
F I G. 118

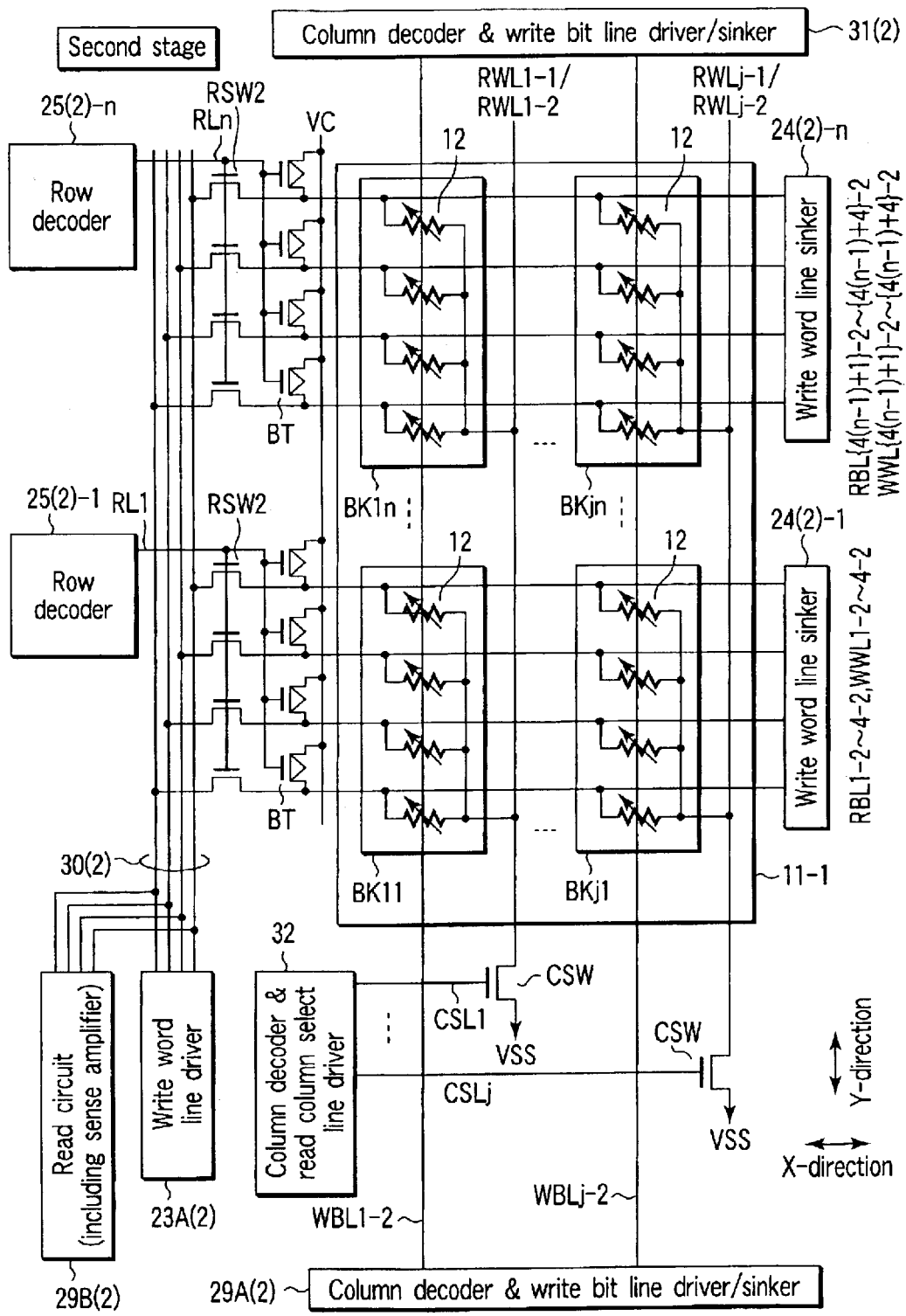
F I G. 119

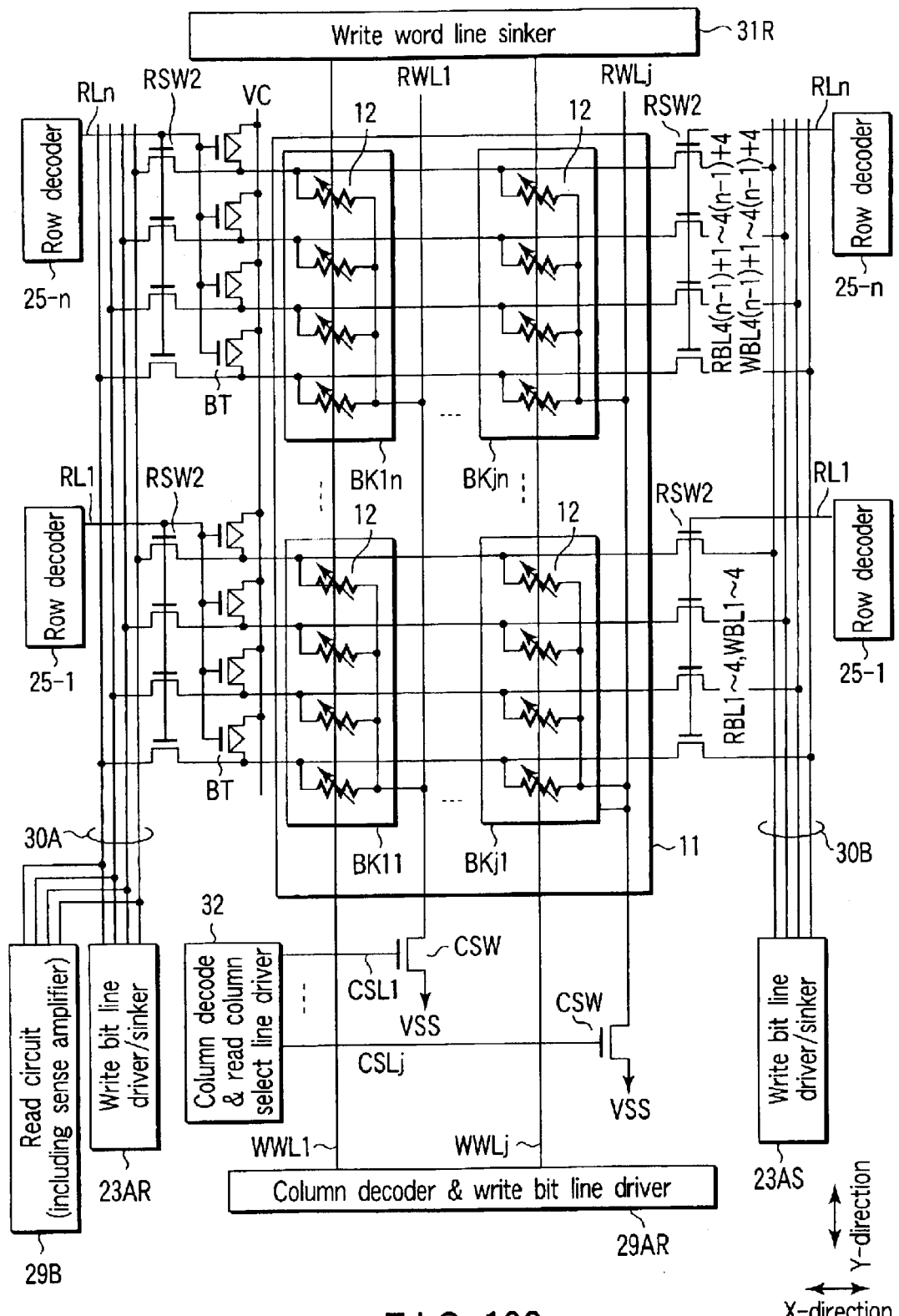
F I G. 120

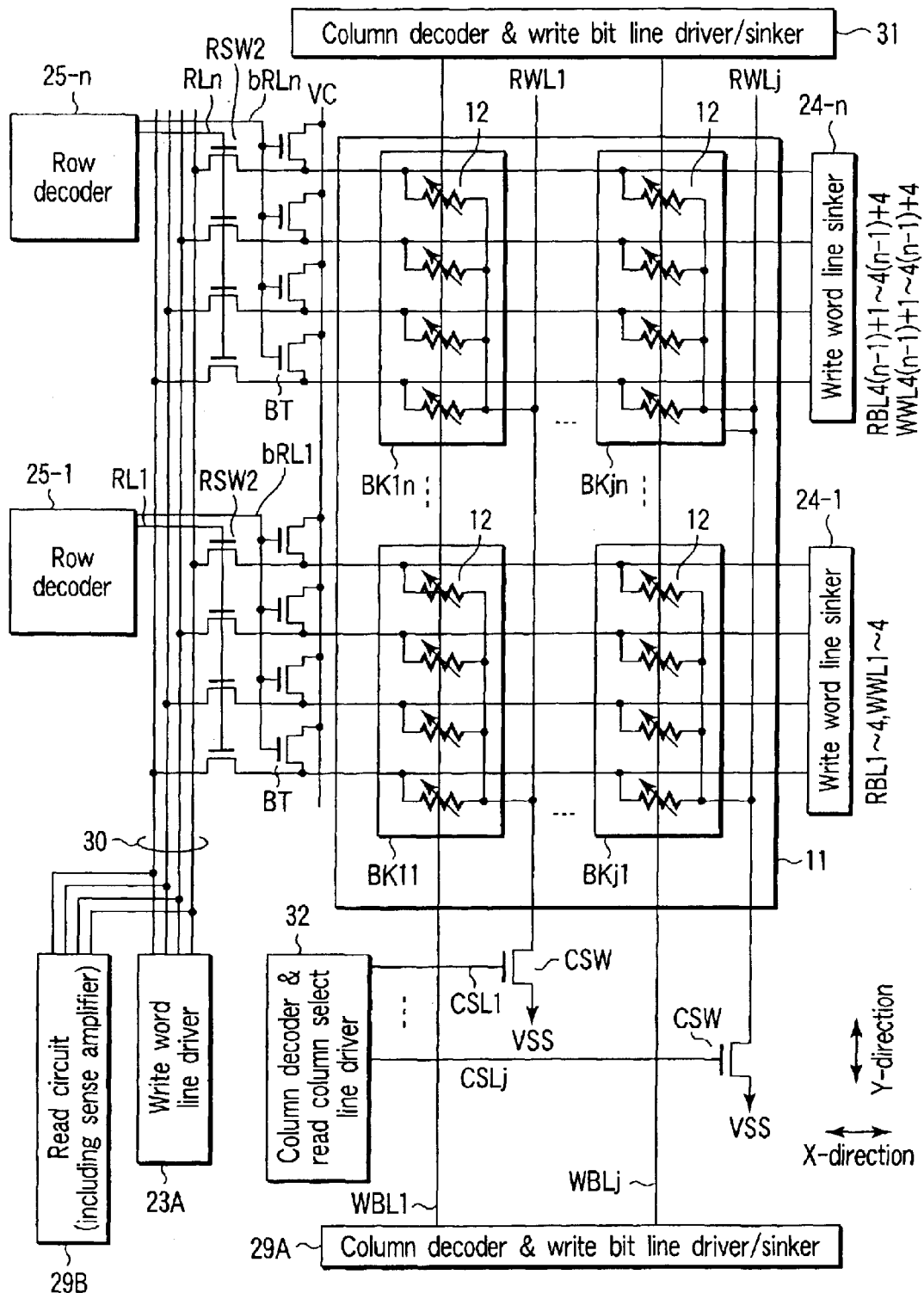
F I G. 121

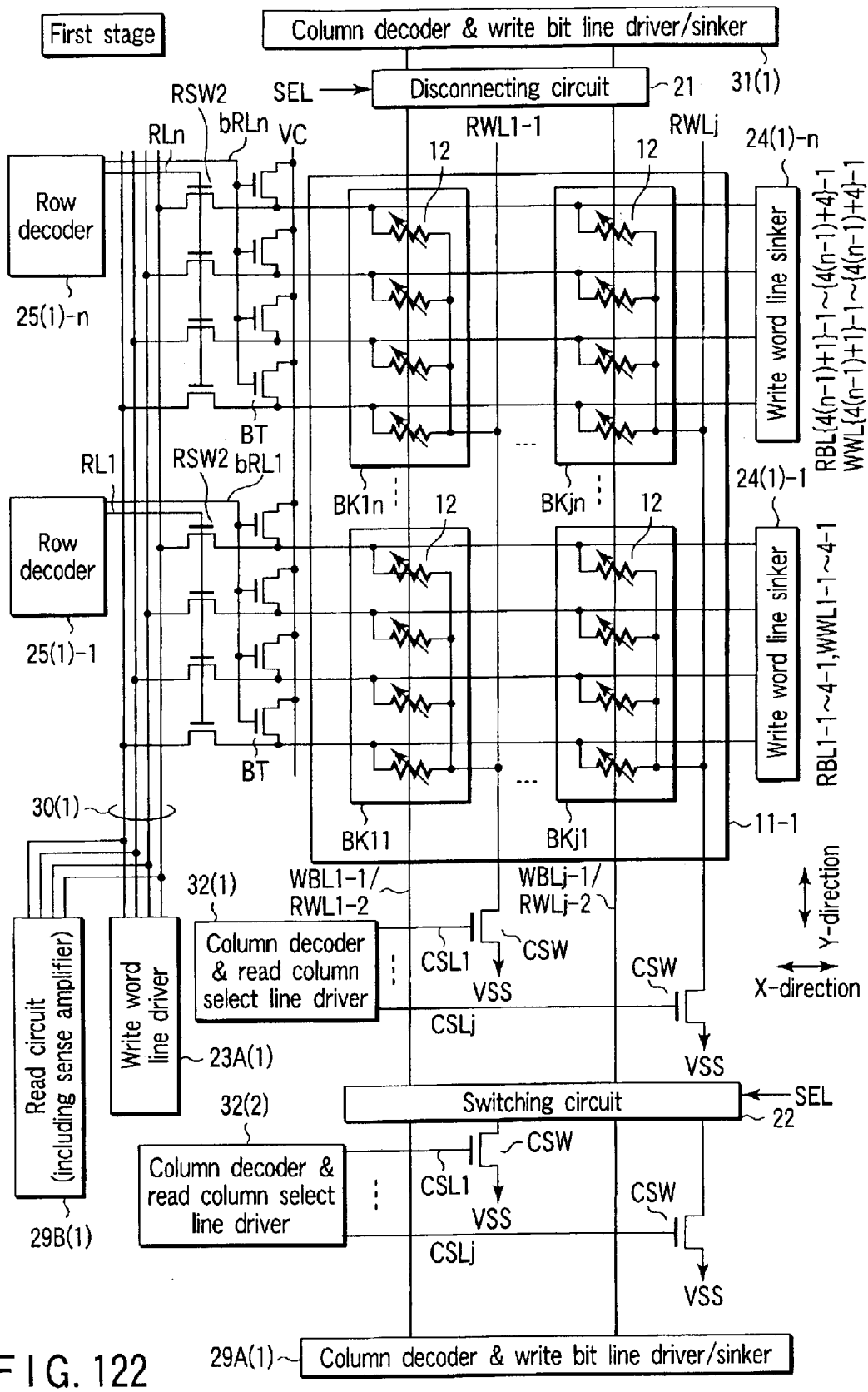
F I G. 122

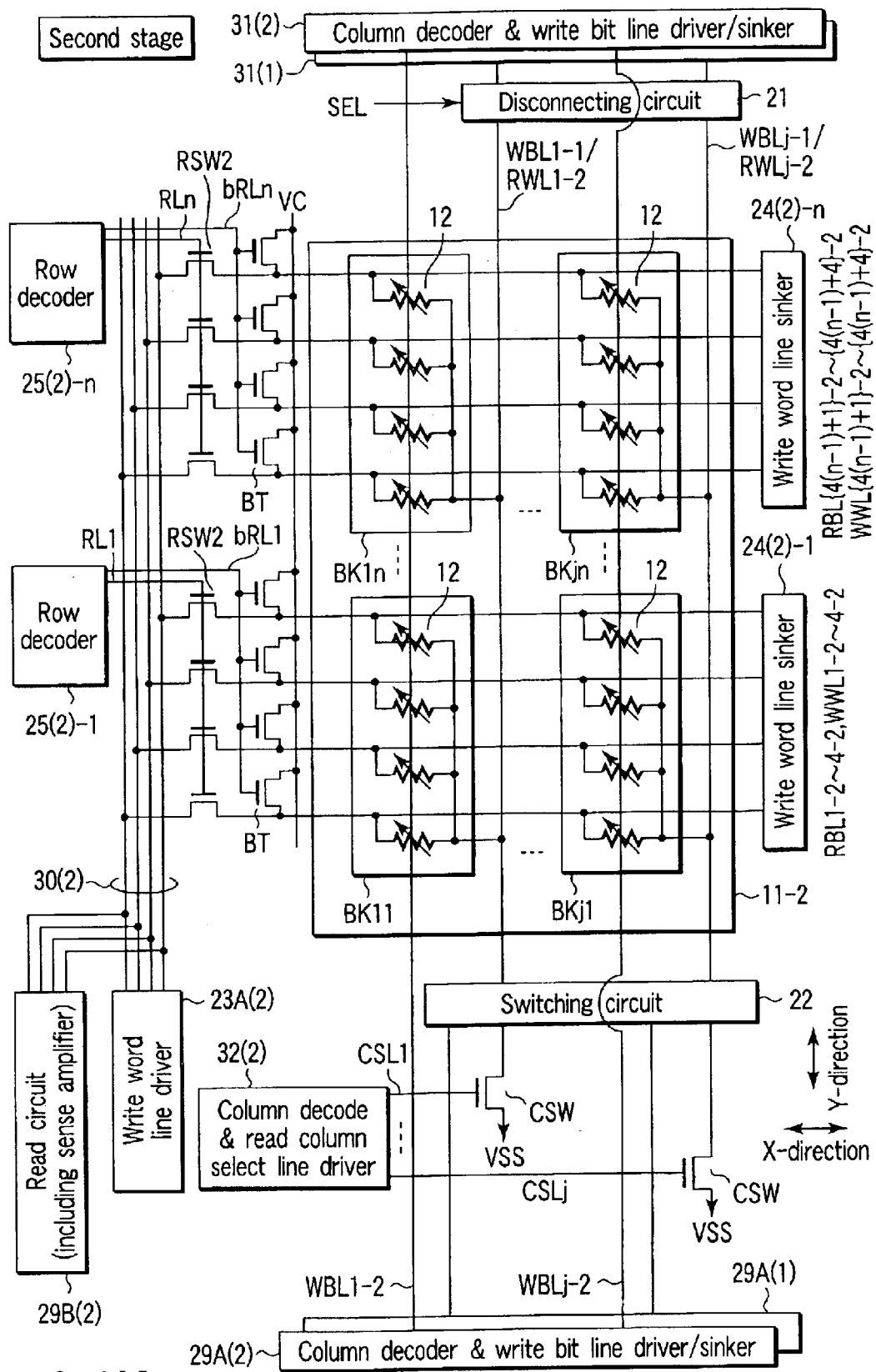
F I G. 123

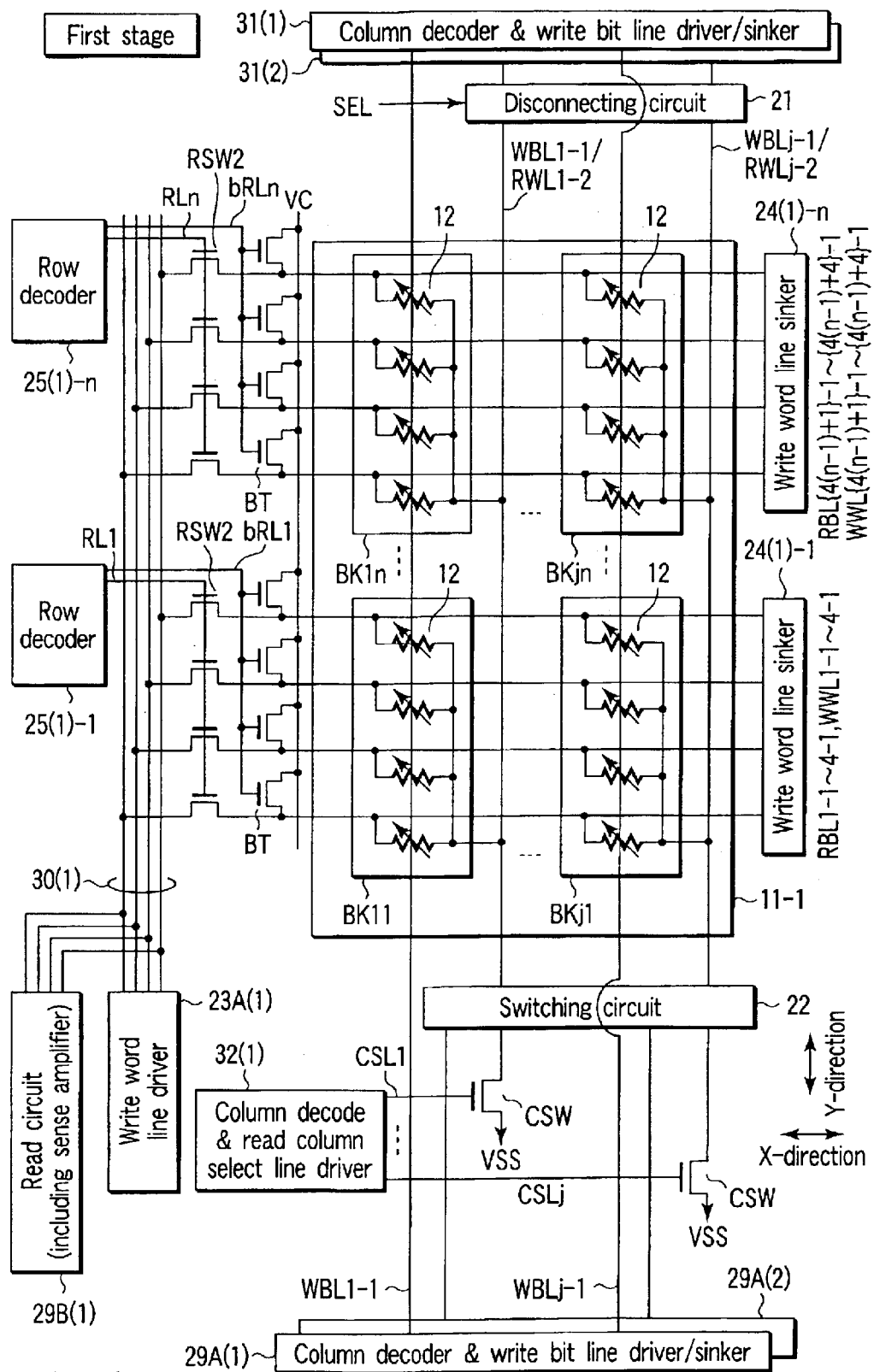
F I G. 124

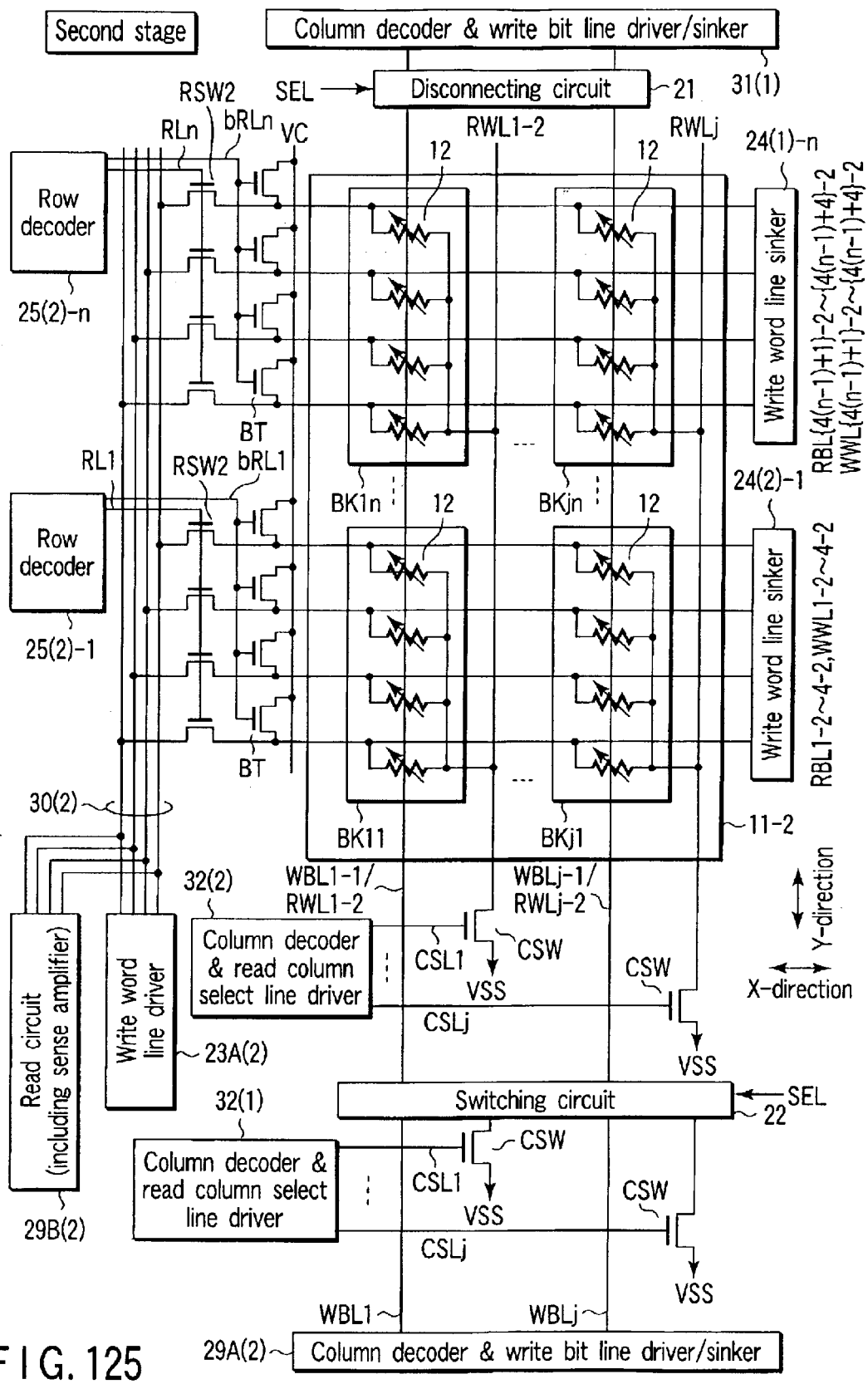
F I G. 125

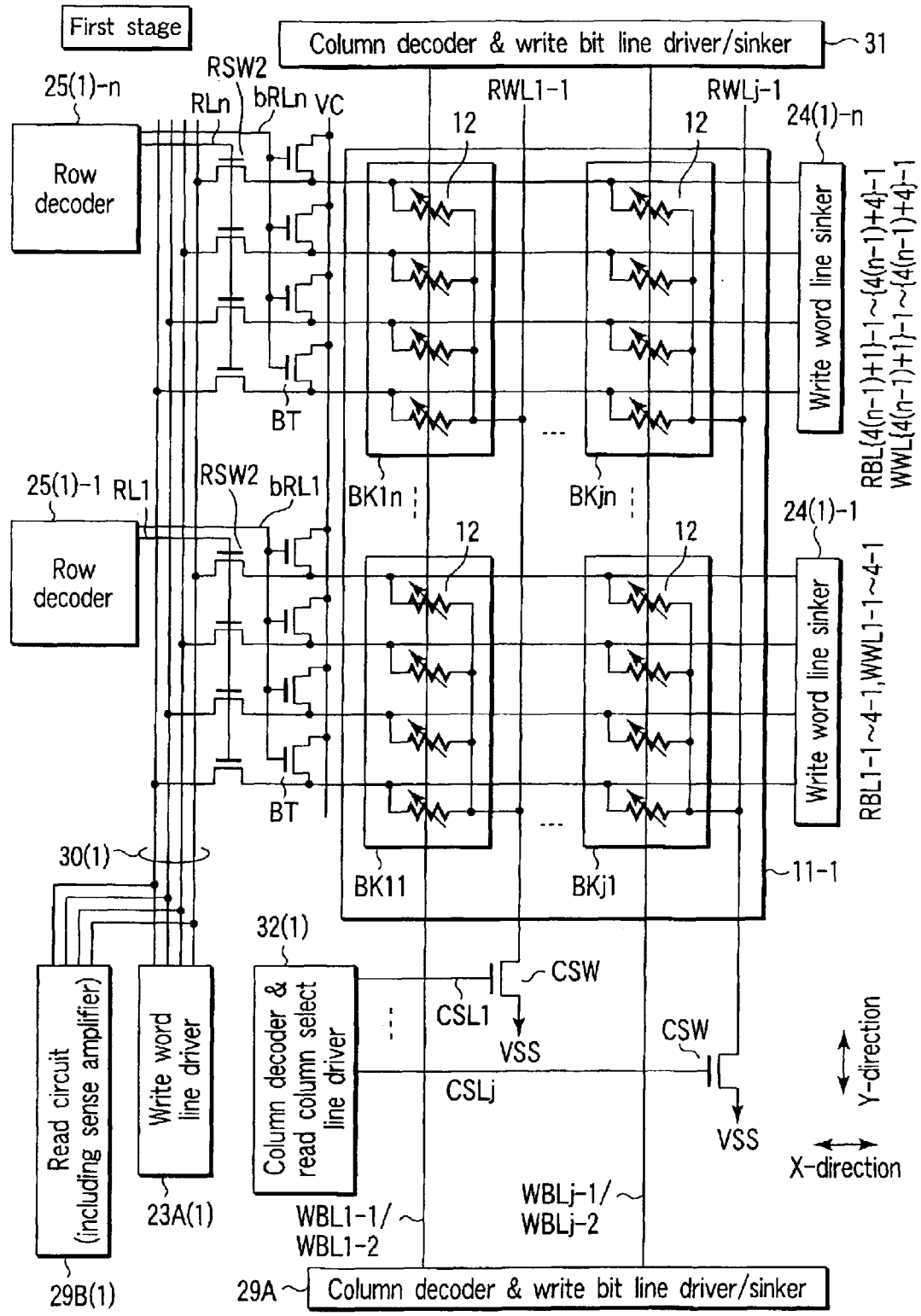
F I G. 126

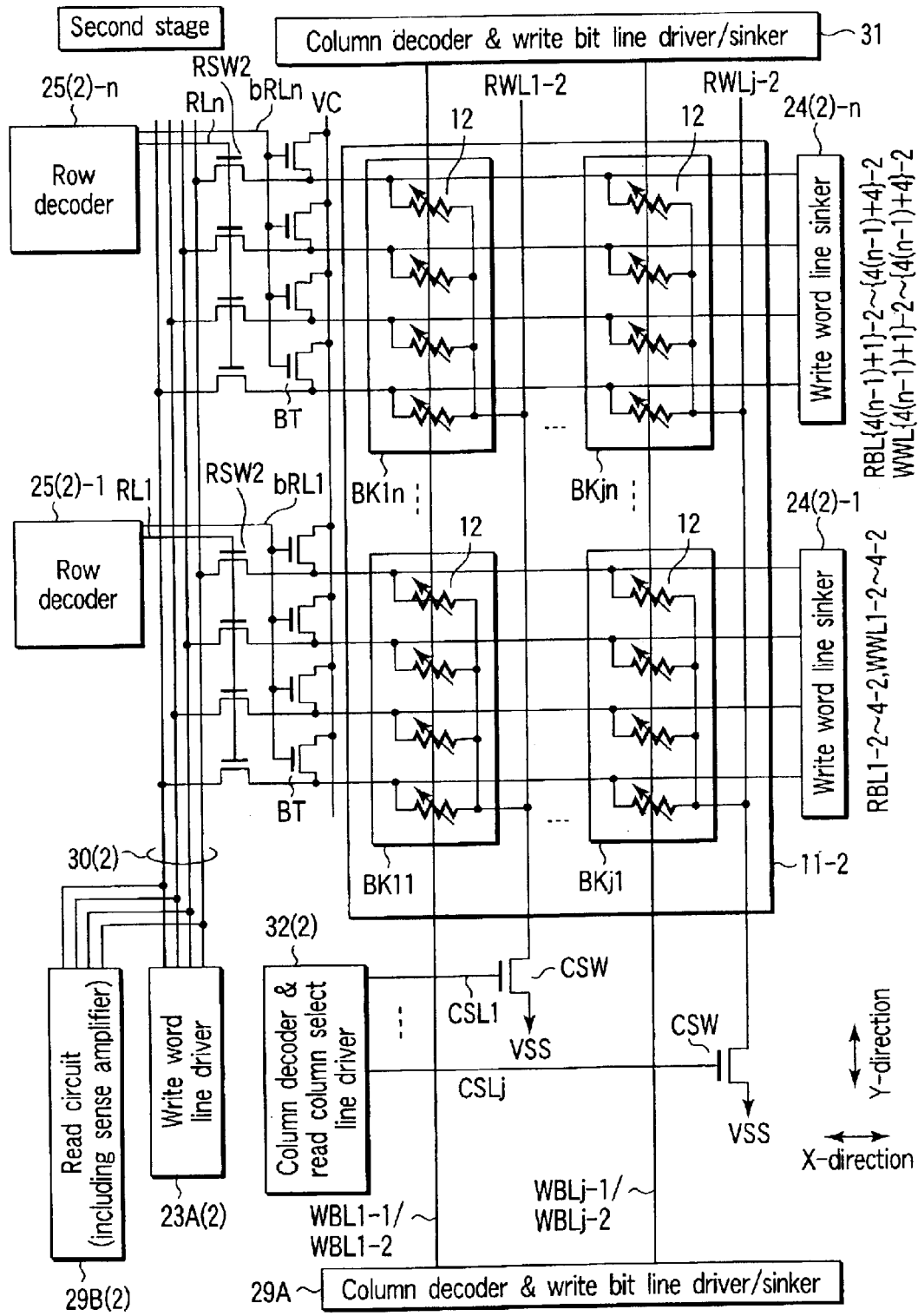
F I G. 127

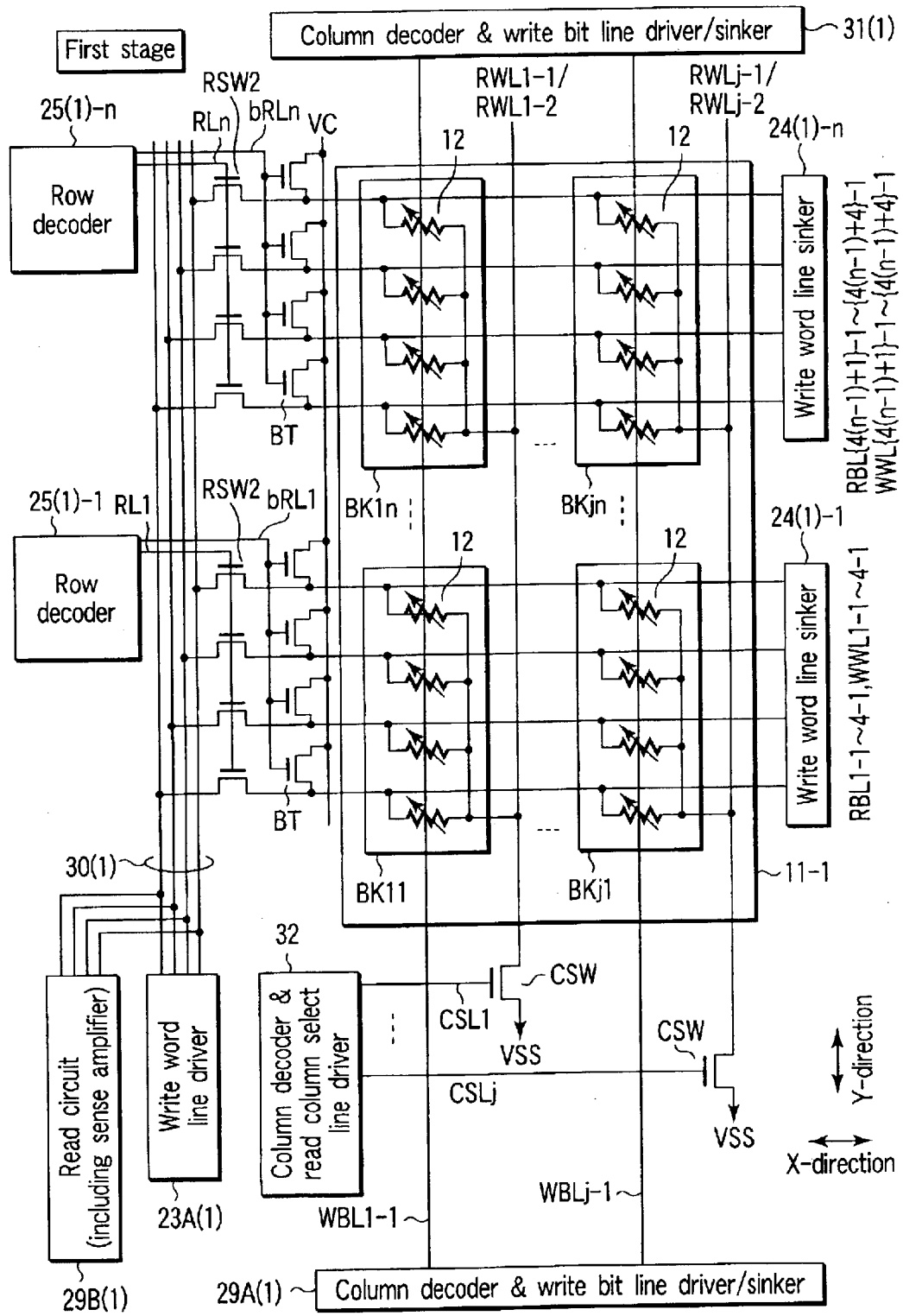
F I G. 128

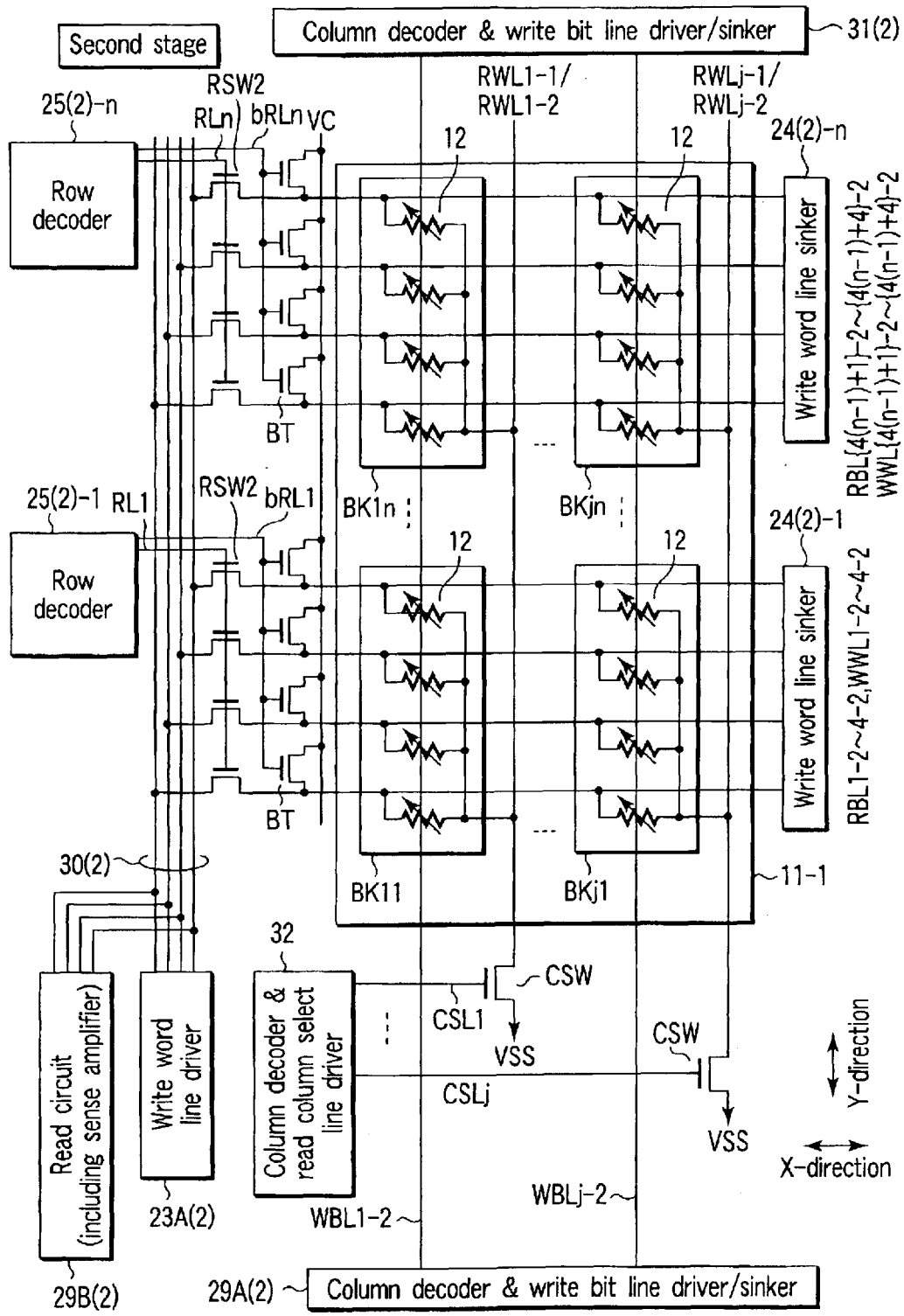
F I G. 129

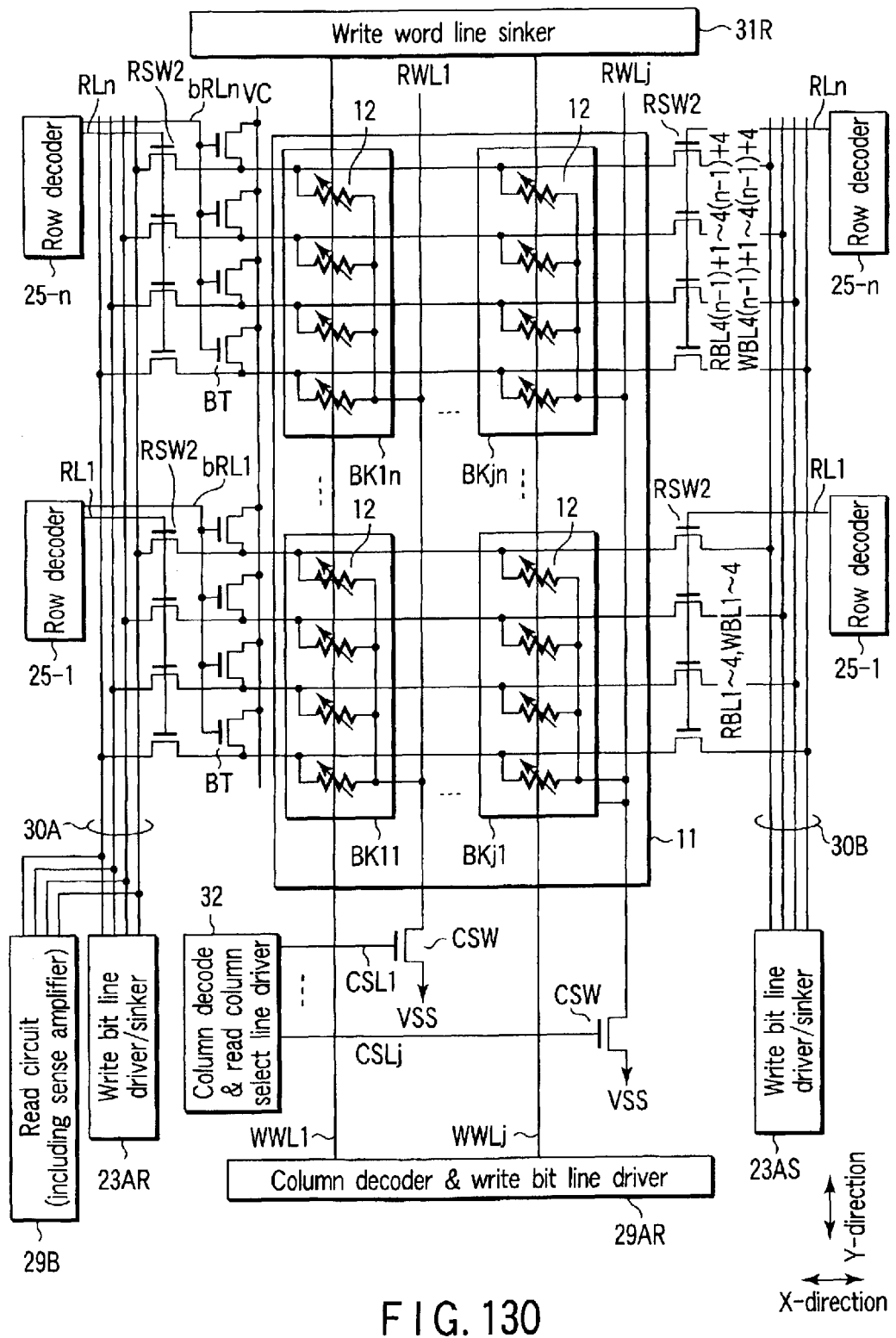
F I G. 130

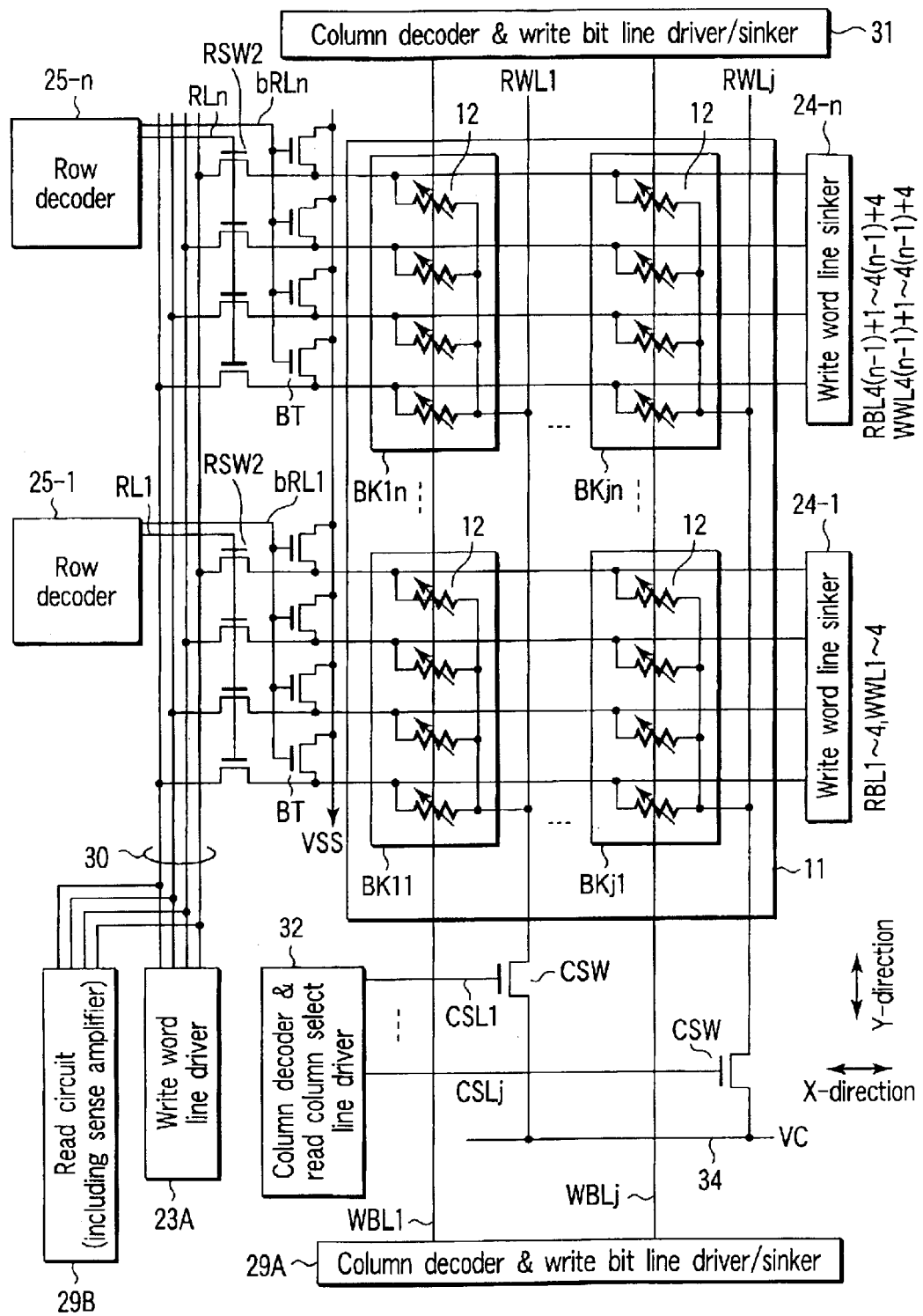
F I G. 131

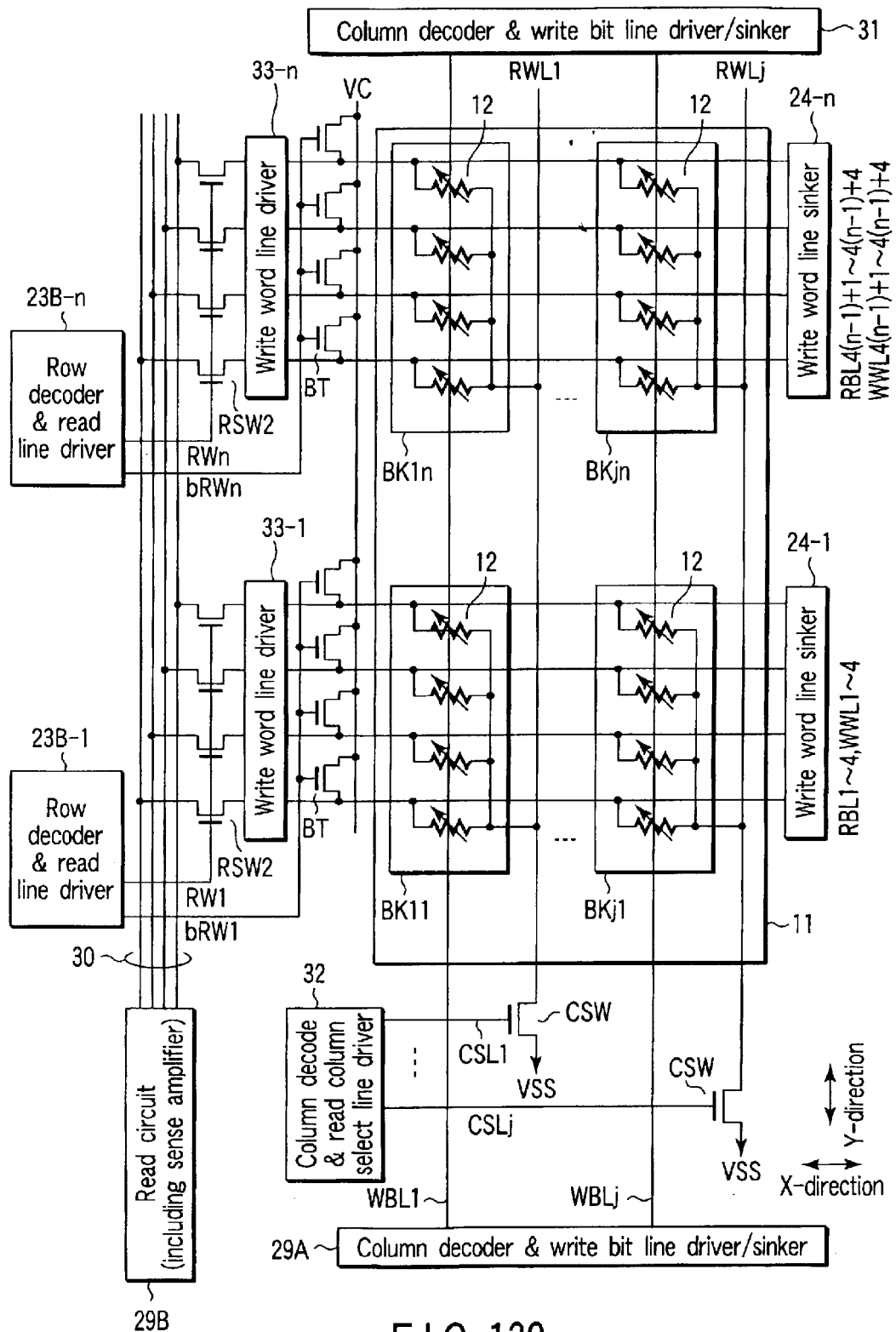
F I G. 132

MAGNETIC RANDOM ACCESS MEMORY

CROSS-REFERENCE TO RELATED APPLICATIONS

This application is based upon and claims the benefit of priority from the prior Japanese Patent Application No. 2002-46964, filed Feb. 22, 2002, the entire contents of which are incorporated herein by reference.

BACKGROUND OF THE INVENTION

1. Field of the Invention

The present invention relates to a magnetic random access memory (MRAM) which utilizes a magnetoresistive effect.

2. Description of the Related Art

In recent years, many memories which store data by new principles have been proposed. One of them is a magnetic random access memory which utilizies the tunneling magnetoresistive (to be referred to as TMR hereinafter) effect.

As a proposal for a magnetic random access memory, for example, Roy Scheuerlein et al, "A 10 ns Read and Write Non-Volatile Memory Array Using a Magnetic Tunnel Junction and FET Switch in each Cell", ISSCC2000 Technical Digest, p. 128 is known.

A magnetic random access memory stores "1"- and "0"-data using MTJ (Magnetic Tunnel Junction) elements. As the basic structure of a MTJ element, an insulating layer (tunneling barrier) is sandwiched between two magnetic layers (ferromagnetic layers). However, various kinds of MTJ element structures have been proposed to, e.g., optimize the MR (MagnetoResistive) ratio.

Data stored in the MTJ element is determined on the basis of whether the magnetizing states of the two magnetic layers are parallel or antiparallel. "Parallel" means that the two magnetic layers have the same magnetizing direction. "Antiparallel" means that the two magnetic layers have opposite magnetizing directions.

Normally, one (fixed layer) of the two magnetic layers has an antiferromagnetic layer. The antiferromagnetic layer serves as a member for fixing the magnetizing direction of the fixed layer. In fact, data ("1" or "0") stored in the MTJ element is determined by the magnetizing direction of the other (free layer) of the two magnetic layers.

When the magnetizing states in the MTJ element are parallel, the tunneling resistance of the insulating layer (tunneling barrier) sandwiched between the two magnetic layers of the MTJ element is minimized. For example, this state is defined as a "1"-state. When the magnetizing states in the MTJ element are antiparallel, the tunneling resistance of the insulating layer (tunneling barrier) sandwiched between the two magnetic layers of the MTJ element is maximized. For example, this state is defined as a "0"-state.

Currently, various kinds of cell array structures have been examined for a magnetic random access memory from the viewpoint of increasing the memory capacity or stabilizing write/read operation.

For example, currently, a cell array structure in which one memory cell is formed from one MOS transistor and one MTJ element is known. Additionally, a magnetic random access memory which has such a cell array structure and stores 1-bit data using two memory cell arrays so as to realize stable read operation is also known.

However, in these magnetic random access memories, it is difficult to increase the memory capacity. This is because one MOS transistor corresponds to one MTJ element in these cell array structures.

As a magnetic random access memory which needs no MOS transistors in the memory cell array, a cross-point cell array structure is conventionally known. A cross-point cell array structure has a simple structure with an MTJ element being arranged at the inter-connection of a word line and a bit line. As a characteristic feature, no select transistor is arranged in the memory cell array.

According to the cross-point cell array structure, the memory cell size can be reduced because no select MOS transistors are used. As a consequence, the memory capacity can be increased.

For example, when the minimum size of design rule is defined as "F", the size of a memory cell formed from a select MOS transistor and MTJ element is $8F^2$. However, a memory cell including only an MTJ element is $4F^2$. That is, the memory cell including only an MTJ element can realize a cell size about ½ that of the memory cell formed from a select MOS transistor and MTJ element.

However, when a magnetic random access memory is formed by employing a cross-point cell array structure, there is posed a problem of breakdown of the insulting layer (tunneling barrier layer) of a TMR (MTJ) element in write operation.

More specifically, in the cross-point cell array structure, an MTJ element is arranged at the intersection of a word line and a bit line while being in contact with them. Write currents having the same value are supplied to the word line and bit line (the directions of the write currents supplied to the word line and bit line change in accordance with the data value) to generate a magnetic field. The direction of magnetization of the MTJ element arranged between the word line and the bit line is thus determined.

The word line and bit line have interconnection resistances. The value of the interconnection resistance across the word line and bit line increases as they become long. That is, when the write current is flowing, the potential at a position close to the driver of the word line or bit line is higher than that at a position close to the sinker of the word line or bit line.

Hence, in write operation, a potential difference may be generated across the MTJ element in accordance with its position. This potential difference may cause voltage stress on the tunneling barrier layer of the MTJ element and then dielectric breakdown of the tunneling barrier layer.

This problem will be described in detail.

An MTJ element (worst case) which is arranged at a position closest to a word line driver WD (farthest from a word line sinker WS) and closest to a bit line sinker BS (farthest from a bit line driver BD), as shown in FIG. 107, will be examined.

The potential at the word-line-side end portion of the MTJ element is, e.g., Vp because the end portion is in contact with the word line at a position closest to the word line driver WD. On the other hand, the potential at the bit-line-side end portion of the MTJ element is, e.g., Vp-α because the end portion is in contact with the bit line at a position farthest from the bit line driver BD, and a voltage drop occurs due to an interconnection resistance r of the bit line.

That is, the potential of the bit-line-side end portion of the MTJ element is lower than that of the word-line-side end portion by α. As a result, the potential difference α is generated across the MTJ element arranged at the closest to the word line driver WD and bit line sinker BS.

Assume that dielectric breakdown of the tunneling barrier layer is caused by an electric field more than 10 [MV/cm] at a very high probability.

When the sheet resistance of the word line and bit line is 100 [mΩ], and the size of the memory cell array is 1750 (1.75 kilo) cells×1750 (1.75 kilo) cells, the interconnection resistance r from one end to the other end of the word line or bit line is as follows.

In the cross-point cell array structure, memory cells are arranged along the word lines and bit lines from one end to the other end of each of them. When a memory cell has a minimum process size (design rule) in the direction in which the word line or bit line runs, the pitch between the memory cells in that direction is also set to the minimum process size (pitch).

That is, the length of a word line or bit line corresponds to an array of 1750×2 memory cells. Hence, the interconnection resistance r from one end to the other end of the word line or bit line is 350 [Ω] (when the memory cell array becomes large, the word lines and bit lines become long, and the interconnection resistance r increases).

When the interconnection resistance r is 350 [Ω], and a write current Ip is 2 [mA], a potential difference of 0.7 (=0.002×350) [V] is generated across each of the word lines and bit lines.

When the thickness of the tunneling barrier layer of the MTJ element (when the MTJ element has a plurality of tunneling barrier layers, the total thickness of the tunneling barrier layers) is 0.7 [nm], and the potential difference across the MTJ element is 0.7 [V], an electric field of 10 [MV/cm] is generated in the MTJ element.

To avoid dielectric breakdown of the tunneling barrier layer under the above conditions, the size of one memory cell array surrounded by the word line driver/sinker and bit line driver/sinker must be set to 1.75 kilo×1.75 kilo or less.

As described above, in the cross-point cell array structure, when dielectric breakdown of the tunneling barrier layer of the MTJ element in write operation is taken into consideration, the upper limit of the memory cell array size is determined. Hence, the degree of integration of MTJ elements cannot be sufficiently increased.

In addition, the write current Ip does not always flow to the word line or bit line. The write current Ip is supplied to the word line or bit line only in the write operation. That is, the potential at a position closest to the word line or bit line sometimes exceeds Vp due to overshoot phenomenon.

In consideration of this overshoot phenomenon, an electric field more than 10 [MV/cm] may be generated in the MTJ element under the above conditions.

Assume that the sheet resistance of the word line and bit line, the write current Ip, and the thickness of the tunneling barrier layer are constant. In this case, to avoid probable generation of an electric field more than 10 [MV/cm] in the MTJ element at a high possibility, the memory cell array size must be further reduced to decrease the voltage drop amount due to the interconnection resistance r of the word line or bit line.

For example, overshoot of the potential on the word line or bit line will be examined under the above conditions. The upper limit size of one memory cell array must be decreased from 3 mega (=1.75 kilo×1.75 kilo) to 1.5 mega.

A clamp circuit which clamps the potential of the word line or bit line may be newly arranged as a peripheral circuit of the memory cell array to prevent the overshoot/undershoot phenomenon.

In this case, however, the size of the peripheral circuits increases as the clamp circuit is added. In addition, the clamp circuit has a function of suppressing abrupt increase/decrease in potential of the word line or bit line. For this reason, changing the potential of the word line or bit line to Vp takes a long time, resulting in a decrease in write speed.

BRIEF SUMMARY OF THE INVENTION

A magnetic random access memory according to a first example of the present invention comprises a memory cell array having memory cells which utilizes a magnetoresistive effect, a first functional line which runs in a first direction in the memory cell array and is commonly connected to one terminal of each of the memory cells, second functional lines which are arranged in correspondence with the memory cells and run in a second direction perpendicular to the first direction in the memory cell array, and a third functional line which is separated from the memory cells and shared by the memory cells. The other terminal of each of the memory cells is independently connected to one of the second functional lines, and one terminal of each of the memory cells is directly connected to the first functional line.

A magnetic random access memory according to a second example of the present invention comprises a memory cell array having a memory cell which utilizes a magnetoresistive effect, a first functional line which runs in a first direction in the memory cell array and is connected to one terminal of the memory cell, a second functional line which runs in a second direction perpendicular to the first direction in the memory cell array and is connected to the other terminal of the memory cell, and a third functional line which is separated from the memory cell and generates a magnetic field to write data in the memory cell. One terminal of the memory cell is directly connected to the first functional line, and the other terminal of the memory cell is directly connected to the second functional line.

A read method of a magnetic random access memory according to a third example of the present invention comprises fixing all the second functional lines to a first potential, setting the first functional line to a second potential different from the second potential, individually supplying a read current to the memory cells, and reading out data from the memory cells on the basis of a value of the read current.

A write method of a magnetic random access memory according to a fourth example of the present invention comprises supplying a first write current flowing in one direction to one of the second functional lines, supplying a second write current having a direction depending on write data to the third functional line, and writing the write data in one of the memory cells using a magnetic field generated by the first and second write currents.

A write method of a magnetic random access memory according to a fifth example of the present invention comprises supplying a first write current having a direction depending on write data to one of the second functional lines, supplying a second write current flowing in one direction to the third functional line, and writing the write data in one of the memory cells using a magnetic field generated by the first and second write currents.

A manufacturing method of a magnetic random access memory according to a sixth example of the present invention comprises the first step of forming a gate electrode of a MOS transistor in a peripheral circuit region and simultaneously forming, in a memory cell array region, dummy interconnections equidistantly, periodically, or in a layout uniform as a whole, the second step of forming a first interlayer dielectric film which covers the MOS transistor and dummy interconnections, the third step of forming a memory cell having a magnetoresistive effect in a surface region of the first interlayer dielectric film in the memory cell array region, and the fourth step of forming a second interlayer dielectric film which covers the memory cell.

BRIEF DESCRIPTION OF THE SEVERAL VIEWS OF THE DRAWING

FIG. 25 is a circuit diagram showing the magnetic random access memory according to Structural Example 4 of the present invention;

FIG. 34 is a circuit diagram showing a magnetic random access memory according to Structural Example 5 of the present invention;

FIG. 45 is a circuit diagram showing the magnetic random access memory according to Structural Example 6 of the present invention;

FIG. 51 is a plan view showing a device structure according to Structural Example 6;

FIG. 52 is a plan view showing a device structure according to Structural Example 6;

FIG. 53 is a circuit diagram showing a magnetic random access memory according to Structural Example 7 of the present invention;

FIG. 59 is a circuit diagram showing a magnetic random access memory according to Structural Example 9 of the present invention;

FIG. 61 is a view showing a structural example of an MTJ element;

FIG. 62 is a view showing a structural example of the MTJ element;

FIG. 63 is a view showing a structural example of the MTJ element;

FIG. 64 is a view showing a circuit example of a write word line driver/sinker;

FIG. 68 is a view showing a circuit example of a write bit line driver/sinker;

FIG. 69 is a view showing a circuit example of a write bit line driver/sinker;

FIG. 70 is a view showing a circuit example of a column decoder & write word line driver/sinker;

FIG. 71 is a view showing a circuit example of a row decoder;

FIG. 87 is a view showing MTJ elements arranged symmetrically with respect to a write line;

FIG. 88 is a view showing MTJ elements arranged symmetrically with respect to a write line;

FIG. 97 is a sectional view showing a step in manufacturing according to the example of the present invention;

FIG. 98 is a sectional view showing a step in manufacturing according to the example of the present invention;

FIG. 99 is a sectional view showing a step in manufacturing according to the example of the present invention;

FIG. 100 is a sectional view showing a step in manufacturing according to the example of the present invention;

FIG. 101 is a sectional view showing a step in manufacturing according to the example of the present invention;

FIG. 102 is a sectional view showing a step in manufacturing according to the example of the present invention;

FIG. 103 is a sectional view showing a step in manufacturing according to the example of the present invention;

FIG. 106 is a sectional view showing a step in manufacturing according to the example of the present invention;

FIG. 107 is a view showing a problem of a cross-point cell array structure;

FIG. 108 is a circuit diagram showing a magnetic random access memory according to Modification example of Structural Example 8;

FIG. 111 is a circuit diagram showing a magnetic random access memory according to Structural Example 12 of the present invention;

FIG. 112 is a circuit diagram showing a magnetic random access memory according to Structural Example 12 of the present invention;

FIG. 113 is a circuit diagram showing a magnetic random access memory according to Structural Example 12 of the present invention;

FIG. 115 is a circuit diagram showing a magnetic random access memory according to Structural Example 12 of the present invention;

FIG. 116 is a circuit diagram showing a magnetic random access memory according to Structural Example 12 of the present invention;

FIG. 117 is a circuit diagram showing a magnetic random access memory according to Structural Example 12 of the present invention;

FIG. 118 is a circuit diagram showing a magnetic random access memory according to Structural Example 12 of the present invention;

FIG. 119 is a circuit diagram showing a magnetic random access memory according to Structural Example 12 of the present invention;

FIG. 120 is a circuit diagram showing a magnetic random access memory according to Structural Example 12 of the present invention;

FIG. 121 is a circuit diagram showing a magnetic random access memory according to Structural Example 13 of the present invention;

FIG. 122 is a circuit diagram showing a magnetic random access memory according to Structural Example 13 of the present invention;

FIG. 123 is a circuit diagram showing a magnetic random access memory according to Structural Example 13 of the present invention;

FIG. 124 is a circuit diagram showing a magnetic random access memory according to Structural Example 13 of the present invention;

FIG. 125 is a circuit diagram showing a magnetic random access memory according to Structural Example 13 of the present invention;

FIG. 126 is a circuit diagram showing a magnetic random access memory according to Structural Example 13 of the present invention;

FIG. 127 is a circuit diagram showing a magnetic random access memory according to Structural Example 13 of the present invention;

FIG. 128 is a circuit diagram showing a magnetic random access memory according to Structural Example 13 of the present invention;

FIG. 129 is a circuit diagram showing a magnetic random access memory according to Structural Example 13 of the present invention;

FIG. 130 is a circuit diagram showing a magnetic random access memory according to Structural Example 13 of the present invention;

FIG. 131 is a circuit diagram showing a magnetic random access memory according to Structural Example 14 of the present invention; and FIG. 132 is a circuit diagram showing a magnetic random access memory according to Structural Example 15 of the present invention.

DETAILED DESCRIPTION OF THE INVENTION

A magnetic random access memory according to an example of the present invention will be described below in detail with reference to the accompanying drawing.

1. Cell Array Structure

The cell array structure of the magnetic random access memory according to the example of the present invention will be described first.

As a characteristic feature of the cell array structure according to the example of the present invention, in a cell array structure in which one terminal of each of a plurality of MTJ elements which form a read block is commonly connected, and the other terminal is independently connected to a read bit line, one terminal of each of the plurality of MTJ elements is directly connected to a read word line without intervening a read select switch.

That is, no read select switch (e.g., a MOS transistor) is arranged in the read block. Consequently, a memory cell array can be formed from only MTJ elements.

According to this cell array structure, no switch element is arranged in the memory cell array. Hence, the density of MTJ elements can be increased, and the underlying layer of the MTJ elements can be planarized (the magnetoresistive value and MR ratio can be uniformed). In addition, since one of two write lines is separated from MTJ elements, no potential difference is generated across an MTJ element in write operation, unlike a cross-point cell array structure. Hence, the tunneling barrier layer of the MTJ element is not broken.

(1) STRUCTURAL EXAMPLE 1

In Structural Example 1, one read block is formed from four MTJ elements.

① Circuit Structure

The circuit structure will be described first.

Figure 1:
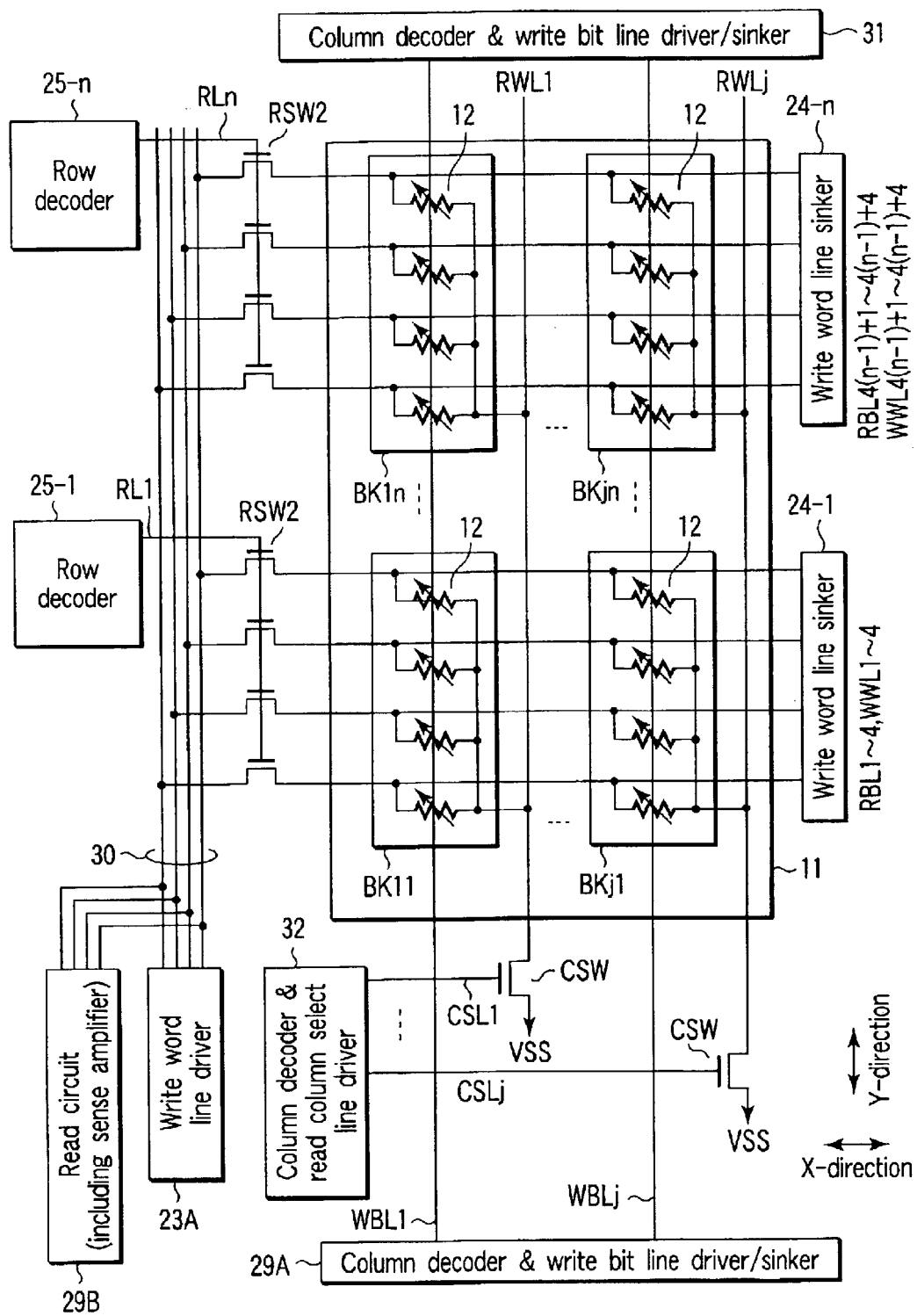
FIG. 1 is a circuit diagram showing a magnetic random access memory according to Structural Example 1 of the present invention.

FIG. 1 shows the main part of a magnetic random access memory according to Structural Example 1 of the present invention.

A memory cell array 11 has a plurality of MTJ elements 12 arranged in an array in the X- and Y-directions. For example, j MTJ elements 12 are arranged in the X-direction, and 4×n MTJ elements 12 are arranged in the Y-direction.

The four MTJ elements 12 arranged in the Y-direction form one read block BKik (i=1, . . . , j, and k=1, . . . , n). One row is constructed by j read blocks BKik arranged in the X-direction. The memory cell array 11 has n rows. In addition, one column is constructed by n read blocks BKik arranged in the Y-direction. The memory cell array 11 has j columns.

One terminal of each of the four MTJ elements 12 in the block BKik is commonly connected. The connection point is connected to, e.g., a read word line RWLi (i=1, . . . , j). The read word line RWLi runs in the Y-direction. One read word line RWLi is arranged in one column.

The MTJ elements 12 in the read blocks BKik arranged in one column are directly connected to the read word lines RWLi (i=1, . . . , j) without intervening read select switches (MOS transistors). One end of each read word line RWLi is connected to a ground point VSS through a column select switch CSW formed from, e.g., a MOS transistor.

The column select switches CSW are arranged outside the memory cell array 11. Hence, no switch elements (MOS transistors) are arranged in the memory cell array 11.

The other terminal of each of the four MTJ elements 12 in the read block BKik is independently connected to a corresponding one of read bit lines RBL4(n−1)+1, RBL4(n−1)+2, RBL4(n−1)+3, and RBL4(n−1)+4. That is, the four read bit lines RBL4(n−1)+1, RBL4(n−1)+2, RBL4(n−1)+3, and RBL4(n−1)+4 are arranged in correspondence with the four MTJ elements 12 in one read block BKik.

The read bit lines RBL4(n−1)+1, RBL4(n−1)+2, RBL4(n−1)+3, and RBL4(n−1)+4 run in the X-direction. One end of each read bit line is connected to a common data line 30 through a row select switch (MOS transistor) RSW2. The common data line 30 is connected to a read circuit 29B (including, e.g., a sense amplifier, selector, and output buffer).

For example, as shown in FIGS. 11I and 12I, the read bit line is connected to a bias transistor BT which sets the bit line potential to VC.

A row select line signal RLi (i=1, ..., n) is input to each row select switch RSW2. Row decoders 25-1, ..., 25-n output the row select line signals RLi.

As shown in FIG. 11I, the bias transistor BT is a PMOS transistor, when the RLi is input to the bias transistor BT. As shown in FIG. 12I, the bias transistor BT is a NMOS transistor, when the inverting signal from RLi is input to the bias transistor BT. Row decoders 25-1, ..., 25-n output the row select line signals RLi and the inverting signal thereof.

The read bit lines RBL4(n−1)+1, RBL4(n−1)+2, RBL4(n−1)+3, and RBL4(n−1)+4 run in the X-direction and also function as write word lines WWL4(n−1)+1, WWL4(n−1)+2, WWL4(n−1)+3, and WWL4(n−1)+4, respectively.

One end of each of the write word lines WWL4(n−1)+1, WWL4(n−1)+2, WWL4(n−1)+3, and WWL4(n−1)+4 is connected to a write word line driver 23A through the row select switches RSW2 and common data line 30. The other end of each write word line is connected to a corresponding one of write word line sinkers 24-1, ..., 24-n.

One write bit line WBLi (i=1, ..., j) which is shared by the four MTJ elements 12 of one read block BKik and run in the Y-direction is arranged near the MTJ elements 12 constituting the read block BKik. One write bit line WBLi is arranged in one column.

One end of each write bit line WBLi is connected to a circuit block 29A including a column decoder and write bit line driver/sinker. The other end is connected to a circuit block 31 including a column decoder and write bit line driver/sinker.

In write operation, the circuit blocks 29A and 31 are set in an operative state. A write current flows to the write bit lines WBLi in accordance with write data in a direction toward the circuit block 29A or 31.

In the write operation, the row decoder 25-n selects one of the plurality of rows on the basis of a row address signal. The write word line driver 23A supplies a write current to the write word lines WWL4(n−1)+1, WWL4(n−1)+2, WWL4(n−1)+3, and WWL4(n−1)+4 in the selected row. The write current is absorbed by the write word line sinker 24-n.

In read operation, the row decoder 25-n selects one of the plurality of rows on the basis of a row address signal. In the read operation, a column decoder 32 selects one of the plurality of columns on the basis of column address signals CSL1, ..., CSLj to turn on the column select switch CSW arranged in the selected column.

In the magnetic random access memory according to Structural Example 1, one terminal of each of the plurality of MTJ elements in a read block is commonly connected. The other terminal is connected to a corresponding one of different read bit lines RBL4(n−1)+1, RBL4(n−1)+2, RBL4(n−1)+3, and RBL4(n−1)+4.

Hence, data of the plurality of MTJ elements in one read block can be read at once by one read step.

The read bit lines RBL4(n−1)+1, RBL4(n−1)+2, RBL4(n−1)+3, and RBL4(n−1)+4 also function as the write word lines WWL4(n−1)+1, WWL4(n−1)+2, WWL4(n−1)+3, and WWL4(n−1)+4, respectively. Since no interconnections which exclusively serve as write word lines need be arranged in the cell array, the cell array structure can be simplified.

As described above, as the characteristic feature of Structural Example 1, a read block has no read select switch for selecting it. In this case, the read bit lines RBL4(n−1)+1, RBL4(n−1)+2, RBL4(n−1)+3, and RBL4(n−1)+4 in an unselected row are biased to same potential to those in a selected row and the write word line WBLj in an unselected column is set in a floating state.

For this reason, the read bit lines RBL4(n−1)+1, RBL4(n−1)+2, RBL4(n−1)+3, and RBL4(n−1)+4 in all rows are set to the same potentials.

In Structural Example 1, in the read operation, for example, the potentials of the read bit lines RBL4(n−1)+1, RBL4(n−1)+2, RBL4(n−1)+3, and RBL4(n−1)+4 in the selected row are fixed to identical values. That is, the potentials of the read bit lines RBL4(n−1)+1, RBL4(n−1)+2, RBL4(n−1)+3, and RBL4(n−1)+4 in the selected row are fixed, and a change in read current flowing to the MTJ elements is detected.

The circuit (clamp circuit) for fixing the potentials of the read bit lines RBL4(n−1)+1, RBL4(n−1)+2, RBL4(n−1)+3, and RBL4(n−1)+4 in the selected row will be described later in detail in association with a read circuit.

If the read bit lines RBL4(n−1)+1, RBL4(n−1)+2, RBL4(n−1)+3, and RBL4(n−1)+4 in all rows always have the same potential in the read operation, no sneak current flows between the read bit lines through the plurality of unselected MTJ elements and poses no problem in determining the data value of the selected MTJ element.

In Structural Example 1, since no read select transistor is arranged in the read block, a current path is formed through the MTJ elements in an unselected block in the read operation. However, the resistance value of the MTJ element is sufficiently large. The read current is much smaller than the write current. Hence, an increase in current consumption poses no serious problem.

In the write operation, when the write current flows to the write word lines WWL4(n−1)+1, WWL4(n−1)+2, WWL4(n−1)+3, and WWL4(n−1)+4 in the selected row, the read word line RWLi is charged through the MTJ elements in the selected row. The read word line RWLi is in the floating state. Hence, it is only charged. No potential difference is generated across the MTJ element.

② Device Structure 1

Device Structure 1 will be described next.

[1] Sectional Structure

Figure 2:
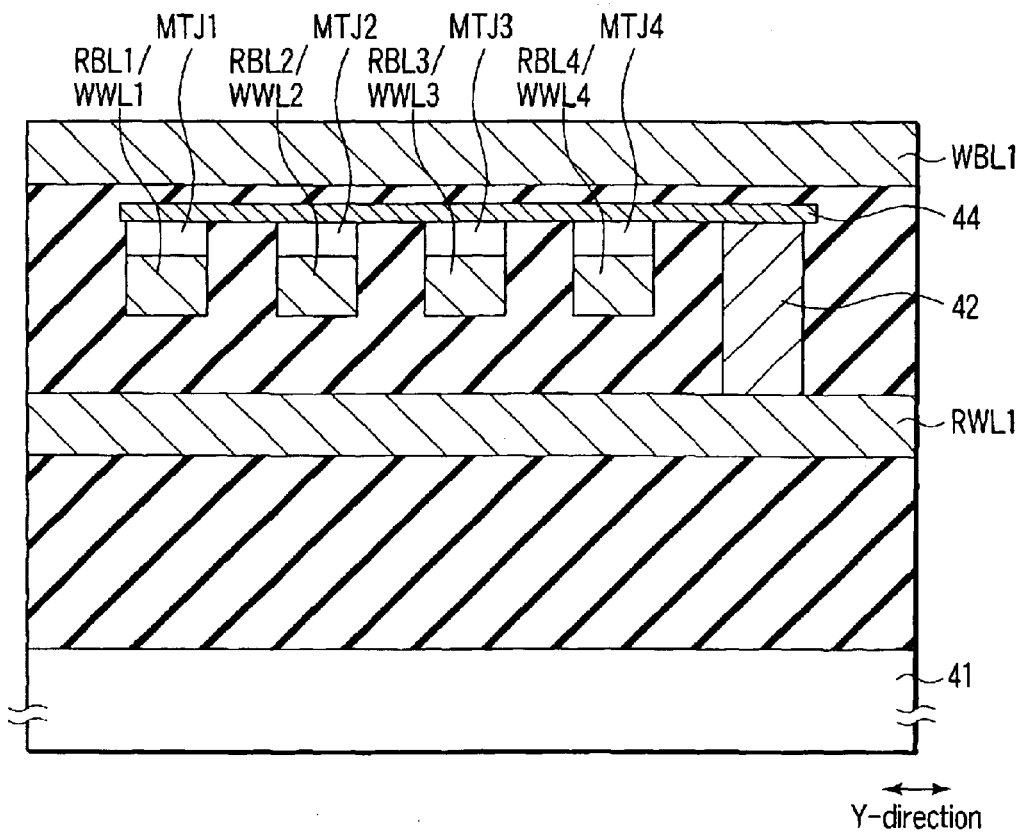
FIG. 2 is a sectional view showing Device Structure 1 according to Structural Example 1.

FIG. 2 shows Device Structure 1 corresponding to one block of the magnetic random access memory according to Structural Example 1 of the present invention.

The same reference numerals as in FIG. 1 denote the same elements in FIG. 2 to show the correspondence between the elements.

A read word line RWL1 running in the Y-direction is formed on a semiconductor substrate 41. No switch element is arranged immediately under the read word line RWL1. Four MTJ elements (Magnetic Tunnel Junction elements) MTJ1, MTJ2, MTJ3, and MTJ4 arrayed in the Y-direction are formed above the read word line RWL1.

One terminal (upper end in this example) of each of the MTJ elements MTJ1, MTJ2, MTJ3, and MTJ4 is commonly connected to an upper electrode 44. A contact plug 42 electrically connects the upper electrode 44 to the read word line RWL1.

The other terminal (lower end in this example) of each of the MTJ elements MTJ1, MTJ2, MTJ3, and MTJ4 is electrically connected to a corresponding one of read bit lines RBL1, RBL2, RBL3, and RBL4 (write word lines WWL1, WWL2, WWL3, and WWL4). The read bit lines RBL1, RBL2, RBL3, and RBL4 run in the X-direction (row direction).

The MTJ elements MTJ1, MTJ2, MTJ3, and MTJ4 are independently connected to the read bit lines RBL1, RBL2, RBL3, and RBL4, respectively. That is, the four read bit lines RBL1, RBL2, RBL3, and RBL4 are arranged in correspondence with the four MTJ elements MTJ1, MTJ2, MTJ3, and MTJ4.

A write bit line WBL1 is formed above and near the MTJ elements MTJ1, MTJ2, MTJ3, and MTJ4. The write bit line WBL1 runs in the Y-direction (column direction).

In Structural Example 1, one write bit line WBL1 is arranged in correspondence with the four MTJ elements MTJ1, MTJ2, MTJ3, and MTJ4 which construct a read block. Instead, for example, the four MTJ elements MTJ1, MTJ2, MTJ3, and MTJ4 may be stacked, and four write bit lines may be arranged in correspondence with the four MTJ elements MTJ1, MTJ2, MTJ3, and MTJ4.

In Structural Example 1, the write bit line WBL1 running in the Y-direction is arranged above the MTJ elements MTJ1, MTJ2, MTJ3, and MTJ4, and the read bit lines RBL1, RBL2, RBL3, and RBL4 running in the X-direction are arranged under the MTJ elements MTJ1, MTJ2, MTJ3, and MTJ4.

However, the positional relationship of the write bit line WBL1 and read bit lines RBL1, RBL2, RBL3, and RBL4 with respect to the MTJ elements MTJ1, MTJ2, MTJ3, and MTJ4 is not limited to this.

For example, the write bit line WBL1 running in the Y-direction may be arranged under the MTJ elements MTJ1, MTJ2, MTJ3, and MTJ4, and the read bit lines RBL1, RBL2, RBL3, and RBL4 running in the X-direction are arranged above the MTJ elements MTJ1, MTJ2, MTJ3, and MTJ4.

According to this device structure, the plurality of MTJ elements MTJ1, MTJ2, MTJ3, and MTJ4 in the read block are electrically connected to the different read bit lines RBL1, RBL2, RBL3, and RBL4 (write word lines WWL1, WWL2, WWL3, and WWL4), respectively. For this reason, data of the plurality of MTJ elements MTJ1, MTJ2, MTJ3, and MTJ4 in the read block can be read at once by one read step.

One terminal of each of the plurality of MTJ elements MTJ1, MTJ2, MTJ3, and MTJ4 in the read block is commonly connected. The connection point is directly connected to the read word line RWL1 without intervening a read select switch. In addition, the write bit line WBL1 running in the Y-direction is shared by the plurality of MTJ elements MTJ1, MTJ2, MTJ3, and MTJ4 in the read block. For this reason, the degree of integration of MTJ elements can be increased, and their characteristic can be improved.

[2] Plane Structure

Figure 3:
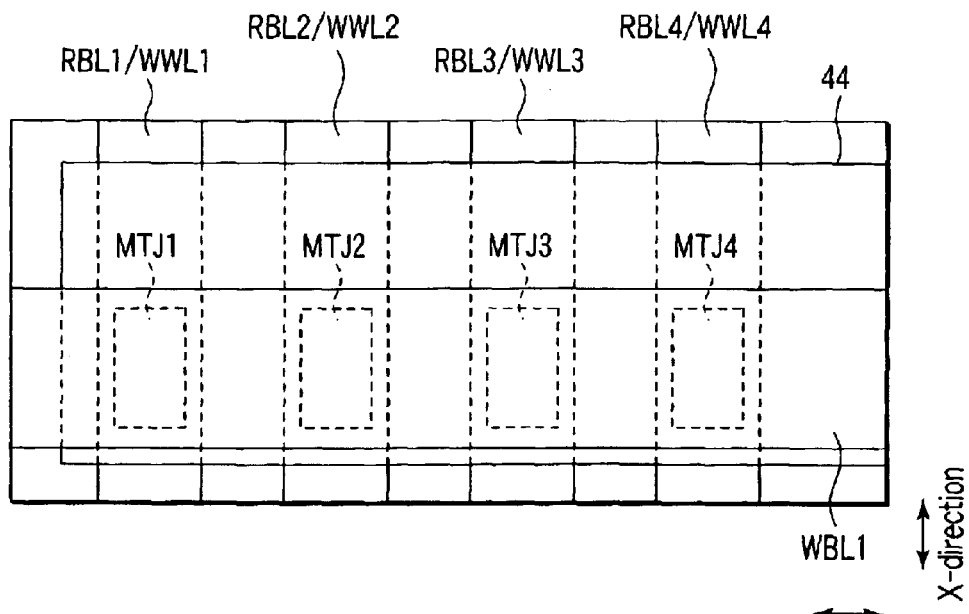
FIG. 3 is a plan view showing Device Structure 1 according to Structural Example 1.

FIG. 3 shows the positional relationship between the MTJ elements, the read bit lines (write word lines), and the write bit line in the device structure shown in FIG. 2.

The upper electrode 44 of the MTJ elements MTJ1, MTJ2, MTJ3, and MTJ4 has, e.g., a rectangular shape and has, as a portion, a contact region for the contact plug.

The MTJ elements MTJ1, MTJ2, MTJ3, and MTJ4 are arranged in the Y-direction. Their axis of easy magnetization (a direction parallel to the long sides of the MTJ elements) is the X-direction. That is, each of the MTJ elements MTJ1, MTJ2, MTJ3, and MTJ4 has a rectangular shape long in the X-direction.

The MTJ elements MTJ1, MTJ2, MTJ3, and MTJ4 are arranged in a region where the write bit line WBL1 and the read bit lines RBL1, RBL2, RBL3, and RBL4 (write word lines WWL1, WWL2, WWL3, and WWL4) cross each other.

③ Device Structure 2

Device Structure 2 will be described next.

[1] Sectional Structure

Figure 4:
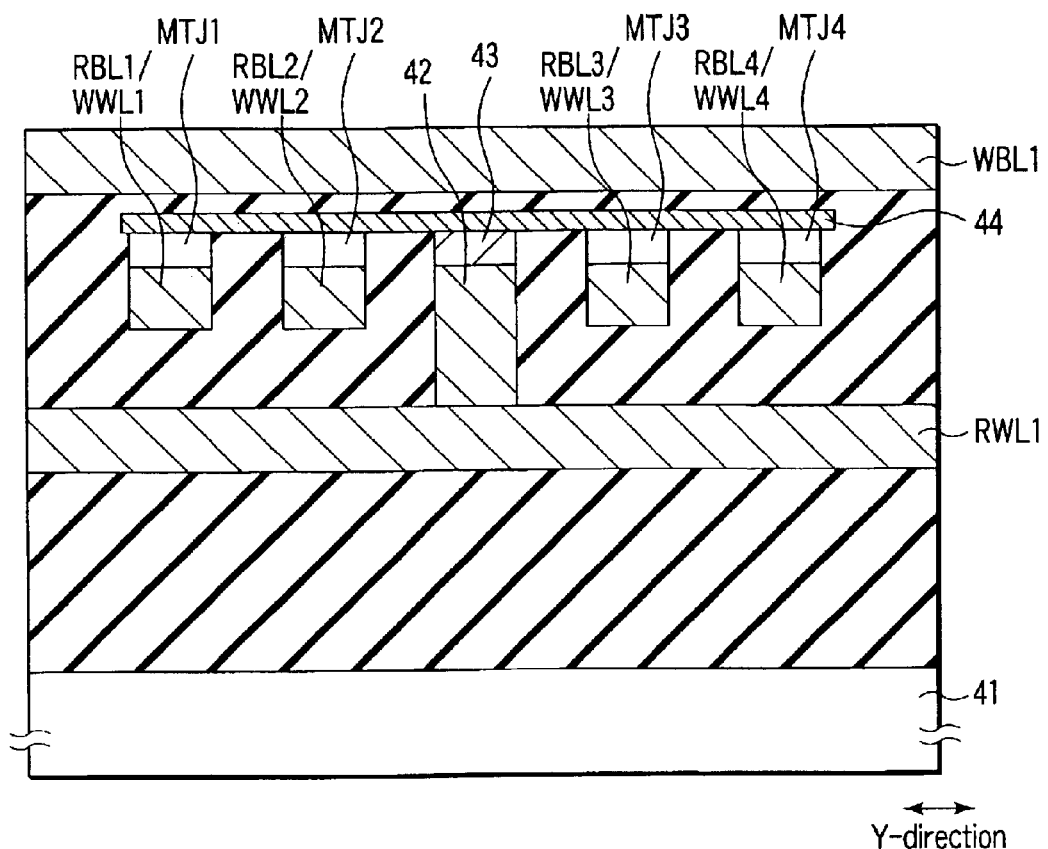
FIG. 4 is a sectional view showing Device Structure 2 according to Structural Example 1.

FIG. 4 shows Device Structure 2 corresponding to one block of the magnetic random access memory according to Structural Example 1 of the present invention.

The same reference numerals as in FIG. 1 denote the same elements in FIG. 4 to show the correspondence between the elements.

The read word line RWL1 running in the Y-direction is formed on the semiconductor substrate 41. No switch element is arranged immediately under the read word line RWL1. The four MTJ elements (Magnetic Tunnel Junction elements) MTJ1, MTJ2, MTJ3, and MTJ4 arrayed in the Y-direction are formed above the read word line RWL1.

One terminal (upper end in this example) of each of the MTJ elements MTJ1, MTJ2, MTJ3, and MTJ4 is commonly connected to the upper electrode 44. The contact plug 42 and a conductive layer 43 electrically connect the upper electrode 44 to the read word line RWL1.

Device Structure 2 is different from Device Structure 1 in the position where the contact plug 42 is formed. More specifically, in Device Structure 1, the contact plug 42 is formed at an end portion in the Y-direction. In Device Structure 2, the contact plug 42 is arranged at the central portion of the upper electrode 44.

When the MTJ elements MTJ1, MTJ2, MTJ3, and MTJ4 are uniformly arranged to be symmetrical with respect to the contact plug 42, signal margin in the read operation due to the interconnection resistance or the like can be maximized.

The conductive layer 43 may be integrated with the upper electrode 44. That is, the conductive layer 43 and upper electrode 44 may be formed simultaneously using the same material.

The other terminal (lower end in this example) of each of the MTJ elements MTJ1, MTJ2, MTJ3, and MTJ4 is electrically connected to a corresponding one of the read bit lines RBL1, RBL2, RBL3, and RBL4 (write word lines WWL1, WWL2, WWL3, and WWL4). The read bit lines RBL1, RBL2, RBL3, and RBL4 run in the X-direction (row direction).

The MTJ elements MTJ1, MTJ2, MTJ3, and MTJ4 are independently connected to the read bit lines RBL1, RBL2, RBL3, and RBL4, respectively. That is, the four read bit lines RBL1, RBL2, RBL3, and RBL4 are arranged in correspondence with the four MTJ elements MTJ1, MTJ2, MTJ3, and MTJ4.

The write bit line WBL1 is formed above and near the MTJ elements MTJ1, MTJ2, MTJ3, and MTJ4. The write bit line WBL1 runs in the Y-direction (column direction).

In Structural Example 1, one write bit line WBL1 is arranged in correspondence with the four MTJ elements MTJ1, MTJ2, MTJ3, and MTJ4 which construct a read block. Instead, for example, the four MTJ elements MTJ1, MTJ2, MTJ3, and MTJ4 may be stacked, and four write bit lines may be arranged in correspondence with the four MTJ elements MTJ1, MTJ2, MTJ3, and MTJ4.

In Structural Example 1, the write bit line WBL1 running in the Y-direction is arranged above the MTJ elements MTJ1, MTJ2, MTJ3, and MTJ4, and the read bit lines RBL1, RBL2, RBL3, and RBL4 running in the X-direction are arranged under the MTJ elements MTJ1, MTJ2, MTJ3, and MTJ4.

However, the positional relationship of the write bit line WBL1 and read bit lines RBL1, RBL2, RBL3, and RBL4 with respect to the MTJ elements MTJ1, MTJ2, MTJ3, and MTJ4 is not limited to this.

For example, the write bit line WBL1 running in the Y-direction may be arranged under the MTJ elements MTJ1, MTJ2, MTJ3, and MTJ4, and the read bit lines RBL1, RBL2, RBL3, and RBL4 running in the X-direction are arranged above the MTJ elements MTJ1, MTJ2, MTJ3, and MTJ4.

According to this device structure, the plurality of MTJ elements MTJ1, MTJ2, MTJ3, and MTJ4 in the read block are electrically connected to the different read bit lines RBL1, RBL2, RBL3, and RBL4 (write word lines WWL1, WWL2, WWL3, and WWL4), respectively. For this reason, data of the plurality of MTJ elements MTJ1, MTJ2, MTJ3, and MTJ4 in the read block can be read at once by one read step.

One terminal of each of the plurality of MTJ elements MTJ1, MTJ2, MTJ3, and MTJ4 in the read block is commonly connected. The connection point is directly connected to the read word line RWL1 without intervening a read select switch. In addition, the write bit line WBL1 running in the Y-direction is shared by the plurality of MTJ elements MTJ1, MTJ2, MTJ3, and MTJ4 in the read block. For this reason, the degree of integration of MTJ elements can be increased, and their characteristic can be improved.

[2] Plane Structure

Figure 5:
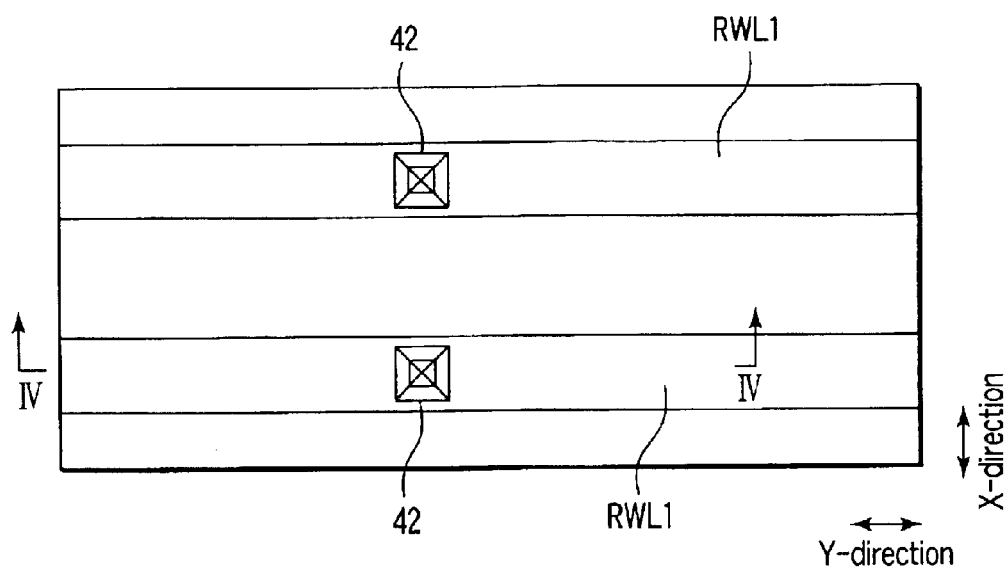
FIG. 5 is a plan view showing Device Structure 2 according to Structural Example 1.
Figure 6:
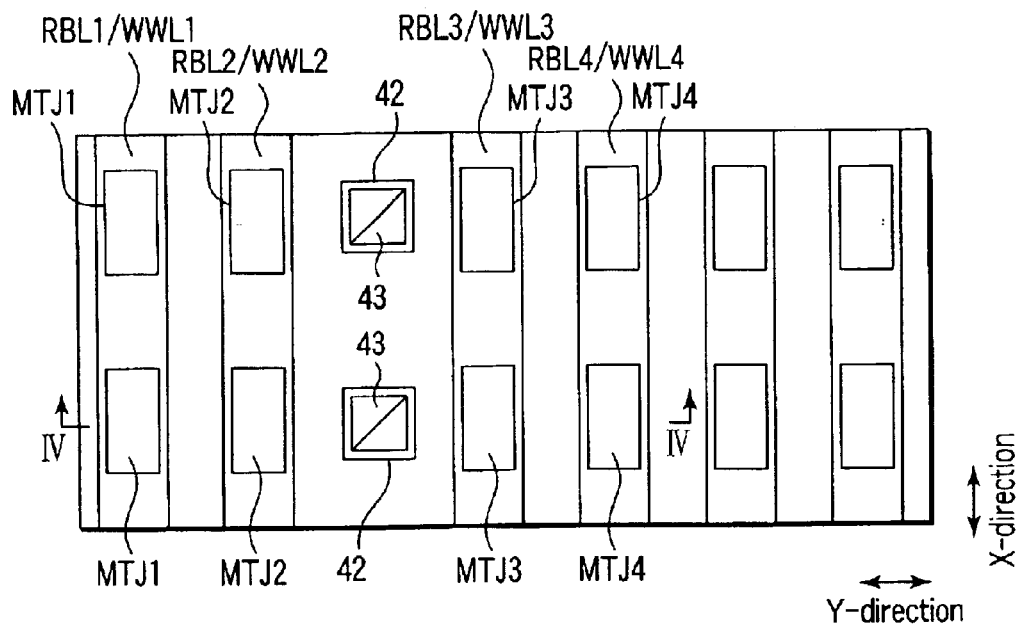
FIG. 6 is a plan view showing Device Structure 2 according to Structural Example 1.
Figure 7:
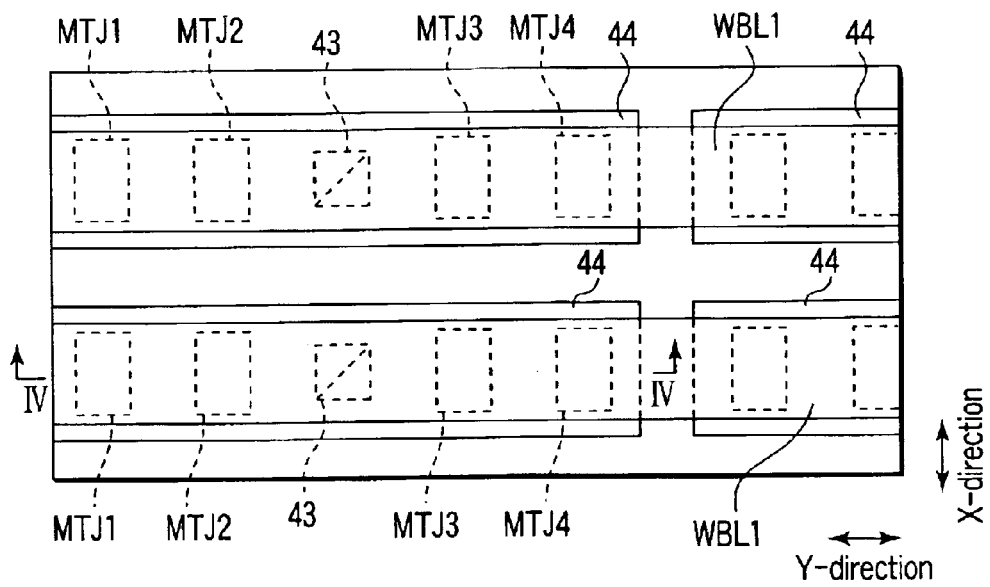
FIG. 7 is a plan view showing Device Structure 2 according to Structural Example 1.

FIGS. 5 to 7 show the layouts of the respective interconnection layers in Device Structure 2 shown in FIG. 4. The section shown in FIG. 4 corresponds to the section taken along a line IV—IV in FIGS. 5 to 7.

FIG. 5 shows the layout of read word lines.

The read word lines RWL1 run in the Y-direction. The contact plug 42 is arranged on each read word line RWL1.

FIG. 6 shows the layout of the read bit lines and MTJ elements.

The read bit lines RBL1, RBL2, RBL3, and RBL4 (write word lines WWL1, WWL2, WWL3, and WWL4) run in the X-direction. The interval between the read bit lines RBL1, RBL2, RBL3, and RBL4 can be set to, e.g., the minimum size (or design rule) processible by photolithography.

The MTJ elements MTJ1, MTJ2, MTJ3, and MTJ4 are arranged on the read bit lines RBL1, RBL2, RBL3, and RBL4, respectively. The axis of easy magnetization of the MTJ elements MTJ1, MTJ2, MTJ3, and MTJ4, i.e., the direction parallel to the long sides of the MTJ elements MTJ1, MTJ2, MTJ3, and MTJ4 is the X-direction.

The read bit line RBL1 is commonly connected to the MTJ elements MTJ1 arranged in the X-direction. The read bit line RBL2 is commonly connected to the MTJ elements MTJ2 arranged in the X-direction. The read bit line RBL3 is commonly connected to the MTJ elements MTJ3 arranged in the X-direction. The read bit line RBL4 is commonly connected to the MTJ elements MTJ4 arranged in the X-direction.

The conductive layer 43 is arranged on the contact plug 42.

FIG. 7 shows the layout of write bit lines.

The upper electrode 44 having a rectangular pattern is arranged on the MTJ elements MTJ1, MTJ2, MTJ3, and MTJ4 and conductive layer 43. The upper electrode 44 are in contact with the MTJ elements MTJ1, MTJ2, MTJ3, and MTJ4 and conductive layer 43.

The write bit lines WBL1 are arranged immediately on the upper electrodes 44. The write bit lines WBL1 run in the Y-direction.

④ Device Structure 3

Device Structure 3 will be described next.

[1] Sectional Structure

Figure 8:
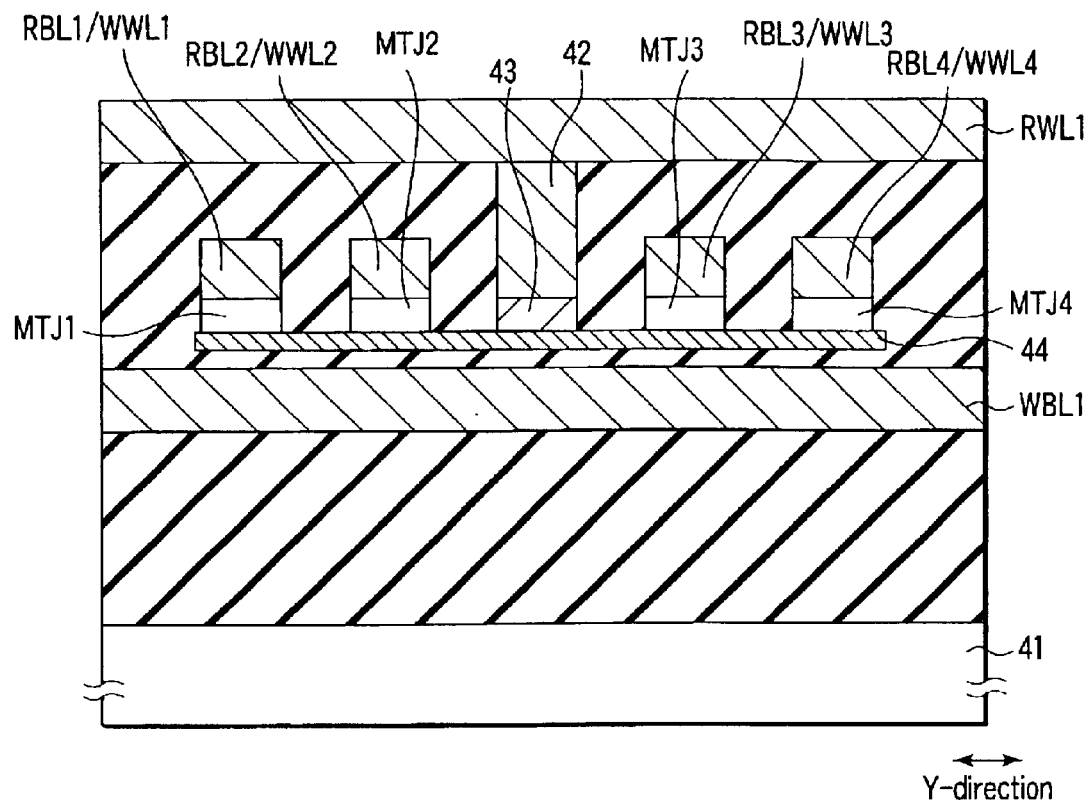
FIG. 8 is a sectional view showing Device Structure 3 according to Structural Example 1.

FIG. 8 shows Device Structure 3 corresponding to one block of the magnetic random access memory according to Structural Example 1 of the present invention.

The same reference numerals as in FIG. 1 denote the same elements in FIG. 8 to show the correspondence between the elements.

The write bit line WBL1 running in the Y-direction is formed on the semiconductor substrate 41. No switch element is arranged immediately under the write bit line WBL1. A lower electrode 44 having, e.g., a rectangular pattern is formed above the write bit line WBL1.

The four MTJ elements (Magnetic Tunnel Junction elements) MTJ1, MTJ2, MTJ3, and MTJ4 arrayed in the Y-direction are formed on the lower electrode 44.

The read bit lines RBL1, RBL2, RBL3, and RBL4 (write word lines WWL1, WWL2, WWL3, and WWL4) are formed on the MTJ elements MTJ1, MTJ2, MTJ3, and MTJ4, respectively. The read bit lines RBL1, RBL2, RBL3, and RBL4 are in contact with the MTJ elements MTJ1, MTJ2, MTJ3, and MTJ4, respectively. The read bit lines RBL1, RBL2, RBL3, and RBL4 run in the X-direction (row direction).

The MTJ elements MTJ1, MTJ2, MTJ3, and MTJ4 are independently connected to the read bit lines RBL1, RBL2, RBL3, and RBL4, respectively. That is, the four read bit lines RBL1, RBL2, RBL3, and RBL4 are arranged in correspondence with the four MTJ elements MTJ1, MTJ2, MTJ3, and MTJ4.

The contact plug 42 and conductive layer 43 are formed on the lower electrode 44. The contact plug 42 and conductive layer 43 electrically connect the lower electrode 44 to the read word line RWL1.

The contact plug 42 is arranged at the central portion of the lower electrode 44. When the MTJ elements MTJ1, MTJ2, MTJ3, and MTJ4 are uniformly arranged to be symmetrical with respect to the contact plug 42, signal margin in the read operation due to the interconnection resistance or the like can be maximized.

The read word line RWL1 is formed above the MTJ elements MTJ1, MTJ2, MTJ3, and MTJ4. The read word line RWL1 runs in the Y-direction (column direction).

In Structural Example 1, one write bit line WBL1 is arranged in correspondence with the four MTJ elements MTJ1, MTJ2, MTJ3, and MTJ4 which construct a read block. Instead, for example, the four MTJ elements MTJ1, MTJ2, MTJ3, and MTJ4 may be stacked, and four write bit lines may be arranged in correspondence with the four MTJ elements MTJ1, MTJ2, MTJ3, and MTJ4.

In Structural Example 1, the write bit line WBL1 running in the Y-direction is arranged under the MTJ elements MTJ1, MTJ2, MTJ3, and MTJ4, and the read bit lines RBL1, RBL2, RBL3, and RBL4 running in the X-direction are arranged above the MTJ elements MTJ1, MTJ2, MTJ3, and MTJ4.

However, the positional relationship of the write bit line WBL1 and read bit lines RBL1, RBL2, RBL3, and RBL4 with respect to the MTJ elements MTJ1, MTJ2, MTJ3, and MTJ4 is not limited to this.

For example, the write bit line WBL1 running in the Y-direction may be arranged above the MTJ elements MTJ1, MTJ2, MTJ3, and MTJ4, and the read bit lines RBL1, RBL2, RBL3, and RBL4 running in the X-direction are arranged under the MTJ elements MTJ1, MTJ2, MTJ3, and MTJ4.

According to this device structure, the plurality of MTJ elements MTJ1, MTJ2, MTJ3, and MTJ4 in the read block are electrically connected to the different read bit lines RBL1, RBL2, RBL3, and RBL4 (write word lines WWL1, WWL2, WWL3, and WWL4), respectively. For this reason, data of the plurality of MTJ elements MTJ1, MTJ2, MTJ3, and MTJ4 in the read block can be read at once by one read step.

One terminal of each of the plurality of MTJ elements MTJ1, MTJ2, MTJ3, and MTJ4 in the read block is commonly connected. The connection point is directly connected to the read word line RWL1 without intervening a read select switch. In addition, the write bit line WBL1 running in the Y-direction is shared by the plurality of MTJ elements MTJ1, MTJ2, MTJ3, and MTJ4 in the read block. For this reason, the degree of integration of MTJ elements can be increased, and their characteristic can be improved.

Furthermore, the contact portion between the lower electrode 44 and the read word line RWL1 is formed in the region between the MTJ elements MTJ1 and MTJ2 and the MTJ elements MTJ3 and MTJ4. When the MTJ elements MTJ1, MTJ2, MTJ3, and MTJ4 are uniformly arranged to be symmetrical with respect to the contact portion of the lower electrode 44, signal margin in the read operation due to the interconnection resistance or the like can be maximized.

[2] Plane Structure

FIGS. 9 to 12 show the layouts of the respective interconnection layers in Device Structure 3 shown in FIG. 8. The section shown in FIG. 8 corresponds to the section taken along a line VIII—VIII in FIGS. 9 to 12.

Figure 9:
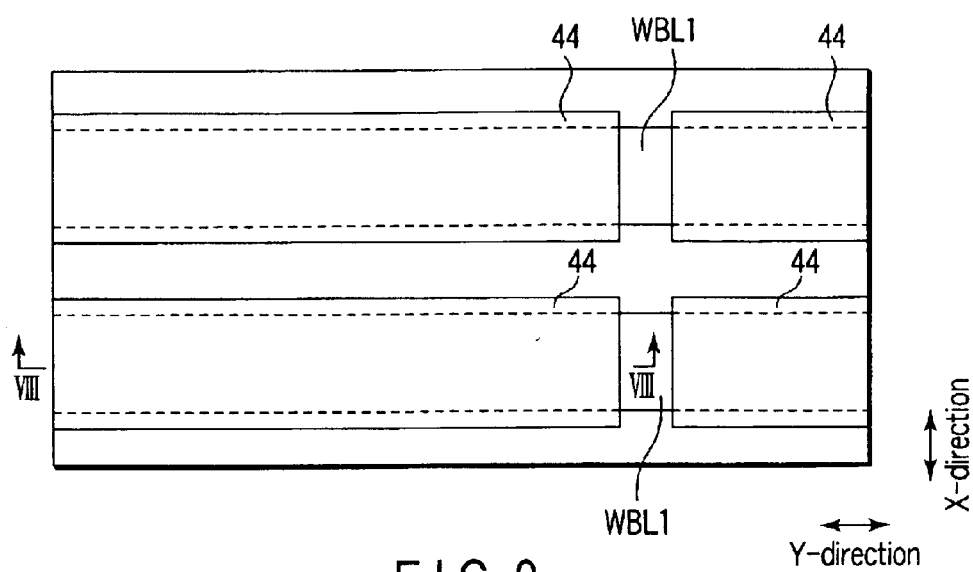
FIG. 9 is a plan view showing Device Structure 3 according to Structural Example 1.

FIG. 9 shows the layout of write bit lines.

The write bit lines WBL1 run in the Y-direction. The lower electrode 44 having a rectangular shape is arranged on each write bit line WBL1.

Figure 10:
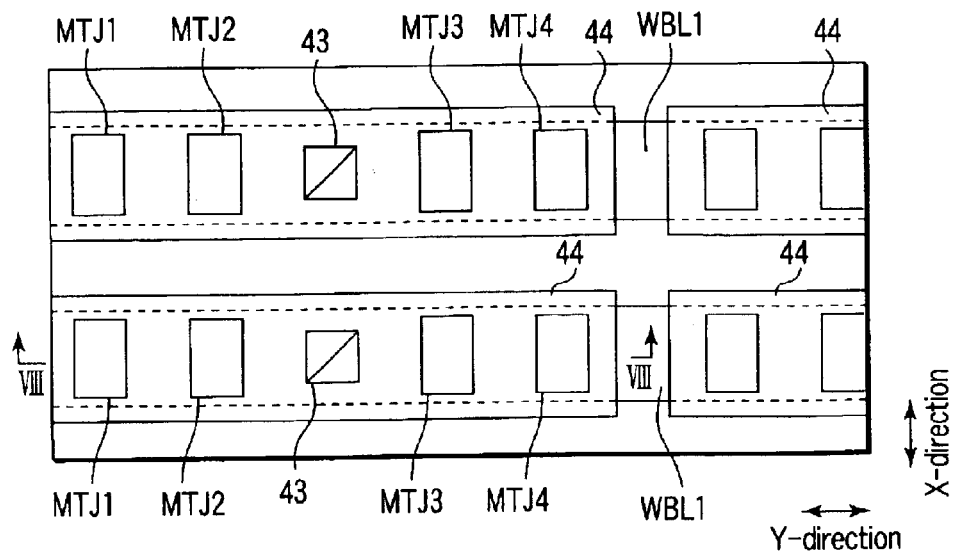
FIG. 10 is a plan view showing Device Structure 3 according to Structural Example 1.

FIG. 10 shows the layout of MTJ elements.

The MTJ elements MTJ1, MTJ2, MTJ3, and MTJ4 and conductive layer 43 are arranged on the lower electrode 44 having a rectangular pattern.

The MTJ elements MTJ1, MTJ2, MTJ3, and MTJ4 on the lower electrode 44 are arranged in the Y-direction. The axis of easy magnetization of the MTJ elements MTJ1, MTJ2, MTJ3, and MTJ4, i.e., the direction parallel to the long sides of the MTJ elements MTJ1, MTJ2, MTJ3, and MTJ4 is the X-direction.

Figure 11:
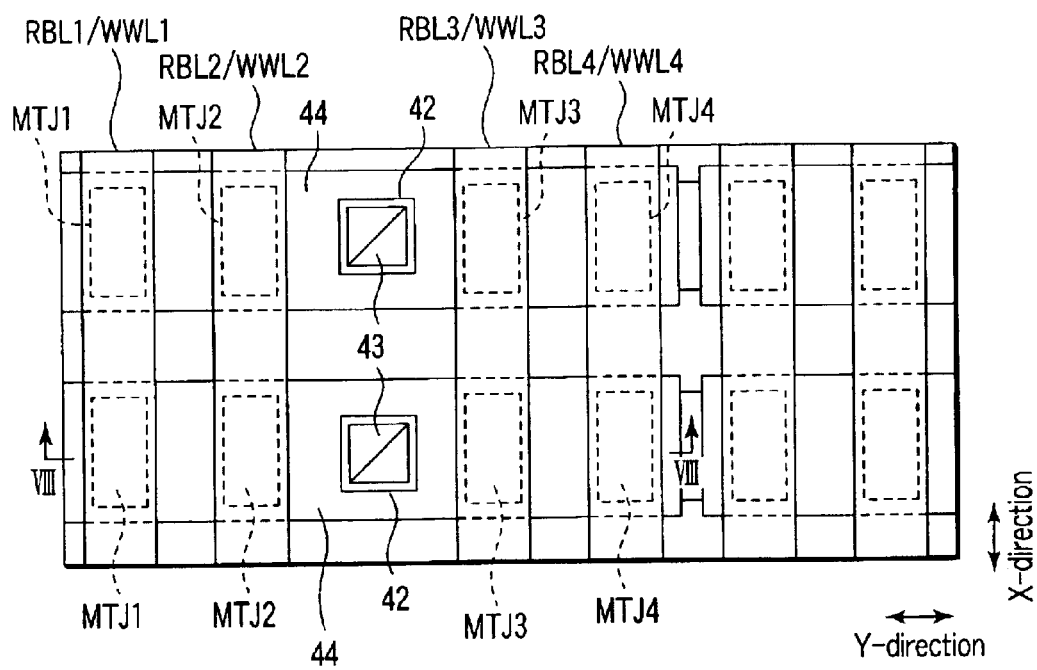
FIG. 11 is a plan view showing Device Structure 3 according to Structural Example 1.

FIG. 11 shows the layout of read bit lines.

The read bit lines RBL1, RBL2, RBL3, and RBL4 (write word lines WWL1, WWL2, WWL3, and WWL4) are arranged on the MTJ elements MTJ1, MTJ2, MTJ3, and MTJ4, respectively.

The read bit lines RBL1, RBL2, RBL3, and RBL4 run in the X-direction. The interval between the read bit lines RBL1, RBL2, RBL3, and RBL4 can be set to, e.g., the minimum size (or design rule) processible by photolithography.

The read bit line RBL1 is commonly connected to the MTJ elements MTJ1 arranged in the X-direction. The read bit line RBL2 is commonly connected to the MTJ elements MTJ2 arranged in the X-direction. The read bit line RBL3 is commonly connected to the MTJ elements MTJ3 arranged in the X-direction. The read bit line RBL4 is commonly connected to the MTJ elements MTJ4 arranged in the X-direction.

The contact plug 42 is arranged on the conductive layer 43.

Figure 12:
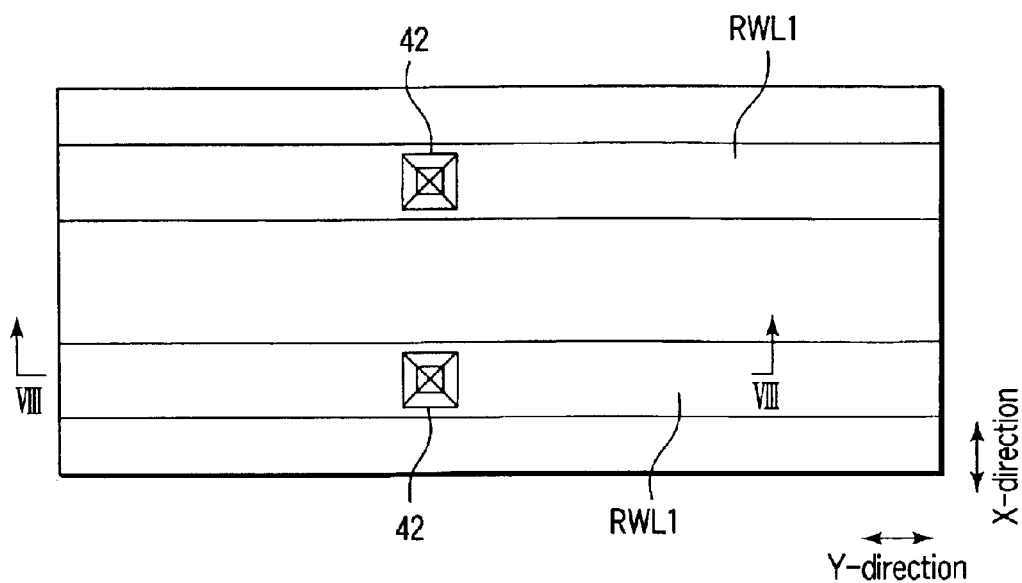
FIG. 12 is a plan view showing Device Structure 3 according to Structural Example 1.

FIG. 12 shows the layout of read word lines.

The read word lines RWL1 run in the Y-direction. The read word line RWL1 is in contact with the contact plug 42.

(2) STRUCTURAL EXAMPLE 2

① Outline

Figure 13:
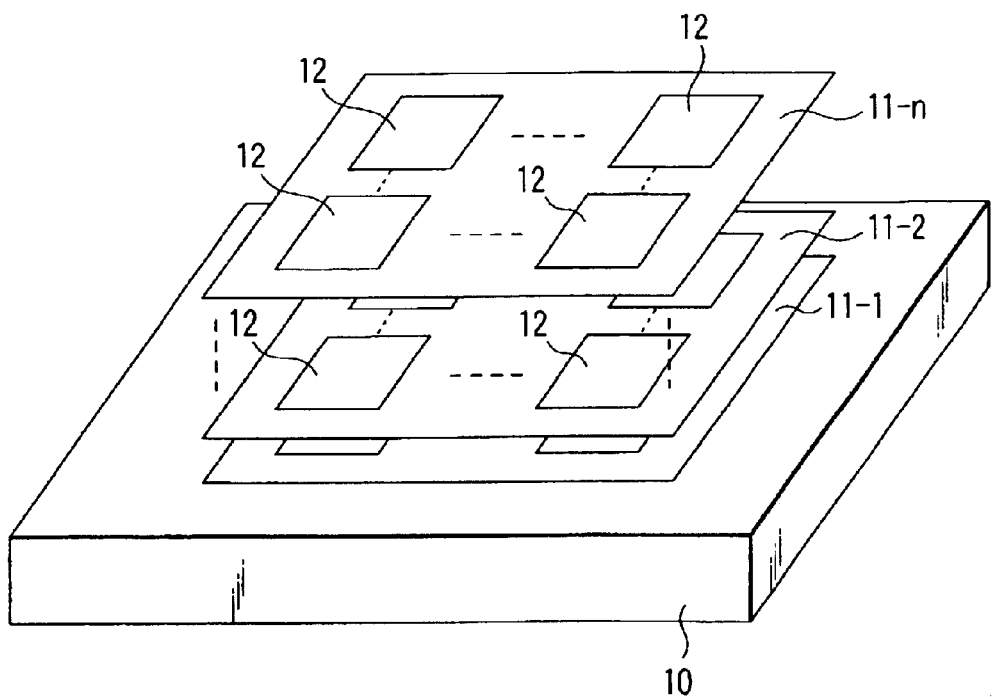
FIG. 13 is a view showing the outline of a magnetic random access memory according to Structural Example 2 of the present invention.

FIG. 13 shows the outline of a magnetic random access memory according to Structural Example 2 of the present invention.

The same reference numerals as in FIG. 1 denote the same elements in FIG. 13 to show the correspondence between the elements.

As a characteristic feature of Structural Example 2, a plurality of stages of memory cell arrays 11-1, 11-2, . . . , 11-$m$ according to Structural Example 1 are stacked on a semiconductor substrate (chip) 10. Each of the memory cell arrays 11-1, 11-2, . . . , 11-$m$ corresponds to the memory cell array 11 shown in FIG. 1.

② Device Structure 1

In Device Structure 1 of Structural Example 2, a plurality of stages of memory cell arrays in Device Structure 2 (FIG. 4) of Structural Example 1 are stacked.

Figure 14:
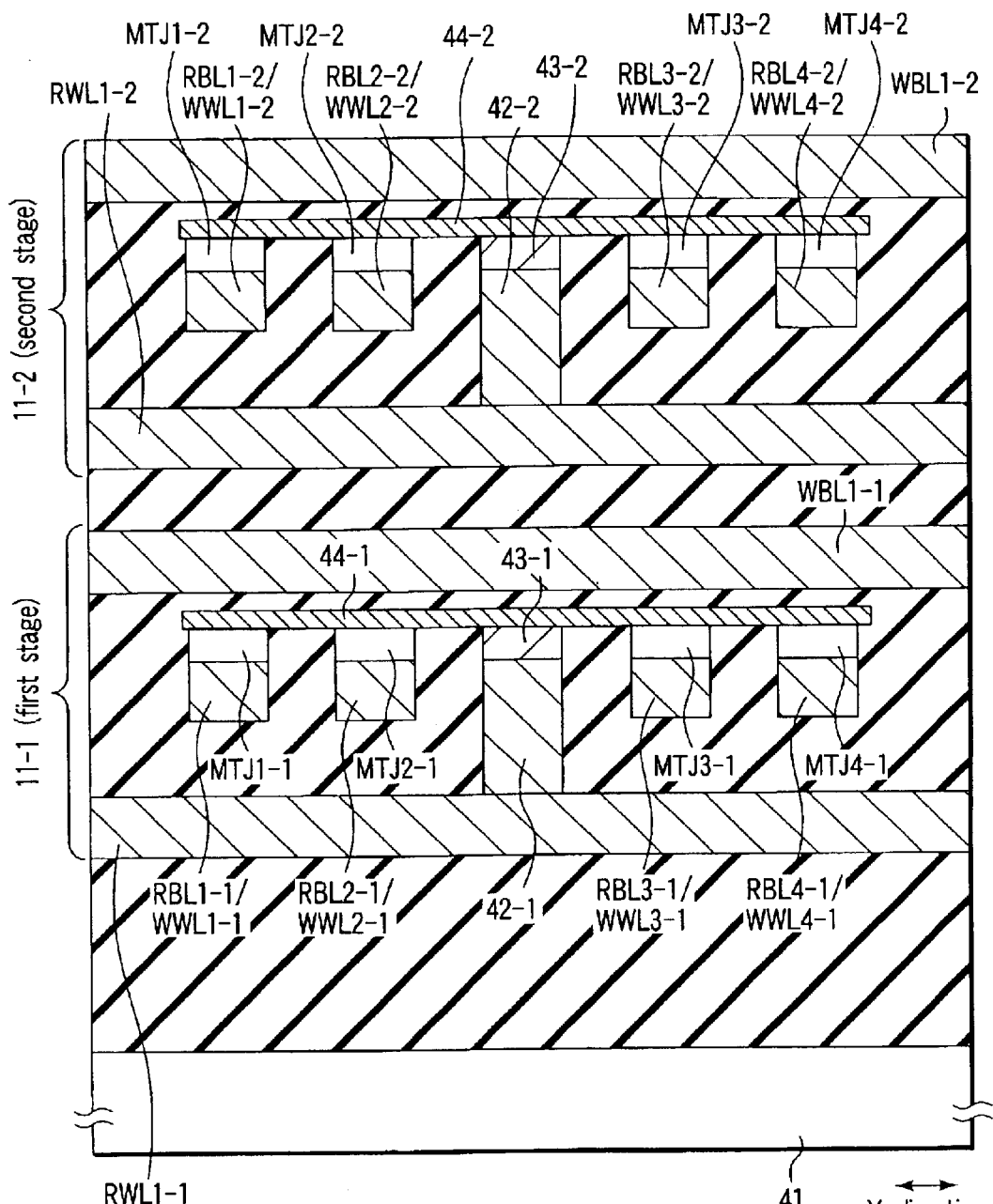
FIG. 14 is a sectional view showing Device Structure 1 according to Structural Example 2.

FIG. 14 shows Device Structure 1 corresponding to one block of the magnetic random access memory according to Structural Example 2 of the present invention.

[1] First Stage (Memory Cell Array 11-1)

A read word line RWL1-1 running in the Y-direction is formed on a semiconductor substrate 41. No switch element is arranged immediately under the read word line RWL1-1. Four MTJ elements (Magnetic Tunnel Junction elements) MTJ1-1, MTJ2-1, MTJ3-1, and MTJ4-1 arrayed in the Y-direction are formed above the read word line RWL1-1.

One terminal (upper end in this example) of each of the MTJ elements MTJ1-1, MTJ2-1, MTJ3-1, and MTJ4-1 is commonly connected to an upper electrode 44-1. A contact plug 42-1 and conductive layer 43-1 electrically connect the upper electrode 44-1 to the read word line RWL1-1.

The contact plug 42-1 is arranged at the central portion of the upper electrode 44-1. When the MTJ elements MTJ1-1, MTJ2-1, MTJ3-1, and MTJ4-1 are uniformly arranged to be symmetrical with respect to the contact plug 42-1, signal margin in the read operation due to the interconnection resistance or the like can be maximized.

The conductive layer 43-1 may be integrated with the upper electrode 44-1. That is, the conductive layer 43-1 and upper electrode 44-1 may be formed simultaneously using the same material.

The other terminal (lower end in this example) of each of the MTJ elements MTJ1-1, MTJ2-1, MTJ3-1, and MTJ4-1 is electrically connected to a corresponding one of read bit lines RBL1-1, RBL2-1, RBL3-1, and RBL4-1 (write word lines WWL1-1, WWL2-1, WWL3-1, and WWL4-1). The read bit lines RBL1-1, RBL2-1, RBL3-1, and RBL4-1 run in the X-direction (row direction).

The MTJ elements MTJ1-1, MTJ2-1, MTJ3-1, and MTJ4-1 are independently connected to the read bit lines RBL1-1, RBL2-1, RBL3-1, and RBL4-1, respectively. That is, the four read bit lines RBL1-1, RBL2-1, RBL3-1, and RBL4-1 are arranged in correspondence with the four MTJ elements MTJ1-1, MTJ2-1, MTJ3-1, and MTJ4-1.

A write bit line WBL1-1 is formed above and near the MTJ elements MTJ1-1, MTJ2-1, MTJ3-1, and MTJ4-1. The write bit line WBL1-1 runs in the Y-direction (column direction).

[2] Second Stage (Memory Cell Array 11-2)

A read word line RWL1-2 running in the Y-direction is formed on the write bit line WBL1-1 in the memory cell array 11-1 of the first stage. Four MTJ elements (Magnetic Tunnel Junction elements) MTJ1-2, MTJ2-2, MTJ3-2, and MTJ4-2 arrayed in the Y-direction are formed above the read word line RWL1-2.

One terminal (upper end in this example) of each of the MTJ elements MTJ1-2, MTJ2-2, MTJ3-2, and MTJ4-2 is commonly connected to an upper electrode 44-2. A contact plug 42-2 and conductive layer 43-2 electrically connect the upper electrode 44-2 to the read word line RWL1-2.

The contact plug 42-2 is arranged at the central portion of the upper electrode 44-2. When the MTJ elements MTJ1-2, MTJ2-2, MTJ3-2, and MTJ4-2 are uniformly arranged to be symmetrical with respect to the contact plug 42-2, signal margin in the read operation due to the interconnection resistance or the like can be maximized.

The conductive layer 43-2 may be integrated with the upper electrode 44-2. That is, the conductive layer 43-2 and upper electrode 44-2 may be formed simultaneously using the same material.

The other terminal (lower end in this example) of each of the MTJ elements MTJ1-2, MTJ2-2, MTJ3-2, and MTJ4-2 is electrically connected to a corresponding one of read bit lines RBL1-2, RBL2-2, RBL3-2, and RBL4-2 (write word lines WWL1-2, WWL2-2, WWL3-2, and WWL4-2). The read bit lines RBL1-2, RBL2-2, RBL3-2, and RBL4-2 run in the X-direction (row direction).

The MTJ elements MTJ1-2, MTJ2-2, MTJ3-2, and MTJ4-2 are independently connected to the read bit lines RBL1-2, RBL2-2, RBL3-2, and RBL4-2, respectively. That is, the four read bit lines RBL1-2, RBL2-2, RBL3-2, and RBL4-2 are arranged in correspondence with the four MTJ elements MTJ1-2, MTJ2-2, MTJ3-2, and MTJ4-2.

A write bit line WBL1-2 is formed above and near the MTJ elements MTJ1-2, MTJ2-2, MTJ3-2, and MTJ4-2. The write bit line WBL1-2 runs in the Y-direction (column direction).

[3] Others

Referring to FIG. 14, the memory cell arrays 11-1 and 11-2 according to Device Structure 2 of the Structural Example 1 are stacked in two stages on the semiconductor substrate 41. In principle, the memory cell arrays may be stacked in three or more stages (there is no upper limit).

According to Device Structure 1 of Structural Example 2, a plurality of stages of memory cell arrays according to Device Structure 2 of Structural Example 1 are stacked on the semiconductor substrate. For this reason, the density of MTJ elements can be increased.

③ Device Structure 2

In Device Structure 2 of Structural Example 2, a plurality of stages of memory cell arrays in Device Structure 3 (FIG. 8) of Structural Example 1 are stacked.

Figure 15:
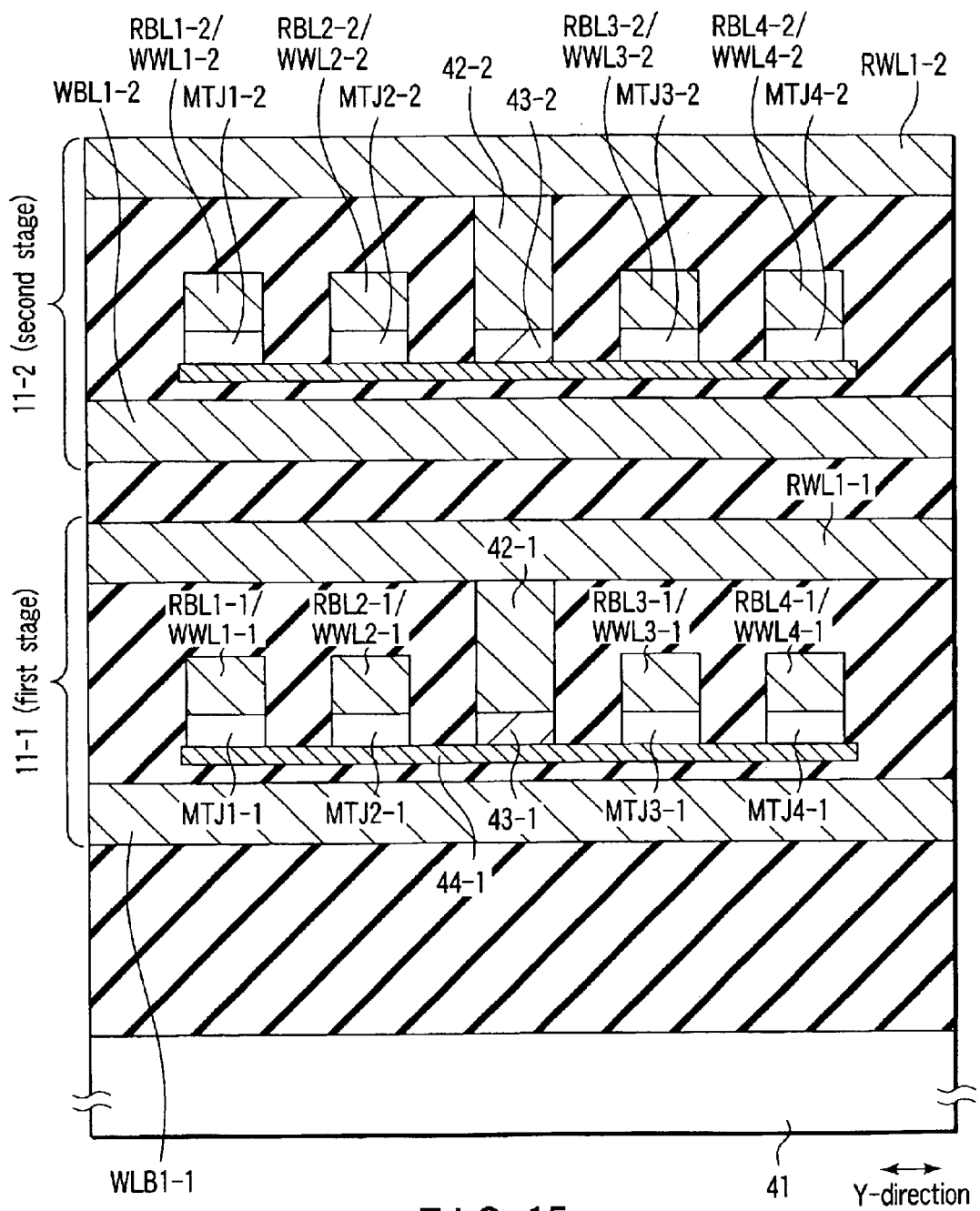
FIG. 15 is a sectional view showing Device Structure 2 according to Structural Example 2.

FIG. 15 shows Device Structure 2 corresponding to one block of the magnetic random access memory according to Structural Example 2 of the present invention.

[1] First Stage (Memory Cell Array 11-1)

The write bit line WBL1-1 running in the Y-direction is formed on the semiconductor substrate 41. No switch element is arranged immediately under the write bit line WBL1-1. A lower electrode 44-1 having, e.g., a rectangular pattern is formed above the write bit line WBL1-1.

The four MTJ elements (Magnetic Tunnel Junction elements) MTJ1-1, MTJ2-1, MTJ3-1, and MTJ4-1 arrayed in the Y-direction are formed on the lower electrode 44-1.

The read bit lines RBL1-1, RBL2-1, RBL3-1, and RBL4-1 (write word lines WWL1-1, WWL2-1, WWL3-1, and WWL4-1) are formed on the MTJ elements MTJ1-1, MTJ2-1, MTJ3-1, and MTJ4-1, respectively. The read bit lines RBL1-1, RBL2-1, RBL3-1, and RBL4-1 are in contact with the MTJ elements MTJ1-1, MTJ2-1, MTJ3-1, and MTJ4-1, respectively. The read bit lines RBL1-1, RBL2-1, RBL3-1, and RBL4-1 run in the X-direction (row direction).

The MTJ elements MTJ1-1, MTJ2-1, MTJ3-1, and MTJ4-1 are independently connected to the read bit lines RBL1-1, RBL2-1, RBL3-1, and RBL4-1, respectively. That is, the four read bit lines RBL1-1, RBL2-1, RBL3-1, and RBL4-1 are arranged in correspondence with the four MTJ elements MTJ1-1, MTJ2-1, MTJ3-1, and MTJ4-1.

The contact plug 42-1 and conductive layer 43-1 are formed on the lower electrode 44-1. The contact plug 42-1 and conductive layer 43-1 electrically connect the lower electrode 44-1 to the read word line RWL1-1.

The contact plug 42-1 is arranged at the central portion of the lower electrode 44-1. When the MTJ elements MTJ1-1, MTJ2-1, MTJ3-1, and MTJ4-1 are uniformly arranged to be symmetrical with respect to the contact plug 42-1, signal margin in the read operation due to the interconnection resistance or the like can be maximized.

The read word line RWL1-1 is formed above the MTJ elements MTJ1-1, MTJ2-1, MTJ3-1, and MTJ4-1. The read word line RWL1-1 runs in the Y-direction (column direction).

[2] Second Stage (Memory Cell Array 11-2)

The write bit line WBL1-2 running in the Y-direction is formed on the semiconductor substrate 41. No switch element is arranged immediately under the write bit line WBL1-2. A lower electrode 44-2 having, e.g., a rectangular pattern is formed above the write bit line WBL1-2.

The four MTJ elements (Magnetic Tunnel Junction elements) MTJ1-2, MTJ2-2, MTJ3-2, and MTJ4-2 arrayed in the Y-direction are formed on the lower electrode 44-2.

The read bit lines RBL1-2, RBL2-2, RBL3-2, and RBL4-2 (write word lines WWL1-2, WWL2-2, WWL3-2, and WWL4-2) are formed on the MTJ elements MTJ1-2, MTJ2-2, MTJ3-2, and MTJ4-2, respectively. The read bit lines RBL1-2, RBL2-2, RBL3-2, and RBL4-2 are in contact with the MTJ elements MTJ1-2, MTJ2-2, MTJ3-2, and MTJ4-2, respectively. The read bit lines RBL1-2, RBL2-2, RBL3-2, and RBL4-2 run in the X-direction (row direction).

The MTJ elements MTJ1-2, MTJ2-2, MTJ3-2, and MTJ4-2 are independently connected to the read bit lines RBL1-2, RBL2-2, RBL3-2, and RBL4-2, respectively. That is, the four read bit lines RBL1-2, RBL2-2, RBL3-2, and RBL4-2 are arranged in correspondence with the four MTJ elements MTJ1-2, MTJ2-2, MTJ3-2, and MTJ4-2.

The contact plug 42-2 and conductive layer 43-2 are formed on the lower electrode 44-2. The contact plug 42-2 and conductive layer 43-2 electrically connect the lower electrode 44-2 to the read word line RWL1-2.

The contact plug 42-2 is arranged at the central portion of the lower electrode 44-2. When the MTJ elements MTJ1-2, MTJ2-2, MTJ3-2, and MTJ4-2 are uniformly arranged to be symmetrical with respect to the contact plug 42-2, signal margin in the read operation due to the interconnection resistance or the like can be maximized.

The read word line RWL1-2 is formed above the MTJ elements MTJ1-2, MTJ2-2, MTJ3-2, and MTJ4-2. The read word line RWL1-2 runs in the Y-direction (column direction).

[3] Others

Referring to FIG. 15, the memory cell arrays 11-1 and 11-2 according to Device Structure 3 of the Structural Example 1 are stacked in two stages on the semiconductor substrate 41. In principle, the memory cell arrays may be stacked in three or more stages (there is no upper limit).

According to Device Structure 2 of Structural Example 2, a plurality of stages of memory cell arrays according to Device Structure 3 of Structural Example 1 are stacked on the semiconductor substrate. For this reason, the density of MTJ elements can be increased.

(3) STRUCTURAL EXAMPLE 3

① Outline

Structural Example 3 is an improvement of Structural Example 2. In Structural Example 2, the plurality of stages of the memory cell arrays 11-1, 11-2, . . . , 11-m according to Structural Example 1 are stacked on the semiconductor substrate (chip).

Even in Structural Example 3, a plurality of stages of memory cell arrays according to Structural Example 1 are stacked on a semiconductor substrate (chip). In Structural Example 3, the number of interconnections in the memory cell arrays is decreased to planarize the underlying layer of MTJ elements (improve the characteristic of MTJ elements). For this purpose, one interconnection is shared by memory cell arrays of different stages.

② Circuit Structure

In Structural Example 3, in a plurality of stages of memory cell arrays 11-1, 11-2, . . . , 11-m stacked, as shown in FIG. 13, the write bit line of the memory cell array of the lower stage and the read word line of the memory cell array of the upper stage are integrated and shared as one write bit line/read word line.

Figure 16:
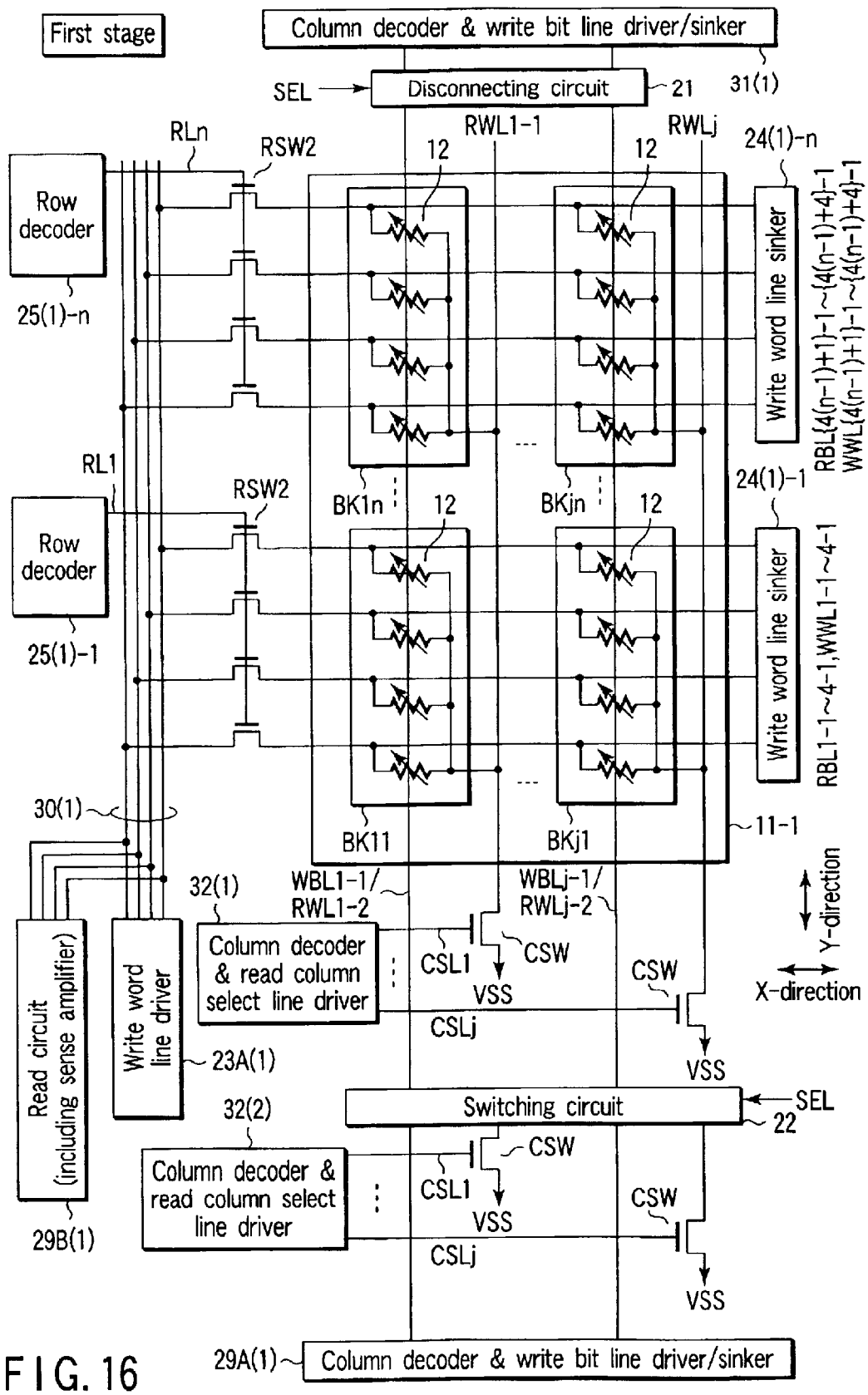
FIG. 16 is a circuit diagram showing a magnetic random access memory according to Structural Example 3 of the present invention.
Figure 17:
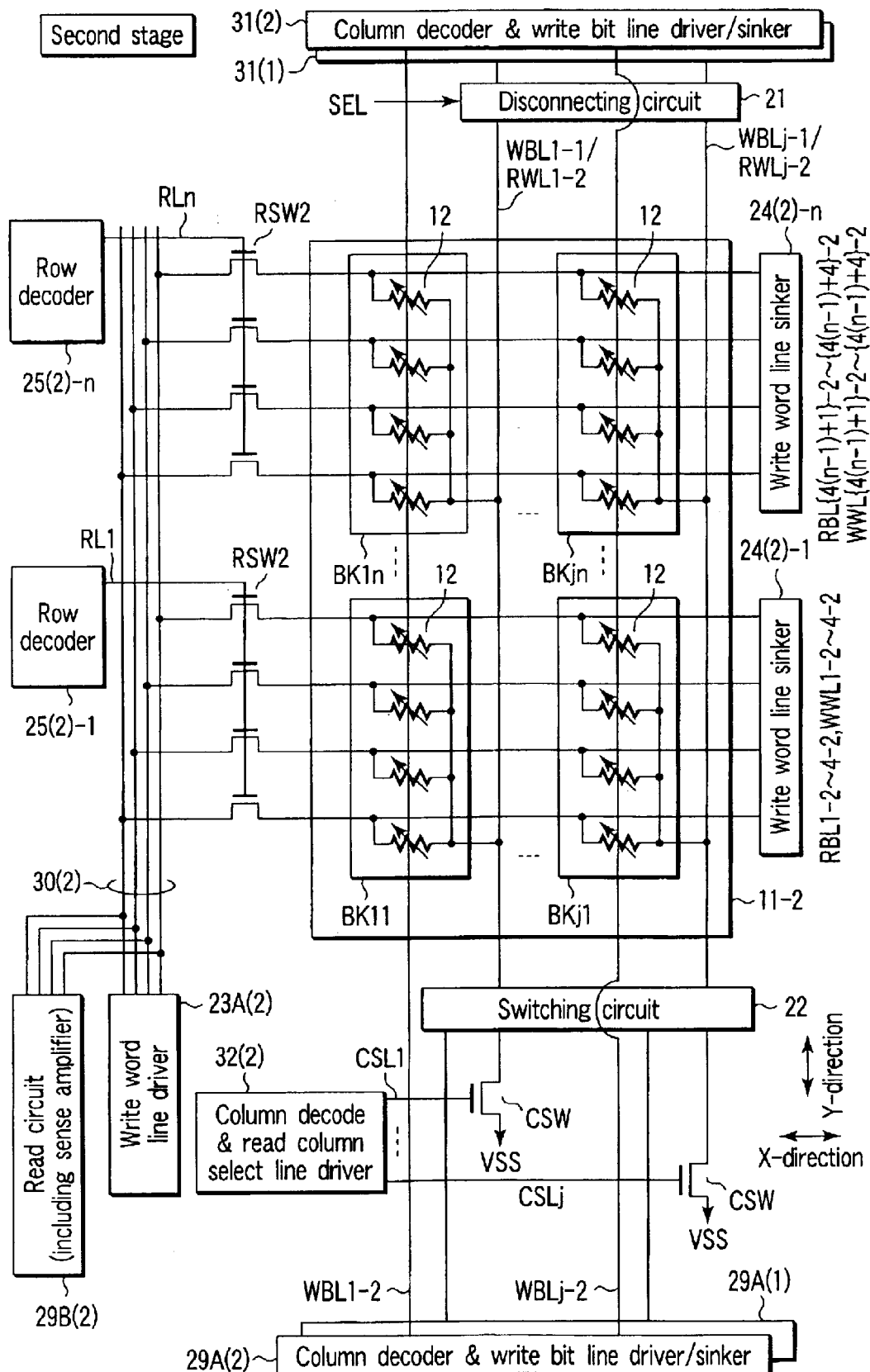
FIG. 17 is a circuit diagram showing the magnetic random access memory according to Structural Example 3 of the present invention.

FIGS. 16 and 17 show the main part of a magnetic random access memory according to Structural Example 3 of the present invention.

[1] First Stage (Lower Stage)

FIG. 16 shows the cell array structure of the first stage of Structural Example 3.

The memory cell array 11-1 has a plurality of MTJ elements 12 arranged in an array in the X- and Y-directions. For example, j MTJ elements 12 are arranged in the X-direction, and 4×n MTJ elements 12 are arranged in the Y-direction.

The four MTJ elements 12 arranged in the Y-direction form one read block BKik (i=1, . . . , j, and k=1, . . . , n). One row is constructed by j read blocks BKik arranged in the X-direction. The memory cell array 11 has n rows. In addition, one column is constructed by n read blocks BKik arranged in the Y-direction. The memory cell array 11-1 has j columns.

One terminal of each of the four MTJ elements 12 in the block BKik is commonly connected. The connection point is connected to, e.g., a read word line RWLi-1 (i=1, . . . , j). The read word line RWLi-1 runs in the Y-direction. One read word line RWLi-1 is arranged in one column.

The MTJ elements 12 in the read blocks BKik arranged in one column are directly connected to the read word lines RWLi-1 (i=1, . . . , j) without intervening read select switches (MOS transistors). One end of each read word line RWLi-1 is connected to a ground point VSS through a column select switch CSW formed from, e.g., a MOS transistor.

The column select switches CSW are arranged outside the memory cell array 11-1. Hence, no switch elements (MOS transistors) are arranged in the memory cell array 11-1.

The other terminal of each of the four MTJ elements 12 in the read block BKik is independently connected to a corresponding one of read bit lines RBL{4(n−1)+1}-1, RBL{4(n−1)+2}-1, RBL{4(n−1)+3}-1, and RBL{4(n−1)+4}-1. That is, the four read bit lines RBL{4(n−1)+1}-1, RBL{4(n−1)+2}-1, RBL{4(n−1)+3}-1, and RBL{4(n−1)+4}-1 are arranged in correspondence with the four MTJ elements 12 in one read block BKik.

The read bit lines RBL{4(n−1)+1}-1, RBL{4(n−1)+2}-1, RBL{4(n−1)+3}-1, and RBL{4(n−1)+4}-1 run in the X-direction. One end of each read bit line is connected to a common data line 30(1) through a row select switch (MOS transistor) RSW2. The common data line 30(1) is connected to a read circuit 29B(1) (including, e.g., a sense amplifier, selector, and output buffer).

For example, as shown in FIGS. 112 and 122, the read bit line is connected to a bias transistor BT which sets the bit line potential to VC.

A row select line signal RLi (i=1, . . . , n) is input to each row select switch RSW2. Row decoders 25(1)-1, . . . , 25(1)-n output the row select line signals RLi.

As shown in FIG. 112, the bias transistor BT is a PMOS transistor, when the RLi is input to the bias transistor BT. As shown in FIG. 122, the bias transistor BT is a NMOS transistor, when the inverting signal from RLi is input to the bias transistor BT. Row decoders 25(1)-1, . . . , 25(1)-n output the row select line signals RLi and the inverting signal thereof.

The read bit lines RBL{4(n−1)+1}-1, RBL{4(n−1)+2}-1, RBL{4(n−1)+3}-1, and RBL{4(n−1)+4}-1 run in the X-direction and also function as write word lines WWL{4(n−1)+1}-1, WWL{4(n−1)+2}-1, WWL{4(n−1)+3}-1, and WWL{4(n−1)+4}-1, respectively.

One end of each of the write word lines WWL{4(n−1)+1}-1, WWL{4(n−1)+2}-1, WWL{4(n−1)+3}-1, and WWL{4(n−1)+4}-1 is connected to a write word line driver 23A(1) through the row select switches RSW2 and common data line 30(1). The other end of each write word line is connected to a corresponding one of write word line sinkers 24(1)-1, . . . , 24(1)-n.

One write bit line WBLi-1 (i=1, . . . , j) which is shared by the four MTJ elements 12 of one read block BKik and run in the Y-direction is arranged near the MTJ elements 12 constituting the read block BKik. One write bit line WBLi-1 is arranged in one column.

One end of each write bit line WBLi-1 is connected to a circuit block 29A(1) including a column decoder and write bit line driver/sinker through a switching circuit 22. The other end of the write bit line WBLi-1 is connected to a circuit block 31(1) including a column decoder and write bit line driver/sinker through a disconnecting circuit 21.

The disconnecting circuit 21 and switching circuit 22 are controlled by a memory cell array select signal SEL. In write operation, when the memory cell array 11-1 of the first stage (lower stage) is selected, the switching circuit 22 electrically connects one end of the write bit line WBLi-1 to the circuit block 29A(1). The disconnecting circuit 21 electrically connects the other end of the write bit line WBLi-1 to the circuit block 31(1).

In the write operation, the circuit blocks 29A(1) and 31(1) are set in an operative state. A write current flows to the write bit lines WBLi-1 in accordance with write data in a direction toward the circuit block 29A(1) or 31(1).

In the write operation, the row decoder 25(1)-n selects one of the plurality of rows on the basis of a row address signal. The write word line driver 23A(1) supplies a write current to the write word lines WWL{4(n−1)+1}-1, WWL{4(n−

1)+2}-1, WWL{4(n−1)+3}-1, and WWL{4(n−1)+4}-1 in the selected row. The write current is absorbed by the write word line sinker 24(1)-n.

In read operation, the row decoder 25(1)-n selects one of the plurality of rows on the basis of a row address signal. In the read operation, a column decoder 32(1) selects one of the plurality of columns on the basis of column address signals CSL1, . . . , CSLj to turn on the column select switch CSW arranged in the selected column.

[2] Second Stage (Upper Stage)

FIG. 17 shows the cell array structure of the second stage of Structural Example 3.

The memory cell array 11-2 has the plurality of MTJ elements 12 arranged in an array in the X- and Y-directions. For example, j MTJ elements 12 are arranged in the X-direction, and 4×n MTJ elements 12 are arranged in the Y-direction.

The four MTJ elements 12 arranged in the Y-direction form one read block BKik (i=1, . . . , j, and k=1, . . . , n). One row is constructed by j read blocks BKik arranged in the X-direction. The memory cell array 11 has n rows. In addition, one column is constructed by n read blocks BKik arranged in the Y-direction. The memory cell array 11-2 has j columns.

One terminal of each of the four MTJ elements 12 in the block BKik is commonly connected. The connection point is connected to, e.g., a read word line RWLi-2 (i=1, . . . , j). The read word line RWLi-2 runs in the Y-direction. One read word line RWLi-2 is arranged in one column.

The MTJ elements 12 in the read blocks BKik arranged in one column are directly connected to the read word lines RWLi-2 (i=1, . . . , j) without intervening read select switches (MOS transistors). One end of each read word line RWLi-2 is connected to the ground point VSS through the column select switch CSW formed from the switching circuit 22 and a MOS transistor.

The other end of the read word line RWLi-2 is connected to the circuit block 31(1) including a column decoder and write bit line driver/sinker through the disconnecting circuit 21.

The disconnecting circuit 21, switching circuit 22, and column select switches CSW are arranged outside the memory cell array 11-2. Hence, no switch elements (MOS transistors) are arranged in the memory cell array 11-2.

The disconnecting circuit 21 and switching circuit 22 are the disconnecting circuit 21 and switching circuit 22 in the cell array structure of the memory cell array of the first stage shown in FIG. 16.

The disconnecting circuit 21 and switching circuit 22 are controlled by the memory cell array select signal SEL.

As described above, in the write operation, when the memory cell array 11-1 of the first stage (lower stage) is selected, the switching circuit 22 electrically connects one end of the write bit line WBLi-1 to the circuit block 29A(1). The disconnecting circuit 21 electrically connects the other end of the write bit line WBLi-1 to the circuit block 31(1).

In the read operation, when the memory cell array 11-2 of the second stage (upper stage) is selected, the switching circuit 22 electrically connects one end of the read word line RWLi-2 to the column select switch CSW. The disconnecting circuit 21 electrically disconnects the other end of the read word line RWLi-2 from the circuit block 31(1).

The other terminal of each of the four MTJ elements 12 in the read block BKik is independently connected to a corresponding one of read bit lines RBL{4(n−1)+1}-2, RBL{4(n−1)+2}-2, RBL{4(n−1)+3}-2, and RBL{4(n−1)+4}-2. That is, the four read bit lines RBL{4(n−1)+1}-2, RBL{4(n−1)+2}-2, RBL{4(n−1)+3}-2, and RBL{4(n−1)+4}-2 are arranged in correspondence with the four MTJ elements 12 in one read block BKik.

The read bit lines RBL{4(n−1)+1}-2, RBL{4(n−1)+2}-2, RBL{4(n−1)+3}-2, and RBL{4(n−1)+4}-2 run in the X-direction. One end of each read bit line is connected to a common data line 30(2) through a row select switch (MOS transistor) RSW2. The common data line 30(2) is connected to a read circuit 29B(2) (including, e.g., a sense amplifier, selector, and output buffer).

For example, as shown in FIGS. 113 and 123, the read bit line is connected to a bias transistor BT which sets the bit line potential to VC.

A row select line signal RLi (i=1, . . . , n) is input to each row select switch RSW2. Row decoders 25(2)-1, . . . , 25(2)-n output the row select line signals RLi.

As shown in FIG. 113, the bias transistor BT is a PMOS transistor, when the RLi is input to the bias transistor BT. As shown in FIG. 123, the bias transistor BT is a NMOS transistor, when the inverting signal from RLi is input to the bias transistor BT. Row decoders 25(2)-1, . . . , 25(2)-n output the row select line signals RLi and the inverting signal thereof.

The read bit lines RBL{4(n−1)+1}-2, RBL{4(n−1)+2}-2, RBL{4(n−1)+3}-2, and RBL{4(n−1)+4}-2 run in the X-direction and also function as write word lines WWL{4(n−1)+1}-2, WWL{4(n−1)+2}-2, WWL{4(n−1)+3}-2, and WWL{4(n−1)+4}-2, respectively.

One end of each of the write word lines WWL{4(n−1)+1}-2, WWL{4(n−1)+2}-2, WWL{4(n−1)+3}-2, and WWL{4(n−1)+4}-2 is connected to a write word line driver 23A(2) through the row select switches RSW2 and common data line 30(2). The other end of each write word line is connected to a corresponding one of write word line sinkers 24(2)-1, . . . , 24(2)-n.

One write bit line WBLi-2 (i=1, . . . , j) which is shared by the four MTJ elements 12 of one read block BKik and run in the Y-direction is arranged near the MTJ elements 12 constituting the read block BKik. One write bit line WBLi-2 is arranged in one column.

One end of each write bit line WBLi-2 is connected to a circuit block 29A(2) including a column decoder and write bit line driver/sinker. The other end of the write bit line WBLi-2 is connected to a circuit block 31(2) including a column decoder and write bit line driver/sinker.

In the write operation, the circuit blocks 29A(2) and 31(2) are set in an operative state. A write current flows to the write bit lines WBLi-2 in accordance with write data in a direction toward the circuit block 29A(2) or 31(2).

In the write operation, the row decoder 25(2)-n selects one of the plurality of rows on the basis of a row address signal. The write word line driver 23A(2) supplies a write current to the write word lines WWL{4(n−1)+1}-2, WWL{4(n−1)+2}-2, WWL{4(n−1)+3}-2, and WWL{4(n−1)+4}-2 in the selected row. The write current is absorbed by the write word line sinker 24(2)-n.

In the read operation, the row decoder 25(2)-n selects one of the plurality of rows on the basis of a row address signal. In the read operation, a column decoder 32(2) selects one of the plurality of columns on the basis of column address signals CSL1, . . . , CSLj to turn on the column select switch CSW arranged in the selected column.

③ Device Structure (Sectional Structure)

As a characteristic feature of the device structure of Structural Example 3, in the memory cell array of Device Structure 1 (FIG. 14) of Structural Example 2, a write bit line WBL1-1 of the lower stage (first stage) and a read word line RWL1-2 of the upper stage (second stage) are integrated and shared as one write bit line/read word line WBL1-1/RWL1-2.

Figure 18:
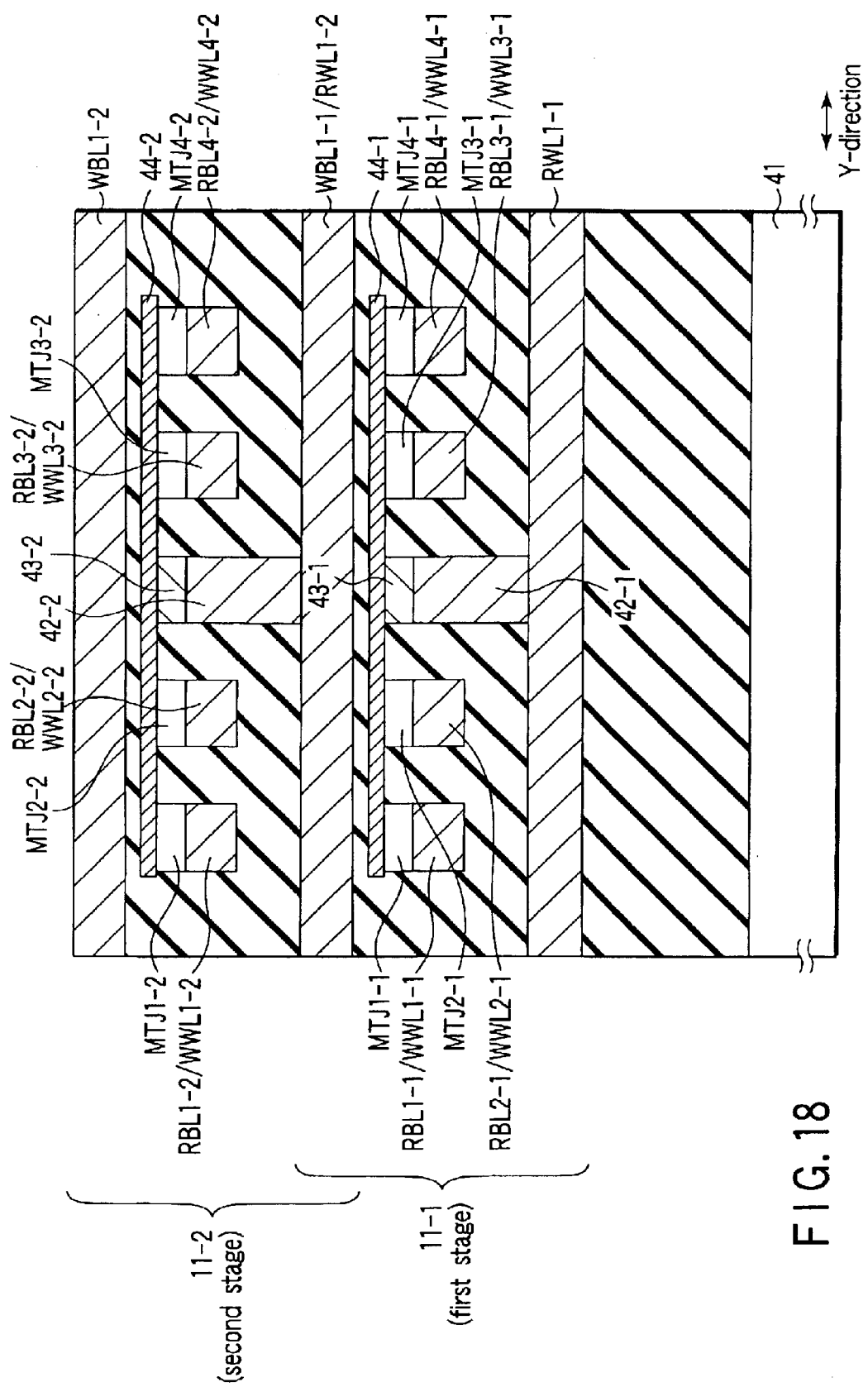
FIG. 18 is a sectional view showing a device structure according to Structural Example 3.

FIG. 18 shows a device structure corresponding to one block of the magnetic random access memory according to Structural Example 3 of the present invention.

[1] First Stage (Memory Cell Array 11-1)

The read word line RWL1-1 running in the Y-direction is formed on a semiconductor substrate 41. No switch element is arranged immediately under the read word line RWL1-1. Four MTJ elements (Magnetic Tunnel Junction elements) MTJ1-1, MTJ2-1, MTJ3-1, and MTJ4-1 arrayed in the Y-direction are formed above the read word line RWL1-1.

One terminal (upper end in this example) of each of the MTJ elements MTJ1-1, MTJ2-1, MTJ3-1, and MTJ4-1 is commonly connected to an upper electrode 44-1. A contact plug 42-1 and conductive layer 43-1 electrically connect the upper electrode 44-1 to the read word line RWL1-1.

The contact plug 42-1 is arranged at the central portion of the upper electrode 44-1. When the MTJ elements MTJ1-1, MTJ2-1, MTJ3-1, and MTJ4-1 are uniformly arranged to be symmetrical with respect to the contact plug 42-1, signal margin in the read operation due to the interconnection resistance or the like can be maximized.

The conductive layer 43-1 may be integrated with the upper electrode 44-1. That is, the conductive layer 43-1 and upper electrode 44-1 may be formed simultaneously using the same material.

The other terminal (lower end in this example) of each of the MTJ elements MTJ1-1, MTJ2-1, MTJ3-1, and MTJ4-1 is electrically connected to a corresponding one of read bit lines RBL1-1, RBL2-1, RBL3-1, and RBL4-1 (write word lines WWL1-1, WWL2-1, WWL3-1, and WWL4-1). The read bit lines RBL1-1, RBL2-1, RBL3-1, and RBL4-1 run in the X-direction (row direction).

The MTJ elements MTJ1-1, MTJ2-1, MTJ3-1, and MTJ4-1 are independently connected to the read bit lines RBL1-1, RBL2-1, RBL3-1, and RBL4-1, respectively. That is, the four read bit lines RBL1-1, RBL2-1, RBL3-1, and RBL4-1 are arranged in correspondence with the four MTJ elements MTJ1-1, MTJ2-1, MTJ3-1, and MTJ4-1.

A write bit line WBL1-1 is formed above and near the MTJ elements MTJ1-1, MTJ2-1, MTJ3-1, and MTJ4-1. The write bit line WBL1-1 runs in the Y-direction (column direction).

[2] Second Stage (Memory Cell Array 11-2)

The write bit line WBL1-1 in the memory cell array 11-1 of the first stage also functions as the read word line RWL1-2 in the memory cell array 11-2 of the second stage.

More specifically, in the write operation, when the memory cell array 11-1 of the first stage is selected, the write bit line/read word line WBL1-1/RWL1-2 are used as the write bit line WBL1-1. In the read operation, when the memory cell array 11-2 of the second stage is selected, the write bit line/read word line WBL1-1/RWL1-2 is used as the read word line RWL1-2.

Four MTJ elements (Magnetic Tunnel Junction elements) MTJ1-2, MTJ2-2, MTJ3-2, and MTJ4-2 arrayed in the Y-direction are formed above the read word line RWL1-2.

One terminal (upper end in this example) of each of the MTJ elements MTJ1-2, MTJ2-2, MTJ3-2, and MTJ4-2 is commonly connected to an upper electrode 44-2. A contact plug 42-2 and conductive layer 43-2 electrically connect the upper electrode 44-2 to the read word line RWL1-2.

The contact plug 42-2 is arranged at the central portion of the upper electrode 44-2. When the MTJ elements MTJ1-2, MTJ2-2, MTJ3-2, and MTJ4-2 are uniformly arranged to be symmetrical with respect to the contact plug 42-2, signal margin in the read operation due to the interconnection resistance or the like can be maximized.

The conductive layer 43-2 may be integrated with the upper electrode 44-2. That is, the conductive layer 43-2 and upper electrode 44-2 may be formed simultaneously using the same material.

The other terminal (lower end in this example) of each of the MTJ elements MTJ1-2, MTJ2-2, MTJ3-2, and MTJ4-2 is electrically connected to a corresponding one of read bit lines RBL1-2, RBL2-2, RBL3-2, and RBL4-2 (write word lines WWL1-2, WWL2-2, WWL3-2, and WWL4-2). The read bit lines RBL1-2, RBL2-2, RBL3-2, and RBL4-2 run in the X-direction (row direction).

The MTJ elements MTJ1-2, MTJ2-2, MTJ3-2, and MTJ4-2 are independently connected to the read bit lines RBL1-2, RBL2-2, RBL3-2, and RBL4-2, respectively. That is, the four read bit lines RBL1-2, RBL2-2, RBL3-2, and RBL4-2 are arranged in correspondence with the four MTJ elements MTJ1-2, MTJ2-2, MTJ3-2, and MTJ4-2.

A write bit line WBL1-2 is formed above and near the MTJ elements MTJ1-2, MTJ2-2, MTJ3-2, and MTJ4-2. The write bit line WBL1-2 runs in the Y-direction (column direction).

[3] Others

In the example shown in FIG. 18, the memory cell arrays 11-1 and 11-2 are stacked in two stages on the semiconductor substrate 41. In principle, the memory cell arrays may be stacked in three or more stages (there is no upper limit).

According to the device structure of Structural Example 3, the memory cell array 11-1 of the lower stage and the memory cell array 11-2 of the upper stage according to Device Structure 1 of Structural Example 2 share one interconnection. For this reason, the density of MTJ elements can be increased. In addition, the underlying layer of the MTJ elements can be planarized (the characteristic of the MTJ elements can be improved).

④ Device Structure (Plane Structure)

FIGS. 19 to 23 show the layouts of the respective interconnection layers in Device Structure 1 shown in FIG. 18. The section shown in FIG. 18 corresponds to the section taken along a line XVIII—XVIII in FIGS. 19 to 23.

Figure 19:
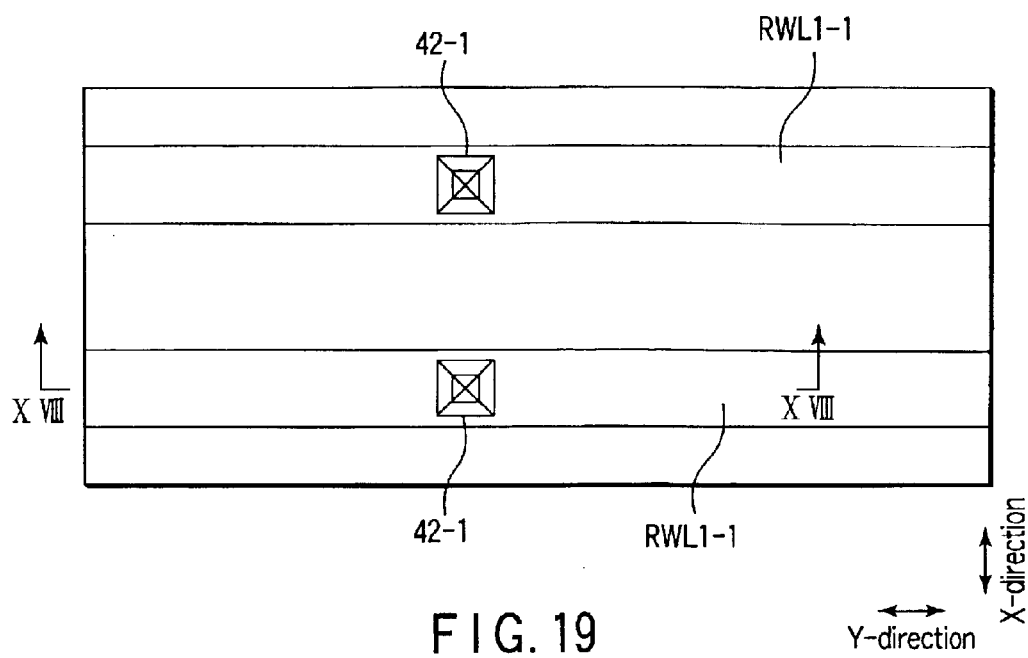
FIG. 19 is a plan view showing a device structure according to Structural Example 3.

FIG. 19 shows the layout of read word lines of the first stage.

The read word lines RWL1-1 run in the Y-direction. The contact plug 42-1 is arranged on each read word line RWL1-1.

Figure 20:
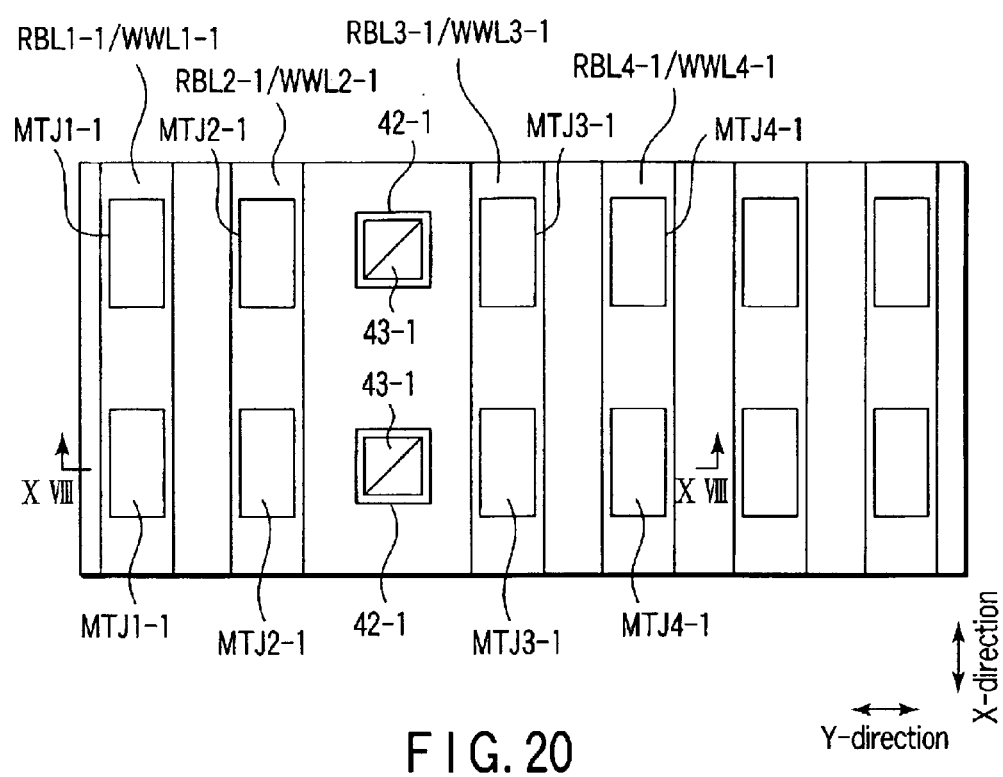
FIG. 20 is a plan view showing a device structure according to Structural Example 3.

FIG. 20 shows the layout of read bit lines of the first stage and MTJ elements of the first stage.

The read bit lines RBL1-1, RBL2-1, RBL3-1, and RBL4-1 (write word lines WWL1-1, WWL2-1, WWL3-1, and WWL4-1) run in the X-direction. The interval between the read bit lines RBL1-1, RBL2-1, RBL3-1, and RBL4-1 can be set to, e.g., the minimum size (or design rule) processible by photolithography.

The MTJ elements MTJ1-1, MTJ2-1, MTJ3-1, and MTJ4-1 are arranged on the read bit lines RBL1-1, RBL2-1, RBL3-1, and RBL4-1. The axis of easy magnetization of the MTJ elements MTJ1-1, MTJ2-1, MTJ3-1, and MTJ4-1, i.e., the direction parallel to the long sides of the MTJ elements MTJ1-1, MTJ2-1, MTJ3-1, and MTJ4-1 is the X-direction.

The read bit line RBL1-1 is commonly connected to the MTJ elements MTJ1-1 arranged in the X-direction. The read bit line RBL2-1 is commonly connected to the MTJ elements MTJ2-1 arranged in the X-direction. The read bit line RBL3-1 is commonly connected to the MTJ elements MTJ3-1 arranged in the X-direction. The read bit line RBL4-1 is commonly connected to the MTJ elements MTJ4-1 arranged in the X-direction.

The conductive layer 43-1 is arranged on the contact plug 42-1.

Figure 21:
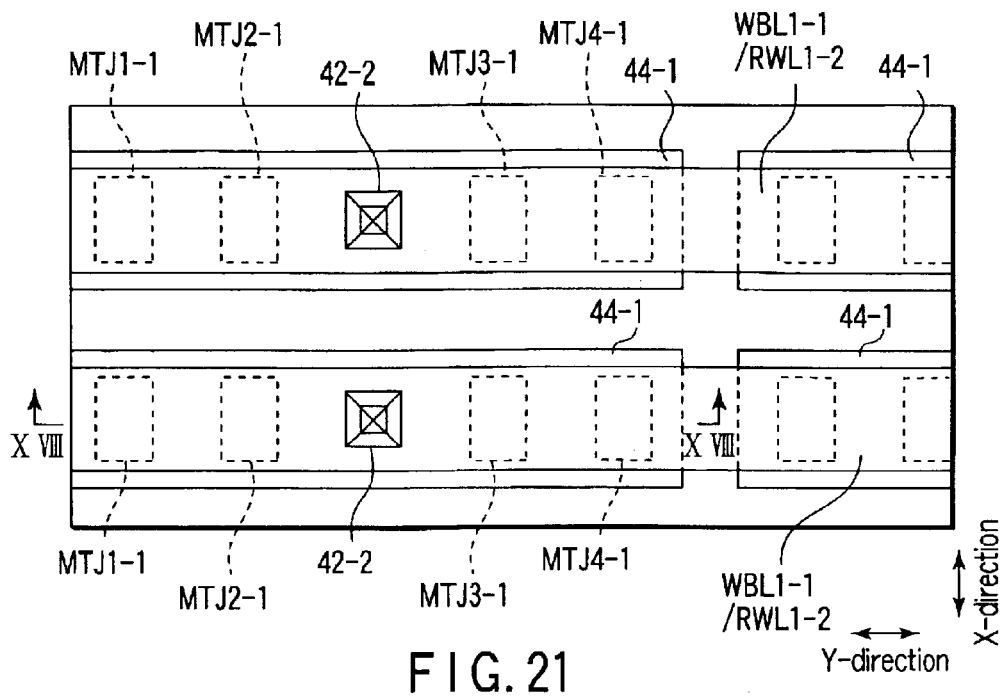
FIG. 21 is a plan view showing a device structure according to Structural Example 3.

FIG. 21 shows the layout of write bit lines of the first stage/read word lines of the second stage.

The upper electrodes 44-1 each having a rectangular pattern are arranged on the MTJ elements MTJ1-1, MTJ2-1, MTJ3-1, and MTJ4-1 and conductive layers 43. The upper electrodes 44-1 are in contact with the MTJ elements MTJ1-1, MTJ2-1, MTJ3-1, and MTJ4-1 and conductive layers 43-1.

The write bit lines/read word lines WBL1-1/RWL1-2 are arranged immediately on the upper electrodes 44-1. The write bit lines/read word lines WBL1-1/RWL1-2 run in the Y-direction.

The contact plug 42-2 is arranged on each write bit lines/read word lines WBL1-1/RWL1-2.

Figure 22:
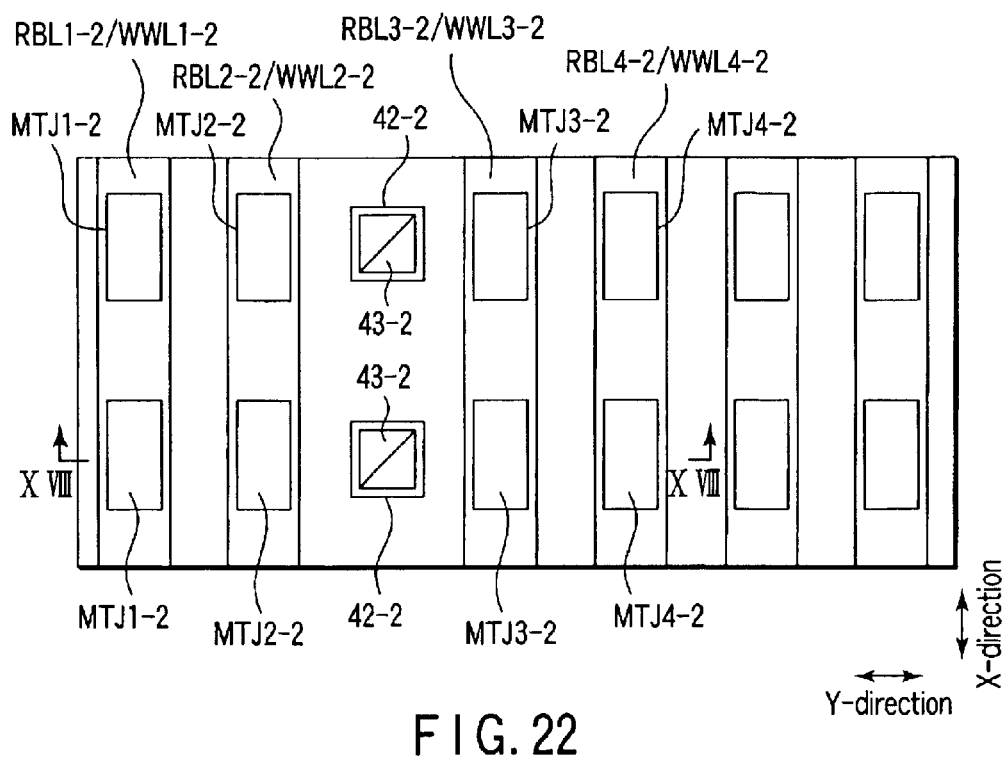
FIG. 22 is a plan view showing a device structure according to Structural Example 3.

FIG. 22 shows the layout of read bit lines of the second stage and MTJ elements of the second stage.

The read bit lines RBL1-2, RBL2-2, RBL3-2, and RBL4-2 (write word lines WWL1-2, WWL2-2, WWL3-2, and WWL4-2) run in the X-direction. The interval between the read bit lines RBL1-2, RBL2-2, RBL3-2, and RBL4-2 can be set to, e.g., the minimum size (or design rule) processible by photolithography.

The MTJ elements MTJ1-2, MTJ2-2, MTJ3-2, and MTJ4-2 are arranged on the read bit lines RBL1-2, RBL2-2, RBL3-2, and RBL4-2. The axis of easy magnetization of the MTJ elements MTJ1-2, MTJ2-2, MTJ3-2, and MTJ4-2, i.e., the direction parallel to the long sides of the MTJ elements MTJ1-2, MTJ2-2, MTJ3-2, and MTJ4-2 is the X-direction.

The read bit line RBL1-2 is commonly connected to the MTJ elements MTJ1-2 arranged in the X-direction. The read bit line RBL2-2 is commonly connected to the MTJ elements MTJ2-2 arranged in the X-direction. The read bit line RBL3-2 is commonly connected to the MTJ elements MTJ3-2 arranged in the X-direction. The read bit line RBL4-2 is commonly connected to the MTJ elements MTJ4-2 arranged in the X-direction.

The conductive layer 43-2 is arranged on the contact plug 42-2.

Figure 23:
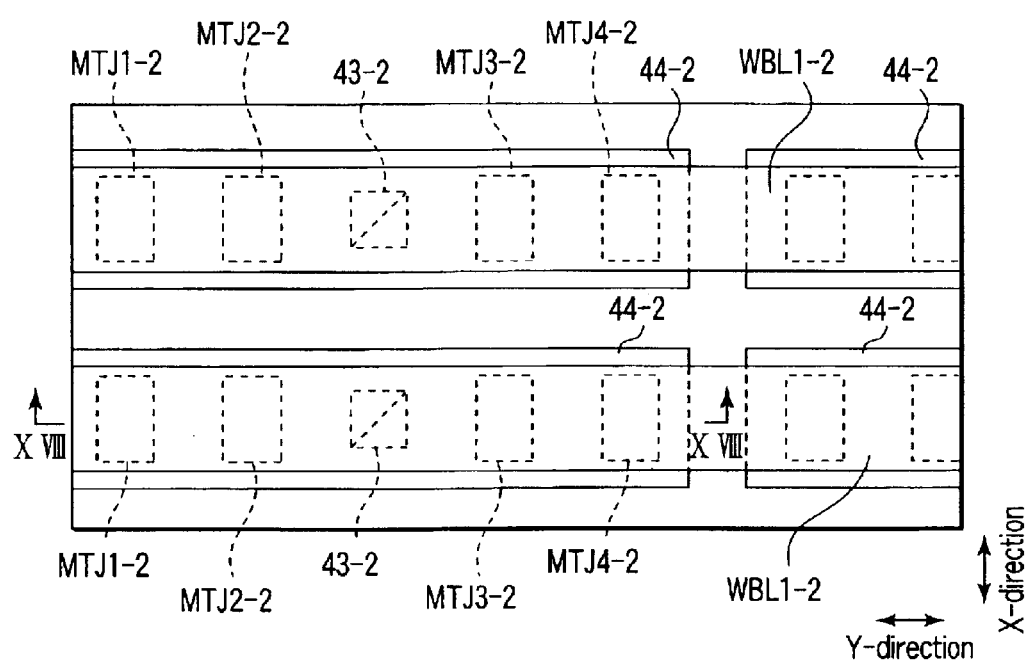
FIG. 23 is a plan view showing a device structure according to Structural Example 3.

FIG. 23 shows the layout of write bit lines of the second stage.

The upper electrodes 44-2 each having a rectangular pattern are arranged on the MTJ elements MTJ1-2, MTJ2-2, MTJ3-2, and MTJ4-2 and conductive layer 43-2. The upper electrodes 44-2 are in contact with the MTJ elements MTJ1-2, MTJ2-2, MTJ3-2, and MTJ4-2 and conductive layers 43-2.

The write bit lines WBL1-2 are arranged immediately on the upper electrodes 44-2. The write bit lines WBL1-2 run in the Y-direction.

(4) STRUCTURAL EXAMPLE 4

① Outline

Structural Example 4 is also an improvement of Structural Example 2. In Structural Example 4, a plurality of stages of memory cell arrays are stacked on a semiconductor substrate (chip), and one interconnection is shared by memory cell arrays of different stages, as in Structural Example 3. With this arrangement, the number of interconnections in the memory cell arrays is decreased to planarize the underlying layer of MTJ elements (improve the characteristic of MTJ elements).

Structural Example 4 is different from Structural Example 3 in the positional relationship of an interconnection to be shared. More specifically, in Structural Example 3, one interconnection is shared as a write bit line of the memory cell array of the lower stage and a read word line of the memory cell array of the upper stage. In Structural Example 4, one interconnection is shared as a read word line of the memory cell array of the lower stage and a write bit line of the memory cell array of the upper stage.

② Circuit Structure

In Structural Example 4, in a plurality of stages of memory cell arrays 11-1, 11-2, . . . , 11-$m$ stacked, the read word line of the memory cell array of the lower stage and the write bit line of the memory cell array of the upper stage are integrated and shared as one write bit line/read word line.

Figure 24:
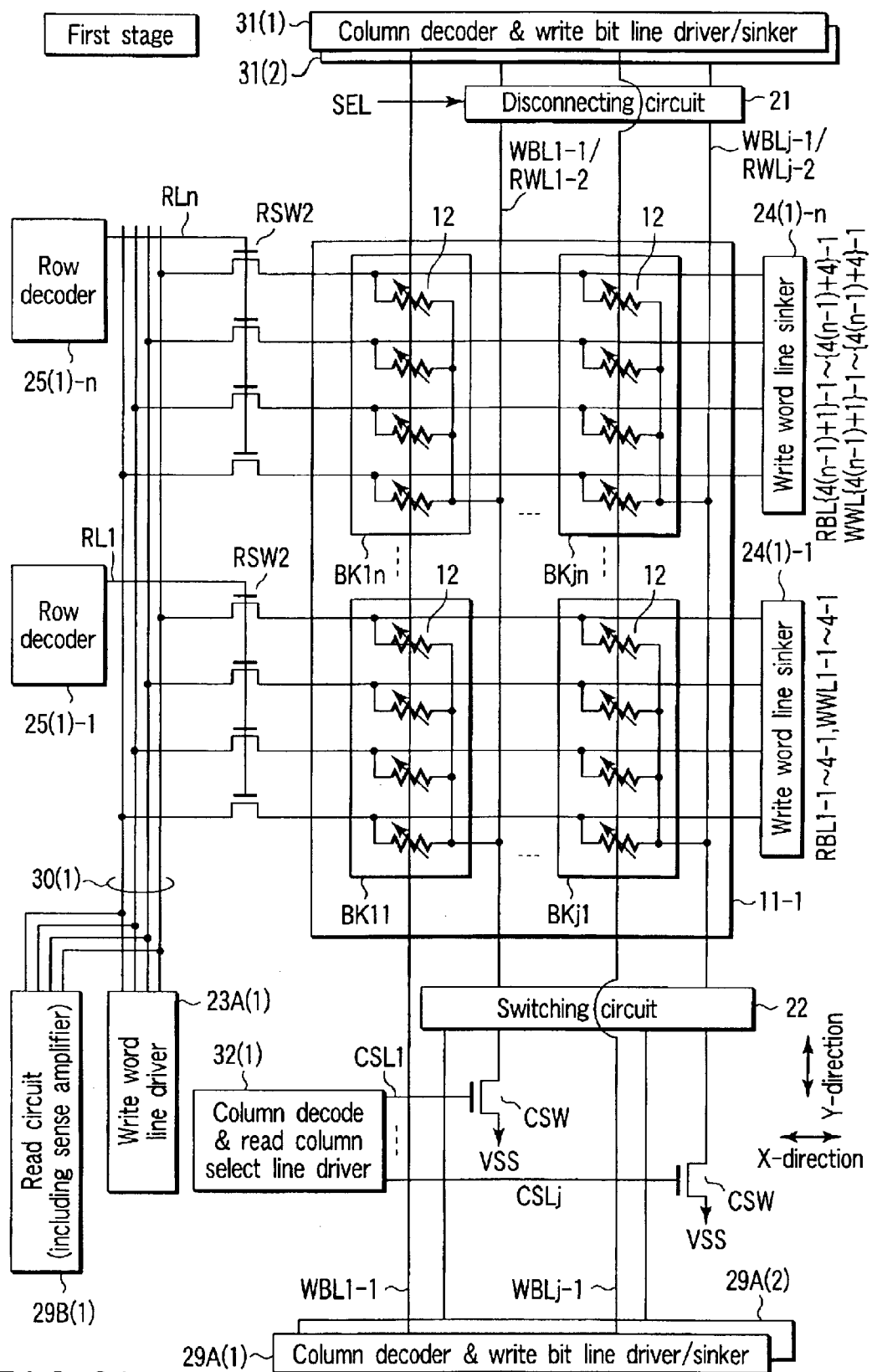
FIG. 24 is a circuit diagram showing a magnetic random access memory according to Structural Example 4 of the present invention.

FIGS. 24 and 25 show the main part of a magnetic random access memory according to Structural Example 4 of the present invention.

[1] First Stage (Lower Stage)

FIG. 24 shows the cell array structure of the first stage of Structural Example 4.

The memory cell array 11-1 has a plurality of MTJ elements 12 arranged in an array in the X- and Y-directions. For example, j MTJ elements 12 are arranged in the X-direction, and 4×n MTJ elements 12 are arranged in the Y-direction.

The four MTJ elements 12 arranged in the Y-direction form one read block BKik (i=1, . . . , j, and k=1, . . . , n). One row is constructed by j read blocks BKik arranged in the X-direction. The memory cell array 11 has n rows. In addition, one column is constructed by n read blocks BKik arranged in the Y-direction. The memory cell array 11-1 has j columns.

One terminal of each of the four MTJ elements 12 in the block BKik is commonly connected. The connection point is connected to, e.g., a read word line RWLi-1 (i=1, . . . , j). The read word line RWLi-1 runs in the Y-direction. One read word line RWLi-1 is arranged in one column.

The MTJ elements 12 in the read blocks BKik arranged in one column are directly connected to the read word lines RWLi-1 (i=1, . . . , j) without intervening read select switches (MOS transistors). One end of each read word line RWLi-1 is connected to a ground point VSS through a switching circuit 22 and a column select switch CSW formed from a MOS transistor.

The other end of the read word line RWLi-1 is connected to a circuit block 31(2) including a column decoder and write bit line driver/sinker through a disconnecting circuit 21.

The disconnecting circuit 21, switching circuit 22, and column select switches CSW are arranged outside the memory cell array 11-1. Hence, no switch elements (MOS transistors) are arranged in the memory cell array 11-1.

The disconnecting circuit 21 and switching circuit 22 are controlled by a memory cell array select signal SEL.

For example, in read operation, when the memory cell array 11-1 of the first stage (lower stage) is selected, the switching circuit 22 electrically connects one end of the read word line RWLi-1 to the column select switch CSW. The disconnecting circuit 21 electrically disconnects the other end of the read word line RWLi-1 from the circuit block 31(2).

The other terminal of each of the four MTJ elements 12 in the read block BKik is independently connected to a corresponding one of read bit lines RBL{4(n−1)+1}-1, RBL{4(n−1)+2}-1, RBL{4(n−1)+3}-1, and RBL{4(n−1)+4}-1. That is, the four read bit lines RBL{4(n−1)+1}-1, RBL{4(n−1)+2}-1, RBL{4(n−1)+3}-1, and RBL{4(n−1)+4}-1 are arranged in correspondence with the four MTJ elements 12 in one read block BKik.

The read bit lines RBL{4(n−1)+1}-1, RBL{4(n−1)+2}-1, RBL{4(n−1)+3}-1, and RBL{4(n−1)+4}-1 run in the X-direction. One end of each read bit line is connected to a common data line 30(1) through a row select switch (MOS transistor) RSW2. The common data line 30(1) is connected to a read circuit 29B(1) (including, e.g., a sense amplifier, selector, and output buffer).

Figure 114:
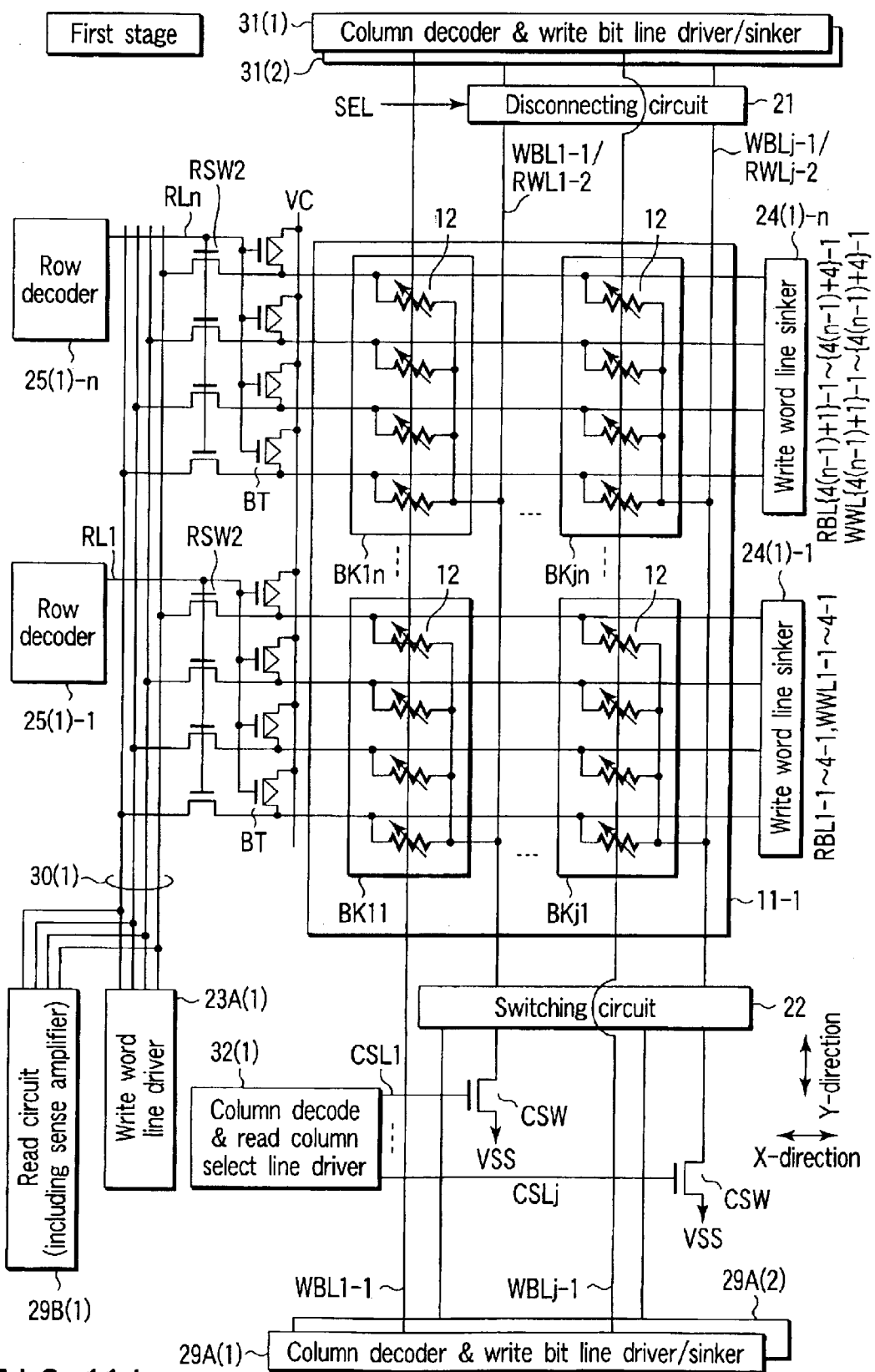
FIG. 114 is a circuit diagram showing a magnetic random access memory according to Structural Example 12 of the present invention.

For example, as shown in FIGS. 114 and 124, the read bit line is connected to a bias transistor BT which sets the bit line potential to VC.

A row select line signal RLi (i=1, ..., n) is input to each row select switch RSW2. Row decoders 25(1)-1, ..., 25(1)-n output the row select line signals RLi.

As shown in FIG. 114, the bias transistor BT is a PMOS transistor, when the RLi is input to the bias transistor BT. As shown in FIG. 124, the bias transistor BT is a NMOS transistor, when the inverting signal from RLi is input to the bias transistor BT. Row decoders 25(1)-1, ..., 25(1)-n output the row select line signals RLi and the inverting signal thereof.

The read bit lines RBL{4(n−1)+1}-1, RBL{4(n−1)+2}-1, RBL{4(n−1)+3}-1, and RBL{4(n−1)+4}-1 run in the X-direction and also function as write word lines WWL{4(n−1)+1}-1, WWL{4(n−1)+2}-1, WWL{4(n−1)+3}-1, and WWL{4(n−1)+4}-1, respectively.

One end of each of the write word lines WWL{4(n−1)+1}-1, WWL{4(n−1)+2}-1, WWL{4(n−1)+3}-1, and WWL{4(n−1)+4}-1 is connected to a write word line driver 23A(1) through the row select switches RSW2 and common data line 30(1). The other end of each write word line is connected to a corresponding one of write word line sinkers 24(1)-1, ..., 24(1)-n.

One write bit line WBLi-1 (i=1, ..., j) which is shared by the four MTJ elements 12 of one read block BKik and run in the Y-direction is arranged near the MTJ elements 12 constituting the read block BKik. One write bit line WBLi-1 is arranged in one column.

One end of each write bit line WBLi-1 is connected to a circuit block 29A(1) including a column decoder and write bit line driver/sinker. The other end of the write bit line WBLi-1 is connected to a circuit block 31(1) including a column decoder and write bit line driver/sinker.

In the write operation, the circuit blocks 29A(1) and 31(1) are set in an operative state. A write current flows to the write bit lines WBLi-2 in accordance with write data in a direction toward the circuit block 29A(1) or 31(1).

In the write operation, the row decoder 25(1)-n selects one of the plurality of rows on the basis of a row address signal. The write word line driver 23A(1) supplies a write current to the write word lines WWL{4(n−1)+1}-1, WWL{4(n−1)+2}-1, WWL{4(n−1)+3}-1, and WWL{4(n−1)+4}-1 in the selected row. The write current is absorbed by the write word line sinker 24(1)-n.

In read operation, the row decoder 25(1)-n selects one of the plurality of rows on the basis of a row address signal. In the read operation, a column decoder 32(1) selects one of the plurality of columns on the basis of column address signals CSL1, ..., CSLj to turn on the column select switch CSW arranged in the selected column.

[2] Second Stage (Upper Stage)

FIG. 25 shows the cell array structure of the second stage of Structural Example 4.

The memory cell array 11-2 has the plurality of MTJ elements 12 arranged in an array in the X- and Y-directions. For example, j MTJ elements 12 are arranged in the X-direction, and 4×n MTJ elements 12 are arranged in the Y-direction.

The four MTJ elements 12 arranged in the Y-direction form one read block BKik (i=1, ..., j, and k=1, ..., n). One row is constructed by j read blocks BKik arranged in the X-direction. The memory cell array 11 has n rows. In addition, one column is constructed by n read blocks BKik arranged in the Y-direction. The memory cell array 11-2 has j columns.

One terminal of each of the four MTJ elements 12 in the block BKik is commonly connected. The connection point is connected to, e.g., a read word line RWLi-2 (i=1, ..., j). The read word line RWLi-2 runs in the Y-direction. One read word line RWLi-2 is arranged in one column.

The MTJ elements 12 in the read blocks BKik arranged in one column are directly connected to the read word lines RWLi-2 (i=1, ..., j) without intervening read select switches (MOS transistors). One end of each read word line RWLi-2 is connected to the ground point VSS through the column select switch CSW formed from, e.g., a MOS transistor.

The column select switches CSW are arranged outside the memory cell array 11-2. Hence, no switch elements (MOS transistors) are arranged in the memory cell array 11-2.

The other terminal of each of the four MTJ elements 12 in the read block BKik is independently connected to a corresponding one of read bit lines RBL{4(n−1)+1}-2, RBL{4(n−1)+2}-2, RBL{4(n−1)+3}-2, and RBL{4(n−1)+4}-2. That is, the four read bit lines RBL{4(n−1)+1}-2, RBL{4(n−1)+2}-2, RBL{4(n−1)+3}-2, and RBL{4(n−1)+4}-2 are arranged in correspondence with the four MTJ elements 12 in one read block BKik.

The read bit lines RBL{4(n−1)+1}-2, RBL{4(n−1)+2}-2, RBL{4(n−1)+3}-2, and RBL{4(n−1)+4}-2 run in the X-direction. One end of each read bit line is connected to a common data line 30(2) through a row select switch (MOS transistor) RSW2. The common data line 30(2) is connected to a read circuit 29B(2) (including, e.g., a sense amplifier, selector, and output buffer).

For example, as shown in FIGS. 115 and 125, the read bit line is connected to a bias transistor BT which sets the bit line potential to VC.

A row select line signal RLi (i=1, ..., n) is input to each row select switch RSW2. Row decoders 25(2)-1, ..., 25(2)-n output the row select line signals RLi.

As shown in FIG. 115, the bias transistor BT is a PMOS transistor, when the RLi is input to the bias transistor BT. As shown in FIG. 125, the bias transistor BT is a NMOS transistor, when the inverting signal from RLi is input to the bias transistor BT. Row decoders 25(2)-1, ..., 25(2)-n output the row select line signals RLi and the inverting signal thereof.

The read bit lines RBL{4(n−1)+1}-2, RBL{4(n−1)+2}-2, RBL{4(n−1)+3}-2, and RBL{4(n−1)+4}-2 run in the X-direction and also function as write word lines WWL{4(n−1)+1}-2, WWL{4(n−1)+2}-2, WWL{4(n−1)+3}-2, and WWL{4(n−1)+4}-2, respectively.

One end of each of the write word lines WWL{4(n−1)+1}-2, WWL{4(n−1)+2}-2, WWL{4(n−1)+3}-2, and WWL{4(n−1)+4}-2 is connected to a write word line driver 23A(2) through the row select switches RSW2 and common data line 30(2). The other end of each write word line is connected to a corresponding one of write word line sinkers 24(2)-1, . . . , 24(2)-n.

One write bit line WBLi-2 (i=1, . . . , j) which is shared by the four MTJ elements 12 of one read block BKik and run in the Y-direction is arranged near the MTJ elements 12 constituting the read block BKik. One write bit line WBLi-2 is arranged in one column.

One end of each write bit line WBLi-2 is connected to a circuit block 29A(2) including a column decoder and write bit line driver/sinker through the switching circuit 22. The other end of the write bit line WBLi-2 is connected to a circuit block 31(2) including a column decoder and write bit line driver/sinker through the disconnecting circuit 21.

The disconnecting circuit 21 and switching circuit 22 are the disconnecting circuit 21 and switching circuit 22 in the cell array structure of the memory cell array of the first stage shown in FIG. 24.

The disconnecting circuit 21 and switching circuit 22 are controlled by the memory cell array select signal SEL.

As described above, in the read operation, when the memory cell array 11-1 of the first stage (lower stage) is selected, the switching circuit 22 electrically connects one end of the read word line RWLi-1 to the column select switch CSW. The disconnecting circuit 21 electrically disconnects the other end of the read word line RWLi-1 from the circuit block 31(2).

In the write operation, when the memory cell array 11-2 of the second stage (upper stage) is selected, the switching circuit 22 electrically connects one end of the write bit line WBLi-2 to the circuit block 29A(2). The disconnecting circuit 21 electrically connects the other end of the write bit line WBLi-2 to the circuit block 31(2).

In the write operation, the circuit blocks 29A(2) and 31(2) are set in an operative state. A write current flows to the write bit lines WBLi-2 in accordance with write data in a direction toward the circuit block 29A(2) or 31(2).

In the write operation, the row decoder 25(2)-n selects one of the plurality of rows on the basis of a row address signal. The write word line driver 23A(2) supplies a write current to the write word lines WWL{4(n−1)+1}-2, WWL{4(n−1)+2}-2, WWL{4(n−1)+3}-2, and WWL{4(n−1)+4}-2 in the selected row. The write current is absorbed by the write word line sinker 24(2)-n.

In the read operation, the row decoder 25(2)-n selects one of the plurality of rows on the basis of a row address signal. In the read operation, a column decoder 32(2) selects one of the plurality of columns on the basis of column address signals CSL1, . . . , CSLj to turn on the column select switch CSW arranged in the selected column.

③ Device Structure (Sectional Structure)

As a characteristic feature of the device structure of Structural Example 4, in the memory cell array of Device Structure 2 (FIG. 15) of Structural Example 2, a read word line RWL1-1 of the lower stage (first stage) and a write bit line WBL1-2 of the upper stage (second stage) are integrated and shared as one read word line/write bit line RWL1-1/WBL1-2.

Figure 26:
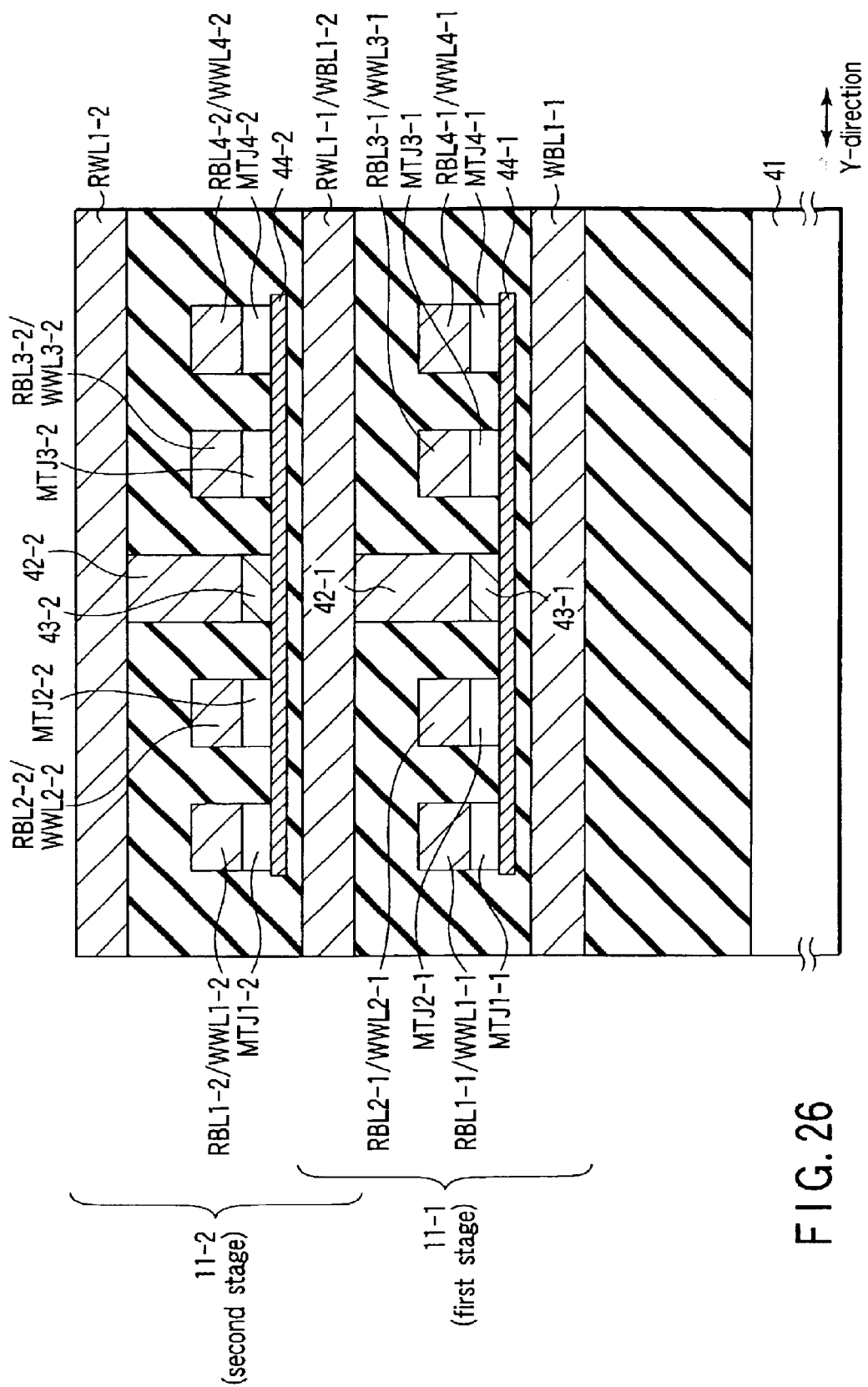
FIG. 26 is a sectional view showing a device structure according to Structural Example 4.

FIG. 26 shows a device structure corresponding to one block of the magnetic random access memory according to Structural Example 4 of the present invention.

[1] First Stage (Memory Cell Array 11-1)

The write bit line WBL1-1 running in the Y-direction is formed on a semiconductor substrate 41. No switch element is arranged immediately under the write bit line WBL1-1. A lower electrode 44-1 having, e.g., a rectangular pattern is formed above the write bit line WBL1-1.

The four MTJ elements (Magnetic Tunnel Junction elements) MTJ1-1, MTJ2-1, MTJ3-1, and MTJ4-1 arrayed in the Y-direction are formed on the lower electrode 44-1.

The read bit lines RBL1-1, RBL2-1, RBL3-1, and RBL4-1 (write word lines WWL1-1, WWL2-1, WWL3-1, and WWL4-1) are formed on the MTJ elements MTJ1-1, MTJ2-1, MTJ3-1, and MTJ4-1, respectively. The read bit lines RBL1-1, RBL2-1, RBL3-1, and RBL4-1 are in contact with the MTJ elements MTJ1-1, MTJ2-1, MTJ3-1, and MTJ4-1, respectively. The read bit lines RBL1-1, RBL2-1, RBL3-1, and RBL4-1 run in the X-direction (row direction).

The MTJ elements MTJ1-1, MTJ2-1, MTJ3-1, and MTJ4-1 are independently connected to the read bit lines RBL1-1, RBL2-1, RBL3-1, and RBL4-1, respectively. That is, the four read bit lines RBL1-1, RBL2-1, RBL3-1, and RBL4-1 are arranged in correspondence with the four MTJ elements MTJ1-1, MTJ2-1, MTJ3-1, and MTJ4-1.

The contact plug 42-1 and conductive layer 43-1 are formed on the lower electrode 44-1. The contact plug 42-1 and conductive layer 43-1 electrically connect the lower electrode 44-1 to the read word line RWL1-1.

The contact plug 42-1 is arranged at the central portion of the lower electrode 44-1. When the MTJ elements MTJ1-1, MTJ2-1, MTJ3-1, and MTJ4-1 are uniformly arranged to be symmetrical with respect to the contact plug 42-1, signal margin in the read operation due to the interconnection resistance or the like can be maximized.

The conductive layer 43-1 may be integrated with the contact plug 42-1. More specifically, the conductive layer 43-1 may be omitted, and the contact plug 42-1 may be brought into direct contact with the lower electrode 44-1.

The read word line RWL1-1 is formed above the MTJ elements MTJ1-1, MTJ2-1, MTJ3-1, and MTJ4-1. The read word line RWL1-1 runs in the Y-direction (column direction).

[2] Second Stage (Memory Cell Array 11-2)

The read word line RWL1-1 in the memory cell array 11-1 of the first stage also functions as the write bit line WBL1-1 in the memory cell array 11-2 of the second stage.

More specifically, in the read operation, when the memory cell array 11-1 of the first stage is selected, the read word line/write bit line RWL1-1/WBL1-2 is used as the read word line RWL1-1. In the write operation, when the memory cell array 11-2 of the second stage is selected, the read word line/write bit line RWL1-1/WB1-2 is used as the write bit line WBL1-2.

A lower electrode 44-2 having, e.g., a rectangular pattern is formed above the write bit line WBL1-2. The four MTJ elements (Magnetic Tunnel Junction elements) MTJ1-2, MTJ2-2, MTJ3-2, and MTJ4-2 arrayed in the Y-direction are formed on the lower electrode 44-2.

The read bit lines RBL1-2, RBL2-2, RBL3-2, and RBL4-2 (write word lines WWL1-2, WWL2-2, WWL3-2, and WWL4-2) are formed on the MTJ elements MTJ1-2, MTJ2-2, MTJ3-2, and MTJ4-2, respectively. The read bit lines RBL1-2, RBL2-2, RBL3-2, and RBL4-2 are in contact with the MTJ elements MTJ1-2, MTJ2-2, MTJ3-2, and MTJ4-2, respectively. The read bit lines RBL1-2, RBL2-2, RBL3-2, and RBL4-2 run in the X-direction (row direction).

The MTJ elements MTJ1-2, MTJ2-2, MTJ3-2, and MTJ4-2 are independently connected to the read bit lines RBL1-2, RBL2-2, RBL3-2, and RBL4-2, respectively. That is, the four read bit lines RBL1-2, RBL2-2, RBL3-2, and RBL4-2 are arranged in correspondence with the four MTJ elements MTJ1-2, MTJ2-2, MTJ3-2, and MTJ4-2.

The contact plug 42-2 and conductive layer 43-2 are formed on the lower electrode 44-2. The contact plug 42-2 and conductive layer 43-2 electrically connect the lower electrode 44-2 to the read word line RWL1-2.

The contact plug 42-2 is arranged at the central portion of the lower electrode 44-2. When the MTJ elements MTJ1-2, MTJ2-2, MTJ3-2, and MTJ4-2 are uniformly arranged to be symmetrical with respect to the contact plug 42-2, signal margin in the read operation due to the interconnection resistance or the like can be maximized.

The conductive layer 43-2 may be integrated with the contact plug 42-2. More specifically, the conductive layer 43-2 may be omitted, and the contact plug 42-2 may be brought into direct contact with the lower electrode 44-2.

The read word line RWL1-2 is formed above the MTJ elements MTJ1-2, MTJ2-2, MTJ3-2, and MTJ4-2. The read word line RWL1-2 runs in the Y-direction (column direction).

[3] Others

In the example shown in FIG. 26, the memory cell arrays 11-1 and 11-2 are stacked in two stages on the semiconductor substrate 41. In principle, the memory cell arrays may be stacked in three or more stages (there is no upper limit).

According to the device structure of Structural Example 4, the memory cell array 11-1 of the lower stage and the memory cell array 11-2 of the upper stage according to Device Structure 2 of Structural Example 2 share one interconnection. For this reason, the density of MTJ elements can be increased. In addition, the underlying layer of the MTJ elements can be planarized (the characteristic of the MTJ elements can be improved).

④ Device Structure (Plan Structure)

FIGS. 27 to 33 show the layouts of the respective interconnection layers in device structure shown in FIG. 26. The section shown in FIG. 26 corresponds to the section taken along a line XXVI—XXVI in FIGS. 27 to 33.

Figure 27:
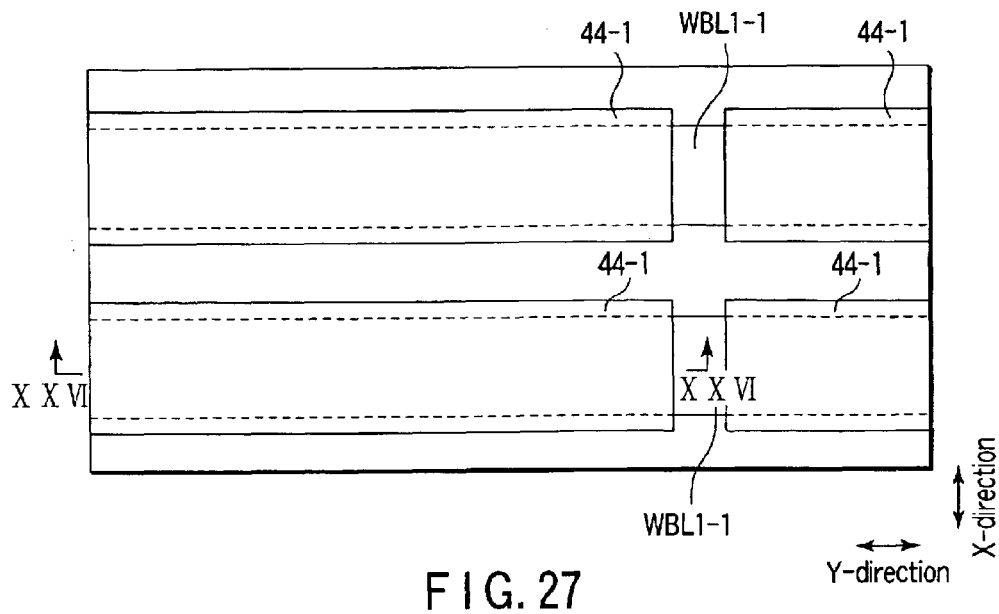
FIG. 27 is a plan view showing a device structure according to Structural Example 4.

FIG. 27 shows the layout of write bit lines of the first stage.

The write bit lines WBL1-1 run in the Y-direction. The lower electrode 44-1 having a rectangular shape is arranged on each write bit line WBL1-1.

Figure 28:
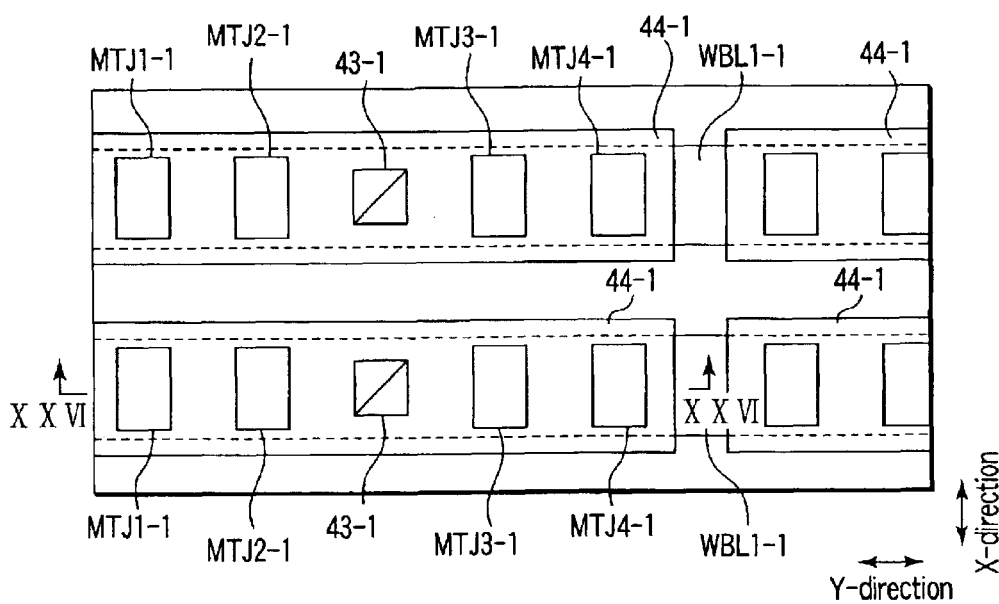
FIG. 28 is a plan view showing a device structure according to Structural Example 4.

FIG. 28 shows the layout of MTJ elements of the first stage.

The MTJ elements MTJ1-1, MTJ2-1, MTJ3-1, and MTJ4-1 and conductive layer 43-1 are arranged on the lower electrode 44-1 having a rectangular pattern.

The MTJ elements MTJ1-1, MTJ2-1, MTJ3-1, and MTJ4-1 on the lower electrode 44-1 are arranged in the Y-direction. The axis of easy magnetization of the MTJ elements MTJ1-1, MTJ2-1, MTJ3-1, and MTJ4-1, i.e., the direction parallel to the long sides of the MTJ elements MTJ1-1, MTJ2-1, MTJ3-1, and MTJ4-1 is the X-direction.

Figure 29:
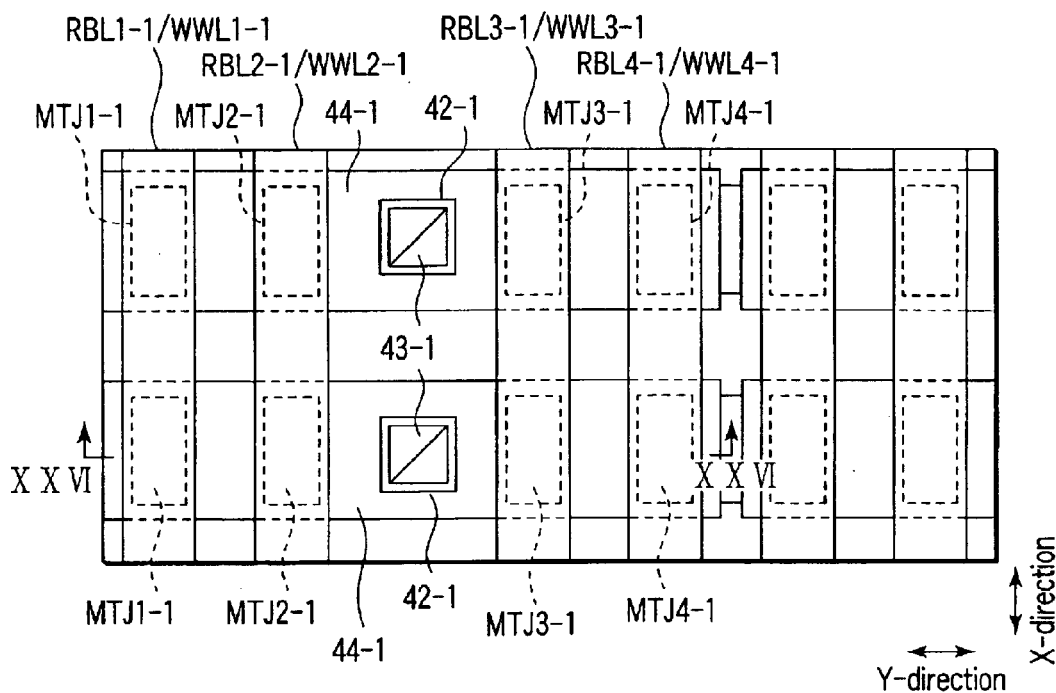
FIG. 29 is a plan view showing a device structure according to Structural Example 4.

FIG. 29 shows the layout of read bit lines of the first stage.

The read bit lines RBL1-1, RBL2-1, RBL3-1, and RBL4-1 (write word lines WWL1-1, WWL2-1, WWL3-1, and WWL4-1) are arranged on the MTJ elements MTJ1-1, MTJ2-1, MTJ3-1, and MTJ4-1, respectively.

The read bit lines RBL1-1, RBL2-1, RBL3-1, and RBL4-1 run in the X-direction. The interval between the read bit lines RBL1-1, RBL2-1, RBL3-1, and RBL4-1 can be set to, e.g., the minimum size (or design rule) processable by photolithography.

The read bit line RBL1-1 is commonly connected to the MTJ elements MTJ1-1 arranged in the X-direction. The read bit line RBL2-1 is commonly connected to the MTJ elements MTJ2-1 arranged in the X-direction. The read bit line RBL3-1 is commonly connected to the MTJ elements MTJ3-1 arranged in the X-direction. The read bit line RBL4-1 is commonly connected to the MTJ elements MTJ4-1 arranged in the X-direction.

The contact plug 42-1 is arranged on the conductive layer 43-1.

Figure 30:
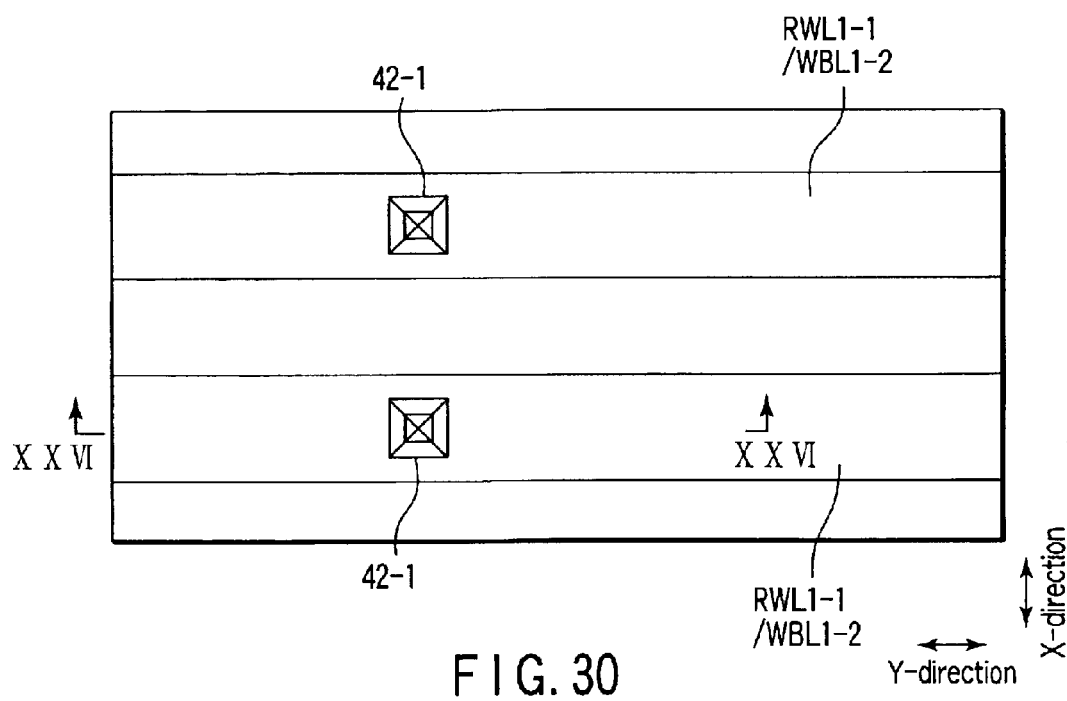
FIG. 30 is a plan view showing a device structure according to Structural Example 4.

FIG. 30 shows the layout of read word lines of the first stage/write bit lines of the second stage.

The read word lines/write bit lines RWL1-1/WBL1-2 run in the Y-direction. The read word line/write bit line RWL1-1/WBL1-2 is in contact with the contact plug 42-1.

Figure 31:
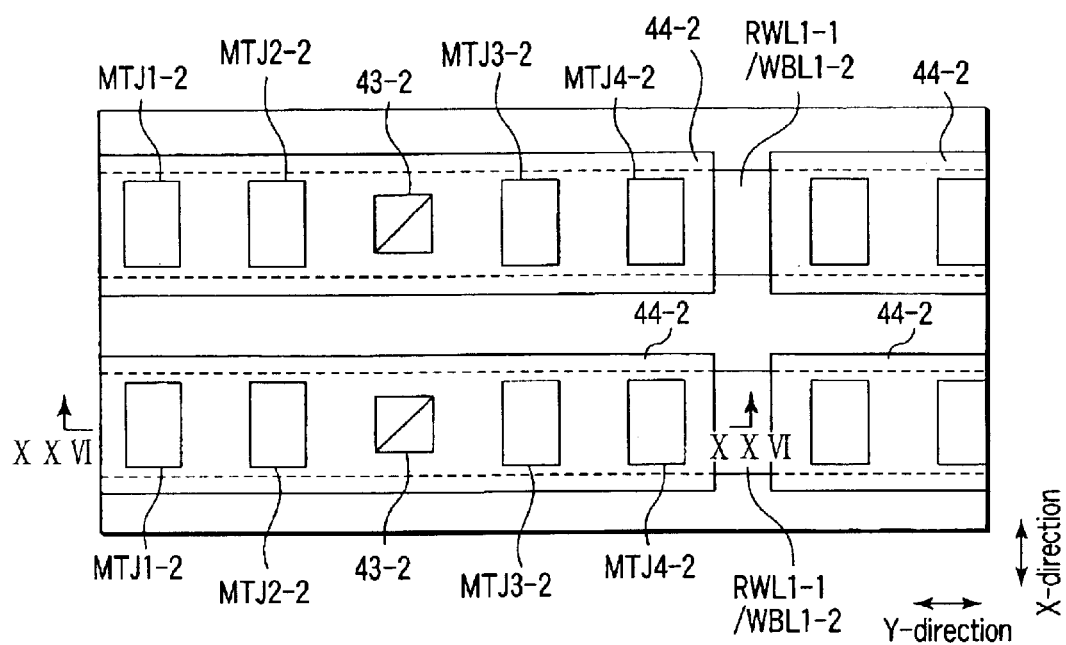
FIG. 31 is a plan view showing a device structure according to Structural Example 4.

FIG. 31 shows the layout of MTJ elements of the second stage.

The MTJ elements MTJ1-2, MTJ2-2, MTJ3-2, and MTJ4-2 and conductive layer 43-2 are arranged on the lower electrode 44-2 having a rectangular pattern.

The MTJ elements MTJ1-2, MTJ2-2, MTJ3-2, and MTJ4-2 on the lower electrode 44-2 are arranged in the Y-direction. The axis of easy magnetization of the MTJ elements MTJ1-2, MTJ2-2, MTJ3-2, and MTJ4-2, i.e., the direction parallel to the long sides of the MTJ elements MTJ1-2, MTJ2-2, MTJ3-2, and MTJ4-2 is the X-direction.

Figure 32:
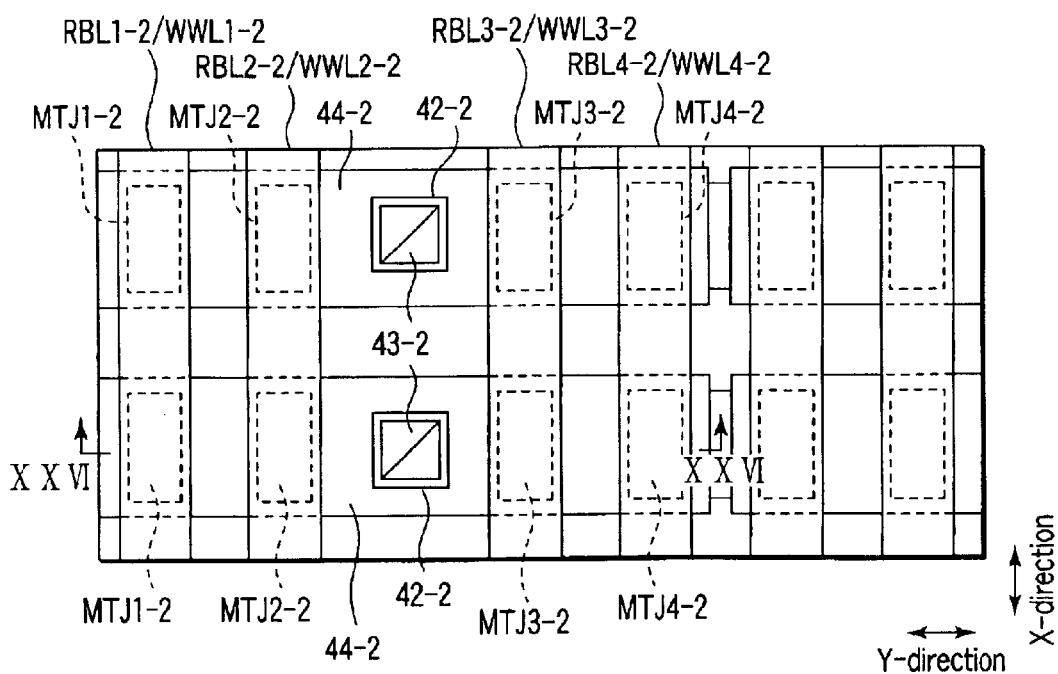
FIG. 32 is a plan view showing a device structure according to Structural Example 4.

FIG. 32 shows the layout of read bit lines of the second stage.

The read bit lines RBL1-2, RBL2-2, RBL3-2, and RBL4-2 (write word lines WWL1-2, WWL2-2, WWL3-2, and WWL4-2) are arranged on the MTJ elements MTJ1-2, MTJ2-2, MTJ3-2, and MTJ4-2, respectively.

The read bit lines RBL1-2, RBL2-2, RBL3-2, and RBL4-2 run in the X-direction. The interval between the read bit lines RBL1-2, RBL2-2, RBL3-2, and RBL4-2 can be set to, e.g., the minimum size (or design rule) processable by photolithography.

The read bit line RBL1-2 is commonly connected to the MTJ elements MTJ1-2 arranged in the X-direction. The read bit line RBL2-2 is commonly connected to the MTJ elements MTJ2-2 arranged in the X-direction. The read bit line RBL3-2 is commonly connected to the MTJ elements MTJ3-2 arranged in the X-direction. The read bit line RBL4-2 is commonly connected to the MTJ elements MTJ4-2 arranged in the X-direction.

The contact plug 42-2 is arranged on the conductive layer 43-2.

Figure 33:
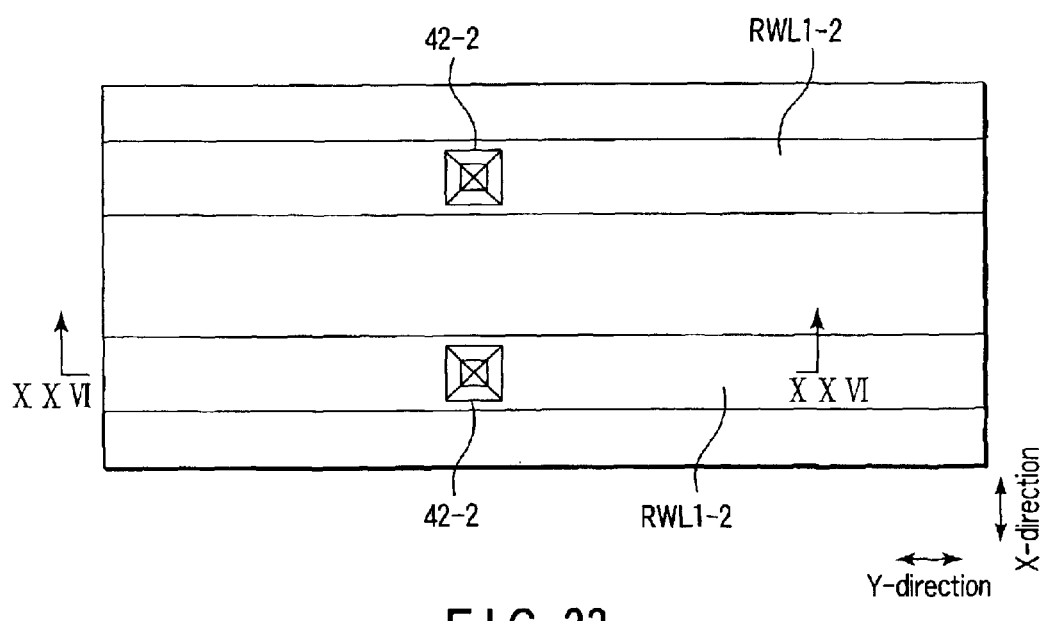
FIG. 33 is a plan view showing a device structure according to Structural Example 4.

FIG. 33 shows the layout of read word lines of the second stage.

The read word lines RWL1-2 run in the Y-direction. The read word line RWL1-2 is in contact with the contact plug 42-2.

(5) STRUCTURAL EXAMPLE 5

① Outline

In Structural Examples 3 and 4, one interconnection is shared as interconnections having different functions of two memory cell arrays (lower and upper stages).

In Structural Example 5, one interconnection is shared as interconnections having identical functions of two memory cell arrays. When one interconnection is shared as interconnections having identical functions, the switching circuit and disconnecting circuit in Structural Examples 3 and 4 can be omitted. Hence, the peripheral circuit arrangement is simplified.

② Circuit Structure

In Structural Example 5, in a plurality of stages of memory cell arrays 11-1, 11-2, ..., 11-*m* stacked, the write bit line of the memory cell array of the lower stage and that of the memory cell array of the upper stage are integrated and shared as one write bit line.

Figure 35:
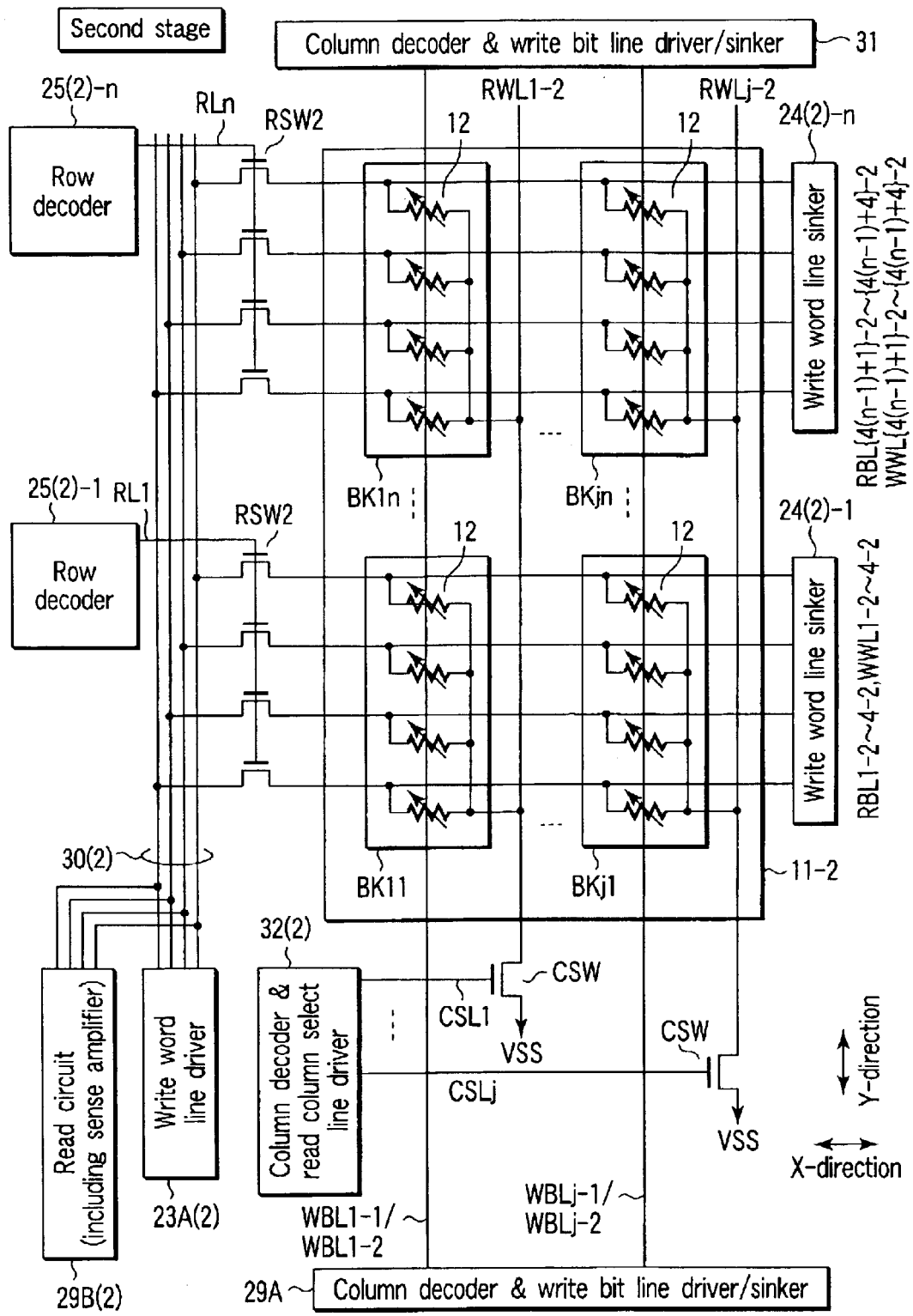
FIG. 35 is a circuit diagram showing the magnetic random access memory according to Structural Example 5 of the present invention.

FIGS. 34 and 35 show the main part of a magnetic random access memory according to Structural Example 5 of the present invention.

[1] First Stage (Lower Stage)

FIG. 34 shows the cell array structure of the first stage of Structural Example 5.

The memory cell array 11-1 has a plurality of MTJ elements 12 arranged in an array in the X- and Y-directions. For example, j MTJ elements 12 are arranged in the X-direction, and 4×n MTJ elements 12 are arranged in the Y-direction.

The four MTJ elements 12 arranged in the Y-direction form one read block BKik (i=1, . . . , j, and k=1, . . . , n). One row is constructed by j read blocks BKik arranged in the X-direction. The memory cell array 11 has n rows. In addition, one column is constructed by n read blocks BKik arranged in the Y-direction. The memory cell array 11-1 has j columns.

One terminal of each of the four MTJ elements 12 in the block BKik is commonly connected. The connection point is connected to, e.g., a read word line RWLi-1 (i=1, . . . , j). The read word line RWLi-1 runs in the Y-direction. One read word line RWLi-1 is arranged in one column.

The MTJ elements 12 in the read blocks BKik arranged in one column are directly connected to the read word lines RWLi-1 (i=1, . . . , j) without intervening read select switches (MOS transistors). One end of each read word line RWLi-1 is connected to a ground point VSS through a column select switch CSW formed from, e.g., a MOS transistor.

The column select switches CSW are arranged outside the memory cell array 11-1. Hence, no switch elements (MOS transistors) are arranged in the memory cell array 11-1.

The other terminal of each of the four MTJ elements 12 in the read block BKik is independently connected to a corresponding one of read bit lines RBL{4(n−1)+1}-1, RBL{4(n−1)+2}-1, RBL{4(n−1)+3}-1, and RBL{4(n−1)+4}-1. That is, the four read bit lines RBL{4(n−1)+1}-1, RBL{4(n−1)+2}-1, RBL{4(n−1)+3}-1, and RBL{4(n−1)+4}-1 are arranged in correspondence with the four MTJ elements 12 in one read block BKik.

The read bit lines RBL{4(n−1)+1}-1, RBL{4(n−1)+2}-1, RBL{4(n−1)+3}-1, and RBL{4(n−1)+4}-1 run in the X-direction. One end of each read bit line is connected to a common data line 30(1) through a row select switch (MOS transistor) RSW2. The common data line 30(1) is connected to a read circuit 29B(1) (including, e.g., a sense amplifier, selector, and output buffer).

For example, as shown in FIGS. 11b and 12b, the read bit line is connected to a bias transistor BT which sets the bit line potential to VC.

A row select line signal RLi (i=1, . . . , n) is input to each row select switch RSW2. Row decoders 25(1)-1, . . . , 25(1)-n output the row select line signals RLi.

As shown in FIG. 11b, the bias transistor BT is a PMOS transistor, when the RLi is input to the bias transistor BT. As shown in FIG. 12b, the bias transistor BT is a NMOS transistor, when the inverting signal from RLi is input to the bias transistor BT. Row decoders 25(1)-1, . . . , 25(1)-n output the row select line signals RLi and the inverting signal thereof.

The read bit lines RBL{4(n−1)+1}-1, RBL{4(n−1)+2}-1, RBL{4(n−1)+3}-1, and RBL{4(n−1)+4}-1 run in the X-direction and also function as write word lines WWL{4(n−1)+1}-1, WWL{4(n−1)+2}-1, WWL{4(n−1)+3}-1, and WWL{4(n−1)+4}-1, respectively.

One end of each of the write word lines WWL{4(n−1)+1}-1, WWL{4(n−1)+2}-1, WWL{4(n−1)+3}-1, and WWL{4(n−1)+4}-1 is connected to a write word line driver 23A(1) through the row select switches RSW2 and common data line 30(1). The other end of each write word line is connected to a corresponding one of write word line sinkers 24(1)-1, . . . , 24(1)-n.

One write bit line WBLi-1 (i=1, . . . , j) which is shared by the four MTJ elements 12 of one read block BKik and run in the Y-direction is arranged near the MTJ elements 12 constituting the read block BKik. One write bit line WBLi-1 is arranged in one column.

The write bit line WBLi-1 also functions as a write bit line WBLi-2 (i=1, . . . , j) in the memory cell array of the second stage.

Each write bit line WBLi-1 is connected to a circuit block 29A including a column decoder and write bit line driver/sinker. The other end of the write bit line WBLi-1 is connected to a circuit block 31 including a column decoder and write bit line driver/sinker.

In the write operation, the circuit blocks 29A and 31 are set in an operative state. A write current flows to the write bit lines WBLi-1 in accordance with write data in a direction toward the circuit block 29A or 31.

In the write operation, the row decoder 25(1)-n selects one of the plurality of rows on the basis of a row address signal. The write word line driver 23A(1) supplies a write current to the write word lines WWL{4(n−1)+1}-1, WWL{4(n−1)+2}-1, WWL{4(n−1)+3}-1, and WWL{4(n−1)+4}-1 in the selected row. The write current is absorbed by the write word line sinker 24(1)-n.

In read operation, the row decoder 25(1)-n selects one of the plurality of rows on the basis of a row address signal. In the read operation, a column decoder 32(1) selects one of the plurality of columns on the basis of column address signals CSL1, . . . , CSLj to turn on the column select switch CSW arranged in the selected column.

[2] Second Stage (Upper Stage)

FIG. 35 shows the cell array structure of the second stage of Structural Example 5.

The memory cell array 11-2 has the plurality of MTJ elements 12 arranged in an array in the X- and Y-directions. For example, j MTJ elements 12 are arranged in the X-direction, and 4×n MTJ elements 12 are arranged in the Y-direction.

The four MTJ elements 12 arranged in the Y-direction form one read block BKik (i=1, . . . , j, and k=1, . . . , n). One row is constructed by j read blocks BKik arranged in the X-direction. The memory cell array 11 has n rows. In addition, one column is constructed by n read blocks BKik arranged in the Y-direction. The memory cell array 11-2 has j columns.

One terminal of each of the four MTJ elements 12 in the block BKik is commonly connected. The connection point is connected to, e.g., a read word line RWLi-2 (i=1, . . . , j). The read word line RWLi-2 runs in the Y-direction. One read word line RWLi-2 is arranged in one column.

The MTJ elements 12 in the read blocks BKik arranged in one column are directly connected to the read word lines RWLi-2 (i=1, . . . , j) without intervening read select switches (MOS transistors). One end of each read word line RWLi-2 is connected to the ground point VSS through the column select switch CSW formed from a MOS transistor.

The column select switches CSW are arranged outside the memory cell array 11-2. Hence, no switch elements (MOS transistors) are arranged in the memory cell array 11-2.

The other terminal of each of the four MTJ elements 12 in the read block BKik is independently connected to a corresponding one of read bit lines RBL{4(n−1)+1}-2, RBL{4(n−1)+2}-2, RBL{4(n−1)+3}-2, and RBL{4(n−1)+4}-2. That is, the four read bit lines RBL{4(n−1)+1}-2, RBL{4(n−1)+2}-2, RBL{4(n−1)+3}-2, and RBL{4(n−1)+4}-2 are arranged in correspondence with the four MTJ elements 12 in one read block BKik.

The read bit lines RBL{4(n−1)+1}-2, RBL{4(n−1)+2}-2, RBL{4(n−1)+3}-2, and RBL{4(n−1)+4}-2 run in the X-direction. One end of each read bit line is connected to a common data line 30(2) through a row select switch (MOS transistor) RSW2. The common data line 30(2) is connected to a read circuit 29B(2) (including, e.g., a sense amplifier, selector, and output buffer).

For example, as shown in FIGS. 117 and 127, the read bit line is connected to a bias transistor BT which sets the bit line potential to VC.

A row select line signal RLi (i=1, . . . , n) is input to each row select switch RSW2. Row decoders 25(2)-1, . . . , 25(2)-n output the row select line signals RLi.

As shown in FIG. 117, the bias transistor BT is a PMOS transistor, when the RLi is input to the bias transistor BT. As shown in FIG. 127, the bias transistor BT is a NMOS transistor, when the inverting signal from RLi is input to the bias transistor BT. Row decoders 25(2)-1, . . . , 25(2)-n output the row select line signals RLi and the inverting signal thereof.

The read bit lines RBL{4(n−1)+1}-2, RBL{4(n−1)+2}-2, RBL{4(n−1)+3}-2, and RBL{4(n−1)+4}-2 run in the X-direction and also function as write word lines WWL{4(n−1)+1}-2, WWL{4(n−1)+2}-2, WWL{4(n−1)+3}-2, and WWL{4(n−1)+4}-2, respectively.

One end of each of the write word lines WWL{4(n−1)+1}-2, WWL{4(n−1)+2}-2, WWL{4(n−1)+3}-2, and WWL{4(n−1)+4}-2 is connected to a write word line driver 23A(2) through the row select switches RSW2 and common data line 30(2). The other end of each write word line is connected to a corresponding one of write word line sinkers 24(2)-1, . . . , 24(2)-n.

One write bit line WBLi-2 (i=1, . . . , j) which is shared by the four MTJ elements 12 of one read block BKik and run in the Y-direction is arranged near the MTJ elements 12 constituting the read block BKik. One write bit line WBLi-2 is arranged in one column.

As described above, the write bit line WBLi-2 is also used as the write bit line WBL1-1 of the memory cell array of the first stage.

One end of each write bit line WBLi-2 is connected to the circuit block 29A including a column decoder and write bit line driver/sinker. The other end of the write bit line WBLi-2 is connected to the circuit block 31 including a column decoder and write bit line driver/sinker.

In the write operation, the circuit blocks 29A and 31 are set in an operative state. A write current flows to the write bit lines WBLi-2 in accordance with write data in a direction toward the circuit block 29A or 31.

In the write operation, the row decoder 25(2)-n selects one of the plurality of rows on the basis of a row address signal. The write word line driver 23A(2) supplies a write current to the write word lines WWL{4(n−1)+1}-2, WWL{4(n−1)+2}-2, WWL{4(n−1)+3}-2, and WWL{4(n−1)+4}-2 in the selected row. The write current is absorbed by the write word line sinker 24(2)-n.

In the read operation, the row decoder 25(2)-n selects one of the plurality of rows on the basis of a row address signal. In the read operation, a column decoder 32(2) selects one of the plurality of columns on the basis of column address signals CSL1, . . . , CSLj to turn on the column select switch CSW arranged in the selected column.

③ Device Structure (Sectional Structure)

As a characteristic feature of the device structure of Structural Example 5, Device Structure 2 (FIG. 4) of Structural Example 1 is employed for the memory cell array of the first stage, Device Structure 3 (FIG. 8) of Structural Example 1 is employed for the memory cell array of the second stage, and the write bit line is shared.

Figure 36:
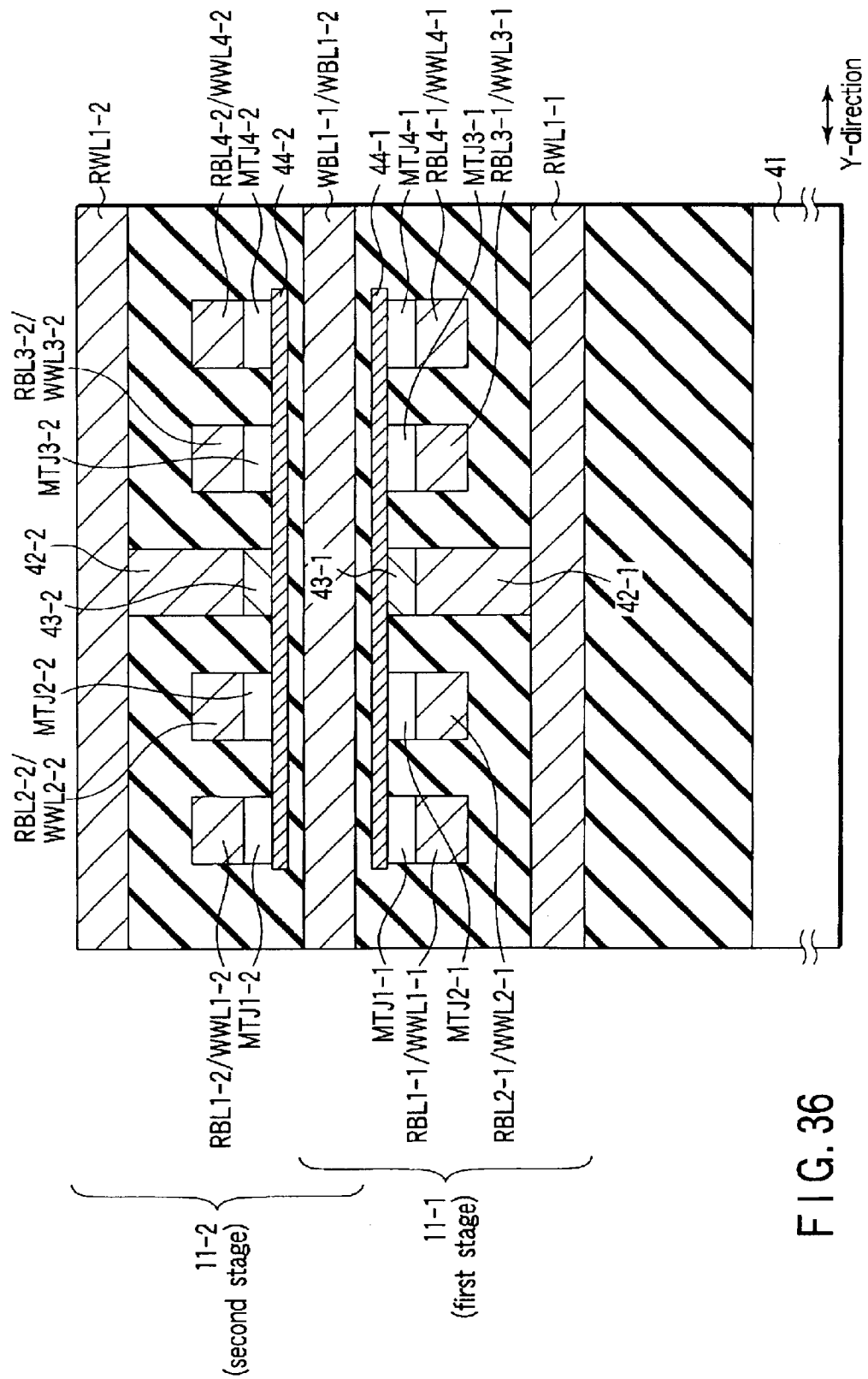
FIG. 36 is a sectional view showing a device structure according to Structural Example 5.

FIG. 36 shows a device structure corresponding to one block of the magnetic random access memory according to Structural Example 5 of the present invention.

[1] First Stage (Memory Cell Array 11-1)

A read word line RWL1-1 running in the Y-direction is formed on a semiconductor substrate 41. No switch element is arranged immediately under the read word line RWL1-1. Four MTJ elements (Magnetic Tunnel Junction elements) MTJ1-1, MTJ2-1, MTJ3-1, and MTJ4-1 arrayed in the Y-direction are formed above the read word line RWL1-1.

One terminal (upper end in this example) of each of the MTJ elements MTJ1-1, MTJ2-1, MTJ3-1, and MTJ4-1 is commonly connected to an upper electrode 44-1. A contact plug 42-1 and conductive layer 43-1 electrically connect the upper electrode 44-1 to the read word line RWL1-1.

The contact plug 42-1 is arranged at the central portion of the upper electrode 44-1. When the MTJ elements MTJ1-1, MTJ2-1, MTJ3-1, and MTJ4-1 are uniformly arranged to be symmetrical with respect to the contact plug 42-1, signal margin in the read operation due to the interconnection resistance or the like can be maximized.

The conductive layer 43-1 may be integrated with the upper electrode 44-1. That is, the conductive layer 43-1 and upper electrode 44-1 may be formed simultaneously using the same material.

The other terminal (lower end in this example) of each of the MTJ elements MTJ1-1, MTJ2-1, MTJ3-1, and MTJ4-1 is electrically connected to a corresponding one of read bit lines RBL1-1, RBL2-1, RBL3-1, and RBL4-1 (write word lines WWL1-1, WWL2-1, WWL3-1, and WWL4-1). The read bit lines RBL1-1, RBL2-1, RBL3-1, and RBL4-1 run in the X-direction (row direction).

The MTJ elements MTJ1-1, MTJ2-1, MTJ3-1, and MTJ4-1 are independently connected to the read bit lines RBL1-1, RBL2-1, RBL3-1, and RBL4-1, respectively. That is, the four read bit lines RBL1-1, RBL2-1, RBL3-1, and RBL4-1 are arranged in correspondence with the four MTJ elements MTJ1-1, MTJ2-1, MTJ3-1, and MTJ4-1.

A write bit line WBL1-1 is formed above and near the MTJ elements MTJ1-1, MTJ2-1, MTJ3-1, and MTJ4-1. The write bit line WBL1-1 runs in the Y-direction (column direction).

[2] Second Stage (Memory Cell Array 11-2)

A write bit line WBL1-1 in the memory cell array 11-1 of the first stage also functions as a write bit line WBL1-2 in the memory cell array 11-2 of the second stage.

More specifically, in write operation, when the memory cell array 11-1 of the first stage is selected, and the memory cell array 11-2 of the second stage is selected, a write current flows to the write bit line WBL1-1/WBL1-2.

Four MTJ elements (Magnetic Tunnel Junction elements) MTJ1-2, MTJ2-2, MTJ3-2, and MTJ4-2 arrayed in the Y-direction are formed above the write bit line WBL1-2.

One terminal (lower end in this example) of each of the MTJ elements MTJ1-2, MTJ2-2, MTJ3-2, and MTJ4-2 is commonly connected to a lower electrode 44-2. A contact plug 42-2 and conductive layer 43-2 electrically connect the lower electrode 44-2 to the read word line RWL1-2.

The contact plug 42-2 is arranged at the central portion of the lower electrode 44-2. When the MTJ elements MTJ1-2, MTJ2-2, MTJ3-2, and MTJ4-2 are uniformly arranged to be symmetrical with respect to the contact plug 42-2, signal margin in the read operation due to the interconnection resistance or the like can be maximized.

The conductive layer 43-2 may be integrated with contact plug 42-2. More specifically, the conductive layer 43-2 may be omitted, and the contact plug 42-2 may be brought into direct contact with the lower electrode 44-2.

The other terminal (upper end in this example) of each of the MTJ elements MTJ1-2, MTJ2-2, MTJ3-2, and MTJ4-2 is electrically connected to a corresponding one of read bit lines RBL1-2, RBL2-2, RBL3-2, and RBL4-2 (write word lines WWL1-2, WWL2-2, WWL3-2, and WWL4-2). The read bit lines RBL1-2, RBL2-2, RBL3-2, and RBL4-2 run in the X-direction (row direction).

The MTJ elements MTJ1-2, MTJ2-2, MTJ3-2, and MTJ4-2 are independently connected to the read bit lines RBL1-2, RBL2-2, RBL3-2, and RBL4-2, respectively. That is, the four read bit lines RBL1-2, RBL2-2, RBL3-2, and RBL4-2 are arranged in correspondence with the four MTJ elements MTJ1-2, MTJ2-2, MTJ3-2, and MTJ4-2.

A write bit line WBL1-2 is formed above and near the MTJ elements MTJ1-2, MTJ2-2, MTJ3-2, and MTJ4-2. The write bit line WBL1-2 runs in the Y-direction (column direction).

[3] Others

In the example shown in FIG. 36, the memory cell arrays 11-1 and 11-2 are stacked in two stages on the semiconductor substrate 41. In principle, the memory cell arrays may be stacked in 2×a (a is a natural number) stages. The memory cell arrays may be stacked in three or more stages (there is no upper limit) by combining Structural Example 5 and Structural Example 6 (to be described later).

According to the device structure of Structural Example 5, the memory cell array 11-1 of the lower stage and the memory cell array 11-2 of the upper stage share one interconnection. For this reason, the degree of integration of MTJ elements can be increased, and the underlying layer of the MTJ elements can be planarized (the characteristic of the MTJ elements can be improved).

④ Device Structure (Plane Structure)

FIGS. 37 to 43 show the layouts of the respective interconnection layers in the device structure shown in FIG. 36. The section shown in FIG. 36 corresponds to the section taken along a line XXXVI—XXXVI in FIGS. 37 to 43.

Figure 37:
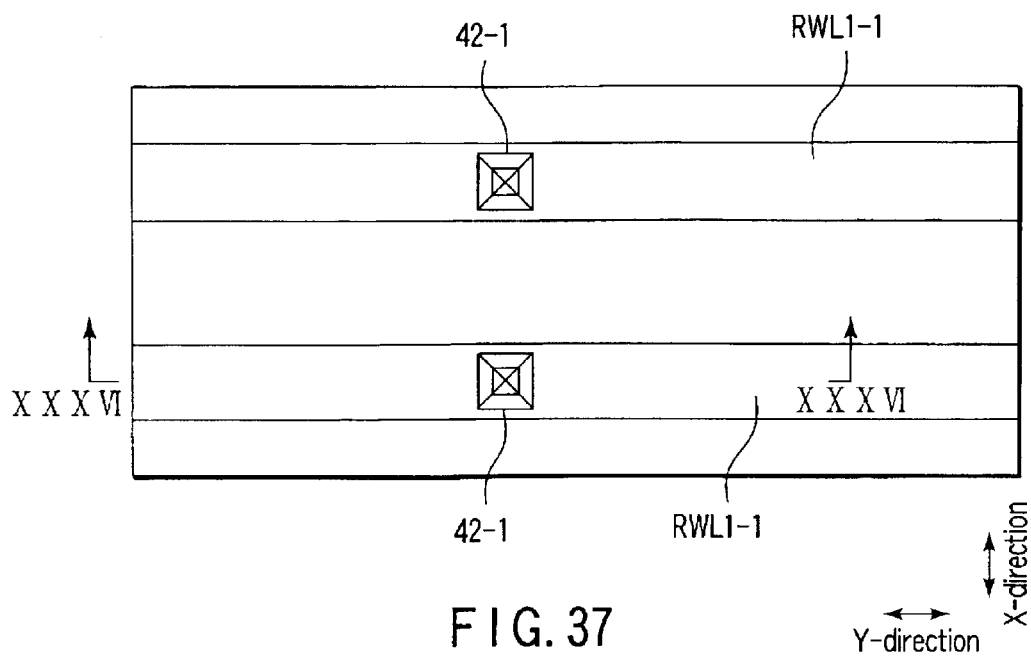
FIG. 37 is a plan view showing a device structure according to Structural Example 5.

FIG. 37 shows the layout of read word lines of the first stage.

The read word lines RWL1-1 run in the Y-direction. The contact plug 42-1 is arranged on each read word line RWL1-1.

Figure 38:
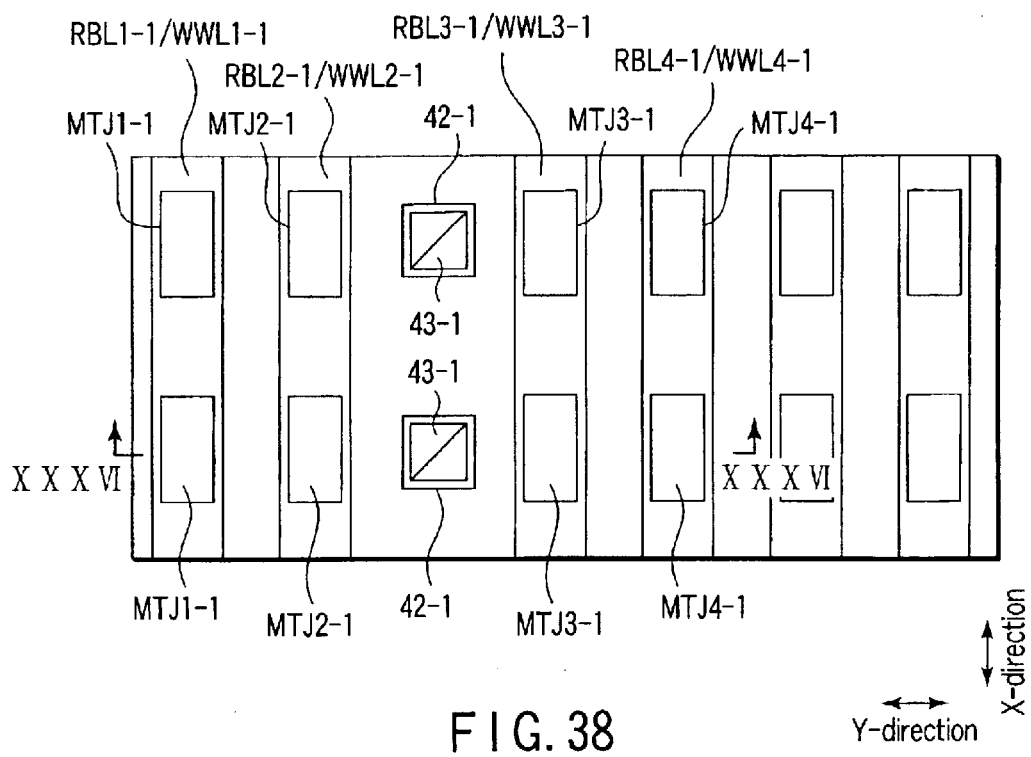
FIG. 38 is a plan view showing a device structure according to Structural Example 5.

FIG. 38 shows the layout of read bit lines of the first stage and MTJ elements of the first stage.

The read bit lines RBL1-1, RBL2-1, RBL3-1, and RBL4-1 (write word lines WWL1-1, WWL2-1, WWL3-1, and WWL4-1) run in the X-direction. The interval between the read bit lines RBL1-1, RBL2-1, RBL3-1, and RBL4-1 can be set to, e.g., the minimum size (or design rule) processible by photolithography.

The MTJ elements MTJ1-1, MTJ2-1, MTJ3-1, and MTJ4-1 are arranged on the read bit lines RBL1-1, RBL2-1, RBL3-1, and RBL4-1. The axis of easy magnetization of the MTJ elements MTJ1-1, MTJ2-1, MTJ3-1, and MTJ4-1, i.e., the direction parallel to the long sides of the MTJ elements MTJ1-1, MTJ2-1, MTJ3-1, and MTJ4-1 is the X-direction.

The read bit line RBL1-1 is commonly connected to the MTJ elements MTJ1-1 arranged in the X-direction. The read bit line RBL2-1 is commonly connected to the MTJ elements MTJ2-1 arranged in the X-direction. The read bit line RBL3-1 is commonly connected to the MTJ elements MTJ3-1 arranged in the X-direction. The read bit line RBL4-1 is commonly connected to the MTJ elements MTJ4-1 arranged in the X-direction.

The conductive layer 43-1 is arranged on the contact plug 42-1.

Figure 39:
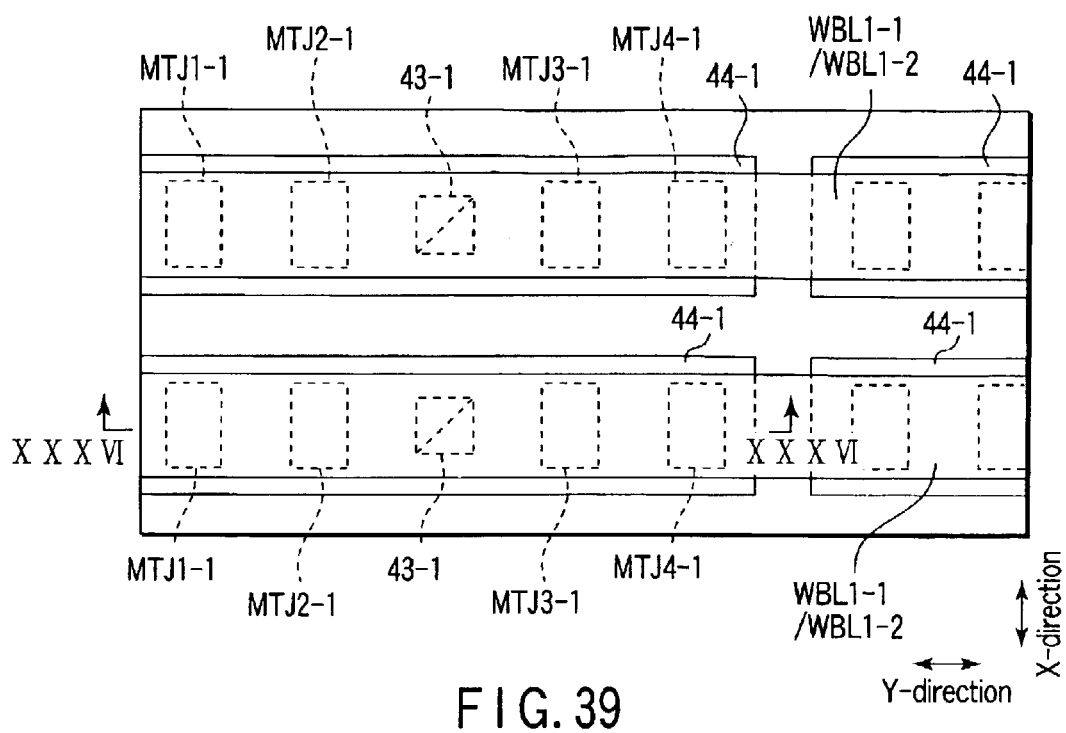
FIG. 39 is a plan view showing a device structure according to Structural Example 5.

FIG. 39 shows the layout of write bit lines of the first stage/write bit lines of the second stage.

The upper electrodes 44-1 each having a rectangular pattern are arranged on the MTJ elements MTJ1-1, MTJ2-1, MTJ3-1, and MTJ4-1 and conductive layers 43. The upper electrodes 44-1 are in contact with the MTJ elements MTJ1-1, MTJ2-1, MTJ3-1, and MTJ4-1 and conductive layers 43-1.

The write bit lines WBL1-1/WBL1-2 are arranged immediately on the upper electrodes 44-1. The write bit lines WBL1-1/WBL1-2 run in the Y-direction.

Figure 40:
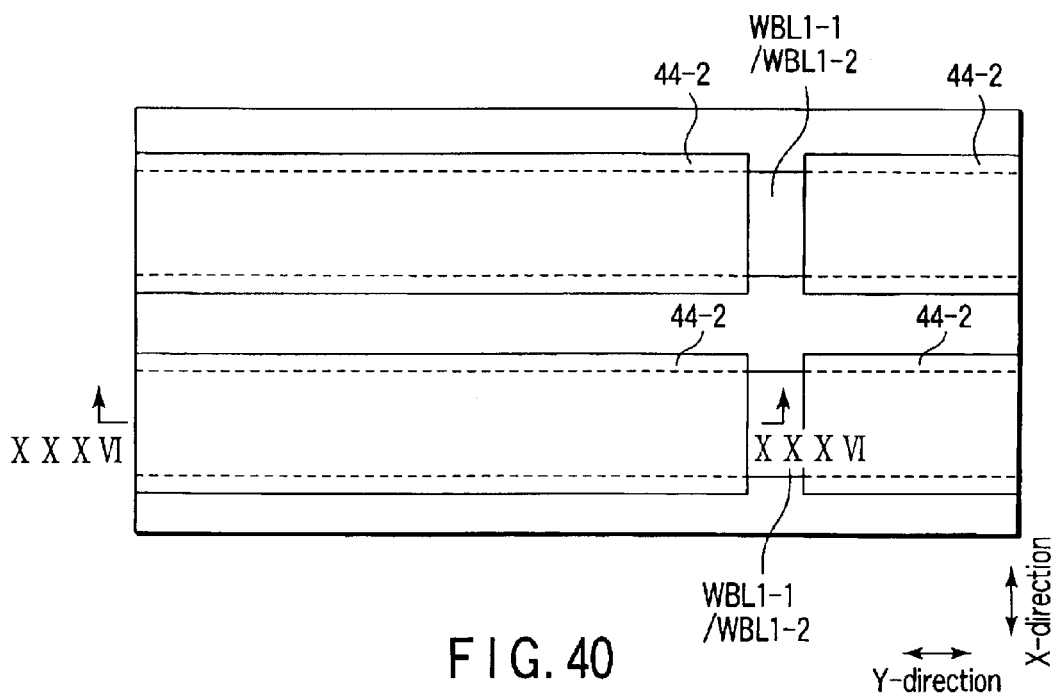
FIG. 40 is a plan view showing a device structure according to Structural Example 5.

FIG. 40 shows the layout of lower electrodes of the second stage.

The lower electrodes 44-2 each having a rectangular pattern are arranged on the write bit lines WBL1-1/WBL1-2. The upper electrodes 44-1 and lower electrodes 44-2 may be arranged to be symmetrical with respect to the write bit lines WBL1-1/WBL1-2, as in this example, or may be arranged asymmetrically.

Figure 41:
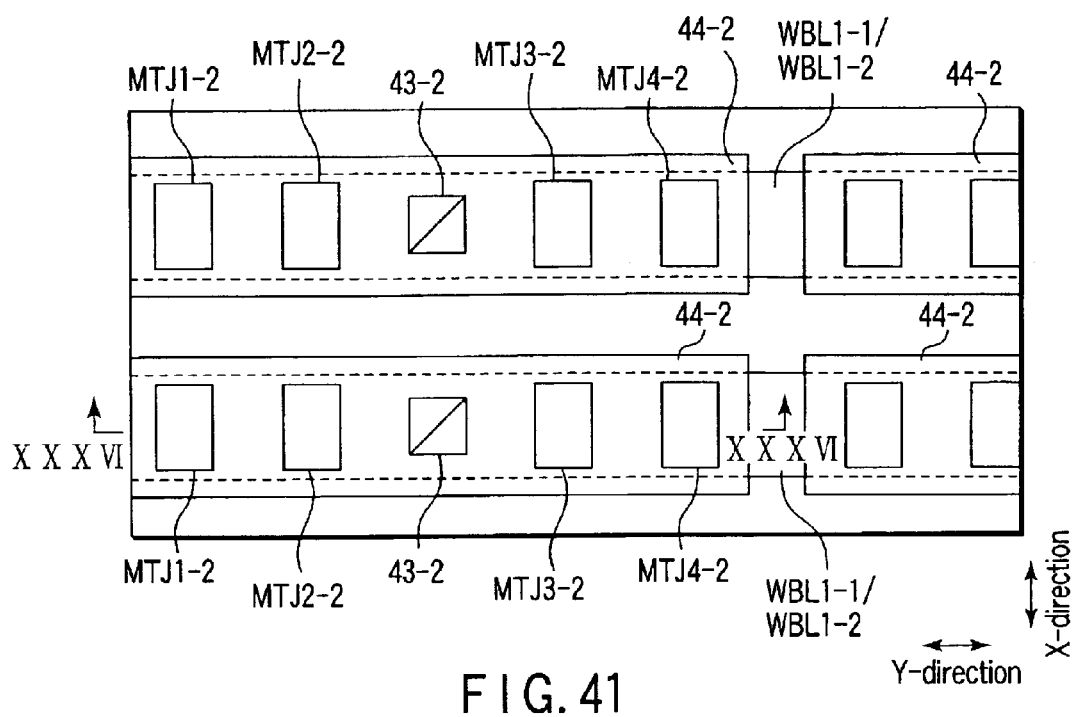
FIG. 41 is a plan view showing a device structure according to Structural Example 5.

FIG. 41 shows the layout of MTJ elements of the second stage.

The MTJ elements MTJ1-2, MTJ2-2, MTJ3-2, and MTJ4-2 and conductive layers 43-2 are arranged on the lower electrodes 44-2 each having a rectangular pattern.

The MTJ elements MTJ1-2, MTJ2-2, MTJ3-2, and MTJ4-2 on the lower electrodes 44-2 are arranged in the Y-direction. The axis of easy magnetization of the MTJ elements MTJ1-2, MTJ2-2, MTJ3-2, and MTJ4-2, i.e., the direction parallel to the long sides of the MTJ elements MTJ1-2, MTJ2-2, MTJ3-2, and MTJ4-2 is the X-direction.

Figure 42:
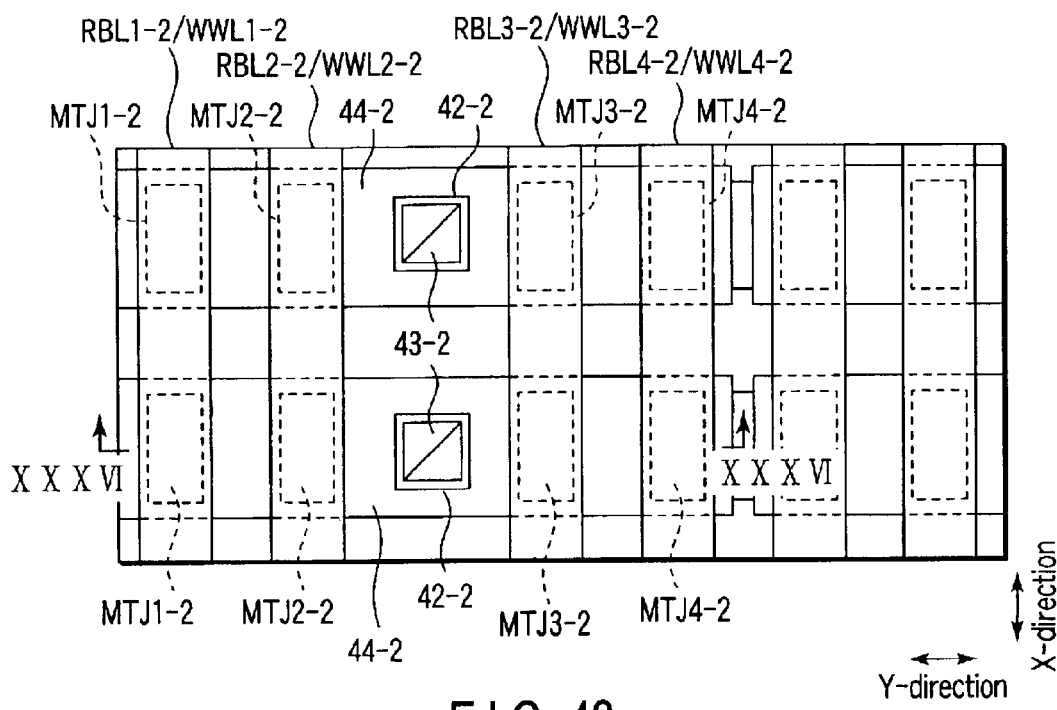
FIG. 42 is a plan view showing a device structure according to Structural Example 5.

FIG. 42 shows the layout of read word lines of second stage.

The read bit lines RBL1-2, RBL2-2, RBL3-2, and RBL4-2 (write word lines WWL1-2, WWL2-2, WWL3-2, and WWL4-2) are arranged on the MTJ elements MTJ1-2, MTJ2-2, MTJ3-2, and MTJ4-2, respectively.

The read bit lines RBL1-2, RBL2-2, RBL3-2, and RBL4-2 run in the X-direction. The interval between the read bit lines RBL1-2, RBL2-2, RBL3-2, and RBL4-2 can be set to, e.g., the minimum size (or design rule) processible by photolithography.

The read bit line RBL1-2 is commonly connected to the MTJ elements MTJ1-2 arranged in the X-direction. The read bit line RBL2-2 is commonly connected to the MTJ elements MTJ2-2 arranged in the X-direction. The read bit line RBL3-2 is commonly connected to the MTJ elements MTJ3-2 arranged in the X-direction. The read bit line RBL4-2 is commonly connected to the MTJ elements MTJ4-2 arranged in the X-direction.

The contact plug 42-2 is arranged on the conductive layer 43-2.

Figure 43:
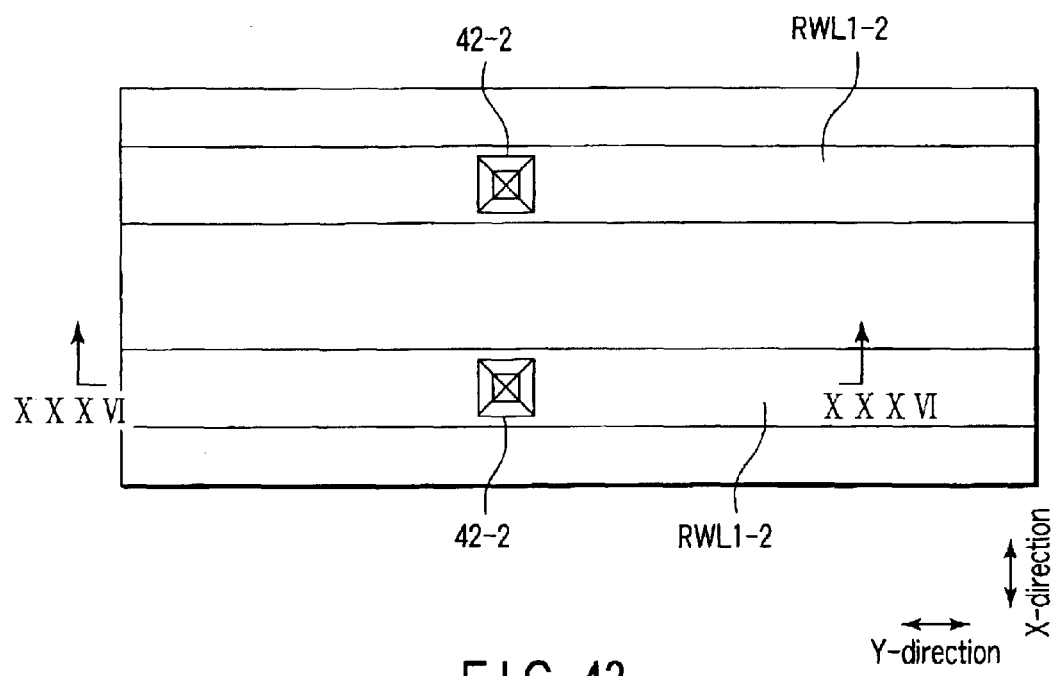
FIG. 43 is a plan view showing a device structure according to Structural Example 5.

FIG. 43 shows the layout of read word lines of the second stage.

The read word lines RWL1-2 run in the Y-direction. The read word line RWL1-2 is in contact with the contact plug 42-2.

(6) STRUCTURAL EXAMPLE 6

① Outline

In Structural Example 6, one interconnection is shared as interconnections having identical functions of two memory cell arrays, like Structural Example 5. In Structural Example 5, a write bit line is shared. However, in Structural Example 6, a read word line is shared.

When one interconnection is shared as interconnections having identical functions, the switching circuit and disconnecting circuit in Structural Examples 3 and 4 can be omitted. Hence, the peripheral circuit arrangement is simplified.

② Circuit Structure

In Structural Example 6, in a plurality of stages of memory cell arrays 11-1, 11-2, ..., 11-$m$ stacked, the read word line of the memory cell array of the lower stage and that of the memory cell array of the upper stage are integrated and shared as one read word line.

Figure 44:
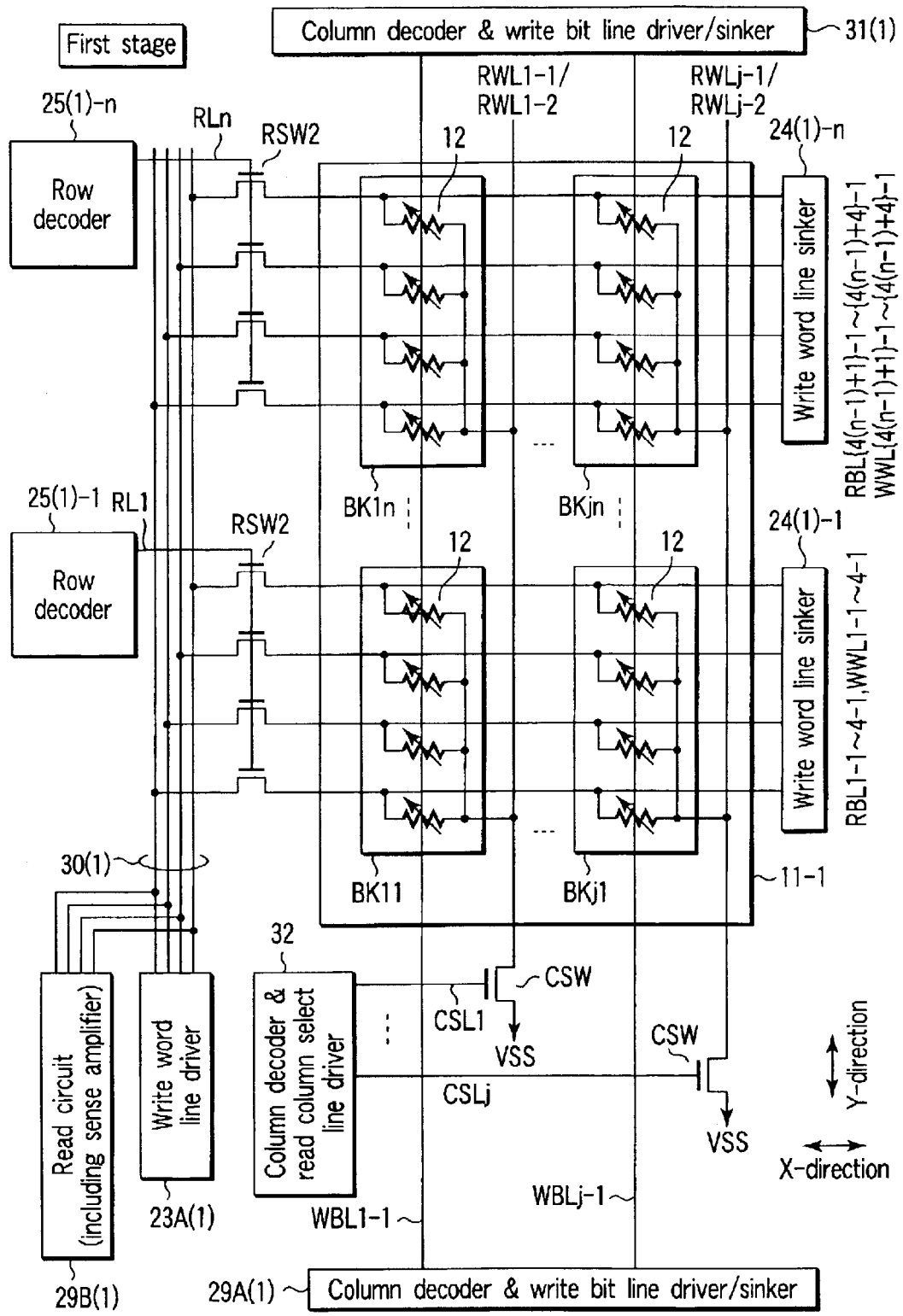
FIG. 44 is a circuit diagram showing a magnetic random access memory according to Structural Example 6 of the present invention.

FIGS. 44 and 45 show the main part of a magnetic random access memory according to Structural Example 6 of the present invention.

[1] First Stage (Lower Stage)

FIG. 44 shows the cell array structure of the first stage of Structural Example 6.

The memory cell array 11-1 has a plurality of MTJ elements 12 arranged in an array in the X- and Y-directions. For example, j MTJ elements 12 are arranged in the X-direction, and 4×n MTJ elements 12 are arranged in the Y-direction.

The four MTJ elements 12 arranged in the Y-direction form one read block BKik (i=1, ..., j, and k=1, ..., n). One row is constructed by j read blocks BKik arranged in the X-direction. The memory cell array 11 has n rows. In addition, one column is constructed by n read blocks BKik arranged in the Y-direction. The memory cell array 11-1 has j columns.

One terminal of each of the four MTJ elements 12 in the block BKik is commonly connected. The connection point is connected to, e.g., a read word line RWLi-1 (i=1, ..., j). The read word line RWLi-1 also functions as a read word line RWLi-2 of the memory cell array of the second stage (to be described later). The read word line RWLi-1 runs in the Y-direction. One read word line RWLi-1 is arranged in one column.

The MTJ elements 12 in the read blocks BKik arranged in one column are directly connected to the read word lines RWLi-1 (i=1, ..., j) without intervening read select switches (MOS transistors). One end of each read word line RWLi-1 is connected to a ground point VSS through a column select switch CSW formed from a MOS transistor.

The column select switches CSW are arranged outside the memory cell array 11-1. Hence, no switch elements (MOS transistors) are arranged in the memory cell array 11-1.

The other terminal of each of the four MTJ elements 12 in the read block BKik is independently connected to a corresponding one of read bit lines RBL{4(n−1)+1}-1, RBL{4(n−1)+2}-1, RBL{4(n−1)+3}-1, and RBL{4(n−1)+4}-1. That is, the four read bit lines RBL{4(n−1)+1}-1, RBL{4(n−1)+2}-1, RBL{4(n−1)+3}-1, and RBL{4(n−1)+4}-1 are arranged in correspondence with the four MTJ elements 12 in one read block BKik.

The read bit lines RBL{4(n−1)+1}-1, RBL{4(n−1)+2}-1, RBL{4(n−1)+3}-1, and RBL{4(n−1)+4}-1 run in the X-direction. One end of each read bit line is connected to a common data line 30(1) through a row select switch (MOS transistor) RSW2. The common data line 30(1) is connected to a read circuit 29B(1) (including, e.g., a sense amplifier, selector, and output buffer).

For example, as shown in FIGS. 118 and 128, the read bit line is connected to a bias transistor BT which sets the bit line potential to VC.

A row select line signal RLi (i=1, ..., n) is input to each row select switch RSW2. Row decoders 25(1)-1, ..., 25(1)-$n$ output the row select line signals RLi.

As shown in FIG. 118, the bias transistor BT is a PMOS transistor, when the RLi is input to the bias transistor BT. As shown in FIG. 128, the bias transistor BT is a NMOS transistor, when the inverting signal from RLi is input to the bias transistor BT. Row decoders 25(1)-1, ..., 25(1)-$n$ output the row select line signals RLi and the inverting signal thereof.

The read bit lines RBL{4(n−1)+1}-1, RBL{4(n−1)+2}-1, RBL{4(n−1)+3}-1, and RBL{4(n−1)+4}-1 run in the X-direction and also function as write word lines WWL{4(n−1)+1}-1, WWL{4(n−1)+2}-1, WWL{4(n−1)+3}-1, and WWL{4(n−1)+4}-1, respectively.

One end of each of the write word lines WWL{4(n−1)+1}-1, WWL{4(n−1)+2}-1, WWL{4(n−1)+3}-1, and WWL{4(n−1)+4}-1 is connected to a write word line driver 23A(1) through the row select switches RSW2 and common data line 30(1). The other end of each write word line is connected to a corresponding one of write word line sinkers 24(1)-1, ..., 24(1)-$n$.

One write bit line WBLi-1 (i=1, ..., j) which is shared by the four MTJ elements 12 of one read block BKik and run in the Y-direction is arranged near the MTJ elements 12 constituting the read block BKik. One write bit line WBLi-1 is arranged in one column.

One end of each write bit line WBLi-1 is connected to a circuit block 29A(1) including a column decoder and write bit line driver/sinker. The other end of the write bit line WBLi-1 is connected to a circuit block 31(1) including a column decoder and write bit line driver/sinker.

In the write operation, the circuit blocks 29A(1) and 31(1) are set in an operative state. A write current flows to the write bit lines WBLi-2 in accordance with write data in a direction toward the circuit block 29A(1) or 31(1).

In the write operation, the row decoder 25(1)-$n$ selects one of the plurality of rows on the basis of a row address signal. The write word line driver 23A(1) supplies a write current to the write word lines WWL{4(n−1)+1}-1, WWL{4(n−1)+2}-1, WWL{4(n−1)+3}-1, and WWL{4(n−1)+4}-1 in the selected row. The write current is absorbed by the write word line sinker 24(1)-$n$.

In read operation, the row decoder 25(1)-$n$ selects one of the plurality of rows on the basis of a row address signal. In the read operation, a column decoder 32 selects one of the plurality of columns on the basis of column address signals CSL1, ..., CSLj to turn on the column select switch CSW arranged in the selected column.

[2] Second Stage (Upper Stage)

FIG. 45 shows the cell array structure of the second stage of Structural Example 6.

The memory cell array 11-2 has the plurality of MTJ elements 12 arranged in an array in the X- and Y-directions.

For example, j MTJ elements 12 are arranged in the X-direction, and 4×n MTJ elements 12 are arranged in the Y-direction.

The four MTJ elements 12 arranged in the Y-direction form one read block BKik (i=1, ..., j, and k=1, ..., n). One row is constructed by j read blocks BKik arranged in the X-direction. The memory cell array 11 has n rows. In addition, one column is constructed by n read blocks BKik arranged in the Y-direction. The memory cell array 11-2 has j columns.

One terminal of each of the four MTJ elements 12 in the block BKik is commonly connected. The connection point is connected to, e.g., a read word line RWLi-2 (i=1, ..., j). The read word line RWLi-2 also functions as the read word line RWLi-1 of the memory cell array of the first stage. The read word line RWLi-2 runs in the Y-direction. One read word line RWLi-2 is arranged in one column.

The MTJ elements 12 in the read blocks BKik arranged in one column are directly connected to the read word lines RWLi-2 (i=1, ..., j) without intervening read select switches (MOS transistors). One end of each read word line RWLi-2 is connected to the ground point VSS through the column select switch CSW formed from, e.g., a MOS transistor.

The other terminal of each of the four MTJ elements 12 in the read block BKik is independently connected to a corresponding one of read bit lines RBL{4(n−1)+1}-2, RBL{4(n−1)+2}-2, RBL{4(n−1)+3}-2, and RBL{4(n−1)+4}-2. That is, the four read bit lines RBL{4(n−1)+1}-2, RBL{4(n−1)+2}-2, RBL{4(n−1)+3}-2, and RBL{4(n−1)+4}-2 are arranged in correspondence with the four MTJ elements 12 in one read block BKik.

The read bit lines RBL{4(n−1)+1}-2, RBL{4(n−1)+2}-2, RBL{4(n−1)+3}-2, and RBL{4(n−1)+4}-2 run in the X-direction. One end of each read bit line is connected to a common data line 30(2) through a row select switch (MOS transistor) RSW2. The common data line 30(2) is connected to a read circuit 29B(2) (including, e.g., a sense amplifier, selector, and output buffer).

For example, as shown in FIGS. 119 and 129, the read bit line is connected to a bias transistor BT which sets the bit line potential to VC.

A row select line signal RLi (i=1, ..., n) is input to each row select switch RSW2. Row decoders 25(2)-1, ..., 25(2)-n output the row select line signals RLi.

As shown in FIG. 119, the bias transistor BT is a PMOS transistor, when the RLi is input to the bias transistor BT. As shown in FIG. 129, the bias transistor BT is a NMOS transistor, when the inverting signal from RLi is input to the bias transistor BT. Row decoders 25(2)-1, ..., 25(2)-n output the row select line signals RLi and the inverting signal thereof.

The read bit lines RBL{4(n−1)+1}-2, RBL{4(n−1)+2}-2, RBL{4(n−1)+3}-2, and RBL{4(n−1)+4}-2 run in the X-direction and also function as write word lines WWL{4(n−1)+1}-2, WWL{4(n−1)+2}-2, WWL{4(n−1)+3}-2, and WWL{4(n−1)+4}-2, respectively.

One end of each of the write word lines WWL{4(n−1)+1}-2, WWL{4(n−1)+2}-2, WWL{4(n−1)+3}-2, and WWL{4(n−1)+4}-2 is connected to a write word line driver 23A(2) through the row select switches RSW2 and common data line 30(2). The other end of each write word line is connected to a corresponding one of write word line sinkers 24(2)-i, ..., 24(2)-n.

One write bit line WBLi-2 (i=1, ..., j) which is shared by the four MTJ elements 12 of one read block BKik and run in the Y-direction is arranged near the MTJ elements 12 constituting the read block BKik. One write bit line WBLi-2 is arranged in one column.

One end of each write bit line WBLi-2 is connected to a circuit block 29A(2) including a column decoder and write bit line driver/sinker. The other end of the write bit line WBLi-2 is connected to a circuit block 31(2) including a column decoder and write bit line driver/sinker.

In the write operation, the circuit blocks 29A(2) and 31(2) are set in an operative state. A write current flows to the write bit lines WBLi-2 in accordance with write data in a direction toward the circuit block 29A(2) or 31(2).

In the write operation, the row decoder 25(2)-n selects one of the plurality of rows on the basis of a row address signal. The write word line driver 23A(2) supplies a write current to the write word lines WWL{4(n−1)+1}-2, WWL{4(n−1)+2}-2, WWL{4(n−1)+3}-2, and WWL{4(n−1)+4}-2 in the selected row. The write current is absorbed by the write word line sinker 24(2)-n.

In the read operation, the row decoder 25(2)-n selects one of the plurality of rows on the basis of a row address signal. In the read operation, a column decoder 32 selects one of the plurality of columns on the basis of column address signals CSL1, ..., CSLj to turn on the column select switch CSW arranged in the selected column.

③ Device Structure (Sectional Structure)

As a characteristic feature of the device structure of Structural Example 6, Device Structure 3 (FIG. 8) of Structural Example 1 is employed for the memory cell array of the first stage, Device Structure 2 (FIG. 4) of Structural Example 1 is employed for the memory cell array of the second stage, and the read word line is shared.

Figure 46:
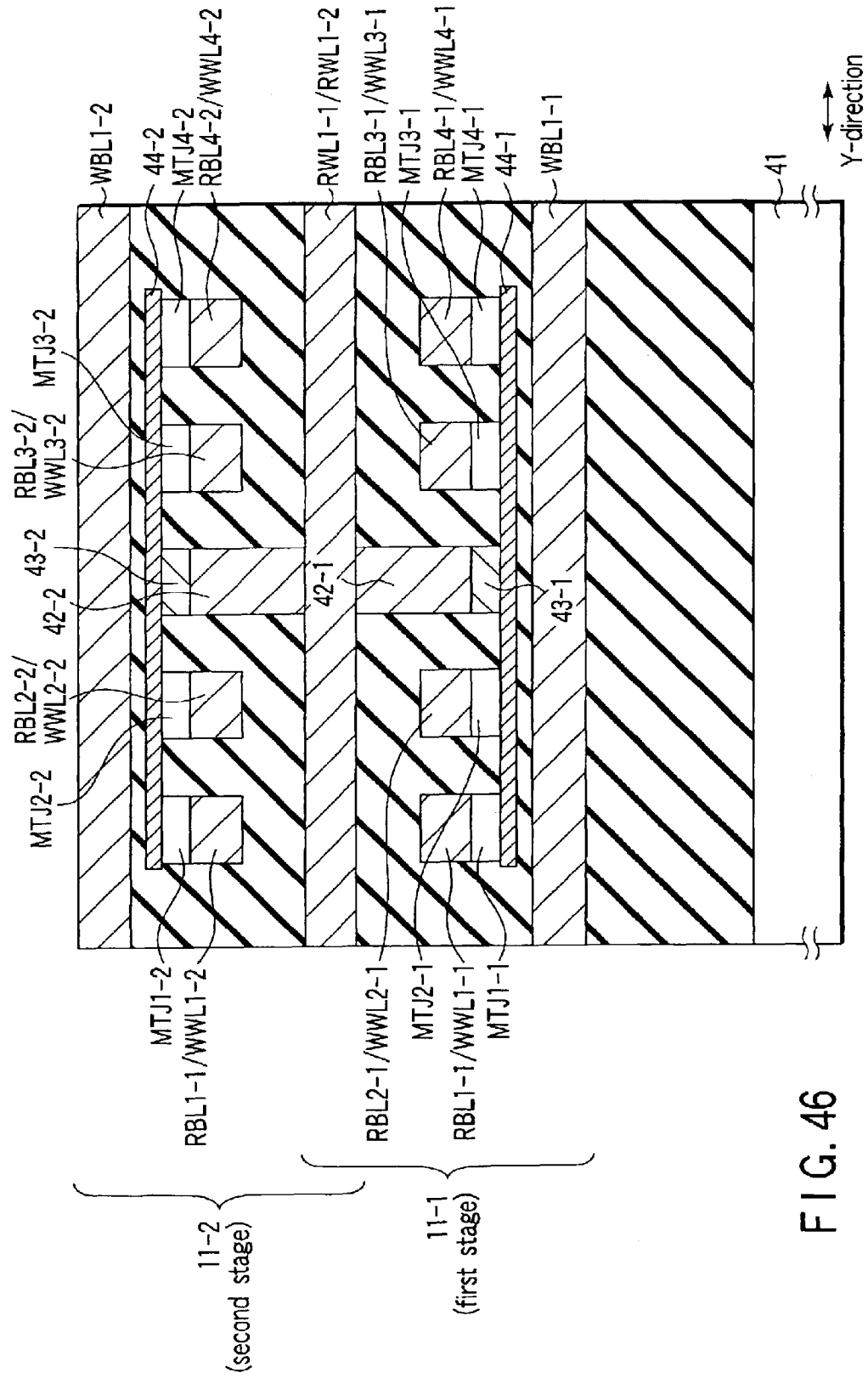
FIG. 46 is a sectional view showing a device structure according to Structural Example 6.

FIG. 46 shows a device structure corresponding to one block of the magnetic random access memory according to Structural Example 6 of the present invention.

[1] First Stage (Memory Cell Array 11-1)

The write bit line WBL1-1 running in the Y-direction is formed on a semiconductor substrate 41. No switch element is arranged immediately under the write bit line WBL1-1. A lower electrode 44-1 having, e.g., a rectangular pattern is formed above the write bit line WBL1-1.

The four MTJ elements (Magnetic Tunnel Junction elements) MTJ1-1, MTJ2-1, MTJ3-1, and MTJ4-1 arrayed in the Y-direction are formed on the lower electrode 44-1.

The read bit lines RBL1-1, RBL2-1, RBL3-1, and RBL4-1 (write word lines WWL1-1, WWL2-1, WWL3-1, and WWL4-1) are formed on the MTJ elements MTJ1-1, MTJ2-1, MTJ3-1, and MTJ4-1, respectively. The read bit lines RBL1-1, RBL2-1, RBL3-1, and RBL4-1 are in contact with the MTJ elements MTJ1-1, MTJ2-1, MTJ3-1, and MTJ4-1, respectively. The read bit lines RBL1-1, RBL2-1, RBL3-1, and RBL4-1 run in the X-direction (row direction).

The MTJ elements MTJ1-1, MTJ2-1, MTJ3-1, and MTJ4-1 are independently connected to the read bit lines RBL1-1, RBL2-1, RBL3-1, and RBL4-1, respectively. That is, the four read bit lines RBL1-1, RBL2-1, RBL3-1, and RBL4-1 are arranged in correspondence with the four MTJ elements MTJ1-1, MTJ2-1, MTJ3-1, and MTJ4-1.

A contact plug 42-1 and conductive layer 43-1 are formed on the lower electrode 44-1. The contact plug 42-1 and conductive layer 43-1 electrically connect the lower electrode 44-1 to the read word line RWL1-1.

The contact plug 42-1 is arranged at the central portion of the lower electrode 44-1. When the MTJ elements MTJ1-1, MTJ2-1, MTJ3-1, and MTJ4-1 are uniformly arranged to be symmetrical with respect to the contact plug 42-1, signal margin in the read operation due to the interconnection resistance or the like can be maximized.

The read word line RWL1-1 is formed above the MTJ elements MTJ1-1, MTJ2-1, MTJ3-1, and MTJ4-1. The read word line RWL1-1 runs in the Y-direction (column direction).

[2] Second Stage (Memory Cell Array 11-2)

The read word line RWL1-1 in the memory cell array 11-1 of the first stage also functions as the read word line RWL1-2 in the memory cell array 11-2 of the second stage.

More specifically, in the read operation, when the memory cell array 11-1 of the first stage is selected, and the memory cell array 11-2 of the second stage is selected, the read word line RWL1-1/RWL1-2 is short-circuited to the ground point.

An upper electrode 44-2 having, e.g., a rectangular pattern is formed above the read word line RWL1-2. The four MTJ elements (Magnetic Tunnel Junction elements) MTJ1-2, MTJ2-2, MTJ3-2, and MTJ4-2 arrayed in the Y-direction are formed immediately under the upper electrode 44-2.

The read bit lines RBL1-2, RBL2-2, RBL3-2, and RBL4-2 (write word lines WWL1-2, WWL2-2, WWL3-2, and WWL4-2) are formed immediately under the MTJ elements MTJ1-2, MTJ2-2, MTJ3-2, and MTJ4-2, respectively. The read bit lines RBL1-2, RBL2-2, RBL3-2, and RBL4-2 are in contact with the MTJ elements MTJ1-2, MTJ2-2, MTJ3-2, and MTJ4-2, respectively. The read bit lines RBL1-2, RBL2-2, RBL3-2, and RBL4-2 run in the X-direction (row direction).

The MTJ elements MTJ1-2, MTJ2-2, MTJ3-2, and MTJ4-2 are independently connected to the read bit lines RBL1-2, RBL2-2, RBL3-2, and RBL4-2, respectively. That is, the four read bit lines RBL1-2, RBL2-2, RBL3-2, and RBL4-2 are arranged in correspondence with the four MTJ elements MTJ1-2, MTJ2-2, MTJ3-2, and MTJ4-2.

A contact plug 42-2 and conductive layer 43-2 are formed between the upper electrode 44-2 and the read word line RWL1-2. The contact plug 42-2 and conductive layer 43-2 electrically connect the upper electrode 44-2 to the read word line RWL1-2.

The contact plug 42-2 is arranged at the central portion of the upper electrode 44-2. When the MTJ elements MTJ1-2, MTJ2-2, MTJ3-2, and MTJ4-2 are uniformly arranged to be symmetrical with respect to the contact plug 42-2, signal margin in the read operation due to the interconnection resistance or the like can be maximized.

The write bit line WBL1-2 is formed above the MTJ elements MTJ1-2, MTJ2-2, MTJ3-2, and MTJ4-2. The write bit line WBL1-2 runs in the Y-direction (column direction).

[3] Others

In the example shown in FIG. 46, the memory cell arrays 11-1 and 11-2 are stacked in two stages on the semiconductor substrate 41. In principle, the memory cell arrays may be stacked in 2×a (a is a natural number) stages. The memory cell arrays may be stacked in three or more stages (there is no upper limit) by combining Structural Examples 5 and 6.

According to the device structure of Structural Example 6, the memory cell array 11-1 of the lower stage and the memory cell array 11-2 of the upper stage share one interconnection. For this reason, the degree of integration of MTJ elements can be increased, and the underlying layer of the MTJ elements can be planarized (the characteristic of the MTJ elements can be improved).

④ Device Structure (Plan Structure)

FIGS. 47 to 52 show the layouts of the respective interconnection layers in device structure shown in FIG. 46. The section shown in FIG. 46 corresponds to the section taken along a line XLVI—XLVI in FIGS. 47 to 52.

Figure 47:
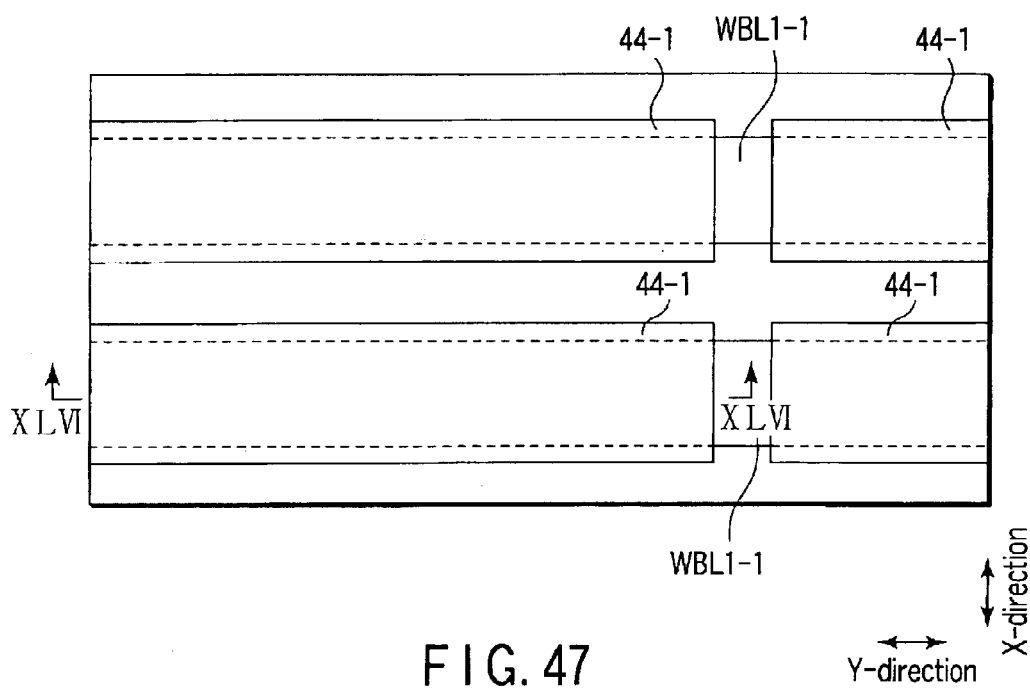
FIG. 47 is a plan view showing a device structure according to Structural Example 6.

FIG. 47 shows the layout of write bit lines of the first stage.

The write bit lines WBL1-1 run in the Y-direction. The lower electrode 44-1 having a rectangular shape is arranged on each write bit line WBL1-1.

Figure 48:
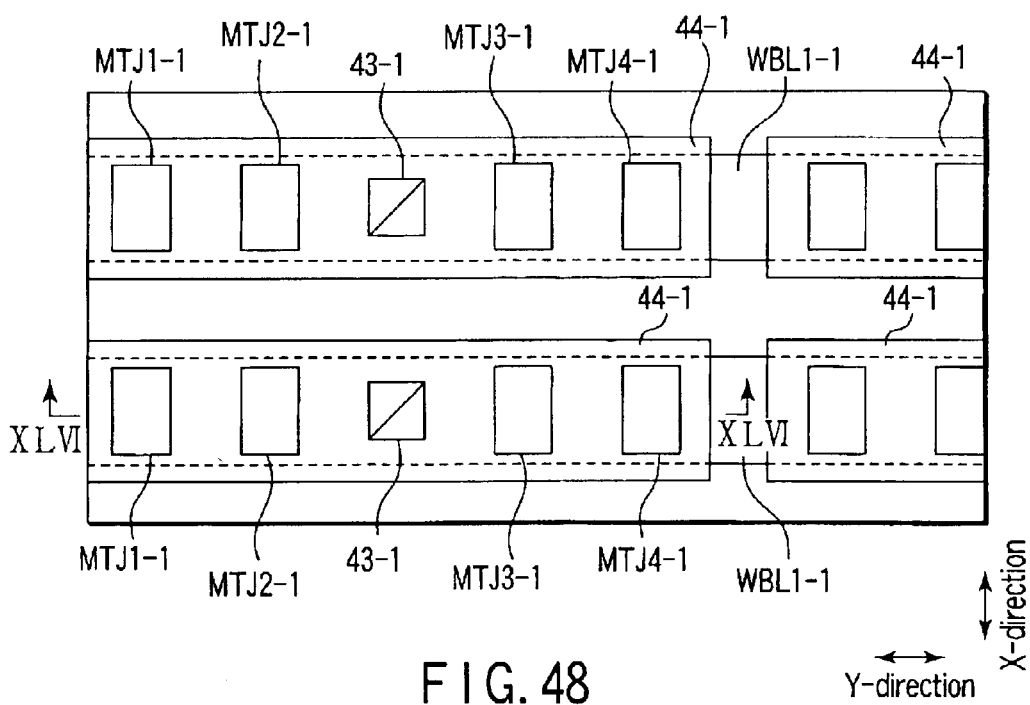
FIG. 48 is a plan view showing a device structure according to Structural Example 6.

FIG. 48 shows the layout of MTJ elements of the first stage.

The MTJ elements MTJ1-1, MTJ2-1, MTJ3-1, and MTJ4-1 and conductive layer 43-1 are arranged on the lower electrode 44-1 having a rectangular pattern.

The MTJ elements MTJ1-1, MTJ2-1, MTJ3-1, and MTJ4-1 on the lower electrode 44-1 are arranged in the Y-direction. The axis of easy magnetization of the MTJ elements MTJ1-1, MTJ2-1, MTJ3-1, and MTJ4-1, i.e., the direction parallel to the long sides of the MTJ elements MTJ1-1, MTJ2-1, MTJ3-1, and MTJ4-1 is the X-direction.

Figure 49:
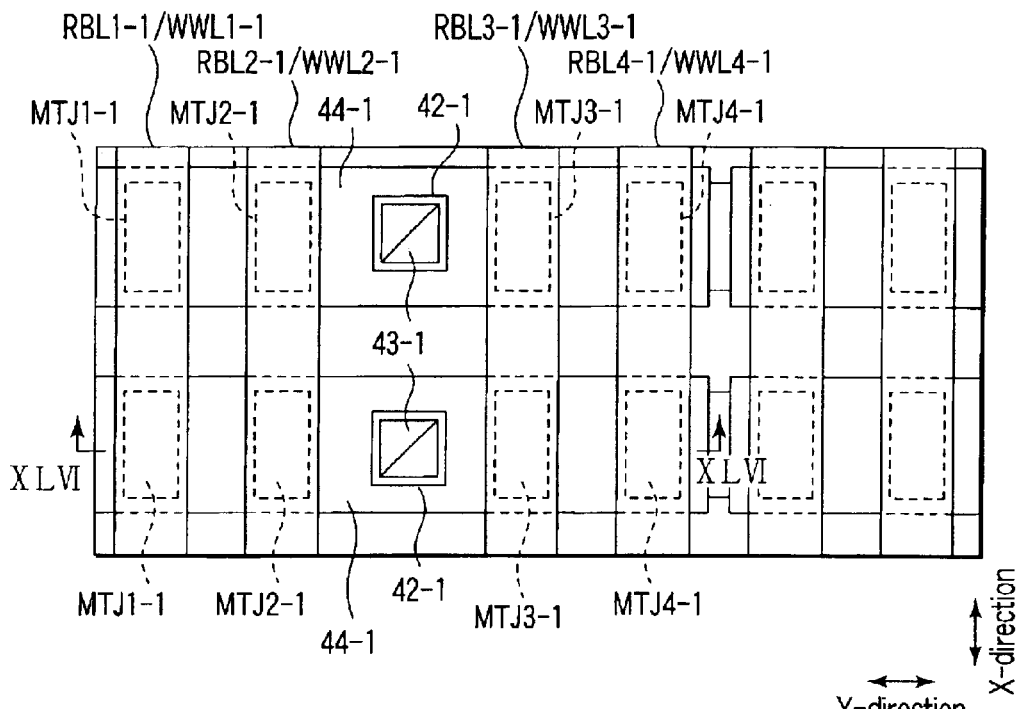
FIG. 49 is a plan view showing a device structure according to Structural Example 6.

FIG. 49 shows the layout of read bit lines of the first stage.

The read bit lines RBL1-1, RBL2-1, RBL3-1, and RBL4-1 (write word lines WWL1-1, WWL2-1, WWL3-1, and WWL4-1) are arranged on the MTJ elements MTJ1-1, MTJ2-1, MTJ3-1, and MTJ4-1, respectively.

The read bit lines RBL1-1, RBL2-1, RBL3-1, and RBL4-1 run in the X-direction. The interval between the read bit lines RBL1-1, RBL2-1, RBL3-1, and RBL4-1 can be set to, e.g., the minimum size (or design rule) processible by photolithography.

The read bit line RBL1-1 is commonly connected to the MTJ elements MTJ1-1 arranged in the X-direction. The read bit line RBL2-1 is commonly connected to the MTJ elements MTJ2-1 arranged in the X-direction. The read bit line RBL3-1 is commonly connected to the MTJ elements MTJ3-1 arranged in the X-direction. The read bit line RBL4-1 is commonly connected to the MTJ elements MTJ4-1 arranged in the X-direction.

The contact plug 42-1 is arranged on the conductive layer 43-1.

Figure 50:
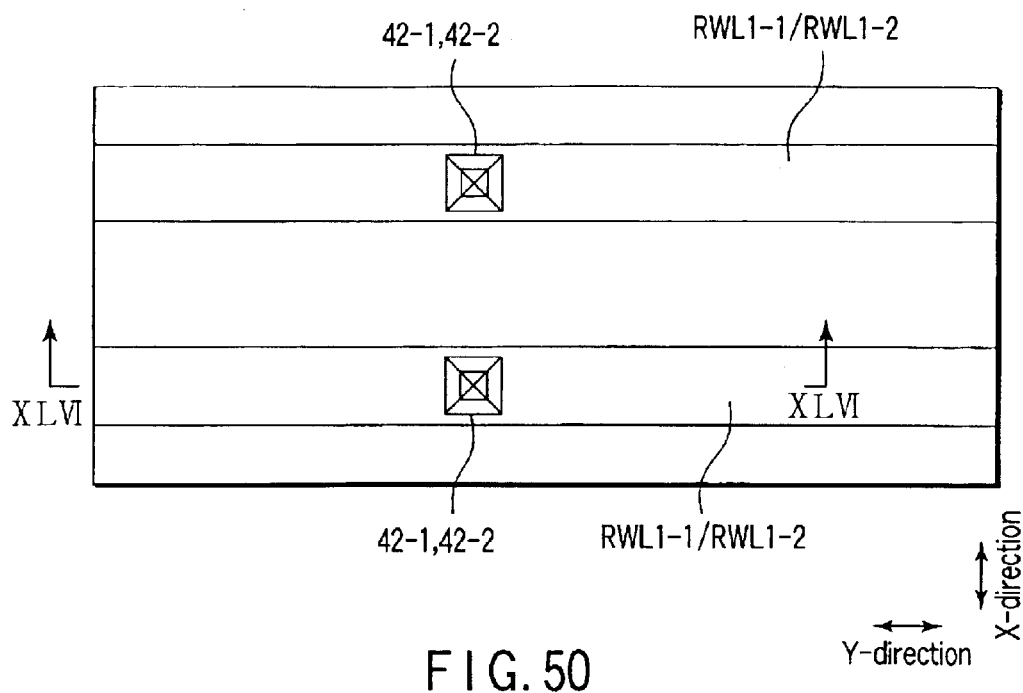
FIG. 50 is a plan view showing a device structure according to Structural Example 6.

FIG. 50 shows the layout of read word lines of the first stage/read word lines of the second stage.

The read word lines RWL1-1/RWL1-2 run in the Y-direction. The read word line RWL1-1/RWL1-2 is in contact with the contact plug 42-1. The contact plug 42-2 is formed on the read word line RWL1-1/RWL1-2.

FIG. 51 shows the layout of read bit lines of the second stage and MTJ elements of the second stage.

The read bit lines RBL1-2, RBL2-2, RBL3-2, and RBL4-2 (write word lines WWL1-2, WWL2-2, WWL3-2, and WWL4-2) run in the X-direction. The interval between the read bit lines RBL1-2, RBL2-2, RBL3-2, and RBL4-2 can be set to, e.g., the minimum size (or design rule) processible by photolithography.

The MTJ elements MTJ1-2, MTJ2-2, MTJ3-2, and MTJ4-2 are arranged on the read bit lines RBL1-2, RBL2-2, RBL3-2, and RBL4-2. The axis of easy magnetization of the MTJ elements MTJ1-2, MTJ2-2, MTJ3-2, and MTJ4-2, i.e., the direction parallel to the long sides of the MTJ elements MTJ1-2, MTJ2-2, MTJ3-2, and MTJ4-2 is the X-direction.

The read bit line RBL1-2 is commonly connected to the MTJ elements MTJ1-2 arranged in the X-direction. The read bit line RBL2-2 is commonly connected to the MTJ elements MTJ2-2 arranged in the X-direction. The read bit line RBL3-2 is commonly connected to the MTJ elements MTJ3-2 arranged in the X-direction. The read bit line RBL4-2 is commonly connected to the MTJ elements MTJ4-2 arranged in the X-direction.

The conductive layer 43-2 is arranged on the contact plug 42-2.

FIG. 52 shows the layout of write bit lines of the second stage.

The upper electrodes 44-2 each having a rectangular pattern are arranged on the MTJ elements MTJ1-2, MTJ2-2, MTJ3-2, and MTJ4-2 and conductive layer 43-2. The upper electrodes 44-2 are in contact with the MTJ elements MTJ1-2, MTJ2-2, MTJ3-2, and MTJ4-2 and conductive layers 43-2.

The write bit lines WBL1-2 are arranged immediately on the upper electrodes 44-2. The write bit lines WBL1-2 run in the Y-direction.

(7) STRUCTURAL EXAMPLE 7

Structural Example 7 is a modification of Structural Example 1. As its characteristic feature, the axis of easy magnetization of the MTJ element of Structural Example 1 is rotated by 90°.

In Structural Example 1, the axis of easy magnetization of the MTJ element is the X-direction (row direction), and the axis of hard magnetization is the Y-direction (column direction). That is, the MTJ element has a rectangular shape long in the X-direction. To the contrary, in Structural Example 7, the axis of easy magnetization of the MTJ element is the Y-direction, and the axis of hard magnetization is the X-direction. That is, the MTJ element has a rectangular shape long in the Y-direction.

In a magnetic random access memory, basically, data is written in a memory cell (the direction of magnetization of the pinning layer is determined) by changing the direction of a write current flowing to a write line that runs in a direction parallel to the axis of hard magnetization.

Hence, in this example, data to be written in a memory cell is determined by controlling the direction of a write current flowing to a write bit line (read bit line) that runs in the X-direction in write operation.

Generally, a write line that runs along the axis of hard magnetization (in a direction parallel to the short axis of an MTJ) is called a write bit line.

① Circuit Structure

FIG. 53 shows the main part of a magnetic random access memory according to Structural Example 7 of the present invention.

A memory cell array 11 has a plurality of MTJ elements 12 arranged in an array in the X- and Y-directions. For example, j MTJ elements 12 are arranged in the X-direction, and 4×n MTJ elements 12 are arranged in the Y-direction.

The four MTJ elements 12 arranged in the Y-direction form one read block BKik (i=1, . . . , j, and k=1, . . . , n). One row is constructed by j read blocks BKik arranged in the X-direction. The memory cell array 11 has n rows. In addition, one column is constructed by n read blocks BKik arranged in the Y-direction. The memory cell array 11 has j columns.

One terminal of each of the four MTJ elements 12 in the block BKik is commonly connected. The connection point is directly connected to a read word line RWLi (i=1, . . . , j) without intervening read select switches. The read word line RWLi runs in the Y-direction. One read word line RWLi is arranged in one column.

Each read word line RWLi is connected to a ground point VSS through a column select switch CSW formed from, e.g., a MOS transistor.

In read operation, in a selected row, a row select switch RSW2 is turned on. In a selected column, the column select switch CSW is turned on. For this reason, the potential of the read word line RWLi becomes the ground potential VSS. A read current flows to the MTJ elements 12 in the read block BKik located at the intersection between the selected row and the selected column.

The other terminal of each of the four MTJ elements 12 in the read block BKik is independently connected to a corresponding one of read bit lines RBL4(n−1)+1, RBL4(n−1)+2, RBL4(n−1)+3, and RBL4(n−1)+4. That is, the four read bit lines RBL4(n−1)+1, RBL4(n−1)+2, RBL4(n−1)+3, and RBL4(n−1)+4 are arranged in correspondence with the four MTJ elements 12 in one read block BKik.

The read bit lines RBL4(n−1)+1, RBL4(n−1)+2, RBL4(n−1)+3, and RBL4(n−1)+4 run in the X-direction. One end of each read bit line is connected to a common data line 30A through the row select switch (MOS transistor) RSW2. The common data line 30A is connected to a read circuit 29B (including, e.g., a sense amplifier, selector, and output buffer).

For example, as shown in FIGS. 120 and 130, the read bit line is connected to a bias transistor BT which sets the bit line potential to VC.

A row select line signal RLi (i=1, . . . , n) is input to each row select switch RSW2. Row decoders 25-1, . . . , 25-n output the row select line signals RLi.

As shown in FIG. 120, the bias transistor BT is a PMOS transistor, when the RLi is input to the bias transistor BT. As shown in FIG. 130, the bias transistor BT is a NMOS transistor, when the inverting signal from RLi is input to the bias transistor BT. Row decoders 25-1, . . . , 25-n output the row select line signals RLi and the inverting signal thereof.

In this example, the read bit lines RBL4(n−1)+1, RBL4(n−1)+2, RBL4(n−1)+3, and RBL4(n−1)+4 run in the X-direction and also function as write bit lines WBL4(n−1)+1, WBL4(n−1)+2, WBL4(n−1)+3, and WBL4(n−1)+4, respectively.

One end of each of the write bit lines WBL4(n−1)+1, WBL4(n−1)+2, WBL4(n−1)+3, and WBL4(n−1)+4 is connected to a write bit line driver/sinker 23AR through the row select switches RSW2 and common data line 30A. The other end of each write bit line is connected to a write bit line driver/sinker 23AS through a common data line 30B.

One write word line WWLi (i=1, . . . , j) which is shared by the four MTJ elements 12 of one read block BKik and run in the Y-direction is arranged near the MTJ elements 12 constituting the read block BKik. One write word line WWLi is arranged in one column.

One end of each write word line WWLi is connected to a circuit block 29AR including a column decoder and write word line driver. The other end is connected to a circuit block 31R including a column decoder and write word line sinker.

In write operation, the circuit blocks 29AR and 31R are set in an operative state. A write current flows to the write word lines WWLi in a direction from the circuit block 29AR to the circuit 31R.

In the write operation, the row decoder 25-n selects one of the plurality of rows on the basis of a row address signal. The write bit line drivers/sinkers 23AR and 23AS supply a write current having a direction corresponding to write data to one of the write bit lines WBL4(n−1)+1, WBL4(n−1)+2, WBL4(n−1)+3, and WBL4(n−1)+4 in the selected row.

In the read operation, the row decoder 25-n selects one of the plurality of rows on the basis of a row address signal.

A column decoder 32 selects one of the plurality of columns on the basis of column address signals and outputs column select signals CSL1, ..., CSLj. The column select switch CS Warranted in the selected column is turned on.

②  Device Structure

The device structure will be described next.

[1] Sectional Structure

Figure 54:
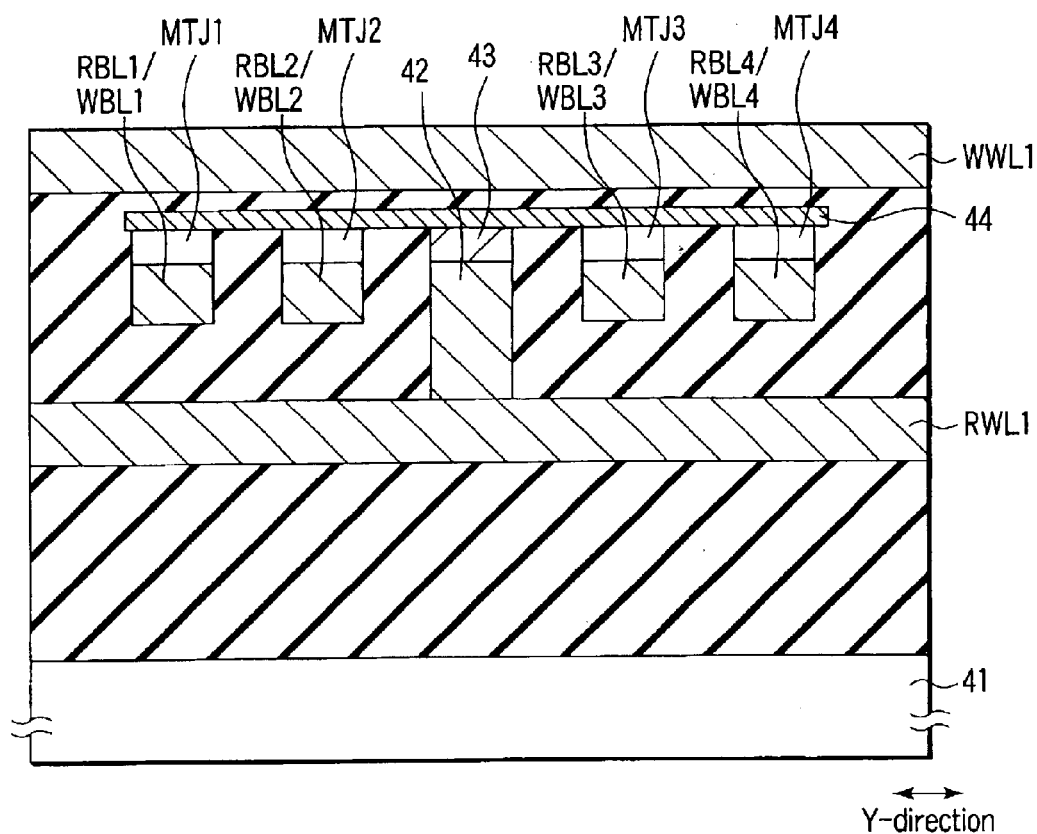
FIG. 54 is a sectional view showing a device structure according to Structural Example 7.

FIG. 54 shows a device structure corresponding to one block of the magnetic random access memory according to Structural Example 7 of the present invention.

The same reference numerals as in FIG. 53 denote the same elements in FIG. 54 to show the correspondence between the elements.

A read word line RWL1 running in the Y-direction is formed on a semiconductor substrate 41. No switch element is arranged immediately under the read word line RWL1. Four MTJ elements (Magnetic Tunnel Junction elements) MTJ1, MTJ2, MTJ3, and MTJ4 arrayed in the Y-direction are formed above the read word line RWL1.

One terminal (upper end in this example) of each of the MTJ elements MTJ1, MTJ2, MTJ3, and MTJ4 is commonly connected to an upper electrode 44. A contact plug 42 and conductive layer 43 electrically connects the upper electrode 44 to the read word line RWL1.

The contact portion between the upper electrode 44 and the read word line RWL1 is formed in the region between the MTJ elements MTJ1 and MTJ2 and the MTJ elements MTJ3 and MTJ4. When the MTJ elements MTJ1, MTJ2, MTJ3, and MTJ4 are uniformly arranged to be symmetrical with respect to the contact portion, signal margin in the read operation due to the interconnection resistance or the like can be maximized.

The conductive layer 43 may be integrated with the upper electrode 44. That is, the conductive layer 43 and upper electrode 44 may be formed simultaneously using the same material.

The other terminal (lower end in this example) of each of the MTJ elements MTJ1, MTJ2, MTJ3, and MTJ4 is electrically connected to a corresponding one of the read bit lines RBL1, RBL2, RBL3, and RBL4 (write bit lines WBL1, WBL2, WBL3, and WBL4). The read bit lines RBL1, RBL2, RBL3, and RBL4 run in the X-direction (row direction).

The MTJ elements MTJ1, MTJ2, MTJ3, and MTJ4 are independently connected to the read bit lines RBL1, RBL2, RBL3, and RBL4, respectively. That is, the four read bit lines RBL1, RBL2, RBL3, and RBL4 are arranged in correspondence with the four MTJ elements MTJ1, MTJ2, MTJ3, and MTJ4.

The write word line WWL1 is formed immediately on and near the MTJ elements MTJ1, MTJ2, MTJ3, and MTJ4. The write word line WWL1 runs in the Y-direction (column direction).

In this example, one write word line WWL1 is arranged in correspondence with the four MTJ elements MTJ1, MTJ2, MTJ3, and MTJ4 which construct a read block. Instead, for example, the four MTJ elements MTJ1, MTJ2, MTJ3, and MTJ4 may be stacked, and four write word lines may be arranged in correspondence with the four MTJ elements MTJ1, MTJ2, MTJ3, and MTJ4.

In this example, the write word line WWL1 running in the Y-direction is arranged above the MTJ elements MTJ1, MTJ2, MTJ3, and MTJ4, and the read bit lines RBL1, RBL2, RBL3, and RBL4 running in the X-direction are arranged under the MTJ elements MTJ1, MTJ2, MTJ3, and MTJ4.

Instead, for example, the write word line WWL1 running in the Y-direction may be arranged under the MTJ elements MTJ1, MTJ2, MTJ3, and MTJ4, and the read bit lines RBL1, RBL2, RBL3, and RBL4 running in the X-direction are arranged above the MTJ elements MTJ1, MTJ2, MTJ3, and MTJ4.

According to this device structure, the plurality of MTJ elements MTJ1, MTJ2, MTJ3, and MTJ4 in the read block are electrically connected to the different read bit lines RBL1, RBL2, RBL3, and RBL4 (write bit lines WBL1, WBL2, WBL3, and WBL4), respectively. For this reason, data of the plurality of MTJ elements MTJ1, MTJ2, MTJ3, and MTJ4 in the read block can be read at once by one read step.

One terminal of each of the plurality of MTJ elements MTJ1, MTJ2, MTJ3, and MTJ4 in the read block is commonly connected. The connection point is directly connected to the read word line RWL1 without intervening a read select switch. In addition, the write word line WWL1 running in the Y-direction is shared by the plurality of MTJ elements MTJ1, MTJ2, MTJ3, and MTJ4 in the read block. For this reason, the degree of integration of MTJ elements can be increased, and their characteristic can be improved.

[Plane Structure]

Figure 55:
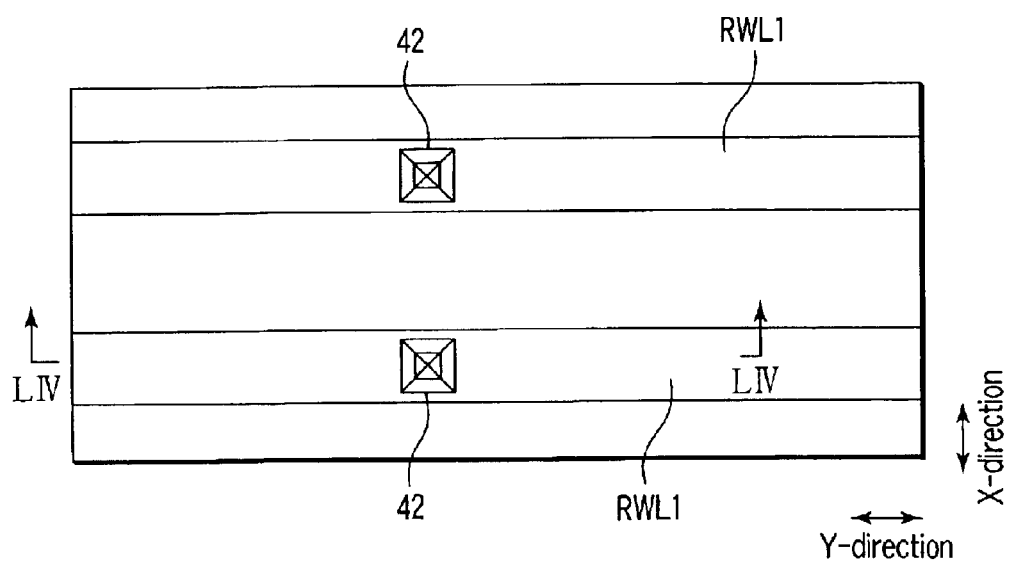
FIG. 55 is a plan view showing a device structure according to Structural Example 7.
Figure 56:
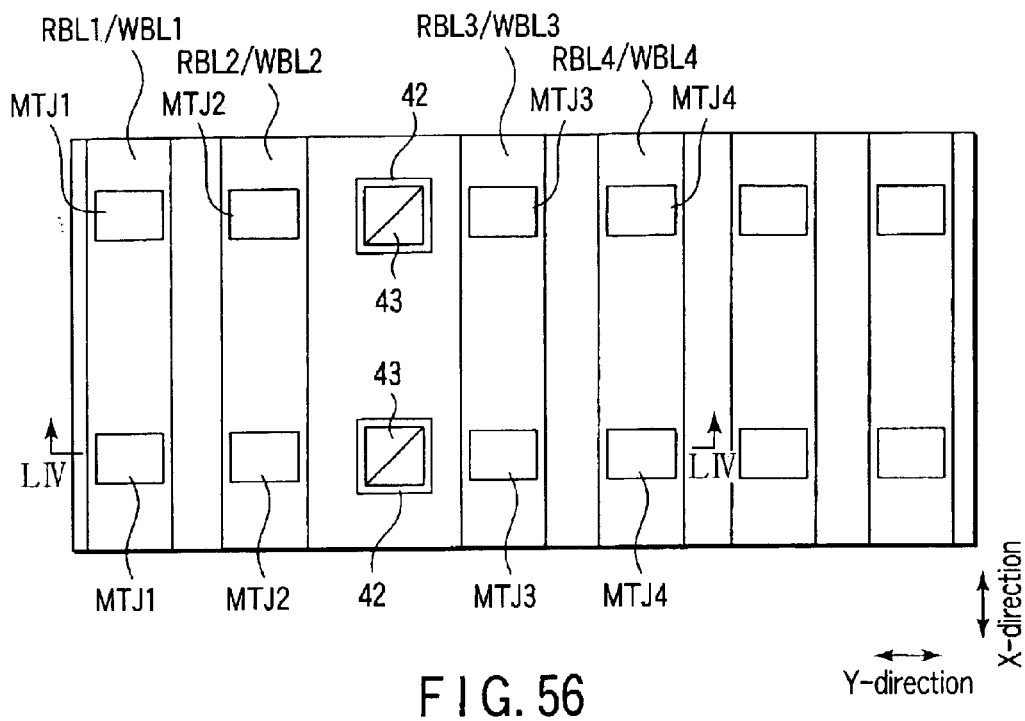
FIG. 56 is a plan view showing a device structure according to Structural Example 7.
Figure 57:
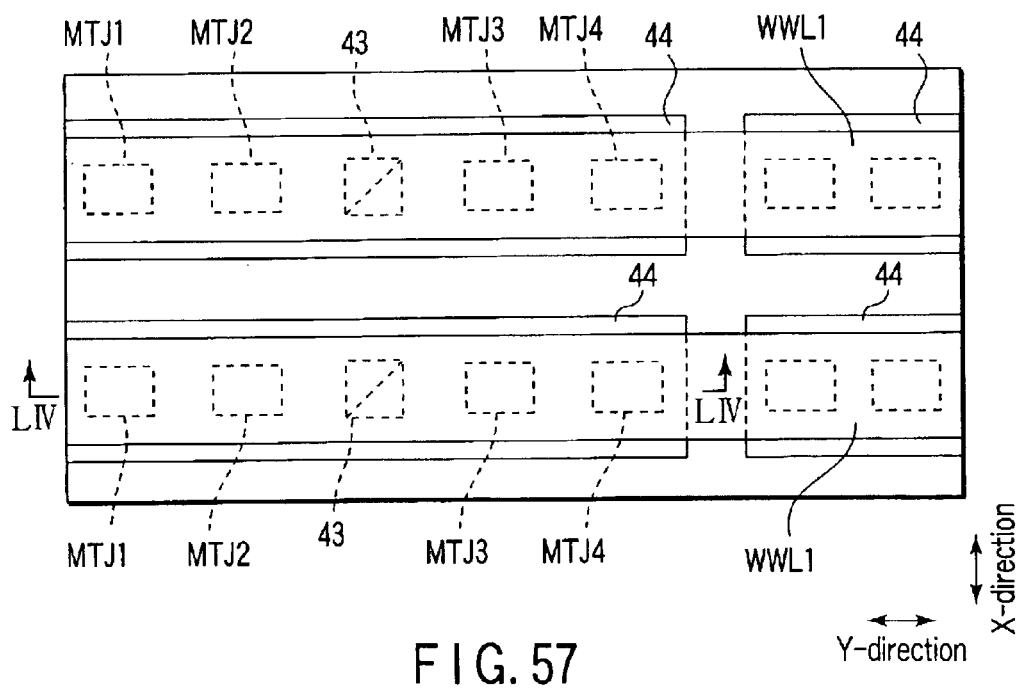
FIG. 57 is a plan view showing a device structure according to Structural Example 7.

FIGS. 55 to 57 show the layouts of the respective interconnection layers in device structure shown in FIG. 54. The section shown in FIG. 54 corresponds to the section taken along a line LIV—LIV in FIGS. 55 to 57.

FIG. 5 shows the layout of read word lines.

The read word lines RWL1 run in the Y-direction. The contact plug 42 is arranged on each read word line RWL1.

FIG. 56 shows the layout of the read bit lines and MTJ elements.

The read bit lines RBL1, RBL2, RBL3, and RBL4 (write bit lines WBL1, WBL2, WBL3, and WBL4) run in the X-direction. The interval between the read bit lines RBL1, RBL2, RBL3, and RBL4 can be set to, e.g., the minimum size (or design rule) processible by photolithography.

The MTJ elements MTJ1, MTJ2, MTJ3, and MTJ4 are arranged on the read bit lines RBL1, RBL2, RBL3, and RBL4, respectively. The axis of easy magnetization of the MTJ elements MTJ1, MTJ2, MTJ3, and MTJ4, i.e., the direction parallel to the long sides of the MTJ elements MTJ1, MTJ2, MTJ3, and MTJ4 is the Y-direction.

The read bit line RBL1 is commonly connected to the MTJ elements MTJ1 arranged in the X-direction. The read bit line RBL2 is commonly connected to the MTJ elements MTJ2 arranged in the X-direction. The read bit line RBL3 is commonly connected to the MTJ elements MTJ3 arranged in the X-direction. The read bit line RBL4 is commonly connected to the MTJ elements MTJ4 arranged in the X-direction.

The conductive layer 43 is arranged on the contact plug 42.

FIG. 57 shows the layout of write bit lines.

The upper electrode 44 having a rectangular pattern is arranged on the MTJ elements MTJ1, MTJ2, MTJ3, and MTJ4 and conductive layer 43. The upper electrode 44 are in contact with the MTJ elements MTJ1, MTJ2, MTJ3, and MTJ4 and conductive layer 43.

The write word lines WWL1 are arranged immediately on the upper electrodes 44. The write word lines WWL1 run in the Y-direction.

(8) STRUCTURAL EXAMPLES 8, 9, and 10

Structural Examples 8, 9, and 10 as improvements of Structural Example 1 will now be described.

① Structural Example 8

Figure 58:
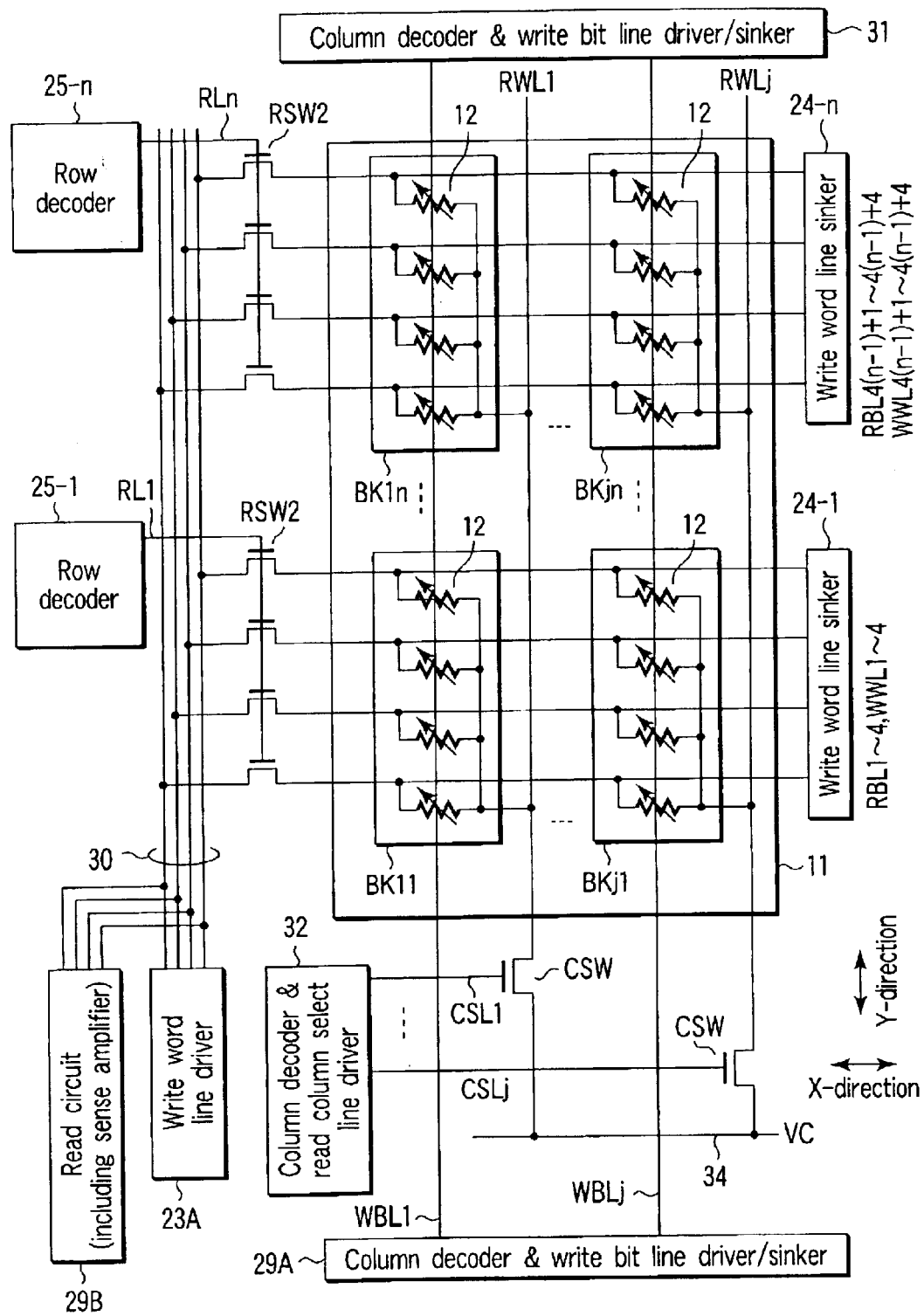
FIG. 58 is a circuit diagram showing a magnetic random access memory according to Structural Example 8 of the present invention.

FIG. 58 shows the main part of a magnetic random access memory according to Structural Example 8 of the present invention.

As a characteristic feature of Structural Example 8, in read operation, a bias voltage VC is applied to one terminal of each of four MTJ elements 12 that form a read block BKik.

More specifically, in Structural Example 1 (FIG. 1), the read word line RWLi is connected to the ground point VSS through the column select switch CSW, and the bias voltage VC is generated by the read circuit 29B. In Structural Example 8, a read word line RWLi is connected to a bias line 34 through a column select switch CSW, and the bias voltage VC is supplied to the bias line 34.

Hence, in the read operation, the bias voltage VC can be applied to the bias line 34, and a read current can be supplied from the bias line 34 to the MTJ element 12. In a mode (e.g., write operation) except the read operation, a ground potential VSS is applied to the bias line 34.

In Structural Example 8, the potential of the read word line RWLi can be changed. Hence, in the read operation, the bias voltage VC can be applied to the read word line RWLi, and the read current can be supplied to the MTJ element 12 in the read block BKik.

For example, as shown in FIG. 131, the read bit line is connected to a bias transistor BT which sets the bit line potential to VC.

A row select line signal RLi (i=1, ..., n) is input to each row select switch RSW2. Row decoders 25-1, ..., 25-n output the row select line signals RLi.

As shown in FIG. 131, the bias transistor BT is a NMOS transistor, when the inverting signal from RLi is input to the bias transistor BT. Row decoders 25-1, ..., 25-n output the row select line signals RLi and the inverting signal thereof.

② Structural Example 9

FIG. 59 shows the main of a magnetic random access memory according to Structural Example 9 of the present invention.

As a characteristic feature of Structural Example 9, a write word line driver is arranged in one row of a memory cell array.

In Structural Example 1 (FIG. 1), only one write word line driver 23A is commonly arranged for all rows of the memory cell array 11 and connected to the common data line (common driver line) 30. In this case, however, elements having resistances, i.e., the common data line and row select switches are connected between the write word line driver and the write word line. Since a voltage drop due to these elements becomes large, the write current becomes small.

In Structural Example 9, write word line drivers 33-1, ..., 33-n are arranged for rows of a memory cell array 11, respectively.

More specifically, in each row of the memory cell array 11, a corresponding one of the write word line drivers 33-1, ..., 33-n is connected between row select switches RSW2 and write word lines WWL4(n−1)+1, WWL4(n−1)+2, WWL4(n−1)+3, and WWL4(n−1)+4.

In this case, the write word line drivers 33-1, ..., 33-n need to drive only the write word lines WWL4(n−1)+1, WWL4(n−1)+2, WWL4(n−1)+3, and WWL4(n−1)+4.

Hence, the driving force for the write word line drivers 33-1, ..., 33-n can be decreased. This contributes to decreasing power consumption and increasing the operation speed.

Since the read current is much smaller than the write current, the driving force of the row select switches RSW2 need not be increased.

The write word line drivers 33-1, ..., 33-n are controlled by output signals (word line enable signals) WLEN1, ..., WLEN4 from row decoders 25-1, ..., 25-n. More specifically, in the write operation, the row decoders 25-1, ..., 25-n are activated to select one row. In the selected row, one of the output signals (word line enable signals) WLEN1, ..., WLEN4 changes to "H".

In Structural Example 1, the row select switches RSW2 are controlled by the output signals from the row decoders 25-1, ..., 25-n which are activated only in the write operation. In Structural Example 9, the row select switches RSW2 are controlled by the output signals from circuit blocks 23B-1, ..., 23B-n each including a row decoder and read line driver.

That is, the gates of the row select switches (MOS transistors) RSW2 are connected to read lines RW1, ..., RWn.

The reason why this structure is employed is as follows. The write word line drivers 33-1, ..., 33-n are arranged for the respective rows. Hence, in the write operation, all the write word lines WWL4(n−1)+1, WWL4(n−1)+2, WWL4(n−1)+3, and WWL4(n−1)+4 must be disconnected from the common data line 30.

More specifically, the circuit blocks 23B-1, ..., 23B-n each including a row decoder and read line driver are activated only in the read operation. In the write operation, the row select switches RSW2 of all rows are turned off, so all the write word lines WWL4(n−1)+1, WWL4(n−1)+2, WWL4(n−1)+3, and WWL4(n−1)+4 are disconnected from the common data line 30.

For example, as shown in FIG. 132, the read bit line is connected to a bias transistor BT which sets the bit line potential to VC.

A row select line signal RWi (i=1, ..., n) is input to each row select switch RSW2. Row decoders 23B-1, ..., 23B-n output the row select line signals RWi.

As shown in FIG. 132, the bias transistor BT is a NMOS transistor, when the inverting signal from RLi is input to the bias transistor BT. Row decoders 23B-1, ..., 23B-n output the row select line signals RWi and the inverting signal thereof.

③ Structural Example 10

Figure 60:
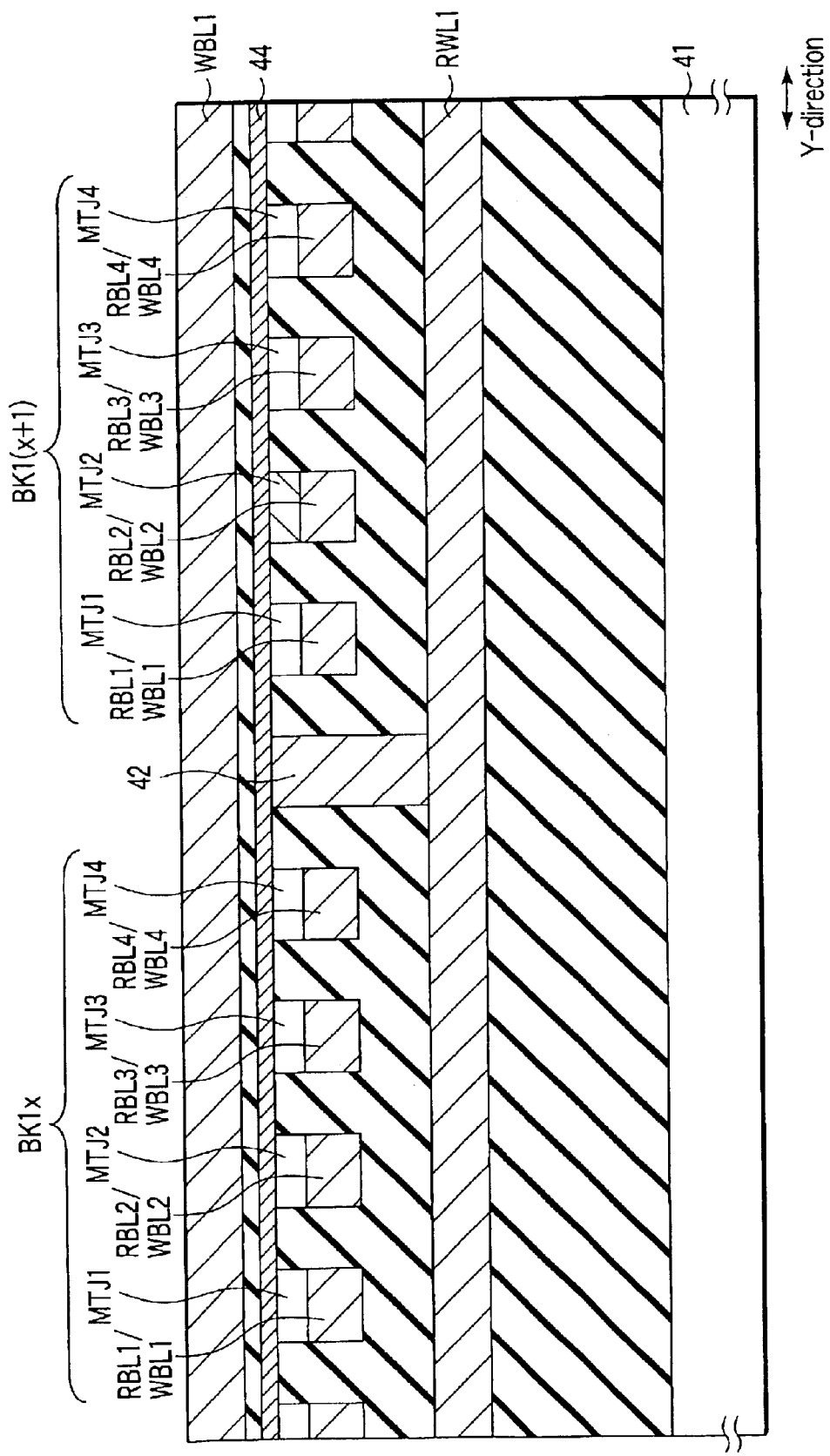
FIG. 60 is a sectional view showing a device structure according to Structural Example 10.

FIG. 60 shows the main part of a magnetic random access memory according to Structural Example 10 of the present invention.

As a characteristic feature of Structural Example 10, MTJ elements MTJ1, MTJ2, MTJ3, and MTJ4 in a plurality of or all read blocks BK1x and BK1(x+1) in one column (Y-direction) share one upper electrode 44.

In Structural Example 1, the upper electrode 44 for the MTJ elements MTJ1, MTJ2, MTJ3, and MTJ4 is arranged for each read block. However, the upper electrodes 44 for the MTJ elements MTJ1, MTJ2, MTJ3, and MTJ4 in read blocks in one column are short-circuited through the read word line RWL1.

Hence, the upper electrodes 44 for the MTJ elements MTJ1, MTJ2, MTJ3, and MTJ4 in the read blocks in one column may be short-circuited. However, the upper electrodes 44 for the MTJ elements MTJ1, MTJ2, MTJ3, and MTJ4 in read blocks in one row (X-direction) must be disconnected from each other.

In Structural Example 10, the MTJ elements MTJ1, MTJ2, MTJ3, and MTJ4 in the plurality of or all the read blocks BK1x and BK1(x+1) in one column share one upper electrode 44.

According to Structural Example 10, since no contact plug 42 must be arranged for each read block, the density of MTJ elements MTJ1, MTJ2, MTJ3, and MTJ4 can be increased. That is, theoretically, at least one contact plug 42 suffices between a read word line RWL1 and the shared upper electrode 44. Actually, a plurality of contact plugs 42 are preferably arranged in one column equidistantly in consideration of the interconnection resistance and the like.

Structural Example 10 has been described as a modification of Structural Example 1. However, Structural Example 10 can be applied to all of Structural Examples 2 to 9.

(9) Others

As described above, the present invention is applied to a magnetic random access memory which has a cell array structure in which one terminal of each of a plurality of MTJ elements of a read block is commonly connected, and the other terminal is independently connected to a read bit line. When a select switch (e.g., a MOS transistor) is arranged in a read block, the degree of integration of MTJ elements can hardly be increased.

Normally, a select switch is formed in the surface region of a semiconductor substrate. An MTJ element is formed above the select switch. In this case, a contact hole is necessary for electrically connecting the select switch and MTJ element. That is, since no MTJ element can be arranged in the region where the contact hole is formed, the area of the memory cell array increases.

On the other hand, the resistance value of the MTJ element which forms a memory cell of the magnetic random access memory is sufficiently large. The read current is much smaller than the write current. That is, even when the select transistor in the read block is omitted, an increase in current consumption due to the read current flowing to MTJ elements in an unselected block poses no serious problem.

In the present invention, first, in the cell array structure in which one terminal of each of the plurality of MTJ elements of a read block is independently connected to a read bit line, the select switch which selects a read block is omitted. That is, no select switch (MOS transistor) is arranged in the memory cell array (immediately under the MTJ elements).

According to the characteristic feature of the present invention, since no select switch is present in the memory cell array, the MTJ elements can be arranged at a high density. In addition, since no select switch (semiconductor element) is present immediately under the MTJ elements, the planarity of the underlying layer of the MTJ elements can be improved, and the characteristics (uniform MR ratio or the like) of the MTJ elements can be improved.

To further improve the planarity of the underlying layer of the MTJ elements, a dummy pattern, e.g., a dummy interconnection pattern which does not function as an actual interconnection is arranged immediately under the MTJ elements.

Normally, to reduce the manufacturing cost (proportional to the number of times of PEP, the members (MTJ elements and the like) of the memory cell array portion and the members (interconnections) of the peripheral circuit portion are simultaneously processed as much as possible. However, when no select switch is present immediately under the MTJ elements, a step difference is generated between the memory cell array portion and the peripheral circuit portion. This step difference degrades the process accuracy of photolithography.

To prevent this, a dummy pattern is arranged immediately under the MTJ elements to increase the planarity of the underlying layer of the MTJ elements. More specifically, the step difference between the memory cell array portion and the peripheral circuit portion is eliminated. As the dummy pattern, a periodical (a repeat of a predetermined pattern) or a pattern which is uniform as a whole is used.

When the plurality of MTJ elements in a read block are arrayed in a direction parallel to the surface of the semiconductor substrate, i.e., arrayed in a line in the horizontal direction, a plurality of stages of memory cell arrays are stacked. When no select switch is present in the read block, a plurality of stages of memory cell arrays can be stacked.

The MTJ elements are also arranged in a direction perpendicular to the surface of the semiconductor substrate, i.e., in the vertical direction. That is, since the MTJ elements are arranged three-dimensionally, the density of MTJ elements can be increased as compared to a two-dimensional cell array structure. In addition, when a predetermined interconnection is shared by the memory cell array of the upper stage and that of the lower stage, the manufacturing cost can be reduced, and the insulating layer of each stage can be planarized (the characteristic of the MTJ elements can be increased).

In the cell array structure having the above characteristic features, an interconnection which functions only as a read bit line is connected to one terminal of each of the plurality of MTJ elements of a read block. That is, one of two write lines for a write is not electrically connected to the plurality of MTJ elements.

Hence, in the write operation, even when a potential difference is generated due to the interconnection resistance of the two write lines, the potential difference is not generated across the MTJ elements. According to the device structure of the present invention, dielectric breakdown (breakdown of the tunneling barrier layer of the MTJ element) in the write operation poses no problem, unlike a cross-point cell array structure.

As a switch for the magnetic random access memory, a MIS (Metal Insulator Semiconductor) transistor (including a MOS transistor), MES (Metal Semiconductor) transistor, junction transistor, bipolar transistor, or diode can be used.

2. Structural Examples of MTJ Element

FIGS. 61 to 63 show structural examples of the MTJ element.

The MTJ element shown in FIG. 61 has the most basic structure having two ferromagnetic layers and a tunneling barrier layer sandwiched between these layers.

An antiferromagnetic layer for fixing the magnetizing direction is added to a fixed layer (pinning layer) of the two ferromagnetic layers, in which the magnetizing direction is fixed. The magnetizing direction in a free layer (storing layer) of the two ferromagnetic layers, in which the magnetizing direction can be freely changed, is determined by a synthesized magnetic field formed by a write word line and write bit line.

The MTJ element shown in FIG. 62 has two tunneling barrier layers in it to make the bias voltage higher than in the MTJ element shown in FIG. 61.

The MTJ element shown in FIG. 62 can be regarded to have a structure (double junction structure) in which two MTJ elements shown in FIG. 61 are connected in series.

In this example, the MTJ element has three ferromagnetic layers. Tunneling barrier layers are inserted between the ferromagnetic layers. Antiferromagnetic layers are added to the two ferromagnetic layers (pinning layers) at two ends. The middle layer in the three ferromagnetic layers serves as a free layer (storing layer) in which the magnetizing direction can be freely changed.

The MTJ element shown in FIG. 63 can easily close lines of magnetic force in the ferromagnetic layer serving as a storing layer, as compared to the MTJ element shown in FIG. 61.

For the MTJ element of this example, it can be regarded that the storing layer of the MTJ element shown in FIG. 61 is replaced with a storing layer formed from two ferromagnetic layers and a nonmagnetic metal layer (e.g., an aluminum layer) sandwiched between those layers.

When the storing layer of the MTJ element has a three-layered structure made of two ferromagnetic layers and a nonmagnetic metal layer sandwiched between these layers, lines of magnetic force in the two ferromagnetic layers of the storing layer readily close. That is, since any antimagnetic field component in the two ferromagnetic layers of the storing layer can be prevented, the MR ratio can be improved.

The structural examples of the MTJ element have been described above. In the present invention (circuit structure, device structure, read operation principle, read circuit, and manufacturing method), the structure of the MTJ element is not particularly limited. The above-described three structural examples are mere representative examples of the MTJ element structure.

3. Examples of Peripheral Circuits

Circuit examples of the write word line driver/sinker, circuit examples of the write bit line driver/sinker, circuit examples of the read word line driver, circuit examples of the row decoder, circuit examples of the column decoder, and circuit examples of a read circuit (including a sense amplifier) will be sequentially described below.

(1) Write Word Line Driver/Sinker

FIG. 64 shows a circuit example of the write word line driver/sinker.

Assume that a read block is formed from four MTJ elements, and each of the four MTJ elements is selected by lower two bits CA0 and CA1 of a column address signal. FIG. 64 shows a write word line driver/sinker of only one row.

The write word line driver 23A includes PMOS transistors QP1, QP2, QP3, and QP4, and NAND gate circuits ND1, ND2, ND3, and ND4. The write word line sinker 24-$n$ is formed from NMOS transistors QN1, QN2, QN3, and QN4.

The source of the PMOS transistor QP1 is connected to a power supply terminal VDD. The drain is connected to one end of the write word line WWL4(n−1)+1 through the common data line (common driver line) 30 and row select switch RSW2. The output terminal of the NAND gate circuit ND1 is connected to the gate of the PMOS transistor QP1. The source of the NMOS transistor QN1 is connected to the ground terminal VSS. The drain is connected to the other end of the write word line WWL4(n−1)+1.

When the output signal from the NAND gate circuit ND1 is "0", a write current flows to the write word line WWL4(n−1)+1 in the selected row (the row whose row select switch RSW2 is turned on).

The source of the PMOS transistor QP2 is connected to the power supply terminal VDD. The drain is connected to one end of the write word line WWL4(n−1)+2 through the common data line (common driver line) 30 and row select switch RSW2. The output terminal of the NAND gate circuit ND2 is connected to the gate of the PMOS transistor QP2. The source of the NMOS transistor QN2 is connected to the ground terminal VSS. The drain is connected to the other end of the write word line WWL4(n−1)+2.

When the output signal from the NAND gate circuit ND2 is "0", a write current flows to the write word line WWL4(n−1)+2 in the selected row (the row whose row select switch RSW2 is turned on).

The source of the PMOS transistor QP3 is connected to the power supply terminal VDD. The drain is connected to one end of the write word line WWL4(n−1)+3 through the common data line (common driver line) 30 and row select switch RSW2. The output terminal of the NAND gate circuit ND3 is connected to the gate of the PMOS transistor QP3. The source of the NMOS transistor QN3 is connected to the ground terminal VSS. The drain is connected to the other end of the write word line WWL4 (n−1)+3.

When the output signal from the NAND gate circuit ND3 is "0", a write current flows to the write word line WWL4 (n−1)+3 in the selected row (the row whose row select switch RSW2 is turned on).

The source of the PMOS transistor QP4 is connected to the power supply terminal VDD. The drain is connected to one end of the write word line WWL4(n−1)+4 through the common data line (common driver line) 30 and row select switch RSW2. The output terminal of the NAND gate circuit ND4 is connected to the gate of the PMOS transistor QP4. The source of the NMOS transistor QN4 is connected to the ground terminal VSS. The drain is connected to the other end of the write word line WWL4(n−1)+4.

When the output signal from the NAND gate circuit ND4 is "0", a write current flows to the write word line WWL4 (n−1)+4 in the selected row (the row whose row select switch RSW2 is turned on).

A write signal WRITE is input to the NAND gate circuits ND1, ND2, ND3, and ND4. In the write operation, the write signal WRITE changes to "H". In addition, different lower column address signals CA0, /CA0, CA1, and /CA1 are input to the NAND gate circuits ND1, ND2, ND3, and ND4.

That is, in this example, column address signal bits bCA0 and bCA1 are used to select one write word line WWL4(n−1)+1 of the four write word lines (read bit lines) in the selected row and input to the NAND circuit ND1.

Column address signal bits CA0 and bCA1 are used to select one write word line WWL4(n−1)+2 of the four write word lines (read bit lines) in the selected row and input to the NAND circuit ND2.

Column address signal bits bCA0 and CA1 are used to select one write word line WWL4(n−1)+3 of the four write word lines (read bit lines) in the selected row and input to the NAND circuit ND3.

The column address signal bits CA0 and CA1 are used to select one write word line WWL4(n−1)+4 of the four write word lines (read bit lines) in the selected row and input to the NAND circuit ND4.

Note that the signal bits bCA0 and bCA1 are inverted signal bits with inverted levels of CA0 and CA1.

In this write word line driver/sinker, in the write operation, the write signal WRITE changes to "H". For example, one of the output signals from the four NAND gate circuits ND1, ND2, ND3, and ND4 changes to "L".

For example, when both CA0 and CA1 are "0", all input signals to the NAND gate circuit ND1 are "1". The output signal from the NAND gate circuit ND1 is "0". As a result, the PMOS transistor QP1 is turned on. The write current flows to the write word line WWL4(n−1)+1.

When CA0 is "1" and CA1 is "0", all input signals to the NAND gate circuit ND2 are "1". The output signal from the NAND gate circuit ND2 is "0". As a result, the PMOS transistor QP2 is turned on. The write current flows to the write word line WWL4(n−1)+2.

When CA0 is "0" and CA1 is "1", all input signals to the NAND gate circuit ND3 are "1". The output signal from the NAND gate circuit ND3 is "0". As a result, the PMOS transistor QP3 is turned on. The write current flows to the write word line WWL4(n−1)+3.

When both CA0 and CA1 are "1", all input signals to the NAND gate circuit ND4 are "1". The output signal from the NAND gate circuit ND4 is "0". As a result, the PMOS transistor QP4 is turned on. The write current flows to the write word line WWL4(n−1)+4.

(2) Write Bit Line Driver/Sinker

Figure 65:
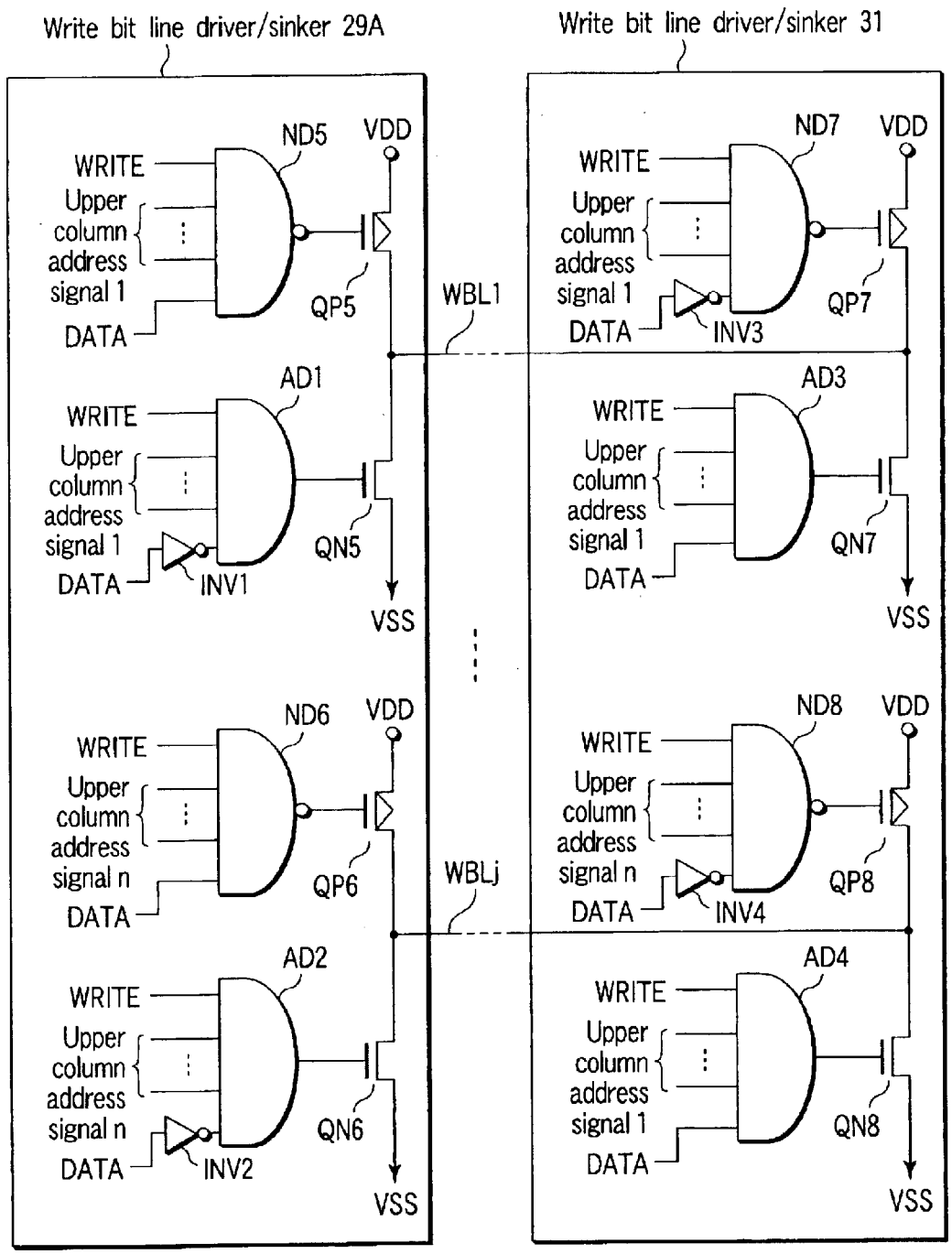
FIG. 65 is a view showing a circuit example of the write word line driver/sinker.

FIG. 65 shows a circuit example of the write bit line driver/sinker.

The write bit line driver/sinker 29A is formed from PMOS transistors QP5 and QP6, NMOS transistors QN5 and QN6, NAND gate circuits ND5 and ND6, AND gate circuits AD1 and AD2, and inverters INV1 and INV2.

The PMOS transistor QP5 is connected between the power supply terminal VDD and one end of the write bit line WBL1. The output signal from the NAND gate circuit ND5 is supplied to the gate of the PMOS transistor QP5. The NMOS transistor QN5 is connected between one end of the write bit line WBL1 and the ground terminal VSS. The output signal from the AND gate circuit AD1 is supplied to the gate of the NMOS transistor QN5.

The PMOS transistor QP6 is connected between the power supply terminal VDD and one end of the write bit line WBLj. The output signal from the NAND gate circuit ND6 is supplied to the gate of the PMOS transistor QP6. The NMOS transistor QN6 is connected between one end of the write bit line WBLj and the ground terminal VSS. The output signal from the AND gate circuit AD2 is supplied to the gate of the NMOS transistor QN6.

The write bit line driver/sinker 31 is formed from PMOS transistors QP7 and QP8, NMOS transistors QN7 and QN8, NAND gate circuits ND7 and ND8, AND gate circuits AD3 and AD4, and inverters INV3 and INV4.

The PMOS transistor QP7 is connected between the power supply terminal VDD and the other end of the write bit line WBL1. The output signal from the NAND gate circuit ND7 is supplied to the gate of the PMOS transistor QP7. The NMOS transistor QN7 is connected between the other end of the write bit line WBL1 and the ground terminal VSS. The output signal from the AND gate circuit AD3 is supplied to the gate of the NMOS transistor QN7.

The PMOS transistor QP8 is connected between the power supply terminal VDD and the other end of the write bit line WBLj. The output signal from the NAND gate circuit ND8 is supplied to the gate of the PMOS transistor QP8. The NMOS transistor QN8 is connected between the other end of the write bit line WBLj and the ground terminal VSS. The output signal from the AND gate circuit AD4 is supplied to the gate of the NMOS transistor QN8.

In the write bit line drivers/sinkers 29A and 31 with the above structures, when the output signal from the NAND gate circuit ND5 is "0", and the output signal from the AND gate circuit AD3 is "1", a write current from the write bit line driver/sinker 29A to the write bit line driver/sinker 31 flows to the write bit line WBL1.

When the output signal from the NAND gate circuit ND7 is "0", and the output signal from the AND gate circuit AD1 is "1", a write current from the write bit line driver/sinker 31 to the write bit line driver/sinker 29A flows to the write bit line WBL1.

In the write bit line drivers/sinkers 29A and 31, in the write operation, the write signal WRITE is "1". In the selected column, all bits of the upper column address signal are "1". Hence, a write current having a direction corresponding to the value of write data DATA flows to the write bit line WBLi (i=1, . . . , j) in the selected column.

The direction of write current flowing to the write bit line WBLi in the selected column is determined in accordance with the value of the write data DATA.

For example, when the write bit line WBL1 is selected, and the write data DATA is "1", the output signal from the NAND gate circuit ND5 is "0". The output signal from the AND gate circuit AD3 is "1". As a result, a write current from the write bit line driver/sinker 29A to the write bit line driver/sinker 31 flows to the write bit line WBL1.

Conversely, when the write data DATA is "0", the output signal from the NAND gate circuit ND7 is "0". The output signal from the AND gate circuit AD1 is "1". As a result, a write current from the write bit line driver/sinker 31 to the write bit line driver/sinker 29A flows to the write bit line WBL1.

(3) Row Decoder

Figure 66:
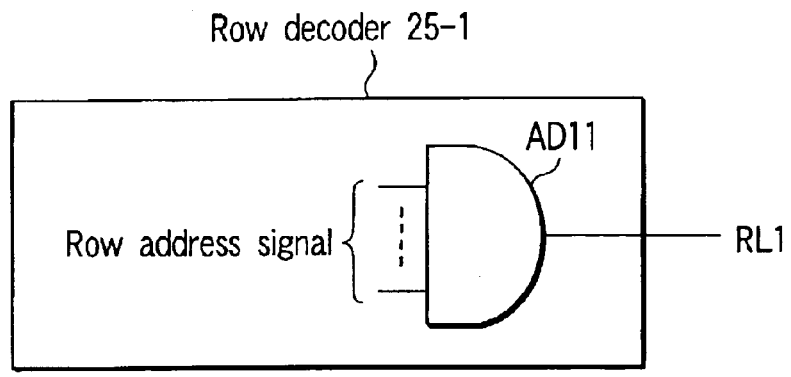
FIG. 66 is a view showing a circuit example of a row decoder.

FIG. 66 shows a circuit example of the row decoder.

The row decoder 25-1 can have, e.g., the following structure. FIG. 66 shows the row decoder of only one row.

The row decoder 25-1 is formed from an AND gate circuit AD11. A row address signal is input to the AND gate circuit AD11. In the selected row, all the bits of the row address signals are "H". Hence, an output signal RL1 from the row decoder 25-1 changes to "H".

(4) Column Decoder & Read Column Select Line Driver

Figure 67:
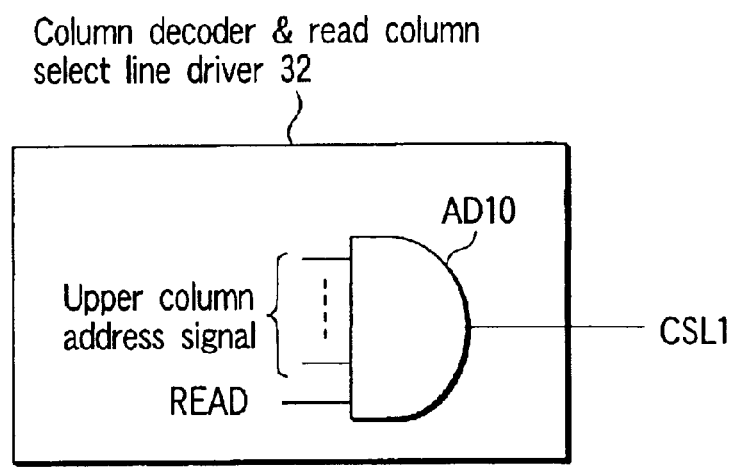
FIG. 67 is a view showing a circuit example of a column decoder & read column select line driver.

FIG. 67 shows a circuit example of the column decoder & read column select line driver.

FIG. 67 illustrates the column decoder & read column select line driver of only one column of the memory cell array.

The column decoder & read column select line driver 32 is formed from an AND gate circuit AD10. A read signal READ and upper column address signal are input to the AND gate circuit AD10.

In the read operation, the read signal changes to "H". That is, in a mode other than the read operation, the potential of the output signal (column select signal) CSL1 from the column decoder & read column select line driver 32 does not change to "H". In the read operation, in the selected column, all bits of the column address signal are "H". Hence, the potential of the output signal CSL1 from the column decoder & read column select line driver 32 changes to "H".

(5) Write Bit Line Driver/Sinker

A circuit example of the write bit line driver/sinker used in Structural Example 7 (FIG. 53) will be described.

FIGS. 68 and 69 show a circuit example of the write bit line driver/sinker.

The write bit line driver/sinker 23AR is formed from PMOS transistors QP5, QP6, QP7, and QP8, NMOS transistors QN5, QN6, QN7, and QN8, NAND gate circuits ND5, ND6, ND7, and ND8, AND gate circuits AD1, AD2, AD3, and AD4, and inverters INV1, INV2, INV3, and INV4.

The PMOS transistor QP5 is connected between the power supply terminal VDD and the common data line 30A.

The output signal from the NAND gate circuit ND5 is supplied to the gate of the PMOS transistor QP5. The NMOS transistor QN5 is connected between the common data line 30A and the ground terminal VSS. The output signal from the AND gate circuit AD1 is supplied to the gate of the NMOS transistor QN5.

The PMOS transistor QP6 is connected between the power supply terminal VDD and the common data line 30A. The output signal from the NAND gate circuit ND6 is supplied to the gate of the PMOS transistor QP6. The NMOS transistor QN6 is connected between the common data line 30A and the ground terminal VSS. The output signal from the AND gate circuit AD2 is supplied to the gate of the NMOS transistor QN6.

The PMOS transistor QP7 is connected between the power supply terminal VDD and the common data line 30A. The output signal from the NAND gate circuit ND7 is supplied to the gate of the PMOS transistor QP7. The NMOS transistor QN7 is connected between the common data line 30A and the ground terminal VSS. The output signal from the AND gate circuit AD3 is supplied to the gate of the NMOS transistor QN7.

The PMOS transistor QP8 is connected between the power supply terminal VDD and the common data line 30A. The output signal from the NAND gate circuit ND8 is supplied to the gate of the PMOS transistor QP8. The NMOS transistor QN8 is connected between the common data line 30A and the ground terminal VSS. The output signal from the AND gate circuit AD4 is supplied to the gate of the NMOS transistor QN8.

The write bit line driver/sinker 23AS is formed from PMOS transistors QP9, QP10, QP11, and QP12, NMOS transistors QN9, QN10, QN11, and QN12, NAND gate circuits ND9, ND10, ND11, and ND12, AND gate circuits AD5, AD6, AD7, and AD8, and inverters INV5, INV6, INV7, and INV8.

The PMOS transistor QP9 is connected between the power supply terminal VDD and the common data line 30B. The output signal from the NAND gate circuit ND9 is supplied to the gate of the PMOS transistor QP9. The NMOS transistor QN9 is connected between the common data line 30B and the ground terminal VSS. The output signal from the AND gate circuit AD5 is supplied to the gate of the NMOS transistor QN9.

The PMOS transistor QP10 is connected between the power supply terminal VDD and the common data line 30B. The output signal from the NAND gate circuit ND10 is supplied to the gate of the PMOS transistor QP10. The NMOS transistor QN10 is connected between the common data line 30B and the ground terminal VSS. The output signal from the AND gate circuit AD6 is supplied to the gate of the NMOS transistor QN10.

The PMOS transistor QP11 is connected between the power supply terminal VDD and the common data line 30B. The output signal from the NAND gate circuit ND11 is supplied to the gate of the PMOS transistor QP11. The NMOS transistor QN11 is connected between the common data line 30B and the ground terminal VSS. The output signal from the AND gate circuit AD7 is supplied to the gate of the NMOS transistor QN11.

The PMOS transistor QP12 is connected between the power supply terminal VDD and the common data line 30B. The output signal from the NAND gate circuit ND12 is supplied to the gate of the PMOS transistor QP12. The NMOS transistor QN12 is connected between the common data line 30B and the ground terminal VSS. The output signal from the AND gate circuit AD8 is supplied to the gate of the NMOS transistor QN12.

In the write bit line drivers/sinkers 23AR and 23AS with the above structures, for example, when the output signal from the NAND gate circuit ND5 is "0", and the output signal from the AND gate circuit AD5 is "1", a write current from the write bit line driver/sinker 23AR to the write bit line driver/sinker 23AS flows to the write bit line WBL4(n−1)+1 in the row selected by the row select switch RSW2.

For example, when the output signal from the NAND gate circuit ND9 is "0", and the output signal from the AND gate circuit AD1 is "1", a write current from the write bit line driver/sinker 2AS to the write bit line driver/sinker 23AR flows to the write bit line WBL4(n−1)+1 in the row selected by the row select switch RSW2.

In the write bit line drivers/sinkers 23AR and 23AS, in the write operation, the write signal WRITE is "1". In this example, one read block BKik is selected by the row address signal and upper column address signal (signal bits except lower two bits of the column address signal).

The four MTJ elements are present in the selected read block BKik. To select one of the four MTJ elements, the lower two bits CA0 and CA1 of the column address signal are used.

The direction of write current flowing to the write bit line WBL4(n−1)+1, which is to be used to write data in the selected MTJ element in the selected read block BKik, is determined in accordance with the value of the write data DATA.

For example, when the write bit line WBL4(n−1)+1 is selected, and the write data DATA is "1", the output signal from the NAND gate circuit ND5 is "0". The output signal from the AND gate circuit AD5 is "1". As a result, a write current from the write bit line driver/sinker 23AR to the write bit line driver/sinker 23AS flows to the write bit line WBL4(n−1)+1.

Conversely, when the write data DATA is "0", the output signal from the NAND gate circuit ND9 is "0". The output signal from the AND gate circuit AD1 is "1". As a result, a write current from the write bit line driver/sinker 23AS to the write bit line driver/sinker 23AR flows to the write bit line WBL4(n−1)+1.

(6) Column Decoder & Write Word Line Driver/Sinker

A circuit example of the column decoder & write word line driver/sinker used in Structural Example 7 (FIG. 53) will be described.

FIG. 70 shows a circuit example of a column decoder & write word line driver/sinker.

The column decoder & write word line driver/sinker 29AR is formed from NAND gate circuits ND1, . . . , NDj and PMOS transistor QP1, . . . , QPj.

Each of the PMOS transistor QP1, . . . , QPj is connected between the power supply terminal VDD and one end of a corresponding one of write word lines WWL1, . . . , WWLj. The output signals from the NAND gate circuits ND1, . . . , NDj are supplied to the gates of the PMOS transistor QP1, . . . , QPj, respectively.

In the write operation, the write signal WRITE is "1". In the selected column, all the upper column address signal bits are "1". Hence, the output signals from the NAND gate circuits ND1, . . . , NDj are "0", and the PMOS transistor QP1, . . . , QPj are turned on.

The write word line sinker 31R is formed from NMOS transistor QN1, . . . , QNj.

Each of the NMOS transistor QN1, ..., QNj is connected between the ground terminal VSS and the other end of a corresponding one of the write word lines WWL1, ..., WWLj. The NMOS transistor QN1, ..., QNj are always ON because the power supply potential VDD is supplied to their gates.

(7) Row Decoder

A circuit example of the row decoder used in Structural Example 9 (FIG. 59) will be described.

FIG. 71 shows a circuit example of the row decoder.

FIG. 71 shows the row decoder 25-1 of only one row.

The row decoder 25-1 is formed from four AND gate circuit AD13 to AD16. The write signal WRITE, row address signal, and lower two bits CA0 and CA1 of the column address signal are input to the AND gate circuit AD13 to AD16.

In the write operation, the write signal WRITE changes to "H". In the selected row, all bits of the row address signal change to "H". In the selected row, one of the four MTJ elements in the selected read block, i.e., one of the four write word lines is selected on the basis of the lower two bits CA0 and CA1 of the column address signal.

(8) Write Word Line Driver

A circuit example of the write word line driver used in Structural Example 9 (FIG. 59) will be described.

Figure 72:
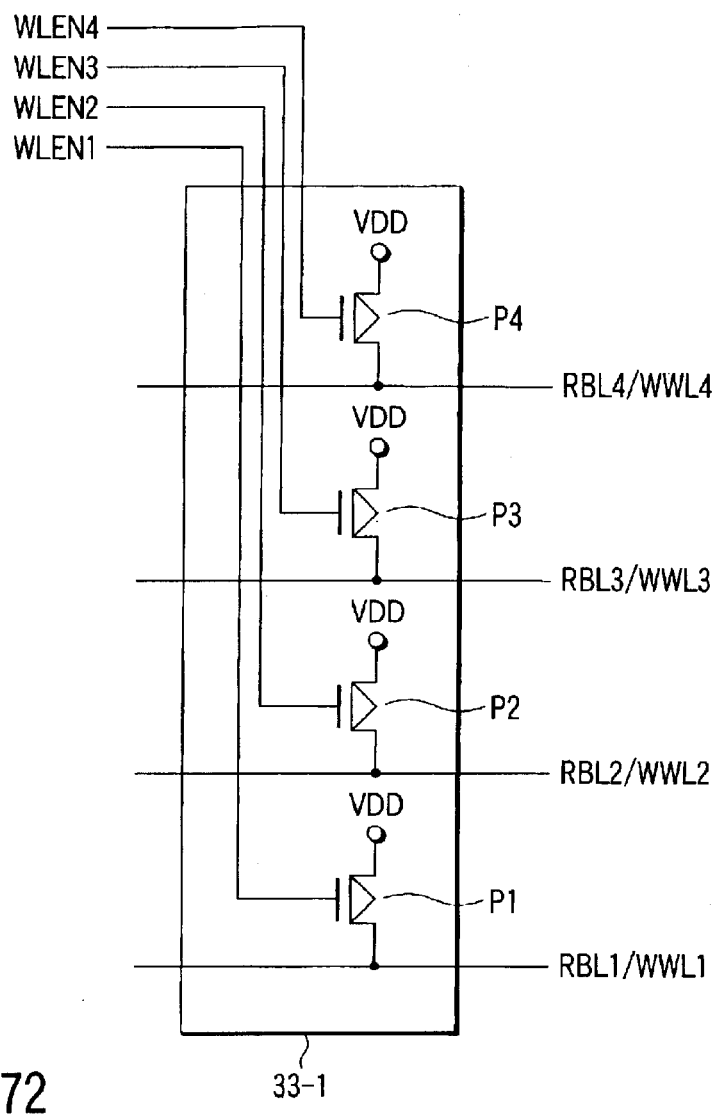
FIG. 72 is a view showing a circuit example of a write word line driver.

FIG. 72 shows a circuit example of the write word line driver.

FIG. 72 shows the write word line driver of only one row.

The write word line driver 33-1 is formed from PMOS transistors P1, P2, P3, and P4 connected to the write word lines WWL1, WWL2, WWL3, and WWL4, respectively.

Each of the PMOS transistors P1, P2, P3, and P4 is connected between the power supply terminal VDD and a corresponding one of the write word lines WWL1, WWL2, WWL3, and WWL4 and controlled by a corresponding one of word line enable signals WLEN1 to WLEN4. The word line enable signals WLEN1 to WLEN4 are obtained by decoding lower two bits of the row address signal and column address signal by the row decoder shown in FIG. 71.

(9) Row Decoder & Read Line Driver

A circuit example of the row decoder & read line driver used in Structural Example 9 (FIG. 59) will be described.

Figure 73:
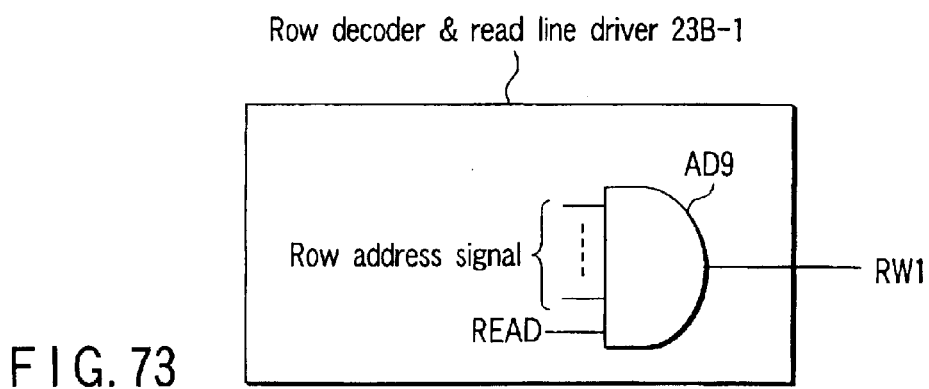
FIG. 73 is a view showing a circuit example of a row decoder & read line driver.

FIG. 73 shows a circuit example of the row decoder & read line driver. FIG. 73 shows the row decoder & read line driver of only one row.

The row decoder & read line driver 23B-1 is formed from an AND gate circuit AD9. The read signal READ and row address signal are input to the AND gate circuit AD9.

In the read operation, the read signal READ changes to "H". That is, in a mode except the read operation, the potential of the read word line RWL1 does not change to "H". In the read operation, in the selected row, all bits of the row address signal change to "H". Hence, the potential of the read line RWL1 is "H".

(10) Column Decoder & Write Bit Line Driver/Sinker

Figure 74:
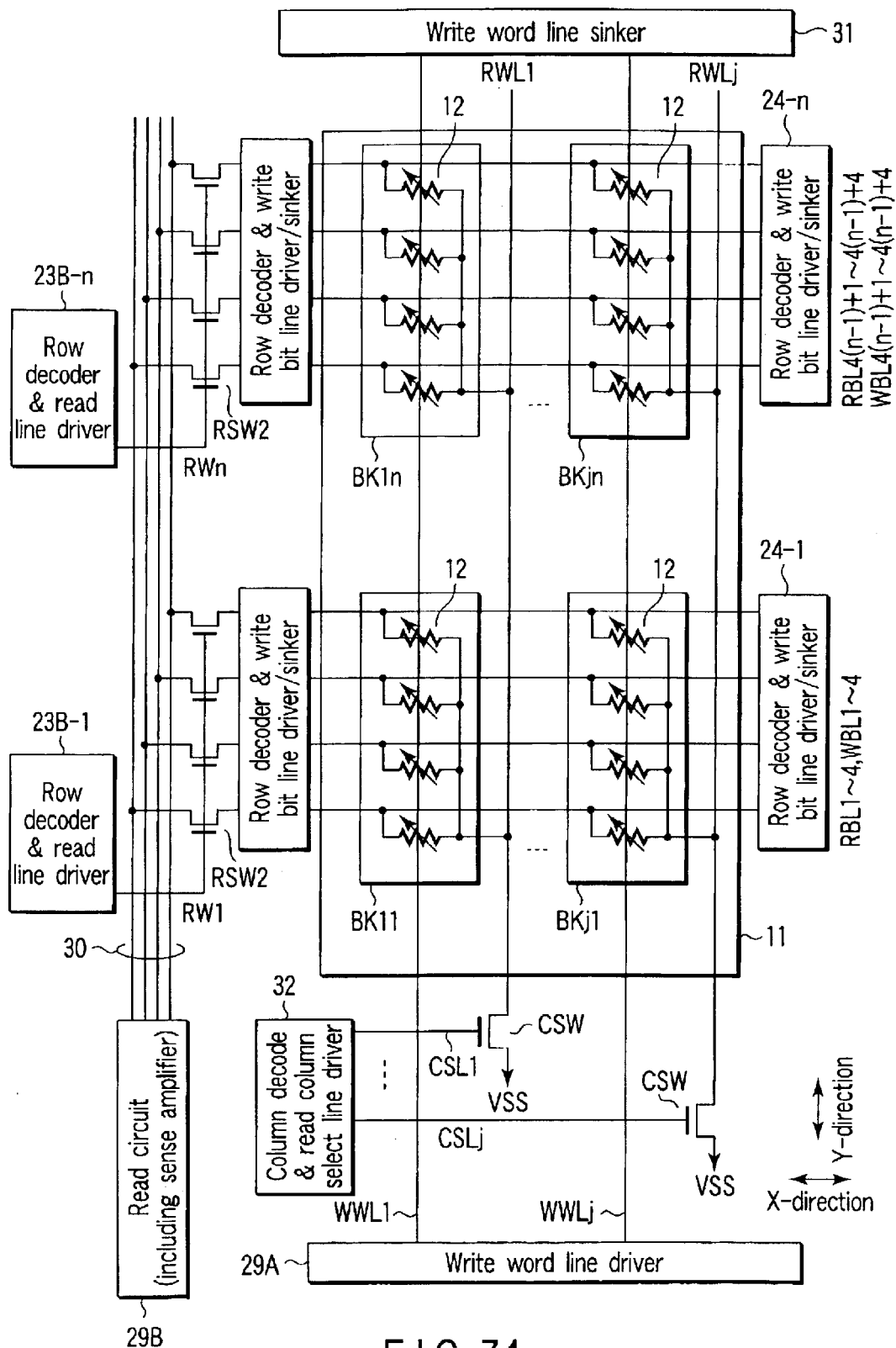
FIG. 74 is a circuit diagram showing a magnetic random access memory according to Structural Example 11 of the present invention.

FIG. 74 is a circuit diagram showing a magnetic random access memory according to Structural Example 11 of the present invention.

Structural Example 11 has a characteristic that the write word lines WWLj are extended in column direction and the write bit lines WBL4(n−1)+1, ... 4(n−1)+4 are extended in row direction.

A circuit example of the column decoder & write bit line driver/sinker used in Structural Example 11 will be described.

Figure 75:
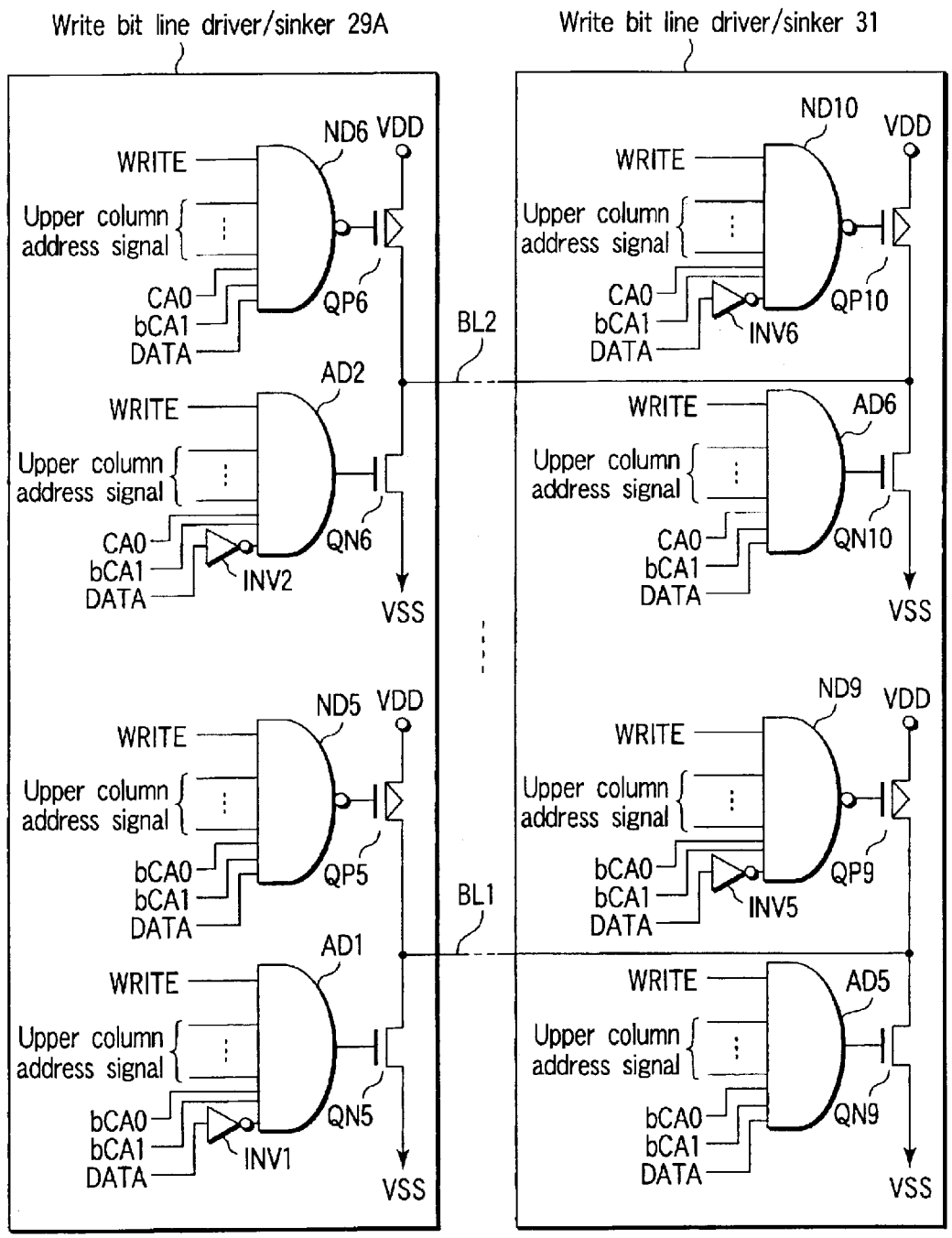
FIG. 75 is a view showing a circuit example of a write bit line driver/sinker of FIG. 74.
Figure 76:
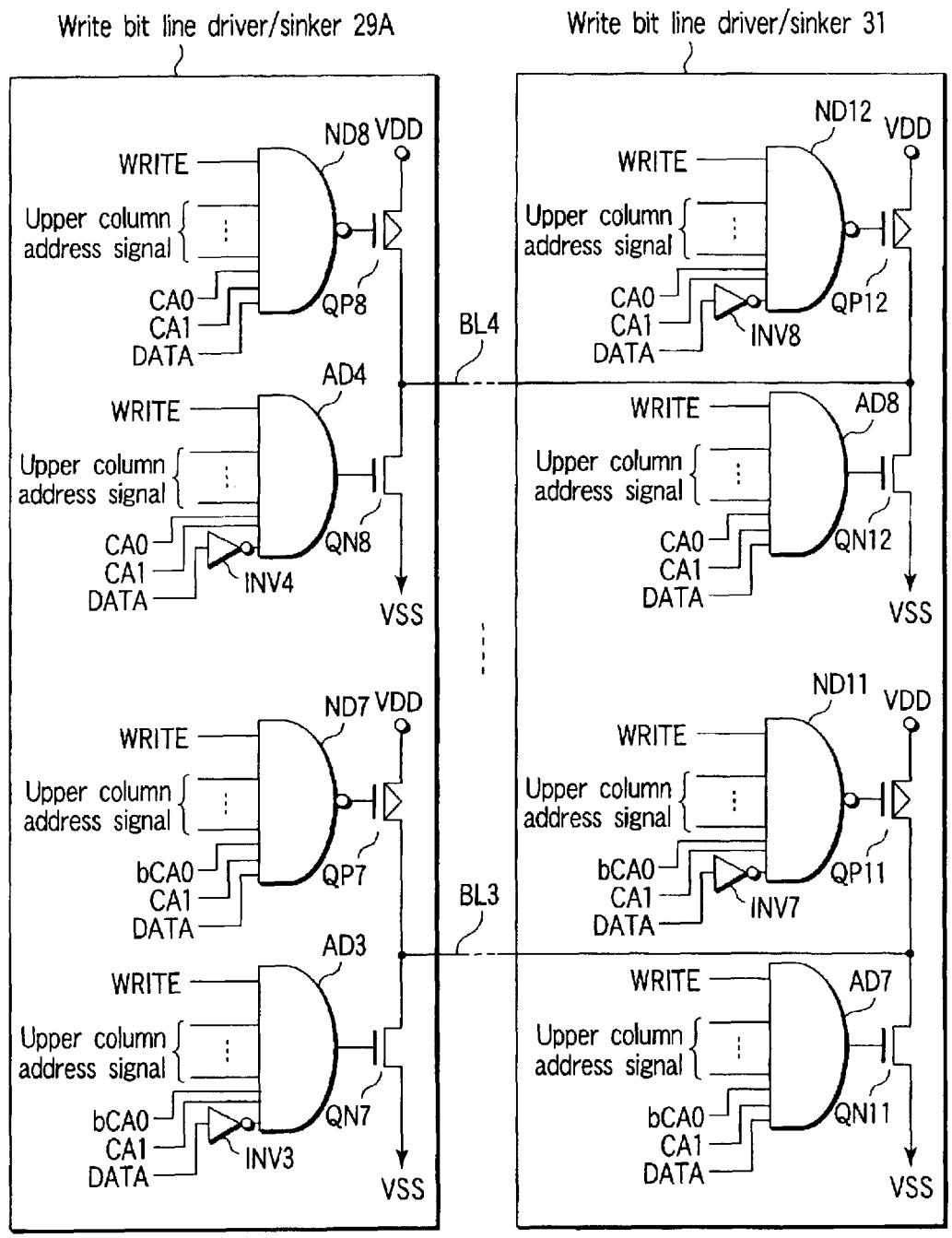
FIG. 76 is a view showing a circuit example of a write bit line driver/sinker of FIG. 74.

FIGS. 75 and 76 show a circuit example of the column decoder & write bit line driver/sinker.

FIGS. 75 and 76 show the column decoder & write bit line driver/sinker of only one column.

In this example, assume that a read block is formed from four MTJ elements, and the four MTJ elements in the Structural Example are selected by lower two bits CA0 and CA1 of the column address signal. In addition, a column of the memory cell array is selected by upper column address signal bits, i.e., a column address signal excluding its lower two bits CA0 and CA1.

The write bit line driver/sinker 29A is formed from the PMOS transistors QP5, QP6, QP7, and QP8, NMOS transistors QN5, QN6, QN7, and QN8, NAND gate circuits ND5, ND6, ND7, and ND8, AND gate circuits AD1, AD2, AD3, and AD4, and inverters INV1, INV2, INV3, and INV4.

The PMOS transistor QP5 is connected between the power supply terminal VDD and one end of the write bit line BL1. The output signal from the NAND gate circuit ND5 is supplied to the gate of the PMOS transistor QP5. The NMOS transistor QN5 is connected between one end of the write bit line BL1 and the ground terminal VSS. The output signal from the AND gate circuit AD1 is supplied to the gate of the NMOS transistor QN5.

The PMOS transistor QP6 is connected between the power supply terminal VDD and one end of the write bit line BL2. The output signal from the NAND gate circuit ND6 is supplied to the gate of the PMOS transistor QP6. The NMOS transistor QN6 is connected between one end of the write bit line BL2 and the ground terminal VSS. The output signal from the AND gate circuit AD2 is supplied to the gate of the NMOS transistor QN6.

The PMOS transistor QP7 is connected between the power supply terminal VDD and one end of the write bit line BL3. The output signal from the NAND gate circuit ND7 is supplied to the gate of the PMOS transistor QP7. The NMOS transistor QN7 is connected between one end of the write bit line BL3 and the ground terminal VSS. The output signal from the AND gate circuit AD3 is supplied to the gate of the NMOS transistor QN7.

The PMOS transistor QP8 is connected between the power supply terminal VDD and one end of the write bit line BL4. The output signal from the NAND gate circuit ND8 is supplied to the gate of the PMOS transistor QP8. The NMOS transistor QN8 is connected between one end of the write bit line BL4 and the ground terminal VSS. The output signal from the AND gate circuit AD4 is supplied to the gate of the NMOS transistor QN8.

The write bit line driver/sinker 31 is formed from the PMOS transistors QP9, QP10, QP11, and QP12, NMOS transistors QN9, QN10, QN11, and QN12, NAND gate circuits ND9, ND10, ND11, and ND12, AND gate circuits AD5, AD6, AD7, and AD8, and inverters INV5, INV6, INV7, and INV8.

The PMOS transistor QP9 is connected between the power supply terminal VDD and the other end of the write bit line BL1. The output signal from the NAND gate circuit ND9 is supplied to the gate of the PMOS transistor QP9. The NMOS transistor QN9 is connected between the other end of the write bit line BL1 and the ground terminal VSS. The output signal from the AND gate circuit AD5 is supplied to the gate of the NMOS transistor QN9.

The PMOS transistor QP10 is connected between the power supply terminal VDD and the other end of the write bit line BL2. The output signal from the NAND gate circuit ND10 is supplied to the gate of the PMOS transistor QP10. The NMOS transistor QN10 is connected between the other end of the write bit line BL2 and the ground terminal VSS. The output signal from the AND gate circuit AD6 is supplied to the gate of the NMOS transistor QN10.

The PMOS transistor QP11 is connected between the power supply terminal VDD and the other end of the write bit line BL3. The output signal from the NAND gate circuit ND11 is supplied to the gate of the PMOS transistor QP11. The NMOS transistor QN11 is connected between the other end of the write bit line BL3 and the ground terminal VSS. The output signal from the AND gate circuit AD7 is supplied to the gate of the NMOS transistor QN11.

The PMOS transistor QP12 is connected between the power supply terminal VDD and the other end of the write bit line BL4. The output signal from the NAND gate circuit ND12 is supplied to the gate of the PMOS transistor QP12. The NMOS transistor QN12 is connected between the other end of the write bit line BL4 and the ground terminal VSS. The output signal from the AND gate circuit AD8 is supplied to the gate of the NMOS transistor QN12.

In the write bit line drivers/sinkers 29A and 31 with the above structures, when the output signal from the NAND gate circuit ND5 is "0", and the output signal from the AND gate circuit AD5 is "1", a write current from the write bit line driver/sinker 29A to the write bit line driver/sinker 31 flows to the write bit line BL1.

When the output signal from the NAND gate circuit ND9 is "0", and the output signal from the AND gate circuit AD1 is "1", a write current from the write bit line driver/sinker 31 to the write bit line driver/sinker 29A flows to the write bit line BL1.

When the output signal from the NAND gate circuit ND6 is "0", and the output signal from the AND gate circuit AD6 is "1", a write current from the write bit line driver/sinker 29A to the write bit line driver/sinker 31 flows to the write bit line BL2.

When the output signal from the NAND gate circuit ND10 is "0", and the output signal from the AND gate circuit AD2 is "1", a write current from the write bit line driver/sinker 31 to the write bit line driver/sinker 29A flows to the write bit line BL2.

When the output signal from the NAND gate circuit ND7 is "0", and the output signal from the AND gate circuit AD7 is "1", a write current from the write bit line driver/sinker 29A to the write bit line driver/sinker 31 flows to the write bit line BL3.

When the output signal from the NAND gate circuit ND11 is "0", and the output signal from the AND gate circuit AD3 is "1", a write current from the write bit line driver/sinker 31 to the write bit line driver/sinker 29A flows to the write bit line BL3.

When the output signal from the NAND gate circuit ND8 is "0", and the output signal from the AND gate circuit AD8 is "1", a write current from the write bit line driver/sinker 29A to the write bit line driver/sinker 31 flows to the write bit line BL4.

When the output signal from the NAND gate circuit ND12 is "0", and the output signal from the AND gate circuit AD4 is "1", a write current from the write bit line driver/sinker 31 to the write bit line driver/sinker 29A flows to the write bit line BL4.

In the write bit line drivers/sinkers 29A and 31, in the write operation, the write signal WRITE is "1". In the selected column, all bits of the upper column address signal, i.e., all bits of the column address signal excluding the lower two bits CA0 and CA1 are "1".

The lower two bits CA0 and CA1 of the column address signal are signal bits for selecting one of the four write bit lines BL1, BL2, BL3, and BL4 in the selected column. A write current having a direction corresponding to the value of write data DATA flows to the selected write bit line.

The direction of write current flowing to the selected write bit line in the selected column is determined in accordance with the value of the write data DATA.

For example, when the write bit line BL1 is selected (CA0="0", and CA1="0"), and the write data DATA is "1", the output signal from the NAND gate circuit ND5 is "0". The output signal from the AND gate circuit AD5 is "1". As a result, a write current from the write bit line driver/sinker 29A to the write bit line driver/sinker 31 flows to the write bit line BL1.

Conversely, when the write data DATA is "0", the output signal from the NAND gate circuit ND9 is "0". The output signal from the AND gate circuit AD1 is "1". As a result, a write current from the write bit line driver/sinker 31 to the write bit line driver/sinker 29A flows to the write bit line BL1.

When the write bit line BL2 is selected (CA0="1", and CA1="0"), and the write data DATA is "1", the output signal from the NAND gate circuit ND6 is "0". The output signal from the AND gate circuit AD6 is "1". As a result, a write current from the write bit line driver/sinker 29A to the write bit line driver/sinker 31 flows to the write bit line BL2.

Conversely, when the write data DATA is "0", the output signal from the NAND gate circuit ND10 is "0". The output signal from the AND gate circuit AD2 is "1". As a result, a write current from the write bit line driver/sinker 31 to the write bit line driver/sinker 29A flows to the write bit line BL2.

When the write bit line BL3 is selected (CA0="0", and CA1="1"), and the write data DATA is "1", the output signal from the NAND gate circuit ND7 is "0". The output signal from the AND gate circuit AD7 is "1". As a result, a write current from the write bit line driver/sinker 29A to the write bit line driver/sinker 31 flows to the write bit line BL3.

Conversely, when the write data DATA is "0", the output signal from the NAND gate circuit ND11 is "0". The output signal from the AND gate circuit AD3 is "1". As a result, a write current from the write bit line driver/sinker 31 to the write bit line driver/sinker 29A flows to the write bit line BL3.

When the write bit line BL4 is selected (CA0="1", and CA1="1"), and the write data DATA is "1", the output signal from the NAND gate circuit ND8 is "0". The output signal from the AND gate circuit AD8 is "1". As a result, a write current from the write bit line driver/sinker 29A to the write bit line driver/sinker 31 flows to the write bit line BL4.

Conversely, when the write data DATA is "0", the output signal from the NAND gate circuit ND12 is "0". The output signal from the AND gate circuit AD4 is "1". As a result, a write current from the write bit line driver/sinker 31 to the write bit line driver/sinker 29A flows to the write bit line BL4.

(11) Read Circuit

Figure 77:
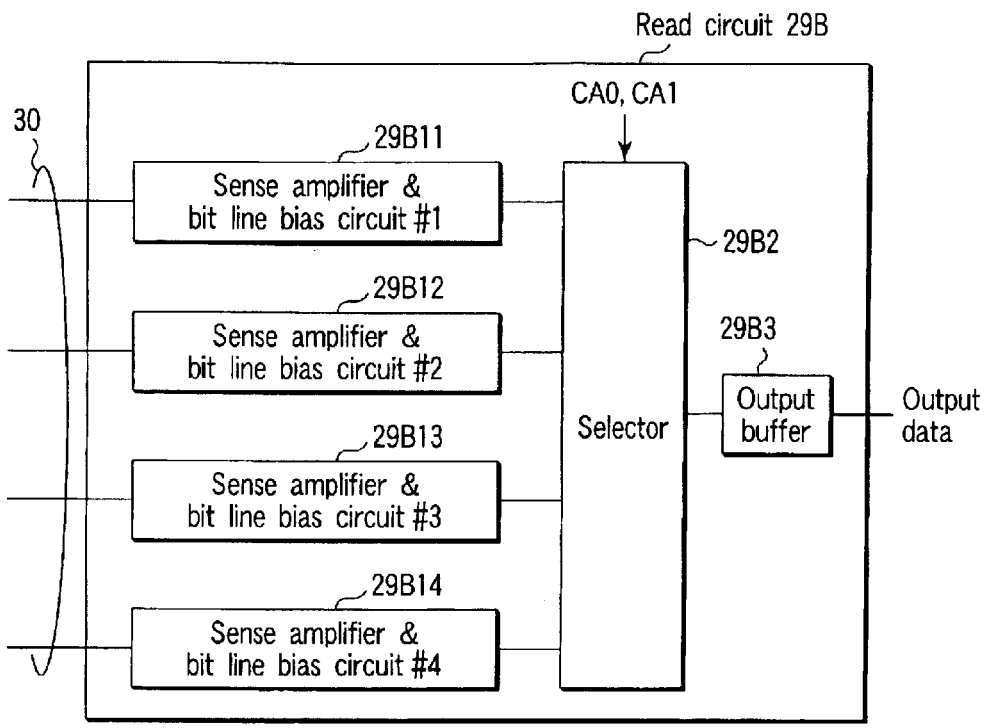
FIG. 77 is a view showing a circuit example of a read circuit.

FIG. 77 shows a circuit example of the read circuit.

In this example, assume that four MTJ elements are arranged in a read block of one column, and the MTJ elements are independently connected to read bit lines. That is, four read bit lines are arranged in one column. These read bit lines are connected to the read circuit 29B through the column select switch.

The read circuit 29B of this example is applied to a 1-bit-type magnetic random access memory which outputs read data bits one by one.

Hence, the read circuit 29B has four sense amplifiers & bias circuits 29B11, 29B12, 29B13, and 29B14, a selector 29B2, and an output buffer 29B3.

In the read operation, read data are simultaneously read from four MTJ elements in the selected read block. These four read data are input to and sensed by the sense amplifiers & bias circuits 29B11, 29B12, 29B13, and 29B14, respectively.

On the basis of the lower two bits CA0 and CA1 of the column address signal, the selector 29B2 selects one of the four read data output from the sense amplifiers & bias circuits 29B11, 29B12, 29B13, and 29B14. The selected read data is output from the magnetic random access memory as output data through the output buffer 29B3.

This example assume that the read circuit 29B is applied to a 1-bit-type magnetic random access memory.

However, when the read circuit 29B is applied to, e.g., a 4-bit-type magnetic random access memory which outputs 4-bit read data, the selector 29B2 can be omitted. To the contrary, four output buffers 29B3 are required in correspondence with the sense amplifiers & bias circuits 29B11, 29B12, 29B13, and 29B14.

Figure 78:
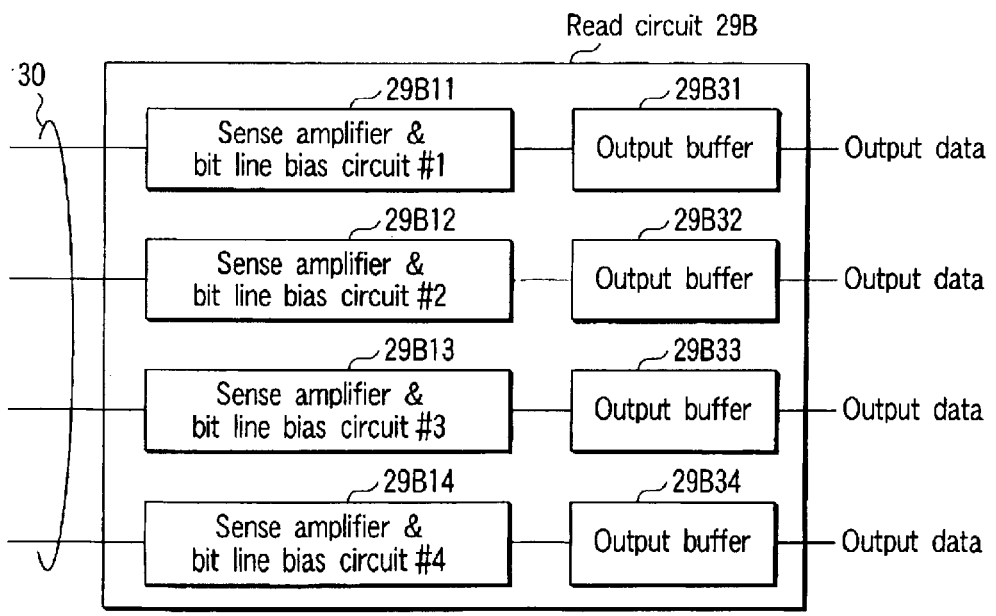
FIG. 78 is a view showing a circuit example of a read circuit.

FIG. 78 shows a circuit example of the read circuit applied to a 4-bit-type magnetic random access memory.

The read circuit 29B has four sense amplifiers & bias circuits 29B11, 29B12, 29B13, and 29B14 and four output buffers 29B31, 29B32, 29B33, and 29B34.

In the read operation, read data are simultaneously read from four MTJ elements in the selected read block. These four read data are input to and sensed by the sense amplifiers & bias circuits 29B11, 29B12, 29B13, and 29B14, respectively.

The output data from the sense amplifiers & bias circuits 29B11, 29B12, 29B13, and 29B14 are output from the magnetic random access memory through the output buffers 29B31, 29B32, 29B33, and 29B34.

Figure 79:
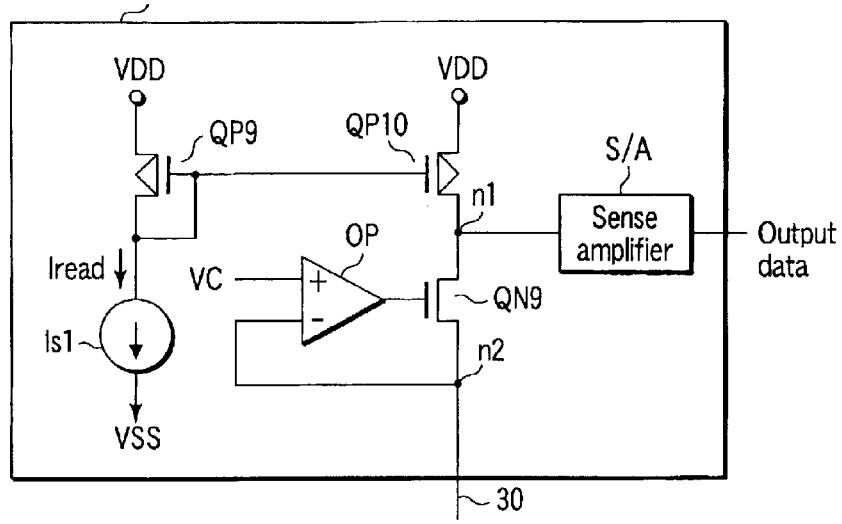
FIG. 79 is a view showing a circuit example of a sense amplifier & bit line bias circuit.

FIG. 79 shows a circuit example of the sense amplifier & bias circuit.

This sense amplifier & bias circuit corresponds to one of the four sense amplifiers & bias circuits shown in FIG. 77 or 78.

A sense amplifier S/A is formed from, e.g., a differential amplifier.

A PMOS transistor QP14 and NMOS transistor QN13 are connected in series between the power supply terminal VDD and the column select switch 29C. The negative input terminal of an operational amplifier OP is connected to a node n2. The output terminal of the operational amplifier OP is connected to the gate of the NMOS transistor QN13. A clamp potential VC is input to the positive input terminal of the operational amplifier OP.

The operational amplifier OP equalizes the potential of the node n2 with the clamp potential VC. The clamp potential VC is set to a predetermined positive value.

A constant current source Is1 generates a read current Iread. The read current Iread flows to a bit line BLi through a current mirror circuit formed from a PMOS transistor QP13 and the PMOS transistor QP14. The sense amplifier formed from, e.g., a differential amplifier senses the data of a memory cell (MTJ element) on the basis of the potential of a node n1 when the read current Iread is flowing.

Figure 80:
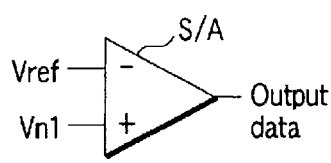
FIG. 80 is a view showing a circuit example of a sense amplifier.

FIG. 80 shows a circuit example of the sense amplifier.

Figure 81:
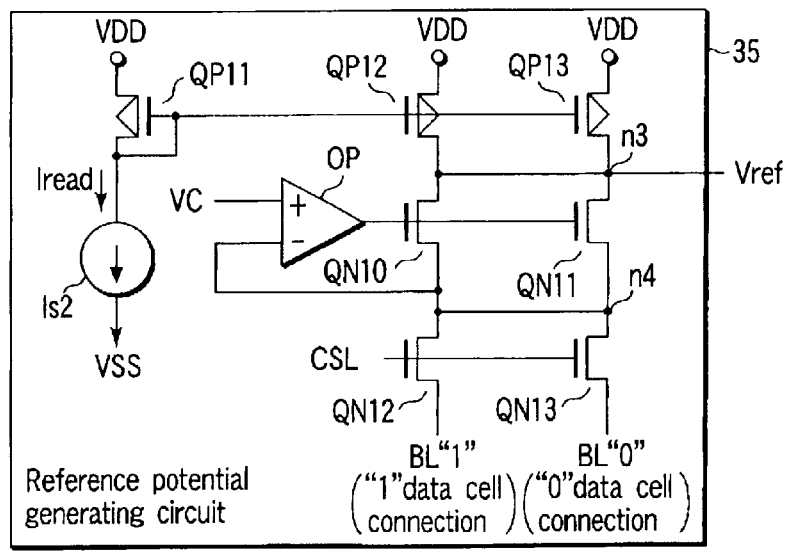
FIG. 81 is a view showing a circuit example of a reference potential generation circuit.

FIG. 81 shows a circuit example of the reference potential generating circuit of the sense amplifier.

The sense amplifier S/A is formed from, e.g., a differential amplifier. The sense amplifier S/A compares a potential Vn1 of the node n1 with a reference potential Vref.

The reference potential Vref is generated by an MTJ element which stores "1" data and an MTJ element which stores "0" data.

A PMOS transistor QP16 and NMOS transistors QN14 and QN15 are connected in series between the power supply terminal VDD and the MTJ element which stores "1" data. A PMOS transistor QP17 and NMOS transistors QN16 and QN17 are connected in series between the power supply terminal VDD and the MTJ element which stores "0" data.

The drains of the PMOS transistors QP16 and QP17 are connected to each other. The drains of the NMOS transistors QN15 and QN17 are also connected to each other.

The operational amplifier OP equalizes the potential of a node n4 with the clamp potential VC. A constant current source Is2 generates the read current Iread. The read current Iread flows to the MTJ element which stores "1" data and MTJ element which stores "0" data through a current mirror circuit formed from the PMOS transistors QP15 and QP16.

The reference potential Vref is output from a node n3.

Figure 82:
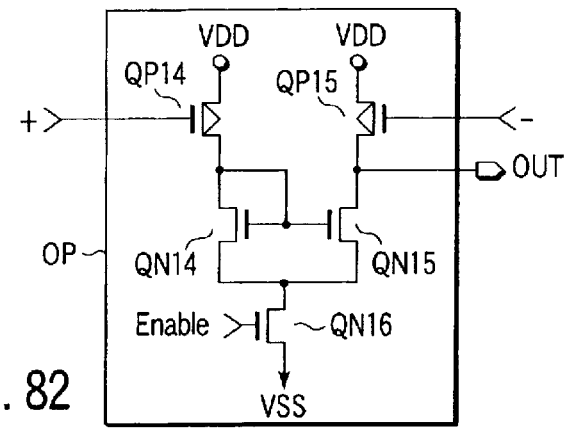
FIG. 82 is a view showing a circuit example of an operational amplifier.

FIG. 82 shows a circuit example of the operational amplifier OP shown in FIGS. 79 and 81.

The operational amplifier OP is formed from PMOS transistors QP18 and QP19 and NMOS transistors QN18, QN19, and QN20. When an enable signal Enable changes to "H", the operational amplifier OP is set in an operative state.

Figure 83:
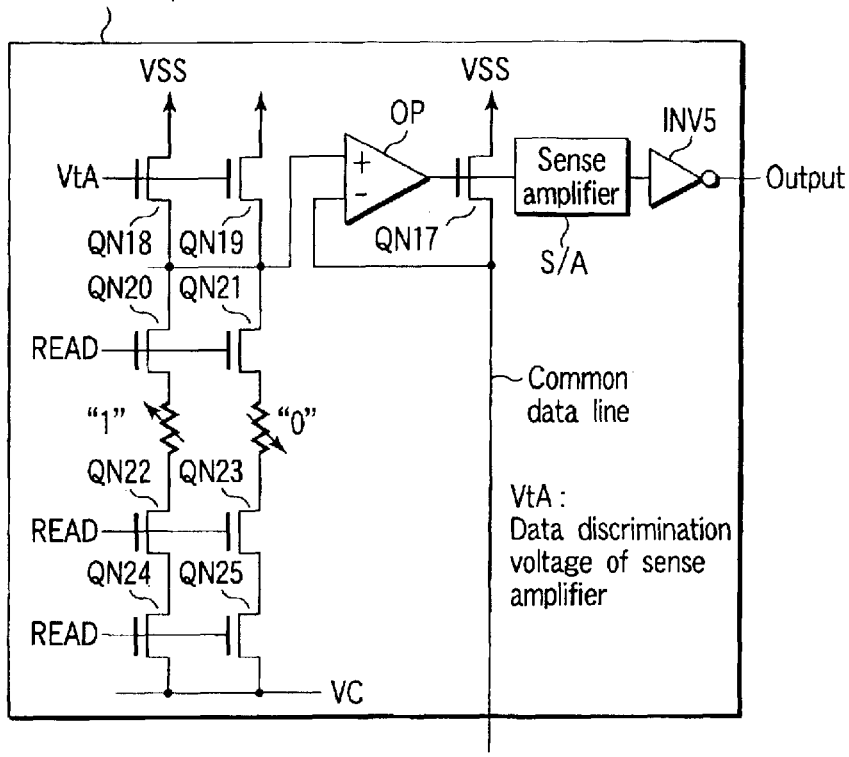
FIG. 83 is a view showing a circuit example of a sense amplifier & bit line bias circuit.

FIG. 83 shows a circuit example of the sense amplifier & bias circuit.

This sense amplifier & bias circuit corresponds to one of the four sense amplifiers & bias circuits shown in FIGS. 77 and 78.

The sense amplifier & bias circuit of this example is applied to Structural Example 8 (FIG. 58).

When the sense amplifier & bias circuit is applied to Structural Example 8 (FIG. 58), NMOS transistors QN24 and QN25 in FIG. 83 have the same size as that of the column select switch CSW shown in FIG. 58. NMOS transistors QN20 and QN21 in FIG. 83 have the same size as that of the row select switch RSW2 shown in FIG. 58.

NMOS transistors QN17, QN18, and QN19 in FIG. 83 have the same size such that they have the same driving capability.

With this structure, the positive input potential of the operational amplifier is an almost intermediate potential between the negative input potential of the operational amplifier when "1" data is read out and that of the operational amplifier when "0" data is read out in FIG. 58. Hence, the positive input potential of the operational amplifier functions as a reference potential in the data read mode.

A signal VtA input to the gates of the NMOS transistors QN18 and QN19 equals the data discrimination voltage of the sense amplifier S/A. The read signal READ which changes to "H" in the read operation is input to the gates of the NMOS transistors QN20, QN21, QN24, and QN25.

Referring to FIG. 83, "1" indicates that the MTJ element stores "1" data, and "0" indicates that the MTJ element stores "0" data. VC equals the bias potential VC applied to the bias line 34 of Structural Example 8 (FIG. 58).

4. Write/Read Operation Principle

The write/read operation principle of the magnetic random access memory of the present invention will be described.

(1) Write Operation Principle

A write in MTJ elements is executed at random. For example, the row decoders 25-1, ..., 25-n select one row on the basis of a row address signal. In the selected row, an output signal RLk from a row decoder 25-k changes to "H", so the row select switch RSW2 is turned on.

The column decoder & read column select line driver 32 is activated only in the read operation. Hence, all the read word lines RWL1, ..., RWLj are in a floating state.

The write word line driver 23A selects one of the four MTJ elements in the selected read block BKik and, more specifically, one of the four write word lines WWL4(n−1)+1, WWL4(n−1)+2, WWL4(n−1)+3, and WWL(n−1)+4 on the basis of, e.g., the lower two bits CA0 and CA1 of the column address signal.

The write word line driver 23A supplies a write current to the selected write word line through the common data line (common driver line) 30 and row select switch RSW2.

The column decoders & write bit line drivers/sinkers 29A and 31 select a column on the basis of, e.g., upper column address signal bits (column address signal excluding the lower two bits CA0 and CA1) and supplies the write current to the write bit line WBLi in the selected column.

The column decoders & write bit line drivers/sinkers 29A and 31 determine the direction of write current to be supplied to the write bit line WBLi in the selected column in accordance with the value of write data.

The magnetizing direction of the free layer (storing layer) of the selected MTJ element is determined by the synthesized magnetic field generated by the write current flowing to the write word line and the write current flowing to the write bit line, and "1"/"0" information is stored in the MTJ element.

In this write operation principle, one terminal of the MTJ element is connected to the read word line RWLi in the floating state in the write operation. Hence, charges are injected into the read word line RWLi from the write word lines WWL4(n−1)+1, WWL4(n−1)+2, WWL4(n−1)+3, and WWL(n−1)+4, though no potential difference is generated across the MTJ element.

Hence, even when the write word line and write bit line have different potentials at a predetermined portion in the write operation due to the interconnection resistance of the write word line and write bit line, no potential difference is generated across the MTJ element, and the tunneling barrier layer is not broken.

(2) Read Operation Principle

A read from MTJ elements is executed for each read block. For example, the row decoders 25-1, ..., 25-n select one row on the basis of a row address signal. In the selected row, the output signal RLk from the row decoder 25-k changes to "H", so the row select switch RSW2 is turned on.

The column decoder & read column select line driver 32 selects a column on the basis of upper column address signal bits. In the selected column, the output signal from the column decoder & read column select line driver 32, i.e., the column select signal CSLi changes to "H", so the column select switch CSW is turned on.

That is, the potential of the read word line RWLi in the selected column is the ground potential VSS. The read word lines RWLi in the remaining unselected columns are set in the floating state.

In the read operation, the write word line driver 23A and column decoders & write bit line drivers/sinkers 29A and 31 are in an inoperative state.

The read circuit 29B generate, e.g., a read current. The read current flows to only the plurality of MTJ elements 12 in the read block which is present in the selected row and column.

More specifically, the read current is absorbed by the ground point VSS through the row select switches RSW2 in the selected row, the MTJ elements 12 in the read block, and the column select switch CSW in the selected column.

In the read operation, one terminal of each of the MTJ elements in read blocks that are present in the selected row and unselected columns is short-circuited. The read bit lines RBL4(n−1)+1, RBL4(n−1)+2, RBL4(n−1)+3, and RBL4(n−1)+4 in the selected row are short-circuited through the MTJ elements.

This problem can be solved by, in the read operation, fixing the potentials of the read bit lines RBL4(n−1)+1, RBL4(n−1)+2, RBL4(n−1)+3, and RBL4(n−1)+4 by a clamp circuit and detecting data on the basis of a change in amount of the read current.

The direction of read current is not particularly limited. The read current may flow in a direction in which the read current is absorbed by the read circuit 29B.

The change in amount of the read current flowing to the read bit lines RBL4(n−1)+1, RBL4(n−1)+2, RBL4(n−1)+3, and RBL4(n−1)+4 is detected by the sense amplifier in the read circuit 29B.

The data in each MTJ element is sensed by the sense amplifier in the read circuit 29B and then output from the magnetic random access memory. The data bits of the plurality of MTJ elements 12 in the read block may be output one by one or simultaneously.

To sequentially output the data bits of the plurality of MTJ elements one by one, one of the data of the plurality of MTJ elements 12 is selected using the lower column address signal bits CA0 and CA1.

(3) STRUCTURAL EXAMPLE 9 (FIG. 59)

① Write Operation Principle

The row decoders 25-1, ..., 25-n select one row on the basis of a row address signal. In the selected row, the output signals WLEN1 to WLEN4 from the row decoder 25-k change to "H". Hence, the write word line driver 33-k is activated, and a write current is supplied to the write word lines WWL4(n−1)+1, WWL4(n−1)+2, WWL4(n−1)+3, and WWL(n−1)+4.

To write data in the MTJ elements at random, the lower two bits CA0 and CA1 of the column address signal, which select one of the four write word lines WWL4(n−1)+1, WWL4(n−1)+2, WWL4(n−1)+3, and WWL(n−1)+4, are input to the row decoders 25-1, ..., 25-n, as shown in, e.g., FIG. 71.

That is, in Structural Example 9, four row decoders are arranged in one row, and different lower two bits CA0 and CA1 of column address signals are input to the row decoders, as shown in FIG. 71. In addition, the four word line enable lines WLEN1 to WLEN4 are arranged in one row such that the four write word lines WWL4(n−1)+1, WWL4(n−1)+2, WWL4(n−1)+3, and WWL(n−1)+4 can be independently driven.

The row decoders & read line drivers 23B-1, . . . , 23B-n and column decoder & read column select line driver 32 are activated only in the read operation.

For this reason, all the read word lines RWL1, . . . , RWLj are in the floating state, and the write word lines WWL4 (n−1)+1, WWL4(n−1)+2, WWL4(n−1)+3, and WWL(n−1)+4 are electrically disconnected from the common data line 30.

The column decoders & write bit line drivers/sinkers 29A and 31 select a column on the basis of, e.g., upper column address signal bits (column address signal excluding the lower two bits CA0 and CA1) and supplies a write current to the write bit line WBLi in the selected column.

The column decoders & write bit line drivers/sinkers 29A and 31 determine the direction of write current to be supplied to the write bit line WBLi in the selected column in accordance with the value of write data.

The magnetizing direction of the free layer (storing layer) of the selected MTJ element is determined by the synthesized magnetic field generated by the write current flowing to the write word line and the write current flowing to the write bit line, and "1"/"0" information is stored in the MTJ element.

② Read Operation Principle

A read from MTJ elements is executed for each read block. In Structural Example 9, the row decoders 25-1, . . . , 25-n are in the inoperative state in the read operation. That is, all the output signals WLEN1 to WLEN4 from the row decoders 25-1, . . . , 25-n are "L".

The row decoders & read line drivers 23B-1, . . . , 23B-n select one row on the basis of the row address signal. In the selected row, the output signal from the row decoder & read line driver 23B-k, i.e., the potential of the read line RWk changes to "H", so the row select switch RSW2 is turned on.

The column decoder & read column select line driver 32 selects one column on the basis of upper column address signal bits. In the selected column, the output signal from the column decoder & read column select line driver 32, i.e., the column select signal CSLi changes to "H", so the column select switch CSW is turned on.

In the read operation, the write word line driver 33-k and column decoders & write bit line drivers/sinkers 29A and 31 are in the inoperative state.

The read circuit 29B generates, e.g., the read current. The read current flows to only the plurality of MTJ elements 12 in the read block which is present in the selected row and column.

More specifically, the read current is absorbed by the ground point VSS through the row select switches RSW2 in the selected row, the MTJ elements 12 in the read block, and the column select switch CSW in the selected column.

The direction of read current is not particularly limited. The read current may flow in a direction in which the read current is absorbed by the read circuit 29B.

5. Positional Relationship Between Pinning Layer and Storing Layer of Each MTJ Element As in Structural Example 5 (e.g., the sectional view shown in FIG. 36), when MTJ elements are arranged on the upper and lower sides of a write line (write word line or write bit line), and data is to be written in the MTJ element on the upper or lower side of the write line using a magnetic field generated by a write current that flows to the write line, the positional relationship between the pinning layer (fixed layer) and the storing layer (free layer) or the magnetizing direction of the pinning layer in each MTJ element must be examined.

This is because the write operation principle or the write circuit arrangement changes depending on the direction of the current flowing to the write line.

Figure 84:
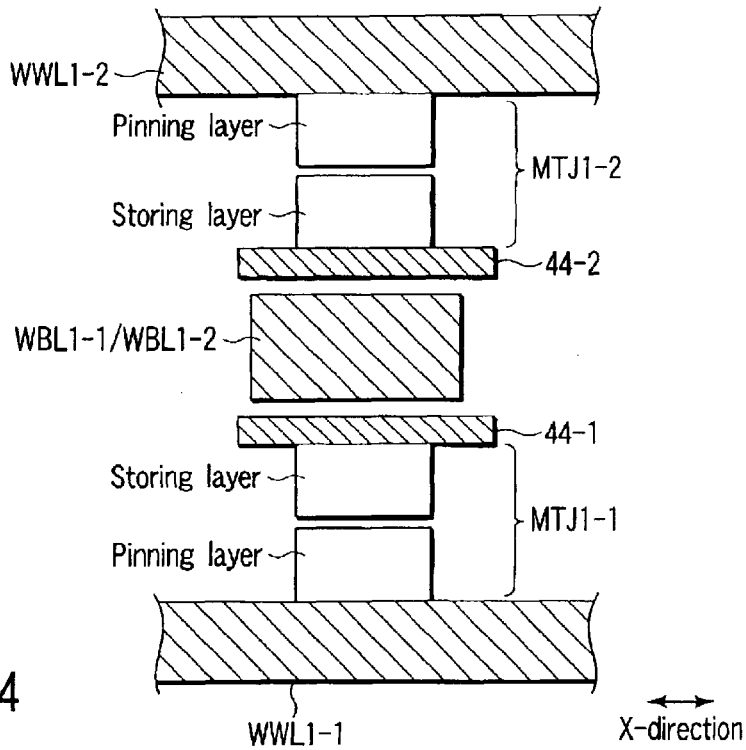
FIG. 84 is a view showing MTJ elements arranged symmetrically with respect to a write line.

(1) Positional Relationship Between Pinning Layer and Storing Layer of Each MTJ Element As shown in FIG. 84, the positional relationship (relative relationship) between the pinning layer and the storing layer of each MTJ element (MTJ element) is preferably symmetrical with respect to a write line to be used.

For example, when MTJ elements are arranged on the upper and lower sides of a write line (write word line or write bit line), and data is to be written in the MTJ element on the upper or lower side of the write line using a magnetic field generated by a write current that flows to the write line, the positional relationship between the pinning layer and the storing layer of each MTJ element is set to be symmetrical with respect to the write line.

More specifically, assume that the MTJ element on the lower side of the write line has a storing layer on a side close to the write interconnection and a pinning layer on a side far from the write interconnection. In this case, the MTJ element on the upper side of the write line also has a storing layer on a side close to the write interconnection and a pinning layer on a side far from the write interconnection.

Similarly, assume that the MTJ element on the lower side of the write line has a pinning layer on a side close to the write interconnection and a storing layer on a side far from the write interconnection. In this case, the MTJ element on the upper side of the write line also has a pinning layer on a side close to the write interconnection and a storing layer on a side far from the write interconnection.

Note that this positional relationship is ensured for all MTJ elements in the memory cell array. In addition, for all write lines in the memory cell array, the MTJ element arranged on the upper side and that arranged on the lower side are symmetrically arranged.

With this positional relationship, the distance from a write line to a storing layer is substantially the same for all MTJ elements. That is, since the influence of a magnetic field generated by a write current flowing to a write line due to the write current flowing to the write line is the same for all MTJ elements. Hence, all MTJ elements can have the same write characteristic.

In this case, the direction of the MTJ element arranged on the lower (or upper) side of the write line is opposite to the direction of the MTJ element arranged on the upper (or lower) side of the write line.

However, that the directions of all the MTJ elements in the memory cell array are not the same, and, for example, the directions of the MTJ elements change for each stage is no disadvantage for the present invention (directions here include only two directions: upward and downward, and the semiconductor substrate side is defined as the lower side).

This is because in forming MTJ elements, the directions of the MTJ elements can easily be changed only by changing the order of forming the layers of MTJ elements.

(2) Magnetizing Direction of Pinning Layer of MTJ Element

When MTJ elements are arranged on the upper and lower sides of a write line (write word line or write bit line), and data is to be written in the MTJ element on the upper or lower side of the write line using a magnetic field generated by a write current that flows to the write line, the write operation principle and read operation principle must be changed depending on the magnetizing direction of the pinning layer of the MTJ element.

This is because the direction of a magnetic field applied to an MTJ element arranged on the upper side of a write line is opposite to that of a magnetic field applied to an MTJ element arranged on the lower side of the write line even though the direction of a current that flows to the write line is constant.

① When Magnetizing Directions of Pinning Layers are Individually Set

When the magnetizing directions of pinning layers can be individually set, the magnetizing direction of the pinning layer of each MTJ element that is present on the lower side of a write line (write word line or write bit line) is made opposite to that of the pinning layer of each MTJ element that is present on the upper side of the write line. With this arrangement, the normal read operation principle and write operation principle can be applied.

That is, a state wherein the magnetizing direction of the pinning layer is the same as that of the storing layer can be defined as "1". A state wherein the magnetizing direction of the pinning layer is different from that of the storing layer can be defined as "0".

A detailed example will be described below.

Figure 85:
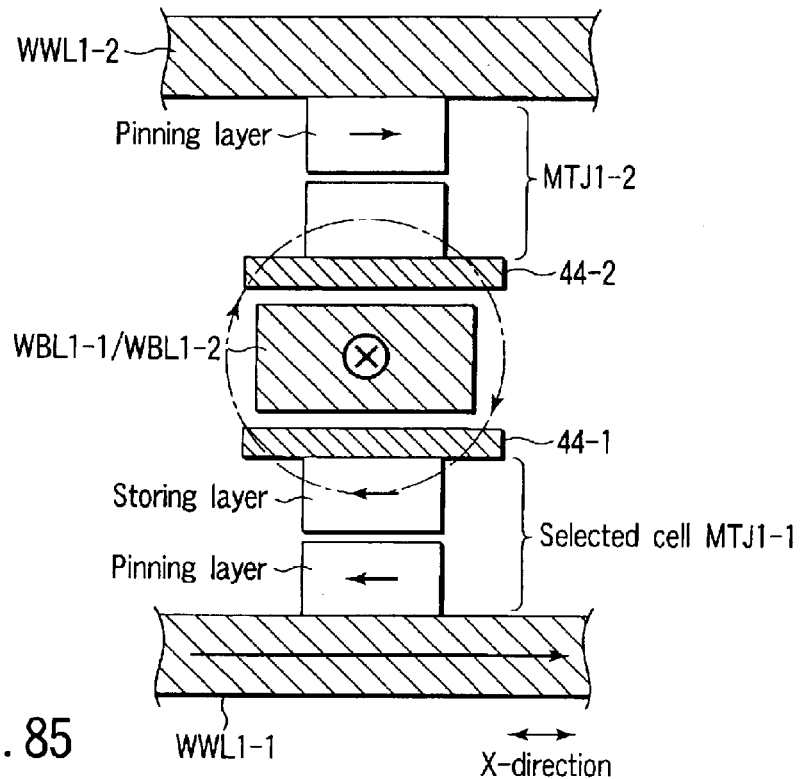
FIG. 85 is a view showing MTJ elements arranged symmetrically with respect to a write line.
Figure 86:
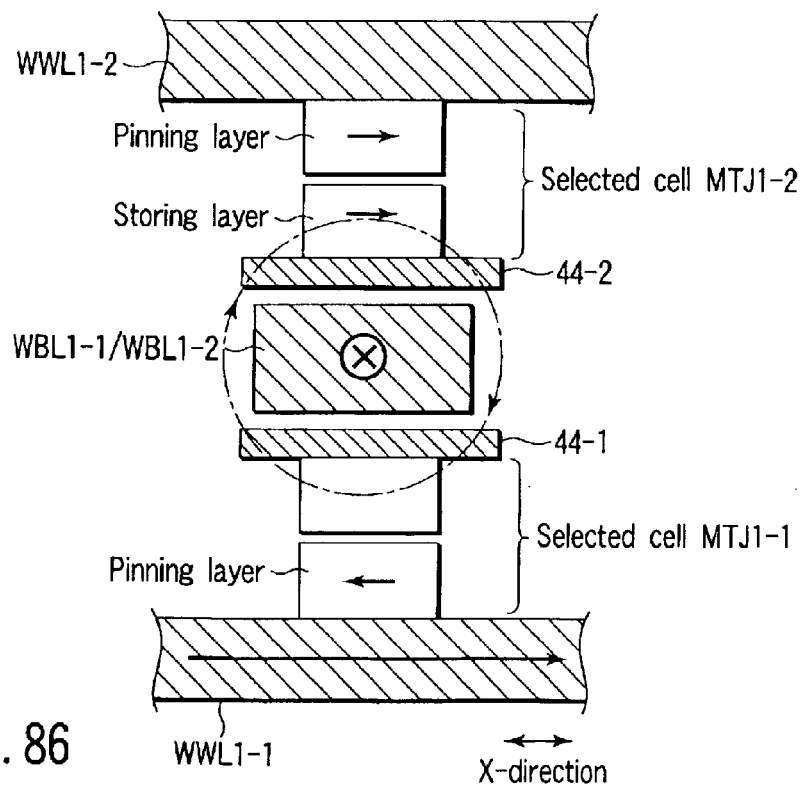
FIG. 86 is a view showing MTJ elements arranged symmetrically with respect to a write line.

As a presupposition, the axes of easy magnetization of the MTJ elements MTJ1-1 and MTJ1-2 are directed in the X-direction (a direction in which the write word lines run), as shown in FIGS. 85 and 86. In addition, the magnetizing direction of the pinning layer of the MTJ element MTJ1-1 arranged on the lower side of the write bit line WBL1-1/WBL1-2 is leftward. The magnetizing direction of the pinning layer of the MTJ element MTJ1-2 arranged on the upper side of the write bit line WBL1-1/WBL1-2 is rightward.

Furthermore, write data is determined by the direction of a write current flowing to the write bit line WBL1-1/WBL1-2. Only a write current directed in one direction flows to the write word lines WWL1-1 and WWL1-2.

When Data Is to Be Written in MTJ Element on Lower Side of Write Bit Line

["1"-Write]

As shown in FIG. 85, a write current directed in one direction is supplied to the write word line WWL1-1. A write current is supplied to the write bit line WBL1-1/WBL1-2 in a direction in which the current is absorbed in the direction perpendicular to the drawing surface. A magnetic field generated by the write current flowing to the write bit line WBL1-1/WBL1-2 forms a circle clockwise about the write bit line WBL1-1/WBL1-2.

In this case, a leftward magnetic field is applied to the MTJ element MTJ1-1 on the lower side of the write bit line WBL1-1/WBL1-2. For this reason, the magnetizing direction of the MTJ element MTJ1-1 on the lower side of the write bit line WBL1-1/WBL1-2 is leftward.

Hence, the magnetizing state of the MTJ element MTJ1-1 on the lower side of the write bit line WBL1-1/WBL1-2 is parallel, and data "1" is written.

["0"-Write]

A write current directed in one direction is supplied to the write word line WWL1-1. A write current is supplied to the write bit line WBL1-1/WBL1-2 in a direction in which the current comes out from the direction perpendicular to the drawing surface. A magnetic field generated by the write current flowing to the write bit line WBL1-1/WBL1-2 forms a circle counterclockwise about the write bit line WBL1-1/WBL1-2.

In this case, a rightward magnetic field is applied to the MTJ element MTJ1-1 on the lower side of the write bit line WBL1-1/WBL1-2. For this reason, the magnetizing direction of the MTJ element MTJ1-1 on the lower side of the write bit line WBL1-1/WBL1-2 is rightward.

Hence, the magnetizing state of the MTJ element MTJ1-1 on the lower side of the write bit line WBL1-1/WBL1-2 is antiparallel, and data "0" is written.

When Data Is to Be Written in MTJ Element on Upper Side of Write Bit Line

If the same data can be written in the MTJ element MTJ1-2 on the upper side of the write bit line WBL1-1/WBL1-2 under the same write condition as for the MTJ element MTJ1-1, the write and read operations can be executed for the two MTJ elements MTJ1-1 and MTJ1-2 using the same write circuit (write bit line driver/sinker) and same read circuit.

["1"-Write]

As shown in FIG. 86, a write current directed in one direction is supplied to the write word line WWL1-2. A write current is supplied to the write bit line WBL1-1/WBL1-2 in a direction in which the current is absorbed in the direction perpendicular to the drawing surface.

This write condition is the same as the "1"-write condition for the MTJ element MTJ1-1 on the lower side of the write bit line WBL1-1/WBL1-2. At this time, a magnetic field generated by the write current flowing to the write bit line WBL1-1/WBL1-2 forms a circle clockwise about the write bit line WBL1-1/WBL1-2.

In this case, a rightward magnetic field is applied to the MTJ element MTJ1-2 on the upper side of the write bit line WBL1-1/WBL1-2. For this reason, the magnetizing direction of the MTJ element MTJ1-2 on the upper side of the write bit line WBL1-1/WBL1-2 is rightward.

Hence, the magnetizing state of the MTJ element MTJ1-2 on the upper side of the write bit line WBL1-1/WBL1-2 is parallel, and data "1" is written.

As described above, when the magnetizing directions of the pinning layers of the MTJ elements MTJ1-1 and MTJ1-2 are opposite to each other, the same data can be written in the MTJ elements MTJ1-1 and MTJ1-2 under the same write condition.

["0"-Write]

A write current directed in one direction is supplied to the write word line WWL1-2. A write current is supplied to the write bit line WBL1-1/WBL1-2 in a direction in which the current comes out from the direction perpendicular to the drawing surface.

This write condition is the same as the "0"-write condition for the MTJ element MTJ1-1 on the lower side of the write bit line WBL1-1/WBL1-2. At this time, a magnetic field generated by the write current flowing to the write bit line WBL1-1/WBL1-2 forms a circle counterclockwise about the write bit line WBL1-1/WBL1-2.

In this case, a leftward magnetic field is applied to the MTJ element MTJ1-2 on the upper side of the write bit line WBL1-1/WBL1-2. For this reason, the magnetizing direction of the MTJ element MTJ1-2 on the upper side of the write bit line WBL1-1/WBL1-2 is leftward.

Hence, the magnetizing state of the MTJ element MTJ1-2 on the upper side of the write bit line WBL1-1/WBL1-2 is antiparallel, and data "0" is written.

As described above, when the magnetizing directions of the pinning layers of the MTJ elements MTJ1-1 and MTJ1-2 are opposite to each other, the same data can be written in the MTJ elements MTJ1-1 and MTJ1-2 under the same write condition.

② When Pinning Layers of All MTJ Elements Have Same Magnetizing Direction

When the pinning layers of all the MTJ elements have the same magnetizing direction, for example, after the wafer process is ended, the magnetizing direction of the pinning layers of all the MTJ elements can be instantaneously determined by simultaneously applying magnetic fields in the same direction to the pinning layers of all the MTJ elements.

Especially, when the temperature of the wafer is increased in applying the magnetic field, the magnetizing directions of the pinning layers of all the MTJ elements can easily be determined.

In this case, however, identical data cannot be written in the MTJ elements arranged on the lower side of a write line and MTJ elements arranged on the upper side of the write line under the same condition.

The following two countermeasures can be used: A. the arrangement of the read circuit is changed without changing the arrangement of the write circuit (write bit line driver/sinker), i.e., the write condition, and B. the arrangement of the write circuit (write bit line driver/sinker), i.e., the write condition is changed without changing the arrangement of the read circuit.

A detailed example will be described below.

As a presupposition, the axes of easy magnetization of the MTJ elements MTJ1-1 and MTJ1-2 are directed in the X-direction (a direction in which the write word lines run), as shown in FIGS. 87 and 88. In addition, both the magnetizing direction of the pinning layer of the MTJ element MTJ1-1 arranged on the lower side of the write bit line WBL1-1/WBL1-2 and the magnetizing direction of the pinning layer of the MTJ element MTJ1-2 arranged on the upper side of the write bit line WBL1-1/WBL1-2 are leftward.

Furthermore, write data is determined by the direction of a write current flowing to the write bit line WBL1-1/WBL1-2. Only a write current directed in one direction flows to the write word lines WWL1-1 and WWL1-2.

A. When Write Condition Is Not Changed
When Data Is to Be Written in MTJ Element on Lower Side of Write Bit Line
["1"-Write]

As shown in FIG. 87, a write current directed in one direction is supplied to the write word line WWL1-1. A write current is supplied to the write bit line WBL1-1/WBL1-2 in a direction in which the current is absorbed in the direction perpendicular to the drawing surface. A magnetic field generated by the write current flowing to the write bit line WBL1-1/WBL1-2 forms a circle clockwise about the write bit line WBL1-1/WBL1-2.

In this case, a leftward magnetic field is applied to the MTJ element MTJ1-1 on the lower side of the write bit line WBL1-1/WBL1-2. For this reason, the magnetizing direction of the MTJ element MTJ1-1 on the lower side of the write bit line WBL1-1/WBL1-2 is leftward.

Hence, the magnetizing state of the MTJ element MTJ1-1 on the lower side of the write bit line WBL1-1/WBL1-2 is parallel, and data "1" is written.

["0"-Write]

A write current directed in one direction is supplied to the write word line WWL1-1. A write current is supplied to the write bit line WBL1-1/WBL1-2 in a direction in which the current comes out from the direction perpendicular to the drawing surface. A magnetic field generated by the write current flowing to the write bit line WBL1-1/WBL1-2 forms a circle counterclockwise about the write bit line WBL1-1/WBL1-2.

In this case, a rightward magnetic field is applied to the MTJ element MTJ1-1 on the lower side of the write bit line WBL1-1/WBL1-2. For this reason, the magnetizing direction of the MTJ element MTJ1-1 on the lower side of the write bit line WBL1-1/WBL1-2 is rightward.

Hence, the magnetizing state of the MTJ element MTJ1-1 on the lower side of the write bit line WBL1-1/WBL1-2 is antiparallel, and data "0" is written.
When Data Is to Be Written in MTJ Element on Upper Side of Write Bit Line For the MTJ element MTJ1-2 on the upper side of the write bit line WBL1-1/WBL1-2, the write operation is executed using the same write condition, i.e., the same write circuit (write bit line driver/sinker) as that for the MTJ element MTJ1-1.
["1"-Write]

As shown in FIG. 88, a write current directed in one direction is supplied to the write word line WWL1-2. A write current is supplied to the write bit line WBL1-1/WBL1-2 in a direction in which the current is absorbed in the direction perpendicular to the drawing surface.

This write condition is the same as the "1"-write condition for the MTJ element MTJ1-1 on the lower side of the write bit line WBL1-1/WBL1-2. At this time, a magnetic field generated by the write current flowing to the write bit line WBL1-1/WBL1-2 forms a circle clockwise about the write bit line WBL1-1/WBL1-2.

In this case, a rightward magnetic field is applied to the MTJ element MTJ1-2 on the upper side of the write bit line WBL1-1/WBL1-2. For this reason, the magnetizing direction of the MTJ element MTJ1-2 on the upper side of the write bit line WBL1-1/WBL1-2 is rightward.

Hence, the magnetizing state of the MTJ element MTJ1-2 on the upper side of the write bit line WBL1-1/WBL1-2 is antiparallel, i.e., data "0" is stored.

The write data for the MTJ element MTJ1-2 is "1". Hence, in the read mode, the "0"-data stored in the MTJ element MTJ1-2 must be read out not as "0" but as "1".

To do this, the arrangement of the read circuit is slightly changed.

Basically, since write data in an inverted state is stored in the MTJ element that is present on the upper side of the write bit line, one inverter is added to the output section (final stage) of the read circuit for reading the data of the MTJ element that is present on the upper side of the write bit line.

For example, in Structural Example 5 (FIG. 36), the write bit line WBL1-1/WBL1-2 is arranged between the MTJ element MTJ1-1 of the first stage and the MTJ element MTJ1-2 of the second stage. For example, when the so-called batch read operation principle is applied, one inverter is added to each of the output sections of the logic circuits for discriminating data.

When the pinning layers of the MTJ elements MTJ1-1 and MTJ1-2 have the same magnetizing direction, data opposite to write data is stored in one of the MTJ element arranged on the upper side of the write line and that arranged on the lower side of the write line.

Hence, when one inverter is added to the output section (final stage) of the read circuit for reading the data of the MTJ element that stores opposite data, the write operation can be executed without changing the arrangement of the write circuit (write bit line driver/sinker)

["0"-Write]

A write current directed in one direction is supplied to the write word line WWL1-2. A write current is supplied to the write bit line WBL1-1/WBL1-2 in a direction in which the current comes out from the direction perpendicular to the drawing surface.

This write condition is the same as the "0"-write condition for the MTJ element MTJ1-1 on the lower side of the write bit line WBL1-1/WBL1-2. At this time, a magnetic field generated by the write current flowing to the write bit line WBL1-1/WBL1-2 forms a circle counterclockwise about the write bit line WBL1-1/WBL1-2.

In this case, a leftward magnetic field is applied to the MTJ element MTJ1-2 on the upper side of the write bit line WBL1-1/WBL1-2. For this reason, the magnetizing direction of the MTJ element MTJ1-2 on the upper side of the write bit line WBL1-1/WBL1-2 is leftward.

Hence, the magnetizing state of the MTJ element MTJ1-2 on the upper side of the write bit line WBL1-1/WBL1-2 is parallel, i.e., data "1" is stored.

The write data for the MTJ element MTJ1-2 is "0". Hence, in the read mode, the "1"-data stored in the MTJ element MTJ1-2 must be read out not as "1" but as "0".

When one inverter is added to the output section (final stage) of the read circuit for reading the data of the MTJ element that is present on the upper side of the write bit line, as described above, the data can be read without any problem.

B. When Write Condition Is Changed

When the write condition is changed, both the states of the MTJ elements MTJ1-1 and MTJ1-2 can be set to parallel when the write data is "1". When the write data is "0", both the states of the MTJ elements MTJ1-1 and MTJ1-2 can be set to antiparallel.

That is, the read circuit need not be changed.

When Data Is to Be Written in MTJ Element on Lower Side of Write Bit Line

["1"-Write]

As shown in FIG. 87, a write current directed in one direction is supplied to the write word line WWL1-1. A write current is supplied to the write bit line WBL1-1/WBL1-2 in a direction in which the current is absorbed in the direction perpendicular to the drawing surface. A magnetic field generated by the write current flowing to the write bit line WBL1-1/WBL1-2 forms a circle clockwise about the write bit line WBL1-1/WBL1-2.

In this case, a leftward magnetic field is applied to the MTJ element MTJ1-1 on the lower side of the write bit line WBL1-1/WBL1-2. For this reason, the magnetizing direction of the MTJ element MTJ1-1 on the lower side of the write bit line WBL1-1/WBL1-2 is leftward.

Hence, the magnetizing state of the MTJ element MTJ1-1 on the lower side of the write bit line WBL1-1/WBL1-2 is parallel, and data "1" is written.

["0"-Write]

A write current directed in one direction is supplied to the write word line WWL1-1. A write current is supplied to the write bit line WBL1-1/WBL1-2 in a direction in which the current comes out from the direction perpendicular to the drawing surface. A magnetic field generated by the write current flowing to the write bit line WBL1-1/WBL1-2 forms a circle counterclockwise about the write bit line WBL1-1/WBL1-2.

In this case, a rightward magnetic field is applied to the MTJ element MTJ1-1 on the lower side of the write bit line WBL1-1/WBL1-2. For this reason, the magnetizing direction of the MTJ element MTJ1-1 on the lower side of the write bit line WBL1-1/WBL1-2 is rightward.

Hence, the magnetizing state of the MTJ element MTJ1-1 on the lower side of the write bit line WBL1-1/WBL1-2 is antiparallel, and data "0" is written.

When Data Is to Be Written in MTJ Element on Upper Side of Write Bit Line

["1"-Write]

Figure 89:
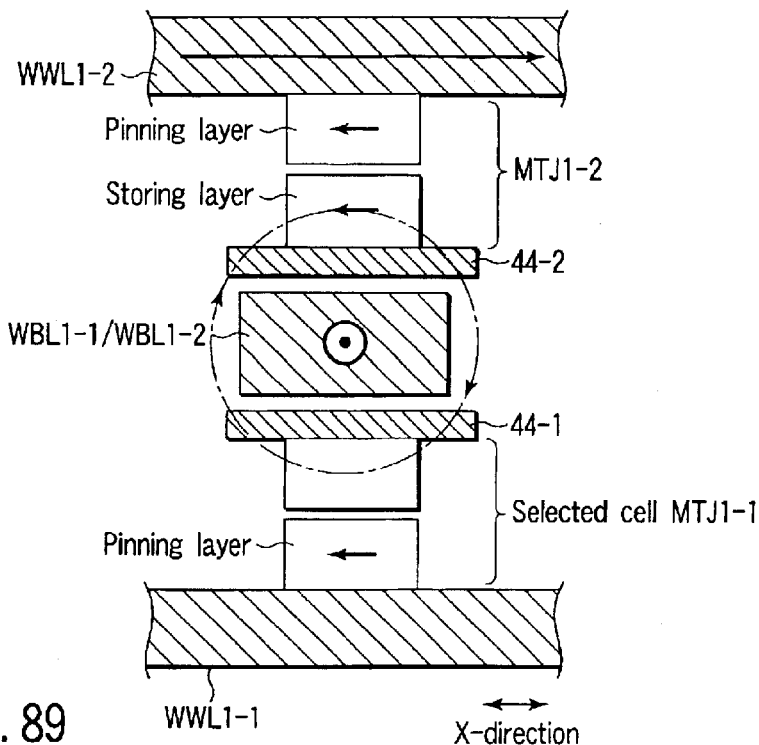
FIG. 89 is a view showing MTJ elements arranged symmetrically with respect to a write line.

As shown in FIG. 89, a write current directed in one direction is supplied to the write word line WWL1-2. A write current is supplied to the write bit line WBL1-1/WBL1-2 in a direction in which the current comes out from the direction perpendicular to the drawing surface.

This write condition is different from the "1"-write condition for the MTJ element MTJ1-1 on the lower side of the write bit line WBL1-1/WBL1-2. That is, if the write data is the same, the direction of the write current to be supplied to the write line changes depending on whether the MTJ element is present on the upper or lower side of the write line.

A write circuit (write bit line driver/sinker) which realizes such operation will be described later.

At this time, a magnetic field generated by the write current flowing to the write bit line WBL1-1/WBL1-2 forms a circle counterclockwise about the write bit line WBL1-1/WBL1-2.

In this case, a leftward magnetic field is applied to the MTJ element MTJ1-2 on the upper side of the write bit line WBL1-1/WBL1-2. For this reason, the magnetizing direction of the MTJ element MTJ1-2 on the upper side of the write bit line WBL1-1/WBL1-2 is leftward.

Hence, the magnetizing state of the MTJ element MTJ1-2 on the upper side of the write bit line WBL1-1/WBL1-2 is parallel, i.e., data "1" is stored.

["0"-Write]

A write current directed in one direction is supplied to the write word line WWL1-2. A write current is supplied to the write bit line WBL1-1/WBL1-2 in a direction in which the current is absorbed in the direction perpendicular to the drawing surface.

This write condition is different from the "0"-write condition for the MTJ element MTJ1-1 on the lower side of the write bit line WBL1-1/WBL1-2. That is, if the write data is the same, the direction of the write current to be supplied to the write line changes depending on whether the MTJ element is present on the upper or lower side of the write line.

At this time, a magnetic field generated by the write current flowing to the write bit line WBL1-1/WBL1-2 forms a circle clockwise about the write bit line WBL1-1/WBL1-2.

In this case, a rightward magnetic field is applied to the MTJ element MTJ1-2 on the upper side of the write bit line WBL1-1/WBL1-2. For this reason, the magnetizing direction of the MTJ element MTJ1-2 on the upper side of the write bit line WBL1-1/WBL1-2 is rightward.

Hence, the magnetizing state of the MTJ element MTJ1-2 on the upper side of the write bit line WBL1-1/WBL1-2 is antiparallel, i.e., data "0" is stored.

Figure 90:
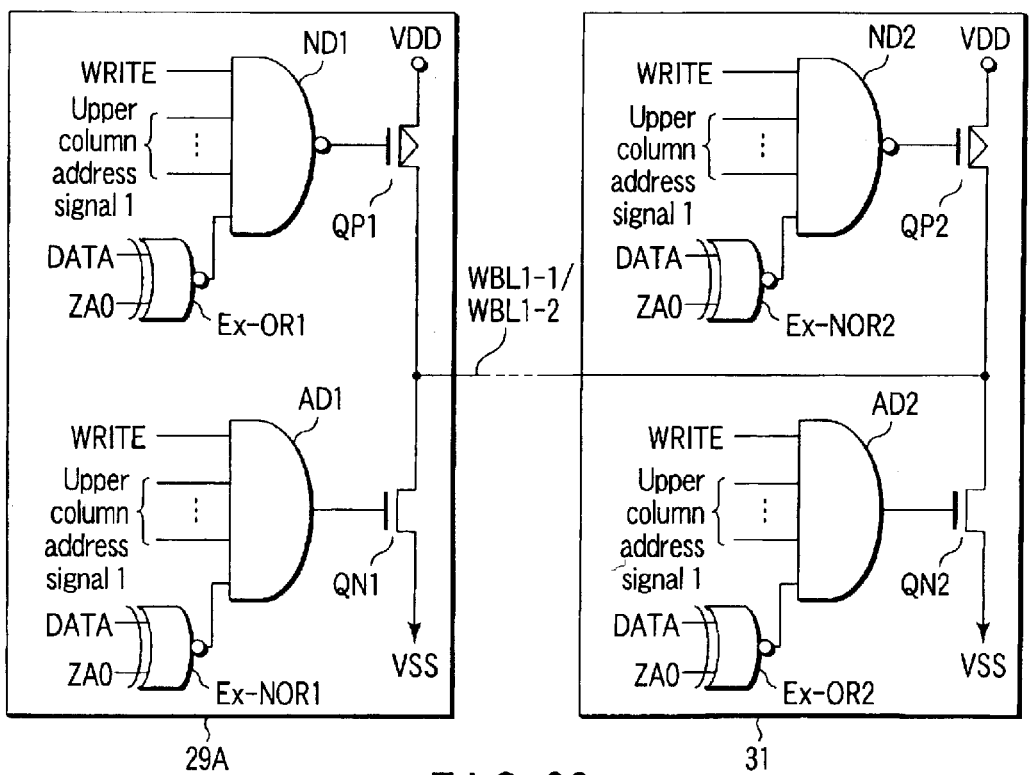
FIG. 90 is a view showing a circuit example of a write bit line driver/sinker.

③ Arrangement of Write Circuit (Write Bit Line Driver/Sinker) When Pinning Layers of All MTJ Elements Have Same Magnetizing Direction FIG. 90 shows a circuit example of the write bit line drivers/sinkers.

The circuit shown in FIG. 90 is applied to the magnetic random access memory according to Structural Example 5

(FIGS. 34 and 35). As a characteristic feature, this circuit has a function of changing the direction of write current on the basis of the position information (lower or upper side) of MTJ elements.

FIG. 90 shows write bit line drivers/sinkers corresponding to only one column.

The write bit line driver/sinker 29A is formed from the PMOS transistor QP1, NMOS transistor QN1, NAND gate circuit ND1, AND gate circuit AD1, exclusive OR circuit Ex-OR1, and exclusive NOR circuit Ex-NOR1.

The write bit line driver/sinker 31 is formed from the PMOS transistor QP2, NMOS transistor QN2, NAND gate circuit ND2, AND gate circuit AD2, exclusive OR circuit Ex-OR2, and exclusive NOR circuit Ex-NOR2.

The PMOS transistor QP1 is connected between the power supply terminal VDD and the write bit line WBL1-1/WBL1-2. The NMOS transistor QN1 is connected between the write bit line WBL1-1/WBL1-2 and the ground terminal VSS. The PMOS transistor QP2 is connected between the power supply terminal VDD and the write bit line WBL1-1/WBL1-2. The NMOS transistor QN2 is connected between the write bit line WBL1-1/WBL1-2 and the ground terminal VSS.

When the output signal from the NAND gate circuit ND1 is "0", and the output signal from the AND gate circuit AD2 is "1", a write current from the write bit line driver/sinker 29A toward the write bit line driver/sinker 31 flows to the write bit line WBL1-1/WBL1-2.

When the output signal from the NAND gate circuit ND2 is "0", and the output signal from the AND gate circuit AD1 is "1", a write current from the write bit line driver/sinker 31 toward the write bit line driver/sinker 29A flows to the write bit line WBL1-1/WBL1-2.

In such write bit line drivers/sinkers 29A and 31, the write signal WRITE is "1" in the write operation. Additionally, in the selected column, all the upper column address signal bits are "1".

In this example, the direction of write current to be supplied to the write bit line WBL1-1/WBL1-2 is determined using a select signal ZA0 for selecting a memory cell array (upper or lower stage).

When Write Data Is "1"

When write data is "1" (DATA="1"), the direction of current flowing to the write bit line WBL1-1/WBL1-2 is as follows.

When the memory cell array (MTJ elements) of the first stage is selected, ZA0="0". The output signals from the exclusive OR circuits Ex-OR1 and Ex-OR2 are "1", and the output signals from the exclusive NOR circuits Ex-NOR1 and Ex-NOR2 are "0".

Hence, the output signal from the NAND gate circuit ND1 is "0", and the output signal from the AND gate circuit AD2 is "1". As a result, a write current from the write bit line driver/sinker 29A to the write bit line driver/sinker 31 flows to the write bit line WBL1-1/WBL1-2.

When the memory cell array (MTJ elements) of the second stage is selected, ZA0="1". The output signals from the exclusive OR circuits Ex-OR1 and Ex-OR2 are "0", and the output signals from the exclusive NOR circuits Ex-NOR1 and Ex-NOR2 are "1".

Hence, the output signal from the NAND gate circuit ND2 is "0", and the output signal from the AND gate circuit AD1 is "1". As a result, a write current from the write bit line driver/sinker 31 to the write bit line driver/sinker 29A flows to the write bit line WBL1-1/WBL1-2.

When Write Data Is "0"

When write data is "0" (DATA="0"), the direction of current flowing to the write bit line WBL1-1/WBL1-2 is as follows.

When the memory cell array (MTJ elements) of the first stage is selected, ZA0="0". The output signals from the exclusive OR circuits Ex-OR1 and Ex-OR2 are "0", and the output signals from the exclusive NOR circuits Ex-NOR1 and Ex-NOR2 are "1".

Hence, the output signal from the NAND gate circuit ND2 is "0", and the output signal from the AND gate circuit AD1 is "1". As a result, a write current from the write bit line driver/sinker 31 to the write bit line driver/sinker 29A flows to the write bit line WBL1-1/WBL1-2.

When the memory cell array (MTJ elements) of the second stage is selected, ZA0="1". The output signals from the exclusive OR circuits Ex-OR1 and Ex-OR2 are "1", and the output signals from the exclusive NOR circuits Ex-NOR1 and Ex-NOR2 are "0".

Hence, the output signal from the NAND gate circuit ND1 is "0", and the output signal from the AND gate circuit AD2 is "1". As a result, a write current from the write bit line driver/sinker 29A to the write bit line driver/sinker 31 flows to the write bit line WBL1-1/WBL1-2.

6. Manufacturing Method

The cell array structure, MTJ element structure, read circuit, and read operation principle of the magnetic random access memory of the present invention have been described above. Finally, a manufacturing method for implementing the magnetic random access memory of the present invention will be described.

The manufacturing method to be described below is related to Device Structure 2 of Structural Example 1. Device Structures 1 and 3 of Structural Example 1 and Structural Examples 2 to 10 can also easily be formed using the following manufacturing method.

(1) Cell Array Structure to Be Manufactured

The cell array structure completed by the manufacturing method of the present invention will be briefly described first. Then, the manufacturing method of the cell array structure will be described.

Figures 91, 92, 93:
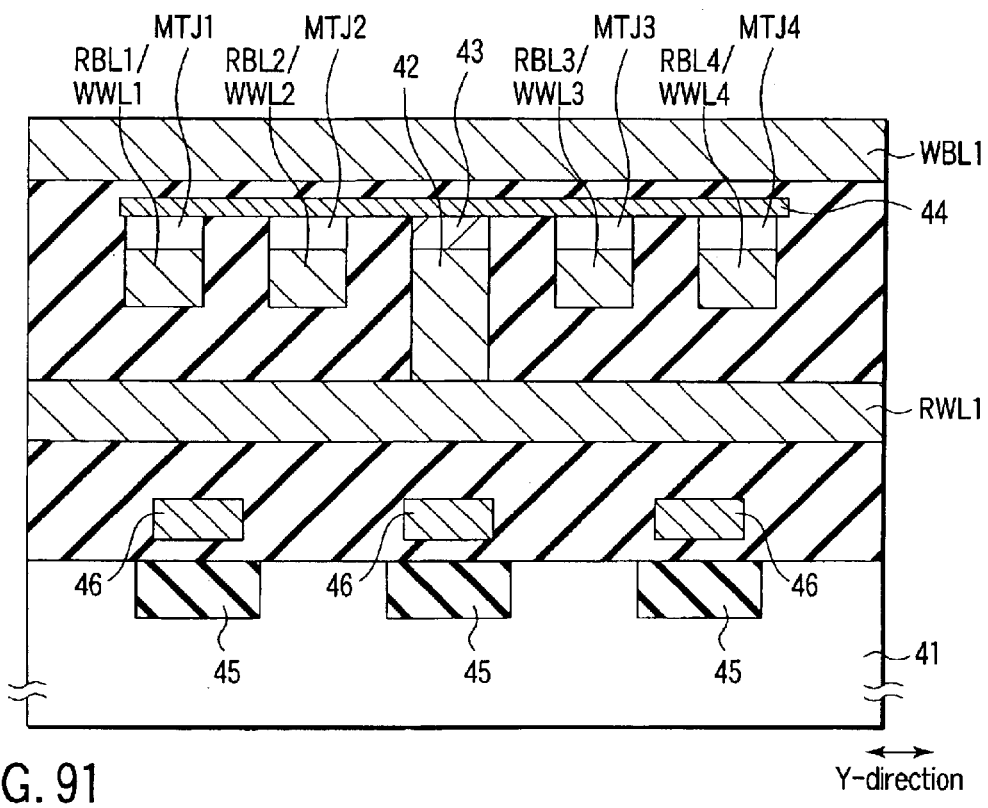
FIG. 91 is a sectional view showing a device structure to which a manufacturing method according to the example of the present invention is applied.
FIG. 92 is a sectional view showing a step in manufacturing according to the example of the present invention.
FIG. 93 is a sectional view showing a step in manufacturing according to the example of the present invention.

FIG. 91 shows a cell array structure including the characteristic feature of Device Structure 2 of Structural Example 1.

Element isolation insulating layers 45 having an STI (Shallow Trench Isolation) structure are formed in the semiconductor substrate 41. Dummy interconnections 46 are formed on the element isolation insulating layers 45. The dummy interconnections 46 are formed in a periodical pattern (a repeat of a predetermined pattern) or a pattern uniform as a whole. In this example, the dummy interconnections 46 are arranged equidistantly.

The dummy interconnections 46 are made of the same material as that of interconnections of peripheral circuits arranged around the memory cell array, e.g., the gate interconnections of MOS transistors.

The read word line RWL1 running in the Y-direction is formed on the dummy interconnections 46. The four MTJ elements MTJ1, MTJ2, MTJ3, and MTJ4 arrayed in the Y-direction are arranged on the read word line RWL1.

One terminal (upper end in this example) of each of the MTJ elements MTJ1, MTJ2, MTJ3, and MTJ4 is commonly connected to the upper electrode 44. The contact plug 42 and conductive layer 43 electrically connect the upper electrode 44 to the read word line RWL1.

The contact portion between the upper electrode 44 and the read word line RWL1 is formed in the region between the MTJ elements MTJ1 and MTJ2 and the MTJ elements MTJ3 and MTJ4. When the MTJ elements MTJ1, MTJ2, MTJ3, and MTJ4 are uniformly arranged to be symmetrical with respect to the contact portion, signal margin in the read operation due to the interconnection resistance or the like can be maximized.

The conductive layer 43 may be integrated with the upper electrode 44. That is, the conductive layer 43 and upper electrode 44 may be formed simultaneously using the same material.

The other terminal (lower end in this example) of each of the MTJ elements MTJ1, MTJ2, MTJ3, and MTJ4 is electrically connected to a corresponding one of the read bit lines RBL1, RBL2, RBL3, and RBL4 (write word lines WWL1, WWL2, WWL3, and WWL4). The read bit lines RBL1, RBL2, RBL3, and RBL4 run in the X-direction (row direction).

The MTJ elements MTJ1, MTJ2, MTJ3, and MTJ4 are independently connected to the read bit lines RBL1, RBL2, RBL3, and RBL4, respectively. That is, the four read bit lines RBL1, RBL2, RBL3, and RBL4 are arranged in correspondence with the four MTJ elements MTJ1, MTJ2, MTJ3, and MTJ4.

The write bit line WBL1 is formed immediately on and near the MTJ elements MTJ1, MTJ2, MTJ3, and MTJ4. The write bit line WBL1 runs in the Y-direction.

(2) Steps in Manufacturing Method

The manufacturing method for implementing the cell array structure shown in FIG. 91 will be described below. A detailed manufacturing method (e.g., employment of a dual damascene process) will be described here. Hence, note that elements that are not illustrated in the cell array structure of FIG. 91 will be mentioned. However, the outline of the finally completed cell array structure is almost the same as that shown in FIG. 91.

[1] Element Isolation Step

First, as shown in FIG. 92, an element isolation insulating layer 52 having an STI (Shallow Trench Isolation) structure is formed in a semiconductor substrate 51.

The element isolation insulating layer 52 can be formed by, e.g., the following process.

A mask pattern (e.g., a silicon nitride film) is formed on the semiconductor substrate 51 by PEP (Photo Engraving Process). The semiconductor substrate 51 is etched by RIE (Reactive Ion Etching) using the mask pattern as a mask to form a trench in the semiconductor substrate 51. This trench is filled with an insulating layer (e.g., a silicon oxide layer) using, e.g., CVD (Chemical Vapor Deposition) and CMP (Chemical Mechanical Polishing).

After that, a p-type impurity (e.g., B or $BF_2$) or an n-type impurity (e.g., P or As) is doped into the semiconductor substrate by, e.g., ion implantation, as needed, to form a p-type well region or an n-type well region.

[2] MOSFET Forming Step

Next, as shown in FIG. 93, a MOS transistor functioning as a read select switch is formed on the surface region of the semiconductor substrate 51.

Figure 95:
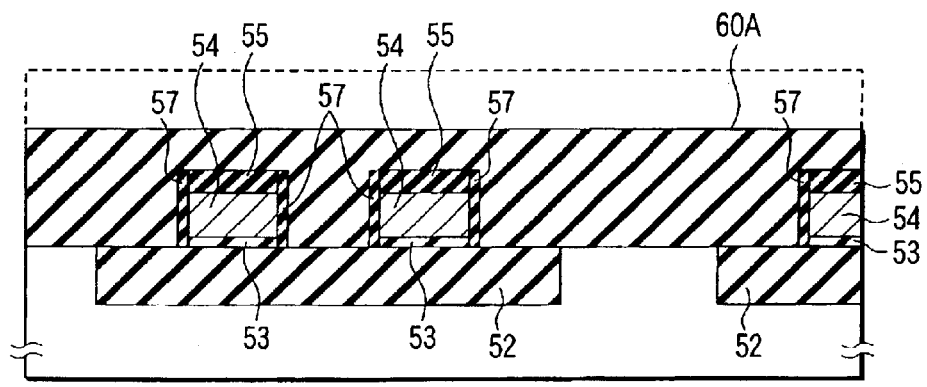
FIG. 95 is a sectional view showing a step in manufacturing according to the example of the present invention.

Dummy interconnections are formed in the memory cell array region simultaneously when the MOS transistor is formed (FIG. 95).

The MOS transistor can be formed by, e.g., the following process.

An impurity for controlling the threshold value of the MOS transistor is ion-implanted into the channel portion in the element region surrounded by the element isolation insulating layer 52. A gate insulating film (e.g., a silicon oxide film) 53 is formed in the element region by thermal oxidation. A gate electrode material (e.g., polysilicon containing an impurity) and cap insulating film (e.g., a silicon nitride film) 55 are formed on the gate insulating film 53 by CVD.

The cap insulating film 55 is patterned by PEP. Then, the gate electrode material and gate insulating film 53 are processed (etched) by RIE using the cap insulating film 55 as a mask. As a consequence, gate electrodes 54 running in the X-direction are formed on the semiconductor substrate 51.

A p- or n-type impurity is doped into the semiconductor substrate 51 by ion implantation using the cap insulating film 55 and gate electrodes 54 as a mask. Lightly-doped impurity regions (LDD regions or extension regions) are formed in the semiconductor substrate.

An insulating film (e.g., a silicon nitride film) is formed on the entire surface of the semiconductor substrate 51 by CVD. After that, the insulating film is etched by RIE to form sidewall insulating layers 57 on the side surfaces of the gate electrodes 54 and cap insulating films 55. A p- or n-type impurity is doped into the semiconductor substrate 51 by ion implantation using the cap insulating films 55, gate electrodes 54, and sidewall insulating layers 57 as a mask. As a result, source regions 56A and drain regions 56B are formed in the semiconductor substrate 51.

After that, an interlayer dielectric film (e.g., a silicon oxide layer) 58 that completely covers the MOS transistor is formed on the entire surface of the semiconductor substrate 51 by CVD. In addition, the surface of the interlayer dielectric film 58 is planarized by CMP.

[3] Contact Hole Forming Step

Figure 94:
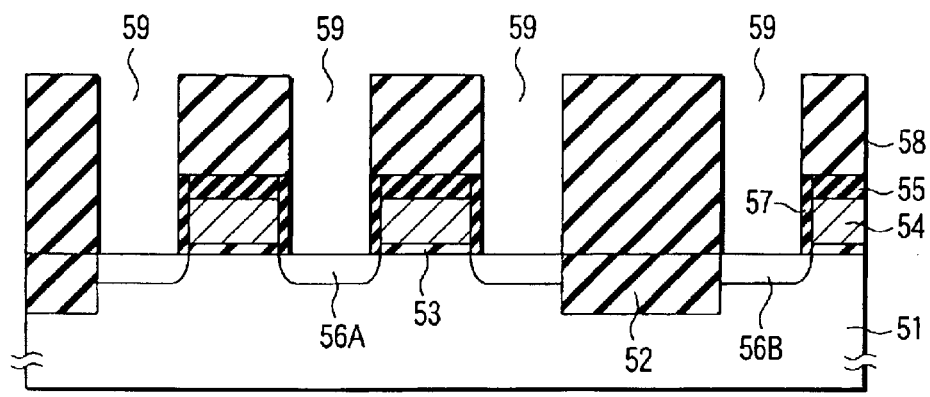
FIG. 94 is a sectional view showing a step in manufacturing according to the example of the present invention.

Next, as shown in FIG. 94, contact holes 59 that reach the source regions 56A and drain regions 56B of MOS transistors are formed in the interlayer dielectric film 58 on the semiconductor substrate 51.

The contact holes 59 can easily be formed by, e.g., forming a resist pattern on the interlayer dielectric film 58 by PEP and etching the interlayer dielectric film 58 by RIE using the resist pattern as a mark. After etching, the resist pattern is removed.

[4] Interconnection Trench & First Interconnection Layer Forming Step

Figure 96:
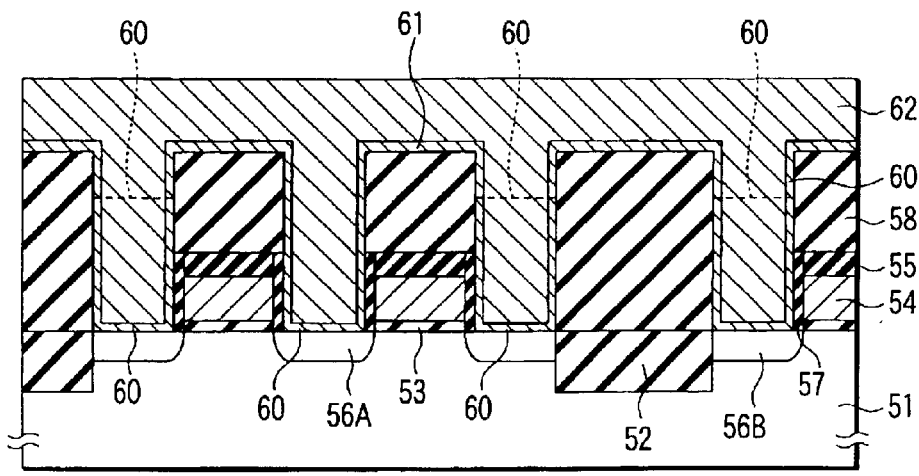
FIG. 96 is a sectional view showing a step in manufacturing according to the example of the present invention.

As shown in FIGS. 95 and 96, interconnection trenches 60 are formed in the interlayer dielectric film 58 on the semiconductor substrate 51. In the memory cell array region, the interconnection trenches 60 are trenches in which read word lines should be formed and run in, e.g., the Y-direction. The interconnection trenches 60 are indicated by broken lines in FIGS. 95 and 96.

The interconnection trenches 60 can easily be formed by, e.g., forming a resist pattern on the interlayer dielectric film 58 by PEP and etching the interlayer dielectric film 58 by RIE using the resist pattern as a mark. After etching, the resist pattern is removed.

As shown in FIGS. 96 and 97, a barrier metal layer (e.g., a multi-layer of Ti and TiN) 61 is formed on the interlayer dielectric film 58, the inner surfaces of the contact holes 59, and the inner surfaces of the interconnection trenches 60 by, e.g., sputtering. Subsequently, a metal layer (e.g., a W layer) 62 that completely fills the contact holes 59 and interconnection trenches 60 is formed on the barrier metal layer 61 by, e.g., sputtering.

After that, the metal layer 62 is polished by, e.g., CMP and left only in the contact holes 59 and interconnection trenches

60. The metal layer 62 remaining in each contact hole 59 forms a contact plug.

As shown in FIG. 98, the metal layer 62 remaining in each interconnection trench 60 forms a first interconnection layer (read word line).

As shown in FIG. 99, an interlayer dielectric film (e.g., a silicon oxide layer) 63 is formed on the interlayer dielectric film 58 by CVD.

The step comprising the contact hole forming step, the interconnection trench forming step, and the first interconnection layer forming step is called a dual damascene process.

[5] Interconnection Trench Forming Step

Next, as shown in FIG. 100, interconnection trenches 64 are formed in the interlayer dielectric film 63. In this example, the interconnection trenches 64 serve as trenches used to form write word lines (read bit lines) and run in the X-direction. Sidewall insulating layers (e.g., silicon nitride layers) for increasing the insulating function may be formed on the side surfaces of the interconnection trenches 64.

The interconnection trenches 64 can easily be formed by, e.g., forming a resist pattern on the interlayer dielectric film 63 by PEP and etching the interlayer dielectric film 63 by RIE using the resist pattern as a mask. After etching, the resist pattern is removed.

The sidewall insulating layers can easily be formed by forming an insulating film (e.g., a silicon nitride film) on the entire surface of the interlayer dielectric film 63 by CVD and etching the insulating film by RIE.

[6] Second Interconnection Layer Forming Step

Next, as shown in FIG. 101, a contact hole 65 that reaches the metal layer 62 serving as the read word line is formed in the interconnection trench 64.

The contact hole 65 can easily be formed by, e.g., forming a resist pattern on the interlayer dielectric film 63 by PEP and etching the interlayer dielectric film 63 by RIE using the resist pattern as a mask. After etching, the resist pattern is removed.

After that, a barrier metal layer (e.g., a multi-layer of Ta and TaN) 66 is formed on the interlayer dielectric film 63 and the inner surfaces of the interconnection trenches 64 and contact hole 65 by, e.g., sputtering. Subsequently, a metal layer (e.g., a Cu layer) 67 that completely fills the interconnection trenches 64 and contact hole 65 is formed on the barrier metal layer 66 by, e.g., sputtering.

After that, the metal layer 67 is polished by, e.g., CMP and left only in the interconnection trenches 64 and contact hole 65. The metal layer 67 remaining in each interconnection trench 64 forms a second interconnection layer that functions as a write word line (read bit line). The metal layer 67 remaining in the contact hole 65 forms a contact plug.

[7] MTJ Element & Lower Electrode Forming Step

As shown in FIG. 102, a lower electrode (e.g., a Ta layer) 68 is formed on the interlayer dielectric film 63 by sputtering. Subsequently, a plurality of layers 69 for MTJ elements are formed on the lower electrode 68. The plurality of layers 69 include, e.g., a tunneling barrier layer, two ferromagnetic layers that sandwich the tunneling barrier layer, and an antiferromagnetic layer.

After that, as shown in FIG. 103, the plurality of layers 69 for MTJ elements are patterned to form a plurality of MTJ elements 69A on the lower electrode 68. Each of the e plurality of MTJ elements 69A finally has the structure shown in, e.g., FIG. 61, 62, or 63.

The plurality of layers 69 for MTJ elements can easily be patterned by forming a resist pattern on the plurality of layers 69 by PEP and etching the plurality of layers 69 by RIE using the resist pattern as a mask. After etching, the resist pattern is removed.

Subsequently, the lower electrode 68 for the MTJ elements is patterned.

The lower electrode 68 can easily be patterned by forming a resist pattern on the lower electrode 68 by PEP and etching the lower electrode 68 by RIE using the resist pattern as a mask. After etching, the resist pattern is removed.

After that, an interlayer dielectric film 70 that completely covers the MTJ elements 69A is formed by CVD. In addition, the interlayer dielectric film 70 is polished and planarized by CMP and left only between the MTJ elements 69A.

[8] Step of Forming Upper Electrode for MTJ Elements

Figure 104:
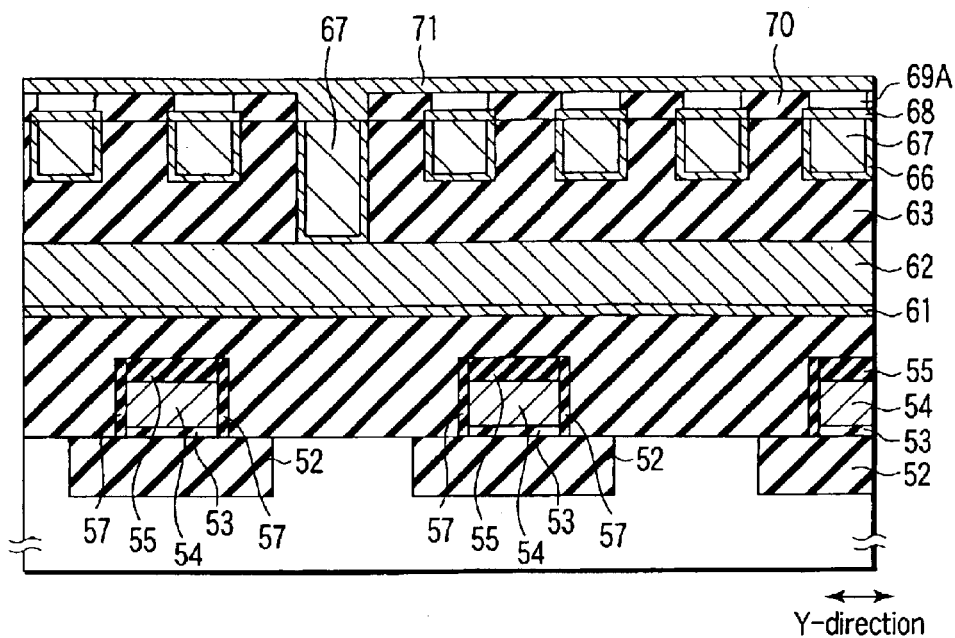
FIG. 104 is a sectional view showing a step in manufacturing according to the example of the present invention.

As shown in FIG. 104, a contact hole that reaches the metal layer 67 serving as a contact plug is formed in the interlayer dielectric film 70.

The contact hole can easily be formed by, e.g., forming a resist pattern on the interlayer dielectric film 70 by PEP and etching the interlayer dielectric film 70 by RIE using the resist pattern as a mask. After etching, the resist pattern is removed.

After that, a metal layer (e.g., a Ta layer) 71 as the upper electrode for the MTJ elements 69A is formed on the MTJ elements 69A and interlayer dielectric film 70 by sputtering such that the contact hole is completely filled. In addition, the metal layer 71 is polished by CMP to planarize the surface of the metal layer 71.

The upper electrode 71 for the MTJ elements 69A is patterned.

The upper electrode 71 for the MTJ elements 69A can easily be patterned by, e.g., forming a resist pattern on the upper electrode 71 by PEP and etching the upper electrode 71 by RIE using the resist pattern as a mask. After etching, the resist pattern is removed.

With this patterning, the upper electrode 71 may be formed for each read block, as in Structural Example 1. Alternatively, the upper electrode 71 may be shared by read blocks in one column, as in Structural Example 10.

[9] Third Interconnection Layer Forming Step

Figure 105:
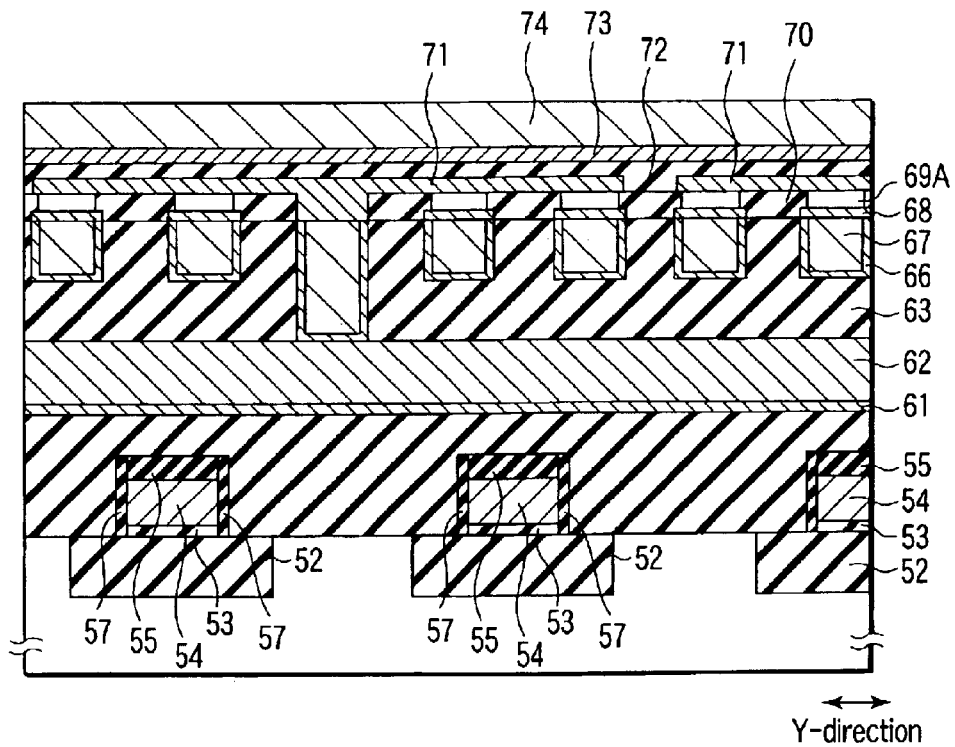
FIG. 105 is a sectional view showing a step in manufacturing according to the example of the present invention.

Next, as shown in FIG. 105, an interlayer dielectric film 72 which completely covers the upper electrode 71 for the MTJ elements 69A is formed on the interlayer dielectric film 70 by CVD. In addition, the interlayer dielectric film 72 is polished by CMP to planarize the surface of the interlayer dielectric film 72.

Interconnection trenches are formed in the interlayer dielectric film 72. The interconnection trenches are trenches in which write bit lines are to be formed and run in the Y-direction. Sidewall insulating layers (e.g., silicon nitride layers) for increasing the insulating function may be formed on the side surfaces of the interconnection trenches.

The interconnection trenches can easily be formed by, e.g., forming a resist pattern on the interlayer dielectric film 72 by PEP and etching the interlayer dielectric film 72 by RIE using the resist pattern as a mask. After etching, the resist pattern is removed.

The sidewall insulating layers can easily be formed by forming an insulating film (e.g., a silicon nitride film) on the entire interlayer dielectric film 72 by CVD and etching the insulating layer by RIE.

After that, a barrier metal layer (e.g., a multi-layer of Ta and TaN) 73 is formed on the interlayer dielectric film 72 and inner surfaces of the interconnection trenches by, e.g., sputtering. Subsequently, a metal layer (e.g., a Cu layer) 74 that completely fills the interconnection trenches is formed on the barrier metal layer 73 by, e.g., sputtering.

The metal layer 74 is polished by, e.g., CMP and left only in the interconnection trenches. The metal layer 74 remaining in each interconnection trench forms a third interconnection layer that functions as a write bit line.

FIG. 106 shows the final structure in which the upper electrode 71 is shared by read block in one column.

(3) Conclusion

According to this manufacturing method, a cell array structure in which no read select switch is connected between a read word line and one terminal of an MR element in a read block, and one of two write lines is not in contact with the MTJ element can be implemented.

No select switch (MOS transistor) is formed immediately under the MTJ element. Instead, for example, a plurality of dummy interconnections are equidistantly formed. For this reason, the interlayer dielectric film can be planarized, and the characteristics of the MTJ element can be improved.

In this example, to form an interconnection layer, a damascene process and dual damascene process are employed. Instead, for example, a process of forming an interconnection layer by etching may be employed.

7. Others

Application examples of Structural Example 8 shown in FIG. 58 will be described briefly.

As a characteristic feature of the example shown in FIG. 58, the bias voltage VC is applied to the selected read word line RWLi in the read mode. The following modifications can also be made for the MRAM having this characteristic feature.

As a characteristic feature of an example shown in FIG. 108, the read circuit 29B is connected to the read word lines RWL1, . . . , RWLi. The column select switch CSW is connected between the read circuit 29B and the read word lines RWLi, . . . , RWLi. One bias circuit BIAS which generates the bias voltage VC is arranged in correspondence with one of the read word lines RWL1, . . . , RWLi. In the read operation, the row decoders 25-1, . . . , 25-n select one read bit line RBLi. The selected read bit line RBLi is connected to the ground point through the read bit line sinker 23A. All the remaining unselected read bit lines are set in the floating state.

Figure 109:
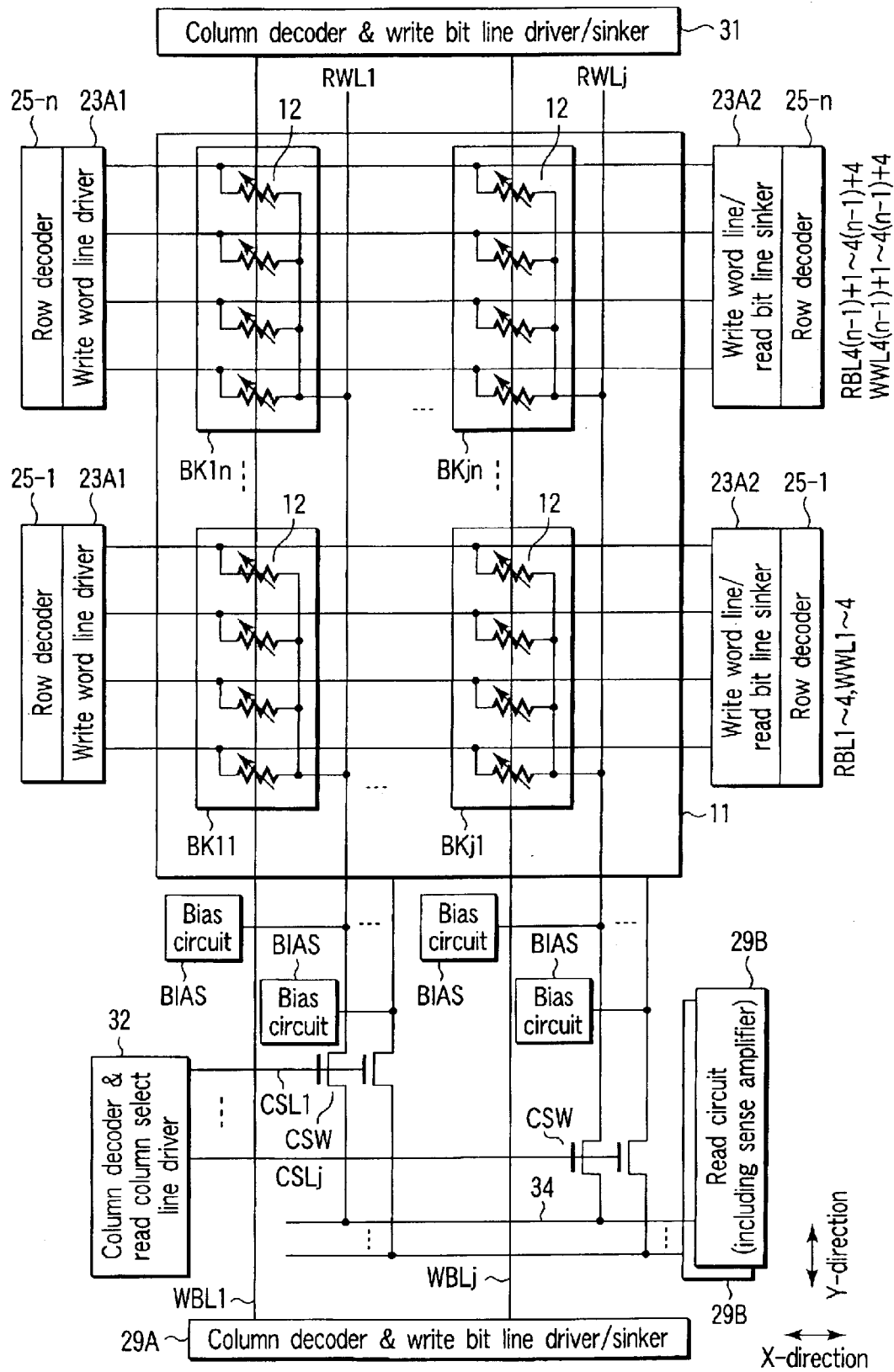
FIG. 109 is a circuit diagram showing a magnetic random access memory according to Modification example of Structural Example 8.

An MRAM shown in FIG. 109 includes the characteristic feature of the MRAM shown in FIG. 108. As a characteristic feature of the example shown in FIG. 109, a plurality of read circuits 29B are present, and a plurality of bit data can simultaneously be read out from a plurality of memory cells (MTJ elements) by read operation of one cycle, unlike the example shown in FIG. 108.

Figure 110:
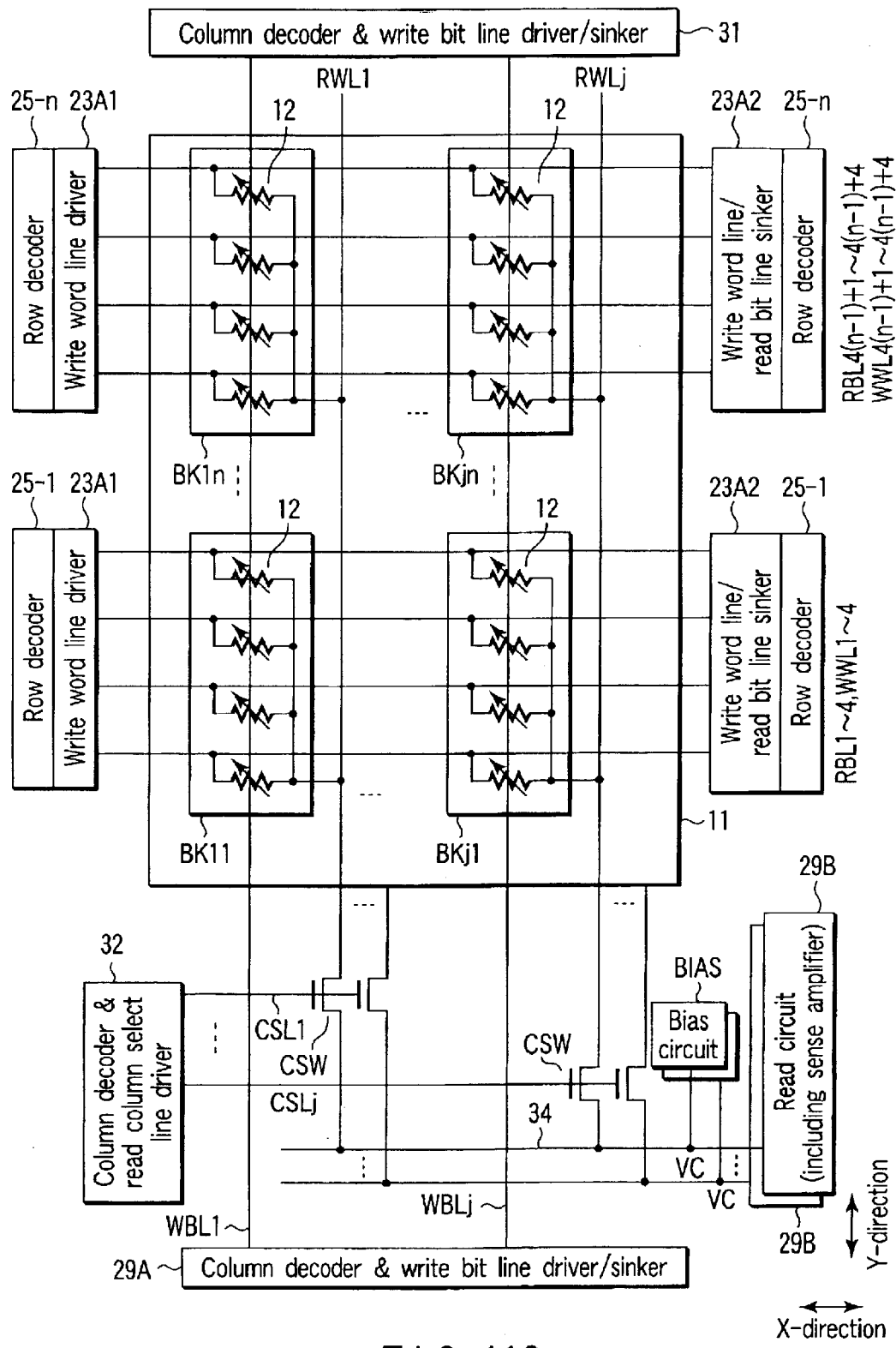
FIG. 110 is a circuit diagram showing a magnetic random access memory according to Modification example of Structural Example 8.

An MRAM shown in FIG. 110 includes the characteristic feature of the MRAM shown in FIG. 108. As a characteristic feature of the example shown in FIG. 110, a plurality of read circuits 29B are present, and a plurality of bit data can simultaneously be read out from a plurality of memory cells (MTJ elements) by read operation of one cycle, unlike the example shown in FIG. 108.

In the above description, a MTJ element is used as a memory cell of the magnetic random access memory. However, even when the memory cell is formed from a GMR (Giant MagnetoResistance) element or CMR (Colossal MagnetoResistance) element, the present invention, i.e., various kinds of cell array structures, the read operation principle, and the detailed example of the read circuit can be applied.

The structure of a MTJ element, GMR element, or CMR element and the materials thereof are not particularly limited in applying the present invention. In this example, the number of MTJ elements in one read block is four. However, the number of MTJ elements in one read block is not limited to four and can freely be set.

As a switch element such as the row/column select switch of the magnetic random access memory, a bipolar transistor, diode, MIS (Metal Insulator Semiconductor) transistor (including a MOSFET), MES (Metal Semiconductor) transistor, or junction transistor can be used.

As has been described above, according to the present invention, a magnetic random access memory having a cell array structure which can implement an increase in memory capacity without forming any select switch in a read block and also prevent the MTJ elements from breaking in a write mode can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a memory cell array having memory cells using a magnetoresistive effect;
   a first functional line which runs in a first direction in the memory cell array and is commonly connected without an intervening select switch to one terminal of each of the memory cells;
   second functional lines which are arranged in correspondence with the memory cells and run in a second direction perpendicular to the first direction in the memory cell array, each second functional line being connected without an intervening select switch to a corresponding memory cell; and
   a third functional line which is electrically insulated from the memory cells and is configured to generate a magnetic field to write data in the memory cells, wherein the magnetic field is shared by the memory cells.

2. A memory according to claim 1, wherein the memory cell array is arranged on a semiconductor substrate, and no switch element is present immediately under the memory cell array.

3. A memory according to claim 2, wherein dummy interconnections which do not function as actual interconnections are arranged immediately under the memory cell array.

4. A memory according to claim 3, wherein each of the dummy interconnections has the same structure as that of a gate electrode of a MOS transistor arranged at a peripheral portion of the memory cell array.

5. A memory according to claim 3, wherein the dummy interconnections are arranged equidistantly, periodically, or uniformly as a whole.

6. A memory according to claim 1, wherein the memory cells are arranged on a semiconductor substrate and arrayed in a direction parallel to a surface of the semiconductor substrate.

7. A memory according to claim 6, wherein the memory cells are arrayed in the first direction, and the first and third functional lines run in the first direction in the memory cell array.

8. A memory according to claim 6, wherein when the memory cell array and the first, second, and third functional lines form one memory cell unit, stages of memory cell units are stacked on the semiconductor substrate.

9. A memory according to claim 8, wherein for first and second memory cell units which are adjacent to each other in the memory cell units, the first functional line of the first memory cell unit and the third functional line of the second memory cell unit are integrated as a fourth functional line.

10. A memory according to claim 9, wherein the first memory cell unit is arranged on the second memory cell unit.

11. A memory according to claim 9, further comprising a switch circuit which determines whether the fourth functional line should function as the first functional line of the first memory cell unit or the third functional line of the second memory cell unit.

12. A memory according to claim 9, wherein for first and second memory cell units which are adjacent to each other in the memory cell units, the first functional lines of the first and second memory cell units are integrated as a fifth functional line.

13. A memory according to claim 12, wherein for first and second memory cell units which are adjacent to each other in the memory cell units, the third functional lines of the first and second memory cell units are integrated as a sixth functional line.

14. A memory according to claim 13, wherein each of the memory cells of the first and second memory cell units is formed from a magnetic storage element having a pinning layer whose magnetizing direction is fixed, and the magnetizing direction of the pinning layer of each of the memory cells of the first memory cell unit is different from the magnetizing direction of the pinning layer of each of the memory cells of the second memory cell unit.

15. A memory according to claim 13, wherein each of the memory cells of the first and second memory cell units is formed from a magnetic storage element having a pinning layer whose magnetizing direction is fixed, and the pinning layers of the memory cells of the first and second memory cell units have the same magnetizing direction.

16. A memory according to claim 1, wherein the first functional line and second functional lines are arranged immediately under the memory cells, and the third functional line is arranged immediately on the memory cells.

17. A memory according to claim 16, wherein said one terminal of each of the memory cells corresponds to an upper surface of the memory cell, another terminal of each of the memory cells corresponds to a lower surface of the memory cell, and the memory cells are arranged symmetrically with respect to a contact plug.

18. A memory according to claim 1, wherein the first functional line and second functional lines are arranged immediately on the memory cells, and the third functional line is arranged immediately under the memory cells.

19. A memory according to claim 18, wherein said one terminal of each of the memory cells corresponds to a lower surface of the memory cell, another terminal of each of the memory cells corresponds to an upper surface of the memory cell, and the memory cells are arranged symmetrically with respect to a contact plug.

20. A memory according to claim 17 or 19, wherein an electrode is connected to said one terminal of each of the memory cells, and said one terminal of each of the memory cells and the first functional line are connected through a contact plug.

21. A memory according to claim 1, wherein the first functional line functions as a read line to supply a read current to the memory cells.

22. A memory according to claim 21, wherein one end of the first functional line is connected to a ground point through a column select switch.

23. A memory according to claim 21, wherein one end of the first functional line is connected to a bias line which is set to a bias potential.

24. A memory according to claim 1, wherein the second functional lines function as read lines to supply a read current to the memory cells and write lines which generate a magnetic field to write data in the memory cells.

25. A memory according to claim 24, wherein one end of each of the second functional lines is connected to a corresponding one of common lines arranged outside the memory cell array through a corresponding one of row select switches.

26. A memory according to claim 25, wherein the common lines run in the first direction.

27. A memory according to claim 25, wherein one end of each of the common lines is connected to a read circuit.

28. A memory according to claim 25, wherein one end of each of the common lines is connected to a driver, and the other end of each of the second functional lines is connected to a sinker.

29. A memory according to claim 25, wherein a driver is connected between the second functional lines and the row select switches, and a sinker is connected to the other end of each of the second functional lines.

30. A memory according to claim 28 or 29, wherein an axis of easy magnetization of MTJ elements is set in the second direction.

31. A memory according to claim 24, wherein one end of each of the second functional lines is connected, through a corresponding one of first row select switches, to a corresponding one of first common lines arranged outside the memory cell array, and the other end of each of the second functional lines is connected, through a corresponding one of second row select switches, to a corresponding one of second common lines arranged outside the memory cell array.

32. A memory according to claim 31, wherein the first and second common lines run in the first direction.

33. A memory according to claim 31, wherein one end of each of the first common lines is connected to a read circuit.

34. A memory according to claim 31, wherein one end of each of the first common lines is connected to a first driver/sinker, and one end of each of the second common lines is connected to a second driver/sinker.

35. A memory according to claim 34, wherein an axis of easy magnetization of MTJ elements is set in the first direction.

36. A memory according to claim 1, wherein drivers/sinkers are respectively connected to two ends of the third functional line.

37. A memory according to claim 1, wherein a driver is connected to one end of the third functional line, and a sinker is connected to the other end of the third functional line.

38. A memory according to claim 27 or 33, wherein the read circuit is formed from sense amplifiers which are arranged in correspondence with the second functional lines, and output buffers which are arranged in correspondence with the sense amplifiers.

39. A memory according to claim 27 or 33, wherein the read circuit is formed from sense amplifiers which are arranged in correspondence with the second functional lines, an output buffer which outputs data from one of the sense amplifiers, and a selector which is connected between the sense amplifiers and the output buffer.

40. A memory according to claim 38, wherein the sense amplifiers fix potentials of the second functional lines and detect a change in read current flowing through the second functional lines.

41. A memory according to claim 38, wherein the sense amplifiers fix potentials of the second functional lines and detect a change in read current flowing through the second functional lines.

42. A memory according to claim 1, wherein the memory cells form a read block, and data from the memory cells are simultaneously read out.

43. A memory according to claim 1, wherein each of the memory cells is formed from a magnetic storage element including a pinning layer whose magnetizing direction is fixed, a storing layer whose magnetizing direction changes in accordance with write data, and a tunneling barrier layer arranged between the pinning layer and the storing layer.

44. A memory according to claim 1, wherein $2^n$ (n is a natural number) memory cells are present.

45. A memory according to claim 1, wherein each of the memory cells is formed from an element which stores data using a tunneling magnetoresistive effect.

46. A read method of a magnetic random access memory, comprising:
   using the method to the magnetic random access memory of claim 1;
   fixing all the second functional lines of claim 1 to a first potential;
   setting the first functional line of claim 1 to a second potential different from the second potential;
   individually supplying a read current to the memory cells of claim 1; and
   reading out data from the memory cells on the basis of a value of the read current.

47. A write method of a magnetic random access memory, comprising:
   using the method to the magnetic random access memory of claim 1;
   supplying a first write current flowing in one direction to one of the second functional lines of claim 1;
   supplying a second write current having a direction depending on write data to the third functional line of claim 1; and
   writing the write data in one of the memory cells using a magnetic field generated by the first and second write currents.

48. A write method of a magnetic random access memory, comprising:
   using the method to the magnetic random access memory of claim 1;
   supplying a first write current having a direction depending on write data to one of the second functional lines of claim 1;
   supplying a second write current flowing in one direction to the third functional line of claim 1; and
   writing the write data in one of the memory cells using a magnetic field generated by the first and second write currents.

* * * * *